(12) United States Patent
Choi et al.

(10) Patent No.: US 9,305,906 B2
(45) Date of Patent: Apr. 5, 2016

(54) SEMICONDUCTOR LIGHT EMITTING DEVICE

(71) Applicant: SAMSUNG ELECTRONICS CO., LTD., Suwon-si, Seoul (KR)

(72) Inventors: Pun Jae Choi, Gyunggi-do (KR); Sang Bum Lee, Gyunggi-do (KR); Jin Bock Lee, Gyunggi-do (KR); Yu Seung Kim, Gyunggi-do (KR); Sang Yeob Song, Gyunggi-do (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 0 days.

(21) Appl. No.: 14/336,973

(22) Filed: Jul. 21, 2014

(65) Prior Publication Data

US 2015/0001463 A1  Jan. 1, 2015

Related U.S. Application Data

(62) Division of application No. 13/127,847, filed as application No. PCT/KR2009/006731 on Nov. 16, 2009, now Pat. No. 8,809,893.

(30) Foreign Application Priority Data

Nov. 14, 2008  (KR) .................. 10-2008-0113568
Dec. 3, 2008  (KR) .................. 10-2008-0122094
Nov. 16, 2009  (KR) .................. 10-2009-0110307

(51) Int. Cl.
*H01L 33/56* (2010.01)
*H01L 25/13* (2006.01)
(Continued)

(52) U.S. Cl.
CPC .............. *H01L 25/13* (2013.01); *H01L 33/002* (2013.01); *H01L 33/0025* (2013.01);
(Continued)

(58) Field of Classification Search
CPC . H01L 25/0753; H01L 33/382; H01L 33/504; H01L 33/0803; H01L 33/502; H01L 33/507
USPC .................. 257/98, 103, 347; 136/256, 251; 220/562; 429/481; 438/158
See application file for complete search history.

(56) References Cited

U.S. PATENT DOCUMENTS

| 5,453,405 A | 9/1995 | Fan et al. |
| 6,372,608 B1 | 4/2002 | Shimoda et al. |

(Continued)

FOREIGN PATENT DOCUMENTS

| JP | 06-151959 | 5/1994 |
| JP | 2001-185802 | 7/2001 |

(Continued)

OTHER PUBLICATIONS

Notice of Allowance U.S. Appl. No. 13/127,847 dated Apr. 14, 2014.
(Continued)

*Primary Examiner* — Kenneth Parker
*Assistant Examiner* — Bo Fan
(74) *Attorney, Agent, or Firm* — McDermott Will & Emery LLP

(57) ABSTRACT

In a semiconductor light emitting device, a light emitting structure includes a first-conductivity type semiconductor layer, an active layer, and a second-conductivity type semiconductor layer, which are sequentially formed on a conductive substrate. A second-conductivity type electrode includes a conductive via and an electrical connection part. The conductive via passes through the first-conductivity type semiconductor layer and the active layer, and is connected to the inside of the second-conductivity type semiconductor layer. The electrical connection part extends from the conductive via and is exposed to the outside of the light emitting structure. An insulator electrically separates the second-conductivity type electrode from the conductive substrate, the first-conductivity type semiconductor layer, and the active layer. A passivation layer is formed to cover at least a side surface of the active layer in the light emitting structure. An uneven structure is formed on a path of light emitted from the active layer.

8 Claims, 125 Drawing Sheets

(51) Int. Cl.
*H01L 33/20* (2010.01)
*H01L 33/38* (2010.01)
*H01L 33/00* (2010.01)
*H01L 33/40* (2010.01)
*H01L 33/44* (2010.01)
*H01L 33/48* (2010.01)
*H01L 33/54* (2010.01)
*H05B 33/08* (2006.01)
*H01L 25/075* (2006.01)
*H01L 33/50* (2010.01)

(52) U.S. Cl.
CPC ........... *H01L 33/0029* (2013.01); *H01L 33/20* (2013.01); *H01L 33/382* (2013.01); *H01L 33/387* (2013.01); *H01L 33/40* (2013.01); *H01L 33/44* (2013.01); *H01L 33/486* (2013.01); *H01L 33/502* (2013.01); *H01L 33/507* (2013.01); *H01L 33/54* (2013.01); *H01L 33/56* (2013.01); *H05B 33/0803* (2013.01); *H01L 25/0753* (2013.01); *H01L 33/504* (2013.01); *H01L 2224/48091* (2013.01); *H01L 2224/48247* (2013.01); *H01L 2224/48257* (2013.01); *H01L 2224/8592* (2013.01); *H01L 2924/1461* (2013.01); *H01L 2924/3025* (2013.01); *H01L 2933/0041* (2013.01)

(56) References Cited

U.S. PATENT DOCUMENTS

| | | |
|---|---|---|
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 2004/0036130 A1* | 2/2004 | Lee et al. ............. 257/409 |
| 2007/0259206 A1* | 11/2007 | Oshio ............... 428/690 |
| 2007/0285378 A1 | 12/2007 | Lankhorst et al. |
| 2008/0136335 A1 | 6/2008 | Chen et al. |
| 2008/0246017 A1* | 10/2008 | Gillies et al. .......... 257/13 |
| 2008/0252229 A1 | 10/2008 | Wu |
| 2010/0117070 A1* | 5/2010 | Adekore et al. ....... 257/43 |
| 2010/0171135 A1* | 7/2010 | Engl et al. ............. 257/98 |

FOREIGN PATENT DOCUMENTS

| | | |
|---|---|---|
| JP | 2008-198998 | 8/2008 |
| KR | 10-0752717 B1 | 8/2007 |
| WO | 2008/131735 A1 | 11/2008 |

OTHER PUBLICATIONS

Taiwanese Office Action, w/English translation thereof, issued in Taiwanese Patent Application No. TW 98138954 dated Apr. 15, 2013.
Chinese Office Action, w/English translation thereof, issued in Chinese Patent Application No. 200980145944.5 dated Dec. 5, 2013.
Chinese Office Action, w/English translation thereof, Issued in Chinese Patent Application No. CN 200980145944.5 dated Jan. 17, 2013.
Final Office Action U.S. Appl. No. 13/127,847 dated Jul. 15, 2013.
Taiwanese Office Action w/English translation thereof, issued in Taiwanese Patent Application No. TW 98138954 dated Apr. 15, 2013.
Non-Final Office Action U.S. Appl. No. 13/127,847 dated Mar. 19, 2013.
Non-Final Office Action U.S. Appl. No. 13/127,847 dated Nov. 13, 2012.
English Translation of the International Preliminary Report on Patentability issued in International Patent Applicatin No. PCT/KR2009/006731 mailed Jul. 14, 2011.
English Translation of the Written Opinion of hte International Searching Authority issued in International Patent Application No. PCT/KR2009/006731, mailed Jun. 11, 2010.
Non-Final Office Action issued in related U.S. Appl. No. 14/338,225 mailed on Jul. 6, 2015.

\* cited by examiner (A)

(B)

(A)

(B)

(A)

(B)

(A)

(B)

(A)

(B)

(A)

(B)

SEMICONDUCTOR LIGHT EMITTING DEVICE

CROSS-REFERENCE TO RELATED APPLICATIONS

This application is a Divisional application of U.S. Ser. No. 13/127,847 filed Aug. 3, 2011, which is the U.S. National Phase of PCT/KR09/06731 filed Nov. 16, 2009, which claims priority from Korean Patent Application No. 10-2009-0110307 filed Nov. 16, 2009, Korean Patent Application No. 10-2008-0122094 filed Dec. 3, 2008 and Korean Patent Application No. 10-2008-0113568 filed Nov. 14, 2008, the subject matter of each is incorporated herein by reference in entirety.

TECHNICAL FIELD

The present invention relates to a semiconductor light emitting device, and more particularly, to a semiconductor light emitting device with improved external light extraction efficiency.

BACKGROUND ART

A semiconductor light emitting device is a semiconductor device which emits light of various colors by the recombination of electrons and holes in a p-n junction between a p-type semiconductor and an n-type semiconductor when a current is applied thereto. When compared with a filament-based light emitting device, a semiconductor light emitting device has a longer lifespan, lower power consumption, superior initial driving characteristic, higher vibration resistance, and so on. Hence, the demand for semiconductor light emitting device is continuously increasing. Specifically, a great deal of attention has recently been paid to a group III nitride semiconductor which can emit light in a short-wavelength region, such as a series of blue colors.

A nitride single-crystal, which constitutes a light emitting device using a group III nitride semiconductor, is formed over a substrate for specific single-crystal growth, e.g., a sapphire substrate or a SiC substrate. However, there are considerable limitations on the arrangement of electrodes when an insulation substrate, such as a sapphire substrate, is used. Specifically, in the case of a conventional nitride semiconductor light emitting device, electrodes are generally arranged in a horizontal direction, which causes a narrow current flow. Such a narrow current flow increases an operating voltage (Vf) of the nitride semiconductor light emitting device, which degrades current efficiency. In addition, the nitride semiconductor light emitting device is vulnerable to electrostatic discharge. To solve these problems, there is a need for a nitride semiconductor light emitting device having an optimized chip structure and electrode structure.

DISCLOSURE

Technical Problem

An aspect of the present invention provides a vertical/horizontal type semiconductor light emitting device which is capable of improving internal/external light efficiency, specifically, external light extraction efficiency through the optimization of an electrode structure and a device structure.

Technical Solution

According to an aspect of the present invention, there is provided a semiconductor light emitting device, including: a conductive substrate; a light emitting structure including a first-conductivity type semiconductor layer, an active layer, and a second-conductivity type semiconductor layer which are sequentially formed on the conductive substrate; a second-conductivity type electrode including a conductive via passing through the first-conductivity type semiconductor layer and the active layer and connected to the inside of the second-conductivity type semiconductor layer, and an electrical connection part extending from the conductive via and exposed to the outside of the light emitting structure; an insulator electrically separating the second-conductivity type electrode from the conductive substrate, the first-conductivity type semiconductor layer, and the active layer; a passivation layer formed to cover at least a side surface of the active layer in the light emitting structure; and an uneven structure formed on a path of light emitted from the active layer.

According to another aspect of the present invention, there is provided a semiconductor light emitting device, including: a conductive substrate; a light emitting structure including a first-conductivity type semiconductor layer, an active layer, and a second-conductivity type semiconductor layer which are sequentially formed on the conductive substrate; a first contact layer electrically connected to the first-conductivity type semiconductor layer between the conductive substrate and the first-conductivity type semiconductor layer and exposed to the outside of the light emitting device; a conductive via extending from the conductive substrate, passing through the first contact layer, the first-conductivity type semiconductor layer, and the active layer, and electrically connected to the inside of the second-conductivity type semiconductor layer; an insulator electrically separating the conductive substrate from the first contact layer, the first-conductivity type semiconductor layer, and the active layer; a passivation layer formed to cover at least a side surface of the active layer in the light emitting structure; and an uneven structure formed on a path of light emitted from the active layer.

The semiconductor light emitting device may further include a second contact layer formed between the first-conductivity type semiconductor layer and the conductive substrate and electrically separated from the second-conductivity type electrode by the insulator.

The light emitting structure may be formed only on a portion of the top surface of the conductive substrate, and an etch stop layer formed on at least a region in which the light emitting structure is not formed over the top surface of the conductive substrate, the etch stop layer having an etching characteristic different from a semiconductor material constituting the light emitting structure.

The uneven structure may be formed on the top surface of the second-conductivity type semiconductor layer.

The first-conductivity type semiconductor layer and the second-conductivity type semiconductor layer may be a p-type semiconductor layer and an n-type semiconductor layer, respectively.

DESCRIPTION OF DRAWINGS

FIGS. 183 through 187(B) are schematic views of LED driver circuits according to various embodiments of the present invention;

FIGS. 194(A) through 197(C) are schematic views of light emitting device packages adopted in the vehicle headlight of FIG. 192 according to various embodiments of the present invention.

MODE FOR INVENTION

Figure 1:
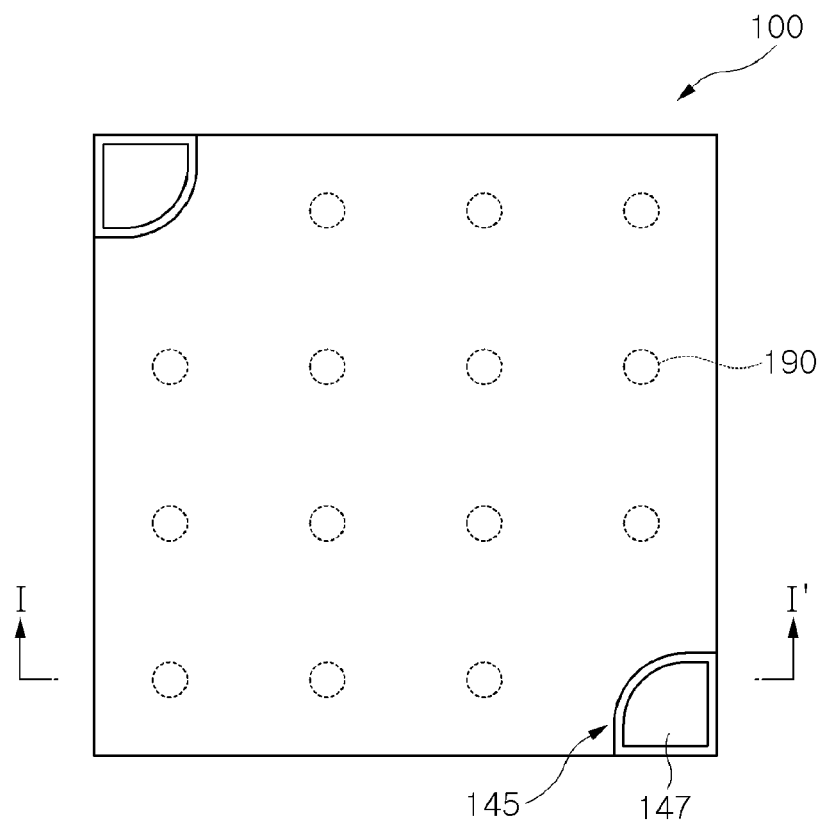
FIG. 1 is a plan view of a semiconductor light emitting device according to an embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

It will be understood that when an element is referred to as being "connected to" another element, it can be directly connected to the other element or intervening elements may also be present. In contrast, when an element is referred to as being "directly connected to" another element, there are no intervening elements present. In addition, unless explicitly described to the contrary, the word "comprise" and variations such as "comprises" or "comprising," as well as the word "include" and variations such as "includes" and "including," will be understood to imply the inclusion of stated elements but not the exclusion of any other elements.

Semiconductor light emitting devices, according to exemplary embodiments of the present invention, will be described in detail, and light emitting device packages and backlight apparatuses using the semiconductor light emitting devices will be then described in detail.

<Semiconductor Light Emitting Device>

Figure 2:
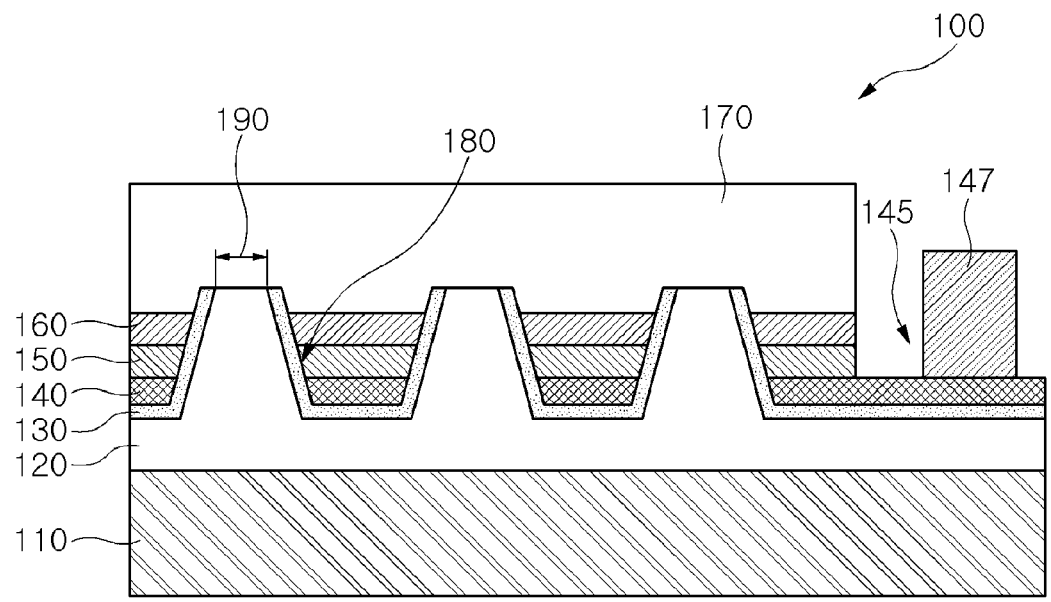
FIG. 2 is a cross-sectional view of the semiconductor light emitting device of FIG. 1.

FIGS. 1 and 2 are a plan view and a cross-sectional view, respectively, of a semiconductor light emitting device according to an embodiment of the present invention. Specifically, FIG. 2 is a cross-sectional view taken along line I-I' of FIG. 1.

Referring to FIGS. 1 and 2, a semiconductor light emitting device 100 according to an embodiment of the present invention includes a conductive substrate 110, a first electrode layer 120, an insulation layer 130, a second electrode layer 140, a second semiconductor layer 150, an active layer 160, and a first semiconductor layer 170, all of which are stacked sequentially.

The conductive substrate 110 may be formed of a material through which electricity may flow. The conductive substrate 110 may be formed of a material including any one of Au, Ni, Al, Cu, W, Si, Se, and GaAs, for example, SiAl which is a combination of Si and Al.

The first electrode layer 120 is provided over the conductive substrate 110. Since the first electrode layer 120 is electrically connected to the conductive substrate 110 and the active layer 160, the first electrode layer 120 may be formed of a material which minimizes contact resistance between the conductive substrate 110 and the active layer 160.

As illustrated in FIG. 2, the first electrode layer 120 provided over the conductive substrate 110 also extends through a contact hole 180, which passes through the insulation layer 130, the second electrode layer 140, the second semiconductor layer 150, the active layer 160, and a predetermined region of the first semiconductor layer 170, so that the first electrode layer 120 comes into contact with the first semiconductor layer 170. Consequently, the conductive substrate 110 and the first semiconductor layer 170 are provided so that they are electrically connected together.

Specifically, the first electrode layer 120 electrically connects the conductive substrate 110 to the first semiconductor layer 170 through the contact hole 180. The conductive substrate 110 and the first semiconductor layer 170 are electrically connected together through the size of the contact hole 180, more exactly, the contact region 190 where the first electrode layer 120 and the first semiconductor layer 170 contact each other through the contact hole 180.

Meanwhile, the insulation layer 130 is provided over the first electrode layer 120 to electrically insulate the first electrode layer 120 from the other layers, except for the conductive substrate 110 and the first semiconductor layer 170. Specifically, the insulation layer 130 is provided between the first electrode layer 120 and the second electrode layer 140, and between the first electrode layer 120 and side surfaces of the second electrode layer 140, the second semiconductor layer 150, and the active layer 160, which are exposed by the contact hole 180. Furthermore, the insulation layer 130 may also be provided on side surfaces of the predetermined region of the first semiconductor layer 180 through which the contact hole 180 passes.

The second electrode layer 140 is provided over the insulation layer 130. As described above, the second electrode layer 140 is not provided in the predetermined regions through which the contact hole 180 passes.

In this case, as illustrated in FIG. 2, the second electrode layer 140 includes at least one exposed region 145, i.e., a region where a portion of the interface with the second semiconductor layer 150 is exposed. An electrode pad portion 147 may be provided in the exposed region 145 in order to connect an external power supply to the second electrode layer 140. Meanwhile, the second semiconductor layer 150, the active layer 160, and the first semiconductor layer 170, which will be described later, are not provided in the exposed region 145. Moreover, as illustrated in FIG. 1, the exposed region 145 may be formed at edges of the semiconductor light emitting device 100 in order to maximize the light emitting area of the semiconductor light emitting device 100.

Meanwhile, the second electrode layer 140 may be formed of a material including Ag, Al, Pt, Ni, Pd, Au, Ir, or a transparent conductive oxide. This is because the second electrode layer 140 electrically contacts the second semiconductor layer 150, and thus, the second electrode layer 140 must have a characteristic which minimizes the contact resistance of the second semiconductor layer 150 and a function which increases the luminous efficiency by reflecting light generated at the active layer 160 to the outside.

The second semiconductor layer 150 is provided over the second electrode layer 140, and the active layer 160 is provided over the second semiconductor layer 150. Also, the first semiconductor layer 170 is provided over the active layer 160.

In this case, the first semiconductor layer 170 may be an n-type nitride semiconductor, and the second semiconductor layer 150 may be a p-type nitride semiconductor.

Meanwhile, a material of the active layer 160 may be differently selected according to materials of the first semiconductor layer 170 and the second semiconductor layer 150. Specifically, since the active layer 160 is a layer which converts energy generated from electron-hole recombination into light and emits the converted light, the active layer 160 may be formed of a material having a smaller energy band gap than the first semiconductor layer 170 and the second semiconductor layer 150.

Figure 6:
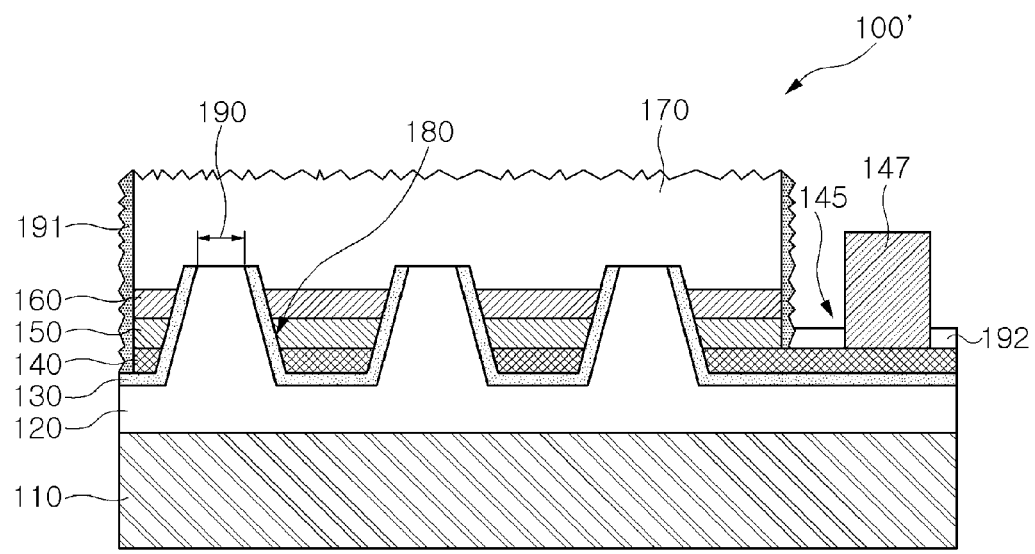
FIG. 6 illustrates a modified embodiment of the semiconductor light emitting device of FIG. 2.

FIG. 6 illustrates a modified embodiment of the semiconductor light emitting device of FIG. 2. The semiconductor light emitting device 100' of FIG. 6 is substantially similar to the semiconductor light emitting device 100 of FIG. 2, except that a passivation layer 191 is provided on sides of the light emitting structure, which includes the second semiconductor layer 159, the active layer 160, and the first semiconductor layer 170, and the top surface of the first semiconductor layer 170 is uneven. The passivation layer 191 protects the light emitting structure, specifically the active layer 160, from the outside. The passivation layer 191 may be formed of silicon oxide, silicon nitride, or other insulating materials, e.g., $SiO_2$, $SiO_xN_y$, or $Si_xN_y$ and may be approximately 0.1-2 µm in thickness. The active layer 160 exposed to the outside may act as a current leakage path during the operation of the semiconductor light emitting device 100'. However, such a problem can be prevented by forming the passivation layer 191 on the sides of the light emitting structure. In this case, as illustrated in FIG. 6, when the uneven passivation layer 191 may improve the light extraction efficiency. Likewise, the top surface of the first semiconductor layer 170 may be uneven. The first semiconductor layer 170 having the uneven top surface increases the probability that light will be emitted to the outside in a direction of the active layer 160. Although not illustrated, in a case in which the light emitting structure is etched in order to expose the second electrode layer 140 in the fabrication process, an etch stop layer may be further be formed over the second electrode layer 140 in order to prevent the material of the second electrode layer 140 from being attached to the side surface of the active layer 160. The above-described modified embodiment of the present invention illustrated in FIG. 6 may be applied to an embodiment of the present invention illustrated in FIG. 7.

Figure 7:
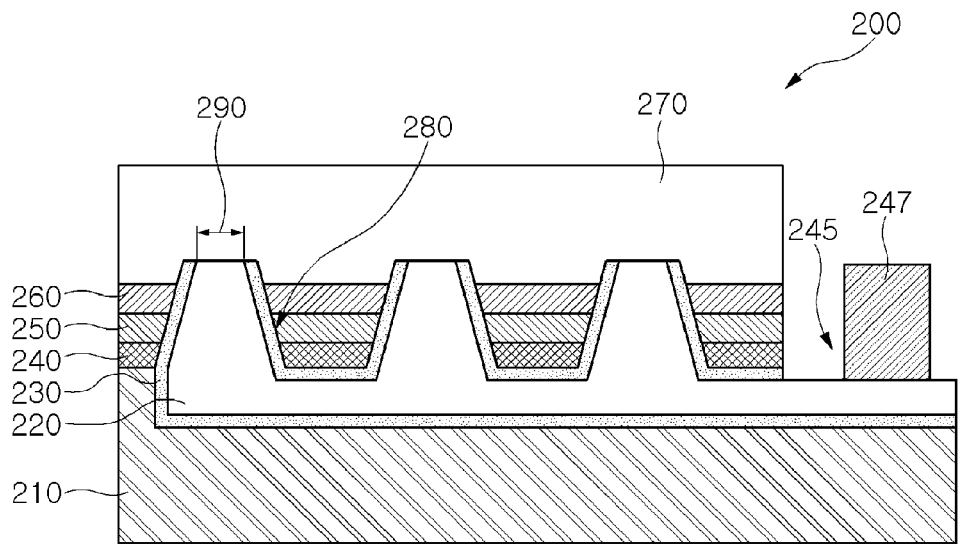
FIG. 7 is a cross-sectional view of a semiconductor light emitting device according to another embodiment of the present invention.

Meanwhile, the semiconductor light emitting device suggested in this embodiment of the present invention may be modified in the above-described structure so that the first electrode layer connected to the contact hole is exposed to the outside. FIG. 7 is a cross-sectional view of a semiconductor light emitting device according to another embodiment of the present invention. A semiconductor light emitting device 200 according to another embodiment of the present invention includes a second semiconductor layer 250, an active layer 260, and a first semiconductor layer 260 over a conductive substrate 210. In this case, a second electrode layer 240 may be provided between the second semiconductor layer 250 and the conductive substrate 210. Unlike the preceding embodiment, the second electrode layer 240 is not necessarily required. In this embodiment, a contact hole 280, having a contact region 290 which contacts the first semiconductor layer 270, is electrically connected to a first electrode layer 220, and the first electrode layer 220 is exposed to the outside and has an electric connection portion 245. An electrode pad portion 247 may be formed in the electric connection portion 245. An insulation layer 230 may be provided to electrically separate the first electrode layer 220 from the active layer 260, the second semiconductor layer 250, the second electrode layer 240, and the conductive substrate 210. As opposed to the foregoing embodiment in which the contact hole is electrically connected to the conductive substrate, the contact hole 280 is electrically separated from the conductive substrate 210, and the first electrode layer 220 connected to the contact hole 280 is exposed to the outside. Hence, the conductive substrate 210 is electrically connected to the second semiconductor layer 240, so that the polarity is different from the foregoing embodiment.

Hereinafter, the optimum size and shape of the contact hole will be found through the simulation of the variation in the electrical characteristics according to the contact area between the first electrode layer and the first semiconductor layer in the semiconductor light emitting devices suggested in the embodiments of the present invention. The following simulation results can be applied to both the structure of FIG. 1 and the structure of FIG. 6. In this simulation, the first semiconductor layer and the second semiconductor layer were implemented with an n-type semiconductor layer and a p-type semiconductor layer, respectively.

Figure 3:
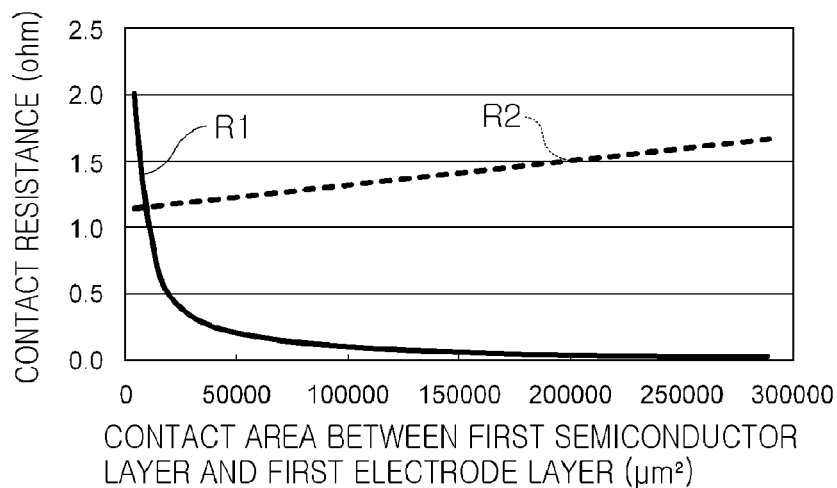
FIG. 3 is a graph showing an n-type ohmic contact resistance and a p-type ohmic contact resistance in a semiconductor light emitting device having an area of $1,000 \times 1,000 \ \mu m^2$.

FIG. 3 is a graph showing n-type ohmic contact resistance and p-type ohmic contact resistance in a semiconductor light emitting device having a size of $1,000 \times 1,000$ µm$^2$.

In the simulation of FIG. 3, an n-type specific contact resistance, i.e., a specific contact resistance between the first electrode layer and the contact hole is $10^{-4}$ Ω/cm$^2$, and a p-type specific contact resistance, i.e., a specific contact resistance between the second semiconductor layer and the second electrode layer is $10^{-2}$ Ω/cm$^2$.

Referring to FIG. 3, when assuming that the semiconductor light emitting device 100 according to this embodiment of the present invention is a rectangular chip having a size of 1,000-µm×1,000-µm, i.e., 1,000,000 µm$^2$, the semiconductor light emitting device 100 has a first contact resistance of the first semiconductor layer 170 and the first electrode layer 120, and a second contact resistance of the first electrode layer 120, the second electrode layer 140, the first semiconductor layer 170, and the second semiconductor layer 150. The first contact resistance R1 and the second contact resistance R2 vary greatly according to contact area.

In particular, it can be seen from FIG. 3 that, as the contact area increases, the first contact resistance R1 changes more than the second contact resistance R2. In FIG. 3, the X-axis represents the magnitude of the contact area between the first semiconductor layer 170 and the first electrode layer 120, and the Y-axis represents the magnitude of the contact resistance. Therefore, the number on the X-axis means the contact area between the first semiconductor layer 170 and the first electrode layer 120, and the contact area between the second semiconductor layer 150 and the second electrode layer 140, which corresponds to the second contact resistance R2, is calculated by subtracting the value of the X-axis from the total area (1,000,000 μm²) of the semiconductor light emitting device 100.

In this case, as described above with reference to FIGS. 1 and 2, the contact area between the first semiconductor layer 170 and the first electrode layer 120 is equal to a total area of the contact region 190 where the first electrode layer 120 and the first semiconductor layer 170 are in contact with each other through the contact hole 180. That is, since the contact hole 180 is provided in plurality, the contact area between the first semiconductor layer 170 and the first electrode layer 120 is equal to the sum of the areas of the respective contact regions 190.

Figure 4:
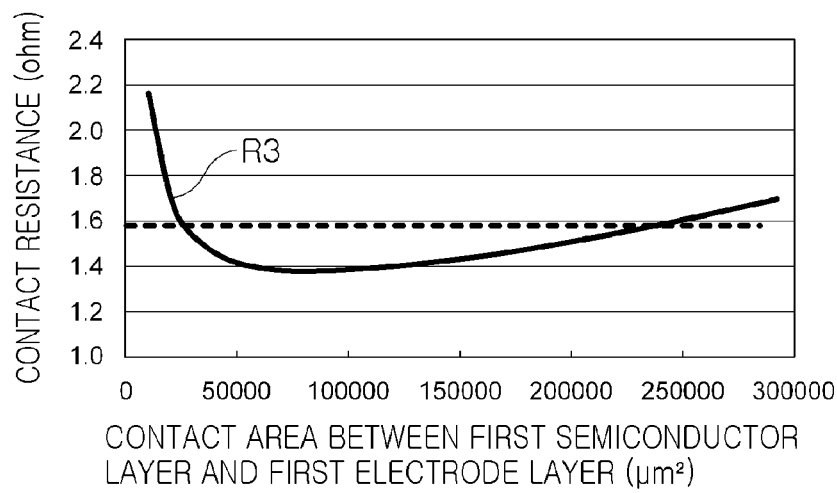
FIG. 4 is a graph showing a total resistance of a first contact resistance and a second contact resistance according to a contact area between a first semiconductor layer and a first electrode layer.

FIG. 4 is a graph showing a total resistance of the first contact resistance and the second contact resistance according to the contact area between the first semiconductor layer and the first electrode layer.

Referring to FIG. 4, since the first contact resistance R1 and the second contact resistance R2 are serially connected in the semiconductor light emitting device 100 according to the embodiment of the present invention, the total resistance R3 obtained by combining the first contact resistance R1 and the second contact resistance R2 is the resistance which is most greatly influenced according to the contact area among all of the resistances of the semiconductor light emitting device 100.

It can be seen from FIG. 4 that the total resistance R3 (see the value of the Y-axis) rapidly decreases at the start as the contact area (see the value of the X-axis) between the first semiconductor layer 170 and the first electrode layer 120 increases, and then, the total resistance R3 increases as the contact area between the first semiconductor layer 170 and the first electrode layer 120 increases.

Meanwhile, when the semiconductor light emitting device 100 is 1,000,000 μm² in size, it is preferable that the n-type contact resistance and the p-type contact resistance are approximately 1.6Ω or less. Thus, it is preferable that the contact area between the first semiconductor layer 170 and the first electrode layer 120 is in the range of approximately 30,000-250,000 μm².

The typical operating voltage of the semiconductor light emitting device is in the range of approximately 3.0-3.2 V, and the typical operating voltage of the semiconductor light emitting device is approximately 0.35 A. If the total resistance of the semiconductor light emitting device is approximately 2Ω, the voltage is equal to 0.70 V (=0.35(A)×2(Ω)), which is out of the normal specification range (i.e., 2.8 V to 3.8 V). As such, if out of the voltage range, the existing circuit configuration needs to be modified, and the increase of the input power may cause the generation of heat and the degradation of light output. Therefore, it is preferable that the total resistance of the semiconductor light emitting device is 2Ω or less. In the semiconductor light emitting device suggested in this embodiment of the present invention, the sum of the n-type contact resistance and the p-type contact resistance is approximately 80% of the total resistance. Thus, the reference contact resistance may be 1.6Ω (=2(Ω)×0.8).

Specifically, the semiconductor light emitting device 100 described above with reference to FIGS. 1 and 2 is most preferable in view of contact resistance when the total contact area of the contact regions 190, where the first electrode layer 120 and the first semiconductor layer 170 are in contact with each other through the contact hole 180, is in the range of approximately 30,000 μm-250,000 μm².

Figure 5:
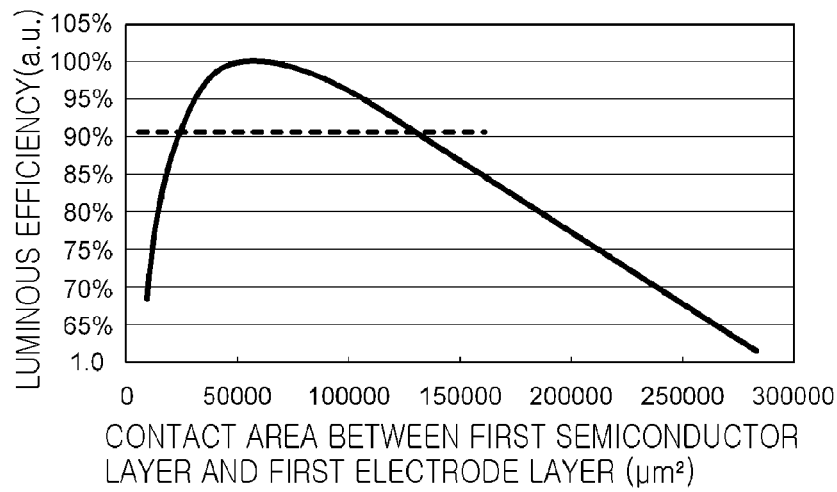
FIG. 5 is a graph showing the luminous efficiency according to the contact area between the first semiconductor layer and the first electrode layer.

FIG. 5 is a graph showing the luminous efficiency according to the contact area between the first semiconductor layer and the first electrode layer.

According to the description made with reference to FIG. 4, it seems that when the contact area between the first semiconductor layer 170 and the first electrode layer 120 is in the range of approximately 30,000-250,000 μm², the total resistance of the semiconductor light emitting device 100 is low and thus the luminous efficiency is high. However, there is no consideration on the fact that the practical light emitting area of the semiconductor light emitting device 100 is reduced with the increase in the contact area between the first semiconductor layer 170 and the first electrode layer 120.

That is, as illustrated in FIG. 5, the luminous efficiency of the semiconductor light emitting device 100 increases because the total resistance is reduced until the contact area between the first semiconductor layer 170 and the first electrode layer 120 is equal to 70,000 μm², but the luminous efficiency of the semiconductor light emitting device 100 decreases if the contact area between the first semiconductor layer 170 and the first electrode layer 120 increases to more than 70,000 μm². The increase in the contact area between the first semiconductor layer 170 and the first electrode layer 120 means the contact area between the second semiconductor layer 150 and the second electrode layer 140 decreases, causing the reduction in the light emitting amount of the semiconductor light emitting device 100.

Therefore, it is important to appropriately determine the contact area between the first semiconductor layer 170 and the first electrode layer 120. As illustrated in FIG. 5, it is preferable that the contact area between the first semiconductor layer 170 and the first electrode layer 120 be 130,000 μm² or less, at which level the luminous efficiency becomes 90% or more.

Consequently, in the semiconductor light emitting device 100 according to this embodiment of the present invention, it is most preferable that the contact area between the first semiconductor layer 170 and the first electrode layer 120 through the contact hole 180 is in the range of approximately 30,000-130,000 μm². This is the case in which the chip size of the semiconductor light emitting device 100 is 1,000,000 μm². Hence, the most preferable contact area between the first semiconductor layer 170 and the first electrode layer 120 is in the range of approximately 3-13% of the area of the semiconductor light emitting device 100.

Meanwhile, when the number of the contact holes 180 is too small, the contact area between the first semiconductor layer 170 and the first electrode layer 120 with respect to one contact region 190 between the first semiconductor layer 170 and the first electrode layer 120 increases. However, the area of the first semiconductor layer 170 to which a current is supplied also increases, thus increasing the amount of current, which must be supplied from the contact region 190. Consequently, a current is crowded in the contact region 190 between the first semiconductor layer 170 and the first electrode layer 120.

On the other hand, when the number of contact holes 180 is too large, the size of the contact hole 180 becomes too small, causing difficulties in the fabrication process.

Therefore, the number of contact holes 180 is appropriately determined according to the size of the semiconductor light emitting device 100, i.e., the chip size. When the size of the semiconductor light emitting device 100 is 1,000,000 μm², it is preferable that the number of the contact holes 180 is 5 to 150.

Meanwhile, the plurality of contact holes 180 may be disposed uniformly in the semiconductor light emitting device 100. The first semiconductor layer 170 and the first electrode layer 120 are contacted through the contact holes 180. Thus, in order to uniformly disperse the current, it is preferable that the contact holes 180 are disposed uniformly, that is, the contact regions 190 between the first semiconductor layer 170 and the first electrode layer 120 are disposed uniformly.

When the size of the semiconductor light emitting device 100 is 1,000,000 μm$^2$ and the number of the contact holes 180 is 5 to 150, the spacing between the adjacent contact holes 180 may be in the range from approximately 100-400 μm in order to ensure the uniform arrangement of the semiconductor light emitting device. The spacing between the adjacent contact holes 180 is a value measured by connecting the center points of the adjacent contact holes 180.

Meanwhile, the semiconductor light emitting device 100 obtains the uniform current dispersion by uniformly disposing the plurality of contact holes 180 as described above. Thus, a semiconductor light emitting device having a size of 1,000,000 μm$^2$, according to the prior art, operates at approximately 35 mA, but the semiconductor light emitting device according to this embodiment of the present invention operates very stably even though a high current of approximately 2 A is applied, and the current crowding phenomenon is also reduced, thereby improving the reliability of the semiconductor light emitting device.

Figure 8:
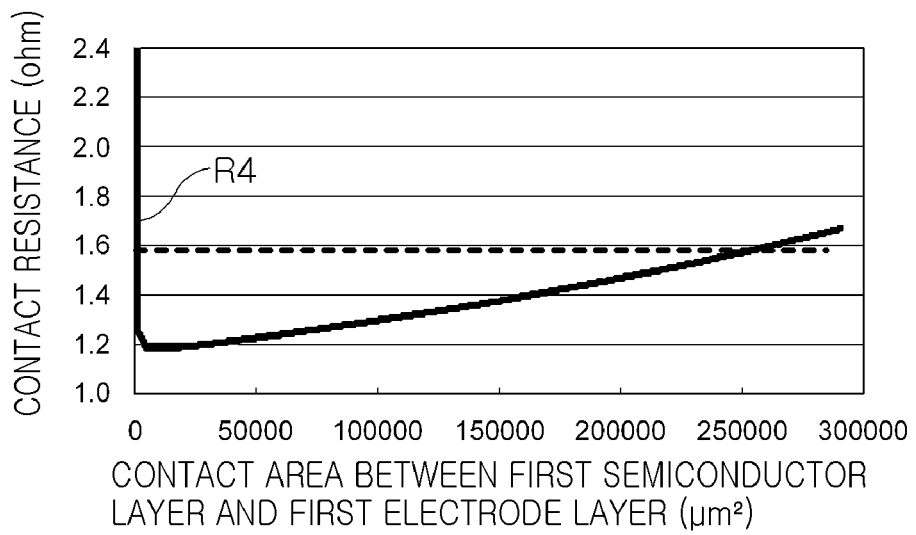
FIGS. 8 and 9 show simulation results when an n-type specific contact resistance is varied.
Figure 9:
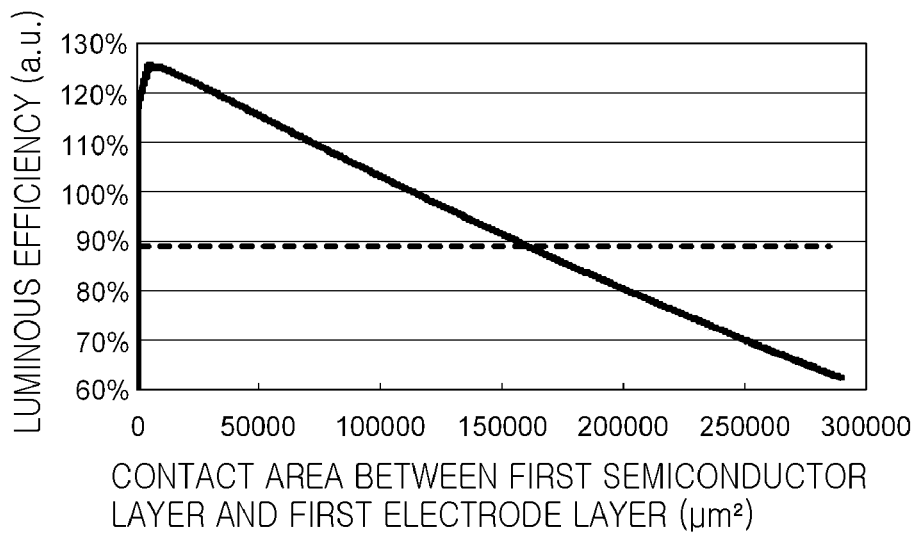
Figure 10:
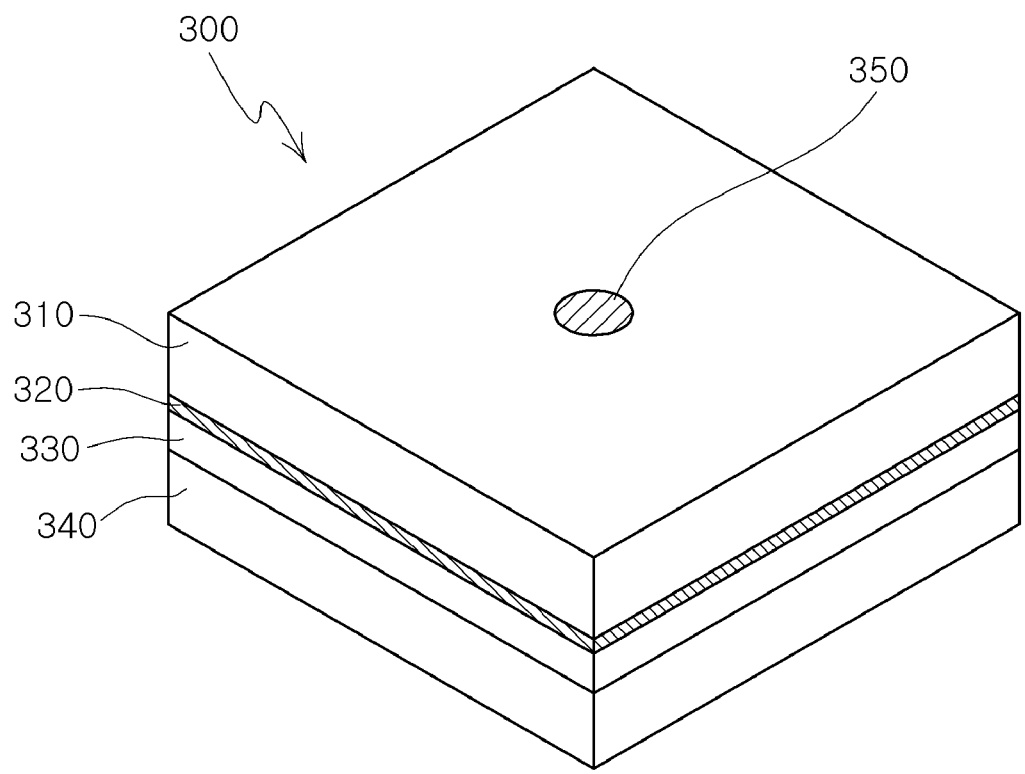
FIGS. 10 through 14 illustrate a semiconductor light emitting device according to another embodiment of the present invention.
Figure 11:
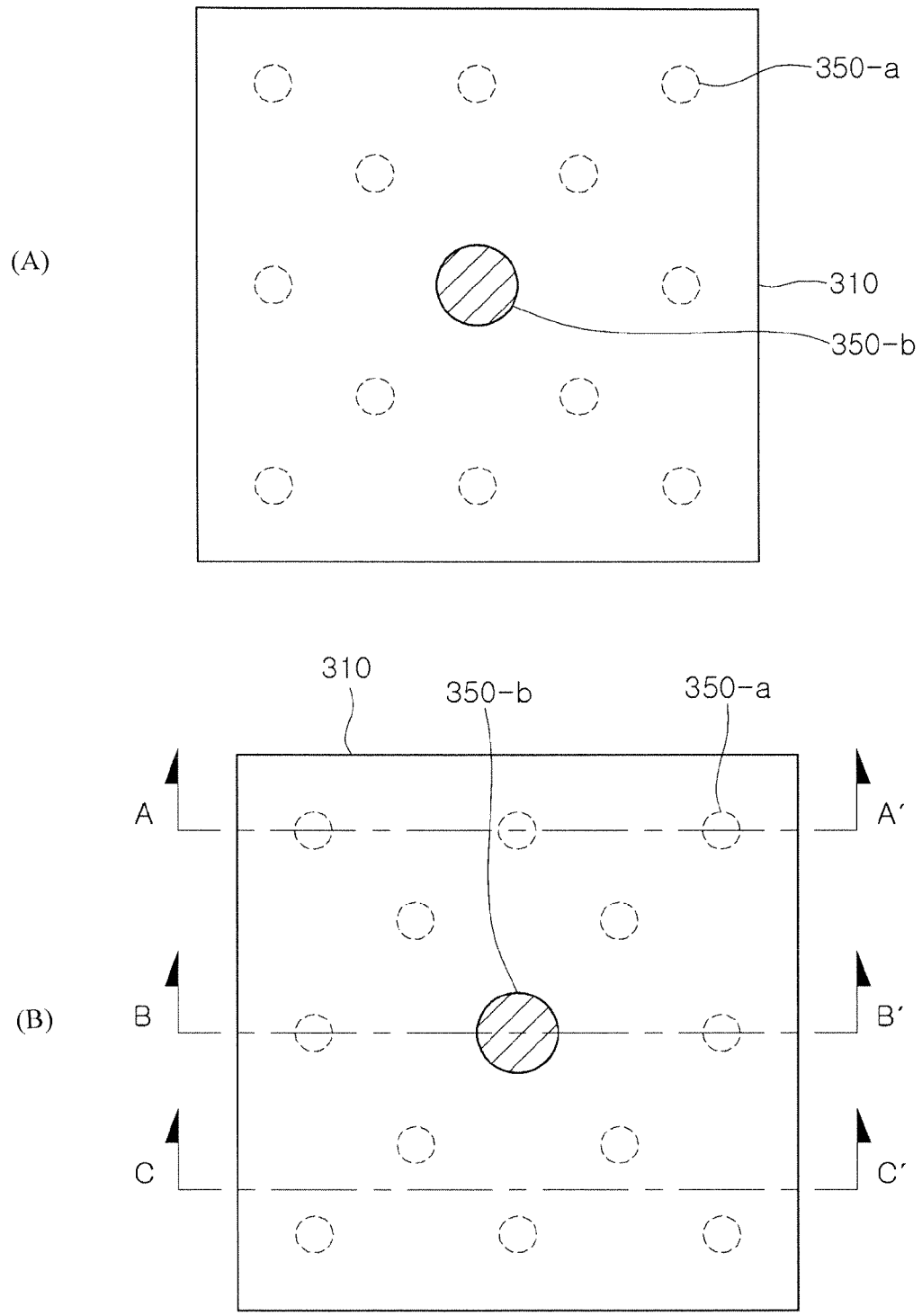
Figure 12:
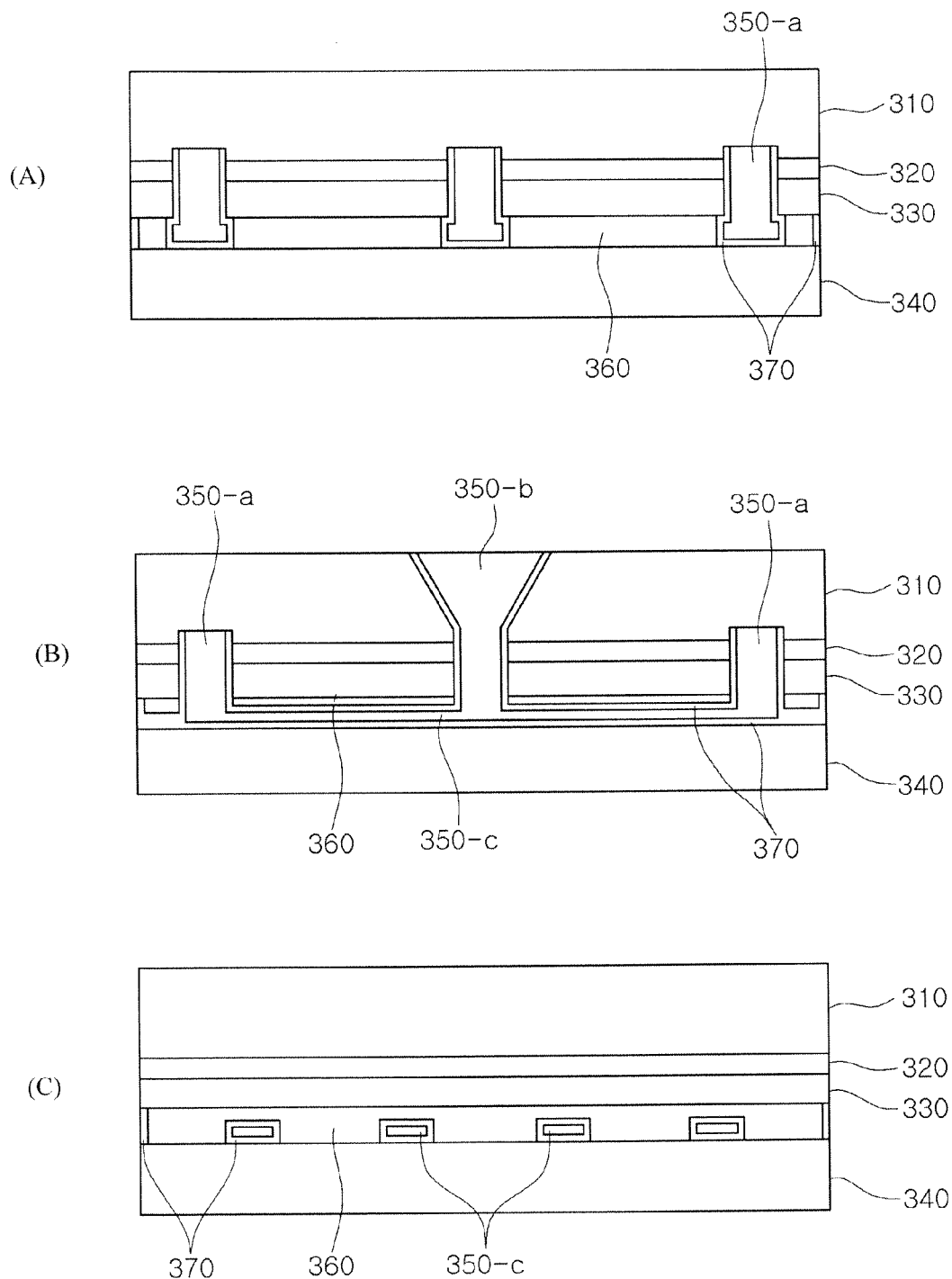
Figure 13:
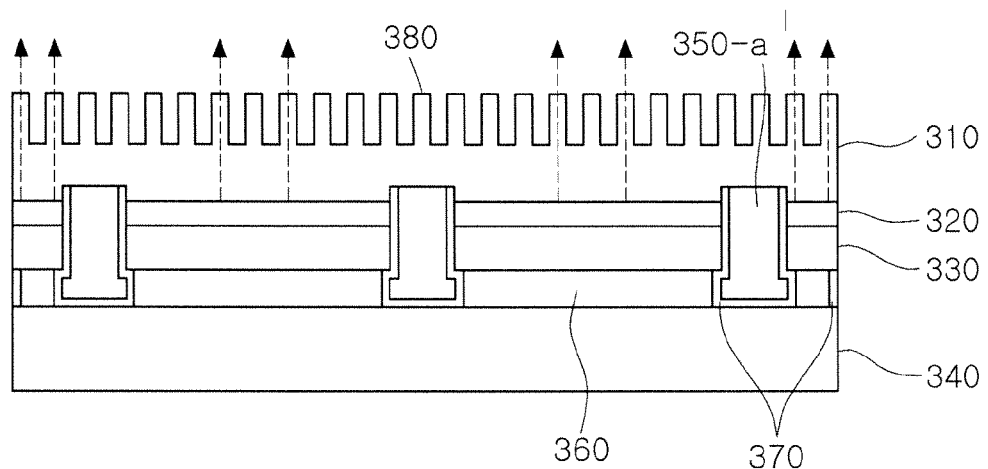
Figure 13:
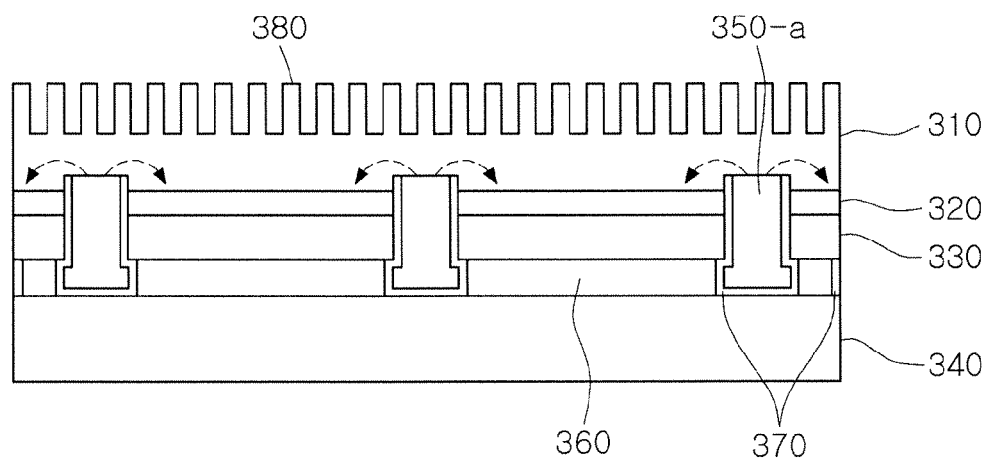

FIGS. 8 and 9 show simulation results when the n-type specific contact resistance is varied. In this simulation, the n-type specific contact resistance is 10$^{-6}$ Ω/cm$^2$, and the p-type specific contact resistance is 10$^{-2}$ Ω/cm$^2$. The n-type specific contact resistance is affected by the doping concentration of the n-type semiconductor layer, the n-type electrode material, the thermal treatment method thereof, and so on. Thus, the n-type specific contact resistance may be reduced to 10$^{-6}$ Ω/cm$^2$ by increasing the doping concentration of the n-type semiconductor layer, or employing a material having a low metal energy barrier, e.g., Al, Ti, Cr, etc., as the n-type electrode material. In other words, the commonly used n-type specific contact resistance may be in the range of approximately 10$^{-4}$-10$^{-6}$ Ω/cm$^2$.

Referring to FIG. 8, when compared with the simulation result of FIG. 4, the sum of the n-type specific contact resistance and the p-type specific contact resistance, i.e., the total contact resistance R4, can be maintained at a very low level even with a small contact area. In addition, when compared with the luminous efficiency of FIG. 5, the luminous efficiency of FIG. 8, according to contact area, can be maintained at a high level, even with a small contact area. In this case, more than 100% of the luminous efficiency represents a relative value with reference to the result of FIG. 5. Referring to the simulation results of FIGS. 8 and 9, the total contact resistance becomes 1.6Ω or less and the luminous efficiency becomes 90% or more when the contact area between the first electrode layer and the first semiconductor layer is in the range of approximately 6,150-156,800 μm$^2$ in the semiconductor light emitting device having a size of 1,000,000 μm$^2$.

When determining the number of contact holes on the basis of the above results, the contents described in the above simulation results may be applied. Specifically, in the case of a circular contact hole having a radius of approximately 1-50 μm, approximately 1-48,000 contact holes are required in order to meet the above-described area condition. Furthermore, when assuming that the contact holes are uniformly disposed, the spacing between the two adjacent contact holes is in the range of approximately 5-500 μm.

Next, semiconductor light emitting devices, according to various embodiments of the present invention, will be described in detail.

A semiconductor light emitting device, according to another embodiment of the present invention, will be described with reference to FIGS. 10 through 14.

A semiconductor light emitting device 300, according to another embodiment of the present invention, includes a conductive substrate 340, a first-conductivity type semiconductor layer 330, an active layer 320, and a second-conductivity type semiconductor layer 310, which are stacked in sequence. In particular, the semiconductor light emitting device 300 according to this embodiment of the present invention includes: a first electrode layer 360 between the conductive substrate 340 and the first-conductivity type semiconductor layer 330; and a second electrode part 350 including an electrode pad portion 350-*b*, an electrode extension portion 350-*a*, and an electrode connection portion 350-*c*.

The electrode pad portion 350-*b* extends from the first electrode layer 360 to the surface of the second-conductivity type semiconductor layer 310, and is electrically separated from the first electrode layer 360, the first-conductivity type semiconductor layer 330, and the active layer 320. The electrode extension portion 350-*a* extends from the first electrode layer 360 to the inside of the second-conductivity type semiconductor layer 310, and is electrically separated from the first electrode layer 360, the first-conductivity type semiconductor layer 330, and the active layer 320. The electrode connection portion 350-*c* is formed on the same layer as the first electrode layer 360, but is electrically separated from the first electrode layer 360. The electrode connection portion 350-*c* connects the electrode pad portion 350-*b* to the electrode extension portion 350-*a*.

The conductive substrate 340 may be a metal substrate, a semiconductor substrate, or a combination thereof. When the conductive substrate 340 is a metal substrate, it may be formed of any one of Au, Ni, Cu, Al, and W. When the conductive substrate 340 is a semiconductor substrate, it may be formed of any one of Si, Ge, and GaAs. Also, the conductive substrate 340 may be formed of a material including Au, Ni, Al, Cu, W, Si, Se, and GaAs, for example, SiAl, which is a combination of Si and Al. The conductive substrate 340 is formed in the semiconductor light emitting device by a plating method, which forms a substrate by forming a plating seed layer, or a substrate bonding method, which separately prepares the conductive substrate 340 and attaches it using a conductive adhesive, e.g., Au, Sn, Ni, Au—Sn, Ni—Sn, Ni—Au—Sn, Pb—Sr, etc.

The semiconductor layers 330 and 310 may be formed of an inorganic semiconductor material, e.g., a GaN-based semiconductor, a SiC-based semiconductor, a ZnO-based semiconductor, a GaAs-based semiconductor, a GaP-based semiconductor, a GaAsP-based semiconductor, etc. The semiconductor layers 330 and 310 may be formed using a metal organic chemical vapor deposition (MOCVD) method, or a molecular beam epitaxy (MBE) method. Furthermore, the semiconductor layers 330 and 310 may be formed of a material selected from the group consisting of a group III-V semiconductor, a group IV-IV semiconductor, a group II-VI semiconductor, a group IV semiconductor, such as Si, and combinations thereof.

The active layer 320 is a layer which activates light emission, and is formed of a material having a smaller energy band gap than those of the first-conductivity type semiconductor layer 330 and the second-conductivity type semiconductor layer 310. For example, when the first-conductivity type semiconductor layer 330 and the second-conductivity type semiconductor layer 310 are formed of a GaN-based compound semiconductor, the active layer 320 may be formed of an InAlGaN-based compound semiconductor having a smaller energy band gap than that of GaN. That is, the active layer 320 may include In$_x$Al$_y$Ga$_{(1-x-y)}$N (where 0≤x≤1, 0≤y≤1, 0≤x+y≤1).

The wavelength of the emitted light may be adjusted by controlling a mole ratio of the constituent materials of the active layer 320. Therefore, the semiconductor light emitting device 300 may emit infrared light, visible light, or ultraviolet light according to characteristics of the active layer 320.

An energy well structure appears in the entire energy band diagram of the semiconductor light emitting device 300 according to the active layer 320, and electrons and holes from the respective semiconductor layers 330 and 310 are confined in the energy well structure, thereby improving light emission.

The first electrode layer 360 is an electrode which electrically connects the first-conductivity type semiconductor layer 330 to an external power source (not shown). The first electrode layer 360 may be formed of a metal. For example, the first electrode layer 360 formed as an n-type electrode may be formed of Ti, Al, Cr, or Au, and the first electrode layer 360 formed as a p-type electrode may be formed of Ni, Pd, Ag, Al, Pt, or Au.

The first electrode layer 360 reflects light generated from the active layer 320. The reflected light is directed to a light emitting plane, thus increasing the luminous efficiency of the semiconductor light emitting device 300. In order to reflect the light generated from the active layer 320, the first electrode layer 360 may be formed of a metal which is whitish in the visible light range. For example, the first electrode layer 360 may be formed of any one of Ag, Al, and Pt. The first electrode layer 360 will be described later in more detail with reference to FIGS. 12A through 12C.

The second electrode part 350 is an electrode which electrically connects the second-conductivity type semiconductor layer 310 to an external power source (not shown). The second electrode part 350 may be formed of a metal. The second electrode part 350 formed as an n-type electrode may be formed of Ti, and the second electrode part 350 formed as a p-type electrode may be formed of Pd or Au. Specifically, the second electrode part 350 according to this embodiment of the present invention includes the electrode pad portion 350-b, the electrode extension portion 350-a and the electrode connection portion 350-c.

Referring to FIG. 11A, the electrode pad portion 350-b is formed on the second-conductivity type semiconductor layer 310, and a plurality of electrode extension portions 350-a indicated by a dotted line are disposed within the second-conductivity type semiconductor layer 310.

FIG. 11B illustrates the sections of the top surface of the second-conductivity type semiconductor layer 310 of FIG. 11A, taken along lines A-A, B-B' and C-C'. The line A-A' is selected to take in the section which includes the electrode extension portion 350-a only, and the line B-B' is selected to take in the section which includes the electrode pad portion 350-b and the electrode extension portion 350-a. The line C-C' is selected to take in the section which does not include the electrode extension portion 350-a and the electrode pad portion 350-b.

FIGS. 12A through 12C are cross-sectional views of the semiconductor light emitting device of FIG. 11B, taken along the lines A-A', B-B' and C-C', respectively. The semiconductor light emitting device will be described below with reference to FIGS. 10, 11A, 11B and 12A through 12C.

Referring to FIG. 12A, the electrode extension portion 350-a extends from the first electrode layer 360 to the inside of the second-conductivity type semiconductor layer 310. The electrode extension portion 350-a passes through the first-conductivity type semiconductor layer 330 and the active layer 320 and extends to the second-conductivity type semiconductor layer 310. The electrode extension portion 350-a extends to a portion of at least the second-conductivity type semiconductor layer 310, but need not extend to the surface of the second-conductivity type semiconductor layer 310, as opposed to the electrode pad portion 350-b. This is because the electrode extension portion 350-a is formed for dispersing the current to the second-conductivity type semiconductor layer 310.

The electrode extension portion 350-a must have a predetermined area because it is formed for dispersing the current to the second-conductivity type semiconductor layer 310. However, unlike the electrode pad portion 350-b, the electrode extension portion 350-a is not used for electrical connection, and thus, a predetermined number of the electrode extension portions 350-a may be formed in such a small area that current may be uniformly dispersed on the second-conductivity type semiconductor layer 310. If a very small number of the electrode extension portions 350-a are formed, current dispersion is difficult and the electrical characteristics are degraded. If a very large number of the electrode extension portions 350-a are formed, the fabrication process is difficult and the active layer is reduced, causing a reduction in the light emitting area. Thus, the number of the electrode extension portions 350-a may be appropriately selected, taking into consideration those conditions. Therefore, the electrode extension portions 350-a are implemented in a shape which occupies an area as small as possible and is effective in the current dispersion.

The electrode extension portions 350-a may be provided in plurality in order to facilitate current dispersion. In addition, the electrode extension portion 350-a may have a cylindrical shape and may have a smaller area than the electrode pad portion 350-b. The electrode extension portion 350-a may be formed to be spaced apart from the electrode pad portion 350-b by a predetermined distance. Since the electrode extension portion 350-a may be connected to the electrode pad portion 350-b on the first electrode layer 360 by the electrode connection portion 350-c, which will be described later, uniform current dispersion is obtained by spacing the electrode extension portion 350-a apart from the electrode pad portion 350-b by a predetermined distance.

The electrode extension portion 350-a is formed from the first electrode layer 360 to the inside of the second-conductivity type semiconductor layer 310. Since the electrode extension portion 350-a is formed for the current dispersion of the second-conductivity type semiconductor layer 310, the electrode extension portion 350-a needs to be electrically separated from the other layers. Hence, the electrode extension portion 350-a is electrically separated from the first electrode layer 360, the first-conductivity type semiconductor layer 330, and the active layer 320. The electrical separation may be performed using an insulating material such as a dielectric.

Referring to FIG. 12B, the electrode pad portion 350-b extends from the first electrode layer 360 to the surface of the second-conductivity type semiconductor layer 310. The electrode pad portion 350-b extends from the first electrode layer 360 to the surface of the second-conductivity type semiconductor layer 310, while passing through the first-conductivity type semiconductor layer 330, the active layer 320, and the second-conductivity type semiconductor layer 310. In particular, the electrode pad portion 350-b is formed for electrical connection between the second electrode part 350 and an external power source (not shown). Therefore, the second electrode part 350 may include at least one electrode pad portion 350-b.

The electrode pad portion 350-b extends from the first electrode layer 360 to the surface of the second-conductivity type semiconductor layer 310. The electrode pad portion 350-*b* is electrically connected to the external power source on the second-conductivity type semiconductor layer 310 and supplies a current to the electrode extension portion 350-*a*. Thus, the electrode pad portion 350-*b* may be electrically separated from the first electrode layer 360, the first-conductivity type semiconductor layer 330, and the active layer 320. The electrical separation may be performed by forming an insulation layer using an insulating material such as a dielectric.

The electrode pad portion 350-*b* may supply a current to the electrode extension portion 350-*a*, and may directly disperse a current because it is not electrically separated from the second-conductivity type semiconductor layer 310. The electrode pad portion 350-*b* may be appropriately electrically separated from the second-conductivity type semiconductor layer 310, taking into consideration the required one of the two functions, that is, the function of supplying a current to the electrode extension portion 350-*a* and the function of dispersing a current to the second-conductivity type semiconductor layer 310.

Specifically, in the electrode pad portion 350-*b*, the section on the active layer 320 may have a smaller area than the section on the surface of the second-conductivity type semiconductor layer 310 in order to maximize the active layer 320 and increase the luminous efficiency of the semiconductor light emitting device 300. However, the section on the second-conductivity type semiconductor layer 310 needs to have a predetermined area in order for connection to the external power source (not shown).

The electrode pad portions 350-*b* may be disposed at the center of the semiconductor light emitting device 300. In this case, the electrode extension portions 350-*a* may be uniformly dispersed and spaced apart from the electrode pad portion 350-*b* by a predetermined distance. Referring to FIG. 11A, the electrode pad portion 350-*b* and the electrode extension portion 350-*a* are uniformly dispersed on the second-conductivity type semiconductor layer 310, thereby optimizing current dispersion. In FIG. 11A, it is assumed that the number of the electrode pad portions 350-*b* is 1 and the number of the electrode extension portions 350-*a* is 12. However, the number of the electrode pad portions 350-*b* and the number of the electrode extension portions 350-*a* may be appropriately selected, taking into consideration the current dispersion conditions, such as the electrical connection state (e.g., the position of the external power source), the thickness of the second-conductivity type semiconductor layer 310, and so on.

When a plurality of electrode extension portions 350-*a* are provided, the electrode pad portion 350-*b* and the plurality of electrode extension portions 350-*a* may be directly connected together. In this case, the electrode pad portion 350-*b* may be formed at the center of the semiconductor light emitting device 300, and the electrode extension portions 350-*a* may be disposed surrounding the electrode pad portion 350-*b*. The electrode connection portion 350-*c* may directly connect the electrode pad portion 350-*b* to the electrode extension portions 350-*a* in a radial form.

Alternatively, some of the electrode extension portions 350-*a* may be directly connected to the electrode pad portion 350-*b*, and the remaining electrode extension portions 350-*a* may be indirectly connected to the electrode pad portion 350-*b* in a manner such that they are connected to the electrode extension portions 350-*a* directly connected to the electrode pad portion 350-*b*. In this case, the efficiency of the current dispersion is improved because a larger number of the electrode extension portions 350-*a* can be formed.

Referring to FIGS. 12A through 12C, the electrode connection portion 350-*c* is formed on the first electrode layer 360 to connect the electrode pad portion 350-*b* to the electrode extension portions 350-*a*. Therefore, a considerable portion of the second electrode part 350 is disposed at the rear source of the active layer 320, that is, a surface opposite to the direction in which light is traveling, thereby increasing the luminous efficiency of the semiconductor light emitting device. Specifically, in FIG. 12C, the electrode connection portion 350-*c* only is disposed on the first electrode layer 360, and the second electrode part 350 is not disposed on the first-conductivity type semiconductor layer 330, the active layer 320, and the second-conductivity type semiconductor layer 310. Hence, in the case of FIG. 12C, the electrode pad portion 350-*b* and the electrode extension portions 350-*a* do not influence light emission and thus become an area which increases luminous efficiency. Although not illustrated in FIG. 12C, the first electrode layer 360 may come into contact with the conductive substrate 340 and be connected to the external power source (not shown).

The electrode connection portion 350-*c* is electrically separated from the first electrode layer 360. The first electrode layer 360 and the second electrode part 350 have opposite polarity. Since the first electrode layer 360 and the second electrode part 350 supply the external power to the first-conductivity type semiconductor layer 330 and the second-conductivity type semiconductor layer 310, the electrodes must be electrically separated from each other. The electrical separation may be performed using an insulating material such as a dielectric.

In FIG. 12B, since the electrode pad portion 350-*b* is disposed on the surface of the second-conductivity type semiconductor layer 310, a characteristic of a vertical type semiconductor light emitting device may be exhibited. In FIG. 12C, since the electrode connection portion 350-*c* is disposed on the same plane as the first electrode layer, a characteristic of a horizontal type semiconductor light emitting device may be exhibited. Therefore, the semiconductor light emitting device has a hybrid type structure having both the horizontal type and the vertical type.

In FIGS. 12A through 12C, the second-conductivity type semiconductor layer 310 may be an n-type semiconductor layer, and the second electrode part may be an n-type electrode part. In this case, the first-conductivity type semiconductor layer 330 may be a p-type semiconductor layer, and the first electrode layer 360 may be a p-type electrode. The electrode pad portion 350-*b*, the electrode extension portion 350-*a*, and the electrode connection portion 350-*c* are connected together to form the second electrode part 350. When the second electrode part 350 is an n-type electrode, the second electrode part 350 may be electrically separated from the first electrode layer 360, which is the p-type electrode, by forming the insulation layer 370 using an insulating material.

FIG. 13A illustrates the light emission of a semiconductor light emitting device having an uneven pattern 380 on the surface thereof according to a modified embodiment of the present invention, and FIG. 13B illustrates the current dispersion of a semiconductor light emitting device having an uneven pattern 380 on the surface thereof according to another modified embodiment of the present invention.

In the semiconductor light emitting device 300 according to this embodiment of the present invention, the outermost surface in the light traveling direction is formed of the second-conductivity type semiconductor layer 310. Therefore, the uneven pattern 380 on the surface of the semiconductor light emitting device may be formed using a known method such as lithography. In this case, the light emitted from the active layer 320 is extracted while passing through the uneven pattern 380 formed on the surface of the second-conductivity type semiconductor layer 310. Thus, light extraction efficiency is increased by the uneven pattern 380.

The uneven pattern 380 may have a photonic crystal structure. A photonic crystal structure is a structure in which media having different refractive indexes are arranged regularly in a crystal-like manner. The photonic crystal structure may further increase light extraction efficiency because it can adjust light on the basis of a length unit corresponding to the multiple of the wavelength of light. The photonic crystal structure may be manufactured by forming the second-conductivity type semiconductor layer 310 and the second electrode part 350 and performing a predetermined process. For example, the photonic crystal structure may be formed by an etching process.

Even though the uneven pattern 380 is formed on the second-conductivity type semiconductor layer 310, there is no influence on the current dispersion. Referring to FIG. 13B, the current dispersion in the electrode extension portion 350-$a$ is not affected by the uneven pattern 380. The respective electrode extension portions 350-$a$ disperse the current at a position under the uneven pattern 380, and the uneven pattern 380 extracts the emitted light, thereby increasing luminous efficiency.

Figure 14:
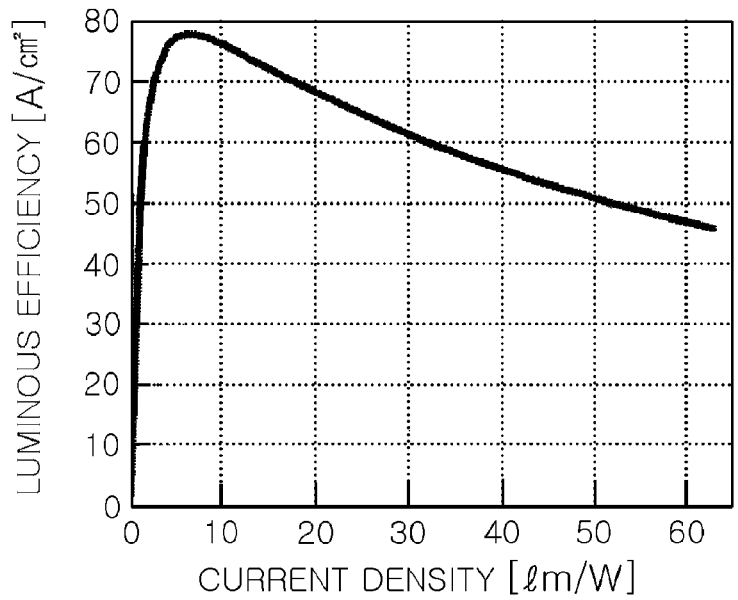

FIG. 14 is a graph showing the relationship between the current density of the light emitting plane and the luminous efficiency. Referring to FIG. 14, in a case in which the current density is approximately 10 A/cm$^2$ or more, the luminous efficiency is high when the current density is low, and the luminous efficiency is low when the current density is high.

Those values are listed in Table 1 below.

TABLE 1

| Light emitting area (cm$^2$) | Current density (A/cm$^2$) | Luminous efficiency (lm/W) | Improvement rate (%) |
| --- | --- | --- | --- |
| 0.0056 | 62.5 | 46.9 | 100 |
| 0.0070 | 50.0 | 51.5 | 110 |
| 0.0075 | 46.7 | 52.9 | 113 |
| 0.0080 | 43.8 | 54.1 | 115 |

As the light emitting area increases, the luminous efficiency increases. However, since the area of the distributed electrodes must be reduced in order to ensure the light emitting area, the current density of the light emitting plane tends to be reduced. The reduction of current density in the light emitting plane may degrade the electrical characteristics of the semiconductor light emitting device.

However, such a problem may be solved by ensuring current dispersion using the electrode extension portion. Therefore, the problem of electrical characteristics, which may be caused by reduced current density, can be solved by forming the electrode extension portion which manages the current dispersion. At this time, the electrode extension portion is formed inside, instead of forming the light emitting surface. Therefore, the semiconductor light emitting device according to this embodiment of the present invention can obtain the desired current dispersion degree and the maximum light emitting area, thereby acquiring the desired luminous efficiency.

FIGS. 15 through 18 illustrate a semiconductor light emitting device according to another embodiment of the present invention.

Figure 15:
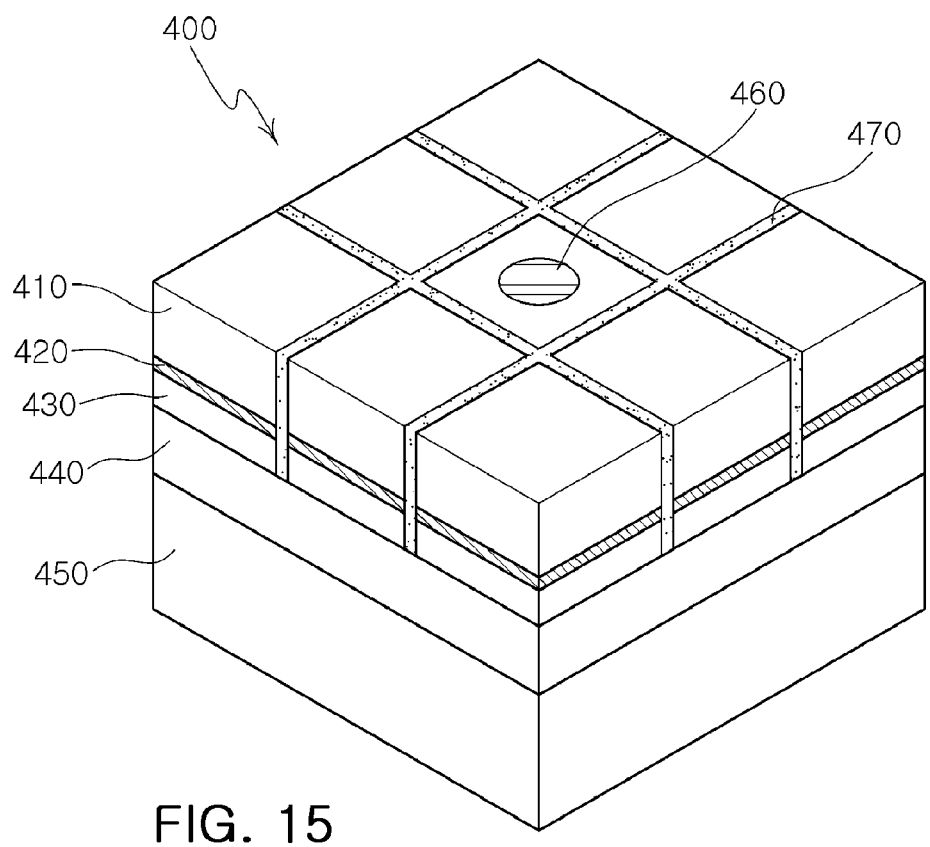
FIGS. 15 through 18 illustrate a semiconductor light emitting device according to another embodiment of the present invention.
Figure 16:
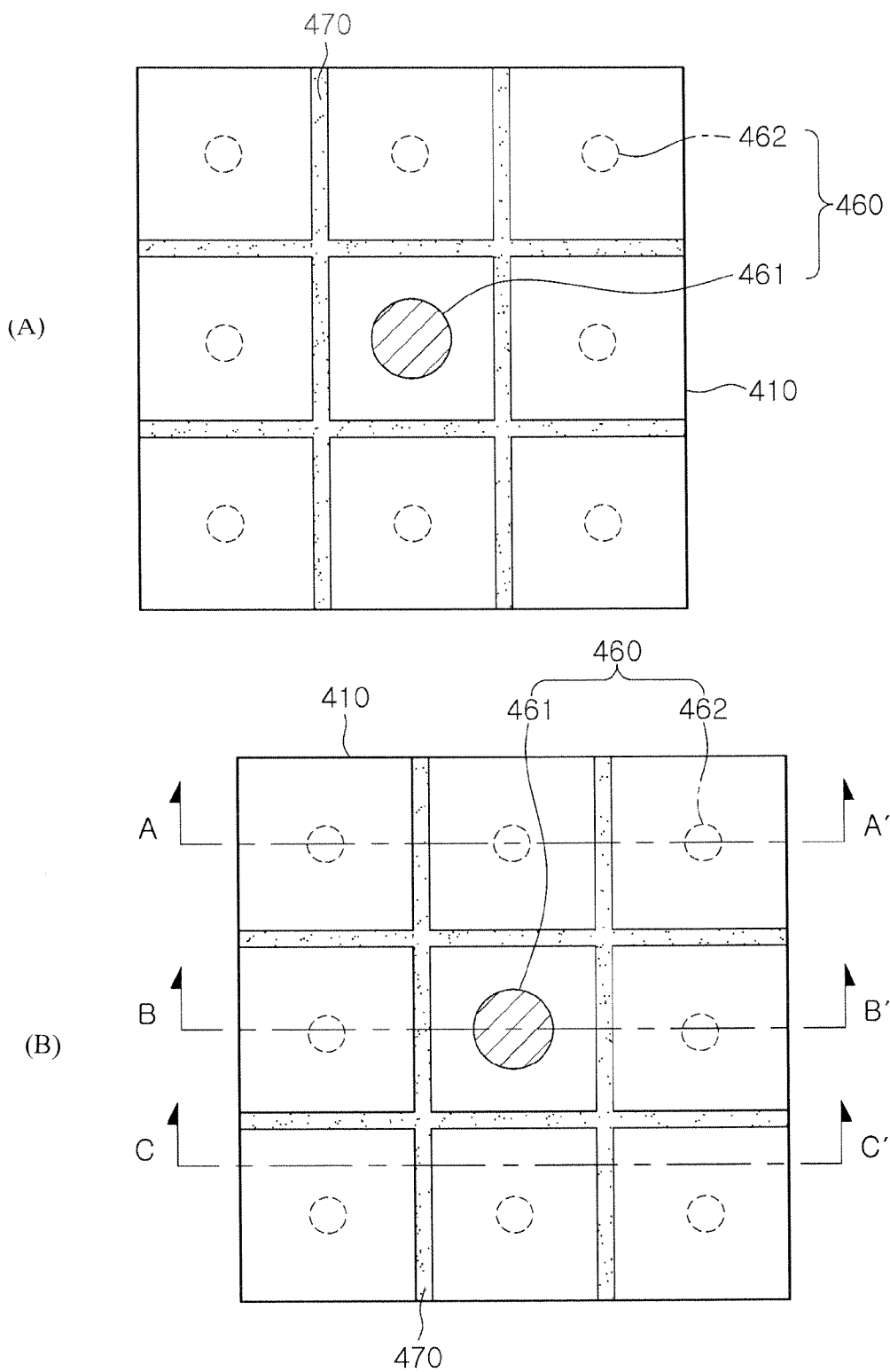
Figure 17:
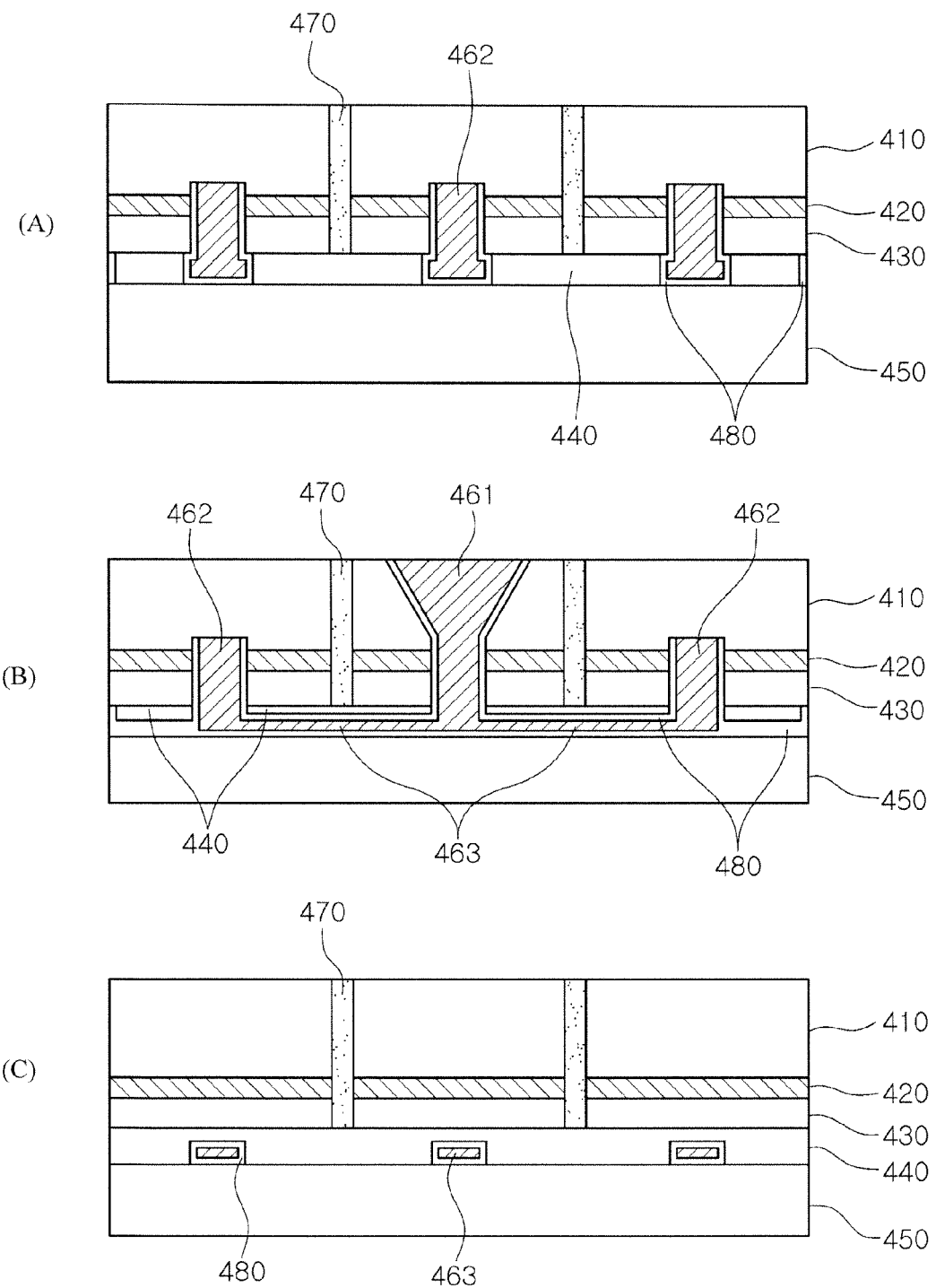

FIG. 15 is a cross-sectional view of a semiconductor light emitting device according to another embodiment of the present invention, FIGS. 16A and 16B are top views of the semiconductor light emitting device illustrated in FIG. 15, and FIGS. 17A through 17C are cross-sectional views of the semiconductor light emitting device illustrated in FIG. 16B, taken along lines A-A', B-B' and C-C', respectively.

The semiconductor light emitting device 400 according to another embodiment of the present invention includes: a light emitting stack structure 430, 420 and 410 provided with a first-conductivity type semiconductor layer 430, a second-conductivity type semiconductor layer 410, and an active layer 420 formed between the first-conductivity type semiconductor layer 430 and the second-conductivity type semiconductor layer 410, wherein the first-conductivity type semiconductor layer 430 and the second-conductivity type semiconductor layer 410 are provided as a first plane and a second plane of the light emitting stack structure 430, 420 and 410, which face each other; at least one electrically insulating barrier rib part 470 extending from the second plane of the light emitting stack structure 430, 420 and 410 to a portion of at least the second-conductivity type semiconductor layer 410 so that the light emitting stack structure 430, 420 and 410 is separated into a plurality of light emitting regions; a second electrode structure 460 formed to be connected to the second-conductivity type semiconductor layer 410 disposed in the plurality of light emitting regions; a first electrode structure 440 formed on the second plane of the light emitting stack structure 430, 420 and 410 so that the first electrode structure 440 is connected to the first-conductivity type semiconductor layer 430; and a conductive substrate 450 formed on the second plane of the light emitting stack structure 430, 420 and 410 so that the conductive substrate 450 is electrically connected to the first electrode structure 440.

The light emitting stack structure 430, 420 and 410 includes the first-conductivity type semiconductor layer 430, the second-conductivity type semiconductor layer 410, and the active layer 420 formed between the first-conductivity type semiconductor layer 430 and the second-conductivity type semiconductor layer 410. The outer surface of the second-conductivity type semiconductor layer 410 is provided as the first plane of the light emitting stack structure 430, 420 and 410, and the outer surface of the first-conductivity type semiconductor layer 410 is provided as the second plane of the light emitting stack structure 430, 420 and 410.

For example, the semiconductor layers 430 and 410 may be formed of semiconductors, such as GaN-based semiconductors, SiC-based semiconductors, ZnO-based semiconductors, GaAs-based semiconductors, GaP-based semiconductors, or GaAsP-based semiconductors. The formation of the semiconductor layers 430 and 410 may be performed using a metal organic chemical vapor deposition (MOCVD) process or a molecular beam epitaxy (MBE) process. Alternatively, the semiconductor layers 430 and 410 may be formed of a material selected from the group consisting of group III-V semiconductors, group IV-IV semiconductors, group II-VI semiconductors, group IV semiconductors such as Si, and combinations thereof. The light emitting stack structure may be grown on a SiC substrate (not shown), an Si substrate (not shown), or a GaAs substrate (not shown). The substrate (not shown) is removed before a subsequent bonding of the conductive substrate.

The active layer 420 is a layer which activates light emission. The active layer 420 is formed of a material having a smaller energy band gap than the second-conductivity type semiconductor layer 410 and the first-conductivity type semiconductor layer 430. For example, when the second-conductivity type semiconductor layer 410 and the first-conductivity type semiconductor layer 430 are formed of GaN-based semiconductors, the active layer 420 may be formed of InAlGaN-based semiconductors having a smaller energy band gap than the GaN-based semiconductors. That is, the active layer 420 may include $In_xAl_yGa_{(1-x-y)}N$ (where $0 \le x \le 1$, $0 \le y \le 1$ and $0 \le x+y \le 1$).

The wavelength of the emitted light may be adjusted by controlling a mole ratio of the constituent materials of the active layer 420. Therefore, the semiconductor light emitting device 400 may emit infrared light, visible light, or ultraviolet light according to the characteristics of the active layer 420.

An energy well structure appears in the entire energy band diagram of the semiconductor light emitting device 400 according to the active layer 420, and electrons and holes from the respective semiconductor layers 430 and 410 are confined in the energy well structure, thereby improving light emission.

The barrier rib part 470 extends from the second plane of the light emitting stack structure 430, 420 and 410 to a portion of at least the second-conductivity type semiconductor layer 410 so that the light emitting stack structure 430, 420 and 410 is separated into a plurality of light emitting regions. The barrier rib part 470 separates the second-conductivity type semiconductor layer 410 into a plurality of light emitting regions and reduces stress caused by heat energy applied to the interface when a separating tool such as a laser is applied between the second-conductivity type semiconductor layer 410 and a growth substrate (not shown) formed on the second-conductivity type semiconductor layer 410.

For example, when the laser is used for separating the second-conductivity type semiconductor layer 410 from the growth substrate (not shown), the temperature at the interface is approximately 1,000° C. Therefore, the second-conductivity type semiconductor layer 410 is separated from the growth substrate (not shown), but the heat causes a stress which induces contraction and expansion in the semiconductor layers and the conductive substrate 450 to be subsequently attached thereto. Generally, since the magnitude of the stress is proportional to the area, such stress may adversely affect the large-sized semiconductor light emitting device.

However, since the semiconductor light emitting device 400 according to this embodiment of the present invention includes the barrier rib part 470, the area of the second-conductivity type semiconductor layer 410 is reduced to the area of the plurality of light emitting regions, thereby reducing stress. That is, since expansion and contraction easily occur in the plurality of light emitting regions, the light emission of the light emitting stack structure 430, 420 and 410 is stabilized.

The barrier rib part 470 electrically insulates the semiconductor layers 430 and 410 and the active layer 420. To this end, the barrier rib part 470 may be filled with air. Alternatively, an insulation layer may be formed inside the barrier rib part 470, and the inside of the insulation layer may be filled with air. Furthermore, the electrical insulation may be achieved by filling the entire inside of the barrier rib part 470 with an insulating material such as a dielectric.

In order to electrically insulate the light emitting stack structure 430, 420 and 410, the barrier rib part 470 may extend from the second plane to the top surface of the second-conductivity type semiconductor layer 410. However, the barrier rib part 470 does not necessarily extend to the top surface of the second-conductivity type semiconductor layer 410. For example, the barrier rib part 470 may extend to the inside of the second-conductivity type semiconductor layer 410.

Moreover, the barrier rib part 470 may be formed in a single structure, or may include a plurality of barrier ribs separated from one another. In this case, the plurality of barrier ribs may be differently formed to give necessary electrical characteristics. For example, the barrier rib part surrounding a bonding part 461 and the barrier rib part surrounding a contact hole 462 may be different in height or shape.

The second electrode structure 460 is formed to be connected to the second-conductivity type semiconductor layer 410 disposed in the plurality of light emitting regions separated by the barrier rib part 470. The second electrode structure 460 includes a contact hole 462, a bonding part 461, and an interconnection part 463.

The contact hole 462 may be provided in plurality. A single contact hole 462 may be provided in a single light emitting region, or a plurality of contact holes 462 may be provided in a single light emitting region. The contact hole 462 is formed to be electrically connected to the second-conductivity type semiconductor layer 410 and electrically insulated from the first-conductivity type semiconductor layer 430 and the active layer 420. To this end, the contact hole 462 extends from the second plane of the light emitting stack structure 430, 420 and 410 to at least a portion of the second-conductivity type semiconductor layer 410. The contact hole 462 is formed to disperse the current on the second-conductivity type semiconductor layer 410.

The bonding part 461 is formed to be connected from the first plane of the light emitting stack structure 430, 420 and 410 to at least one of the plurality of contact holes 462, and the region exposed in the first plane is provided as the bonding region.

The interconnection part 463 is provided in the second plane of the light emitting stack structure 430, 420 and 410 and electrically insulated from at least the first-conductivity type semiconductor layer 430, so that the contact hole 462 connected to the bonding part 461 is electrically connected to the other contact hole 462. The interconnection part 463 may electrically connect the contact hole 462 to the other contact hole 462 and electrically connect the contact hole 462 to the bonding part 461. The luminous efficiency may be improved by disposing the interconnection part 463 under the second-conductivity type semiconductor layer 410 and the active layer 420.

Hereinafter, the contact hole 462, the bonding part 461, and the interconnection part 463 will be described in more detail with reference to FIGS. 16C through 17C.

The first electrode structure 440 is formed on the second plane of the light emitting stack structure 430, 420 and 410 so that the first electrode structure 440 is electrically connected to the first-conductivity type semiconductor layer 430. That is, the first electrode structure 440 is an electrode which electrically connects the first-conductivity type semiconductor layer 430 to an external power source (not shown). The first electrode structure 440 may be formed of a metal. For example, the first electrode structure 440 as an n-type electrode may be formed of Ti, Al, Cr, or Au, and the first electrode structure 440 as a p-type electrode may be formed of Ni, Pd, Ag, Al, Pt, or Au.

The first electrode structure 440 reflects light emitted from the active layer 420. Since the first electrode structure 440 is disposed under the active layer 420, it is disposed on a plane opposite to the light emitting direction of the semiconductor light emitting device with respect to the active layer 420. Therefore, light traveling from the active layer 420 to the first electrode structure 440 travels in a direction opposite to the light emitting direction. Thus, in order to increase the luminous efficiency, such light must be reflected. Consequently, the light reflected from the first electrode structure 440 is directed to the light emitting plane, thereby increasing the luminous efficiency of the semiconductor light emitting device.

In order to reflect the light emitted from the active layer 420, the first electrode structure 440 may be formed of a metal which is whitish in a visible light range. For example, the first electrode structure 440 may be formed of any one of Ag, Al, and Pt. The first electrode structure 440 will be described later in more detail with reference to FIGS. 17A through 17C.

The conductive substrate 450 is formed on the second plane of the light emitting stack structure 430, 420 and 410 so that the conductive substrate 450 is electrically connected to the first electrode structure 440. The conductive substrate 450 may be a metal substrate or a semiconductor substrate. When the conductive substrate 450 is a metal substrate, it may be formed of any one of Au, Ni, Cu, and W. When the conductive substrate 450 is a semiconductor substrate, it may be formed of any one of Si, Ge, and GaAs. Also, the conductive substrate 450 may be formed of a material including Au, Ni, Al, Cu, W, Si, Se, and GaAs, for example, SiAl, which is a combination of Si and Al. The conductive substrate 450 is formed in the semiconductor light emitting device by a plating method, which forms a substrate by forming a plating seed layer, or a substrate bonding method, which separately prepares the conductive substrate 450 and attaches it by using a conductive adhesive, e.g., Au, Sn, Ni, Au—Sn, Ni—Sn, Ni—Au—Sn, Pb—Sr, etc.

Referring to FIG. 16A, the bonding part 461 is formed on the second-conductivity type semiconductor layer 410, and the plurality of contact holes 462 indicated by dotted lines are disposed inside the second-conductivity type semiconductor layer 410. The second-conductivity type semiconductor layer 410 includes a plurality of light emitting regions separated by the barrier rib part 470. Although one bonding part 461 is illustrated in FIGS. 16A and 16B, a plurality of bonding parts 461 may be formed in the same light emitting region, or a plurality of bonding parts 461 may be formed in a plurality of light emitting regions. Also, although one contact hole 462 is formed in each light emitting region, the current dispersion may be further improved by forming a plurality of contact holes 462 in a single light emitting region.

FIG. 16B illustrates the sections of the top surface of the second-conductivity type semiconductor layer 410 of FIG. 16A, taken along lines A-A', B-B' and C-C'. The line A-A' is selected to take in the section which includes the contact hole 462 only, and the line B-B' is selected to take in the section which includes the bonding part 461 and the contact hole 462. The line C-C' is selected to take in the section which does not include the contact hole 462 and the bonding part 461, but includes the interconnection part 463 only.

FIGS. 17A through 17C are cross-sectional views of the semiconductor light emitting device of FIG. 16B, taken along the lines A-A', B-B' and C-C', respectively. The semiconductor light emitting device will be described below with reference to FIGS. 15, 16A, 16B and 17A through 17C.

Referring to FIG. 17A, the contact hole 462 extends from the first electrode structure 440 to the inside of the second-conductivity type semiconductor layer 410. The contact hole 462 passes through the first-conductivity type semiconductor layer 430 and the active layer 420 and extends to the second-conductivity type semiconductor layer 410. The contact hole 462 extends up to a portion of at least the second-conductivity type semiconductor layer 410, but need not extend to the surface of the second-conductivity type semiconductor layer 410, as opposed to the bonding part 461. However, the contact hole 462 must extend to the second-conductivity type semiconductor layer 410 because the contact hole 462 is formed for dispersing the current to the second-conductivity type semiconductor layer 410.

The contact hole 462 must have a predetermined area because it is formed for dispersing the current to the second-conductivity type semiconductor layer 410. However, unlike the bonding part 461, the contact hole 462 is not used for electrical connection, and thus, a predetermined number of contact holes 462 may be formed in such a small area that the current may be uniformly dispersed on the second-conductivity type semiconductor layer 410. If a very small number of contact holes 462 are formed, current dispersion is difficult and the electrical characteristics are degraded. If a very large number of the contact holes 462 are formed, the fabrication process is difficult and the active layer is reduced, causing a reduction in the light emitting area. Thus, the number of contact holes 462 may be appropriately selected, taking into consideration those conditions. Therefore, the contact holes 462 are implemented in a shape which occupies an area as small as possible and is effective in the current dispersion.

The contact hole 462 may be provided in plurality in order for the current dispersion. In addition, the contact hole 462 may have a cylindrical shape and may have a smaller sectional area than the bonding part 461. The contact hole 462 may be formed to be spaced apart from the bonding part 461 by a predetermined distance. Since the contact hole 462 may be connected to the bonding part 461 on the first electrode structure 440 by the interconnection part 463, which will be described later, uniform current dispersion must be induced within the second-conductivity type semiconductor layer 410 by spacing the contact hole 462 apart from the bonding part 461 by a predetermined distance.

The contact hole 462 is formed from the first electrode structure 440 to the inside of the second-conductivity type semiconductor layer 410. Since the contact hole 462 is formed for the current dispersion of the second-conductivity type semiconductor layer 410, the contact hole 462 needs to be electrically separated from the first-conductivity type semiconductor layer 430 and the active layer 420. Hence, the contact hole 462 is electrically separated from the first electrode structure 440, the first-conductivity type semiconductor layer 430, and the active layer 220. The electrical separation may be performed using an insulating material such as a dielectric.

Referring to FIG. 17B, the bonding part 461 extends from the first electrode structure 440 to the surface of the second-conductivity type semiconductor layer 410, while passing through the first-conductivity type semiconductor layer 430, the active layer 420, and the second-conductivity type semiconductor layer 410. The bonding part 461 is formed to be connected from the first plane of the light emitting stack structure 430, 420 and 410 to at least one of the contact holes 462. The region exposed to the first plane is provided as the bonding region.

In particular, the bonding part 461 is formed for electrical connection between the second electrode structure 460 and the external power source (not shown). Therefore, the second electrode structure 460 may include at least one bonding part 461.

The bonding part 461 is electrically connected to the external power source on the surface of the second-conductivity type semiconductor layer 410 and supplies a current to the contact hole 462. Thus, the bonding part 461 may be electrically separated from the first electrode 440, the second-conductivity type semiconductor layer 410, and the active layer 420. The electrical separation may be performed by forming an insulation layer using an insulating material such as a dielectric.

The bonding part 461 functions to supply a current to the contact hole 462, and may directly disperse a current because it is not electrically separated from the second-conductivity type semiconductor layer 410. The bonding part 461 may be appropriately electrically separated from the second-conductivity type semiconductor layer 410, taking into consideration the required function, that is, either the function of supplying a current to the contact hole 462 or the function of dispersing a current to the second-conductivity type semiconductor layer 410.

Specifically, in the bonding part 461, the section on the active layer 420 may have a smaller area than the section on the surface of the second-conductivity type semiconductor layer 410 in order to maximize the active layer 420 and increase the luminous efficiency of the semiconductor light emitting device 400. However, the section on the second-conductivity type semiconductor layer 410 needs to have a predetermined area in order for connection to the external power source (not shown).

The bonding part 461 may be disposed at the center of the semiconductor light emitting device 400. In this case, the contact hole 462 may be uniformly dispersed and spaced apart from the bonding part 461 by a predetermined distance. Referring again to FIG. 16A, the bonding part 461 and the contact hole 462 are uniformly dispersed on the second-conductivity type semiconductor layer 410, thereby optimizing the current dispersion. In FIG. 16A, it is assumed that the number of the bonding parts 461 is 1 and the number of the contact holes 462 is 8. However, the number of the bonding parts 461 and the number of the contact holes 462 may be appropriately selected, taking into consideration the current dispersion conditions, such as the electrical connection state (e.g., the position of the external power source), the thickness of the second-conductivity type semiconductor layer 410, and so on.

When a plurality of contact holes 462 are provided, the bonding part 461 and the plurality of contact holes 462 may be directly connected together. In this case, the bonding part 462 may be formed at the center of the semiconductor light emitting device 400, and the contact holes 462 may be disposed surrounding the bonding part 461. The interconnection part 463 may directly connect the bonding part 461 to the contact holes 462 in a radial form.

Alternatively, some of the contact holes 462 may be directly connected to the bonding part 461, and the remaining contact holes 462 may be indirectly connected to the bonding part 461 in a manner such that they are connected to the contact holes 462 directly connected to the bonding part 461. In this case, the efficiency of the current dispersion is improved because a larger number of the contact holes 462 can be formed.

Referring to FIGS. 17A through 17C, the interconnection part 463 is formed on the first electrode structure 440 to connect the bonding part 461 to the contact hole 462. Therefore, a considerable portion of the first electrode structure 440 is disposed at the rear source of the active layer 420, that is, a surface opposite to the traveling direction of the light, thereby increasing the luminous efficiency of the semiconductor light emitting device 400. Specifically, in FIG. 17C, the interconnection part 463 is only disposed on the first electrode structure 440, and the second electrode structure 460 is not disposed on the first-conductivity type semiconductor layer 430, the active layer 420, and the second-conductivity type semiconductor layer 410. Hence, in the case of FIG. 17C, the bonding part 461 and the contact holes 462 do not influence the light emission and thus become an area which increases luminous efficiency.

The interconnection part 463 is electrically separated from the first electrode structure 440. The second electrode structure 460 and the first electrode structure 440 have opposite polarity. Since the second electrode structure 460 and the first electrode structure 440 supply the external power to the second-conductivity type semiconductor layer 410 and the first-conductivity type semiconductor layer 430, the two electrodes must be electrically separated from each other. The electrical separation may be performed by forming the insulation layer 480 using an insulating material such as a dielectric.

In FIG. 17B, since the bonding part 461 is disposed on the surface of the second-conductivity type semiconductor layer 410, it may have the characteristics of a vertical type semiconductor light emitting device. In FIG. 17C, since the interconnection part 463 is disposed on the same plane as the first electrode structure 440, it may have the characteristics of a horizontal type semiconductor light emitting device. Therefore, the semiconductor light emitting device 400 has a hybrid type structure having the characteristics of both the horizontal type and the vertical type semiconductor light emitting devices.

In FIGS. 17A through 17C, the first-conductivity type semiconductor layer 430 may be a p-type semiconductor layer, and the first electrode structure 440 may be a p-type electrode part. In this case, the second-conductivity type semiconductor layer 410 may be an n-type semiconductor layer, and the second electrode structure 460 may be an n-type electrode. The bonding part 461, the contact hole 462, and the interconnection part 463 are connected together to form the second electrode structure 460. When the second electrode structure 460 is an n-type electrode, the second electrode structure 460 may be electrically separated from the first electrode structure 440, which is the p-type electrode, by forming the insulation layer 480 using an insulating material.

Figure 18:
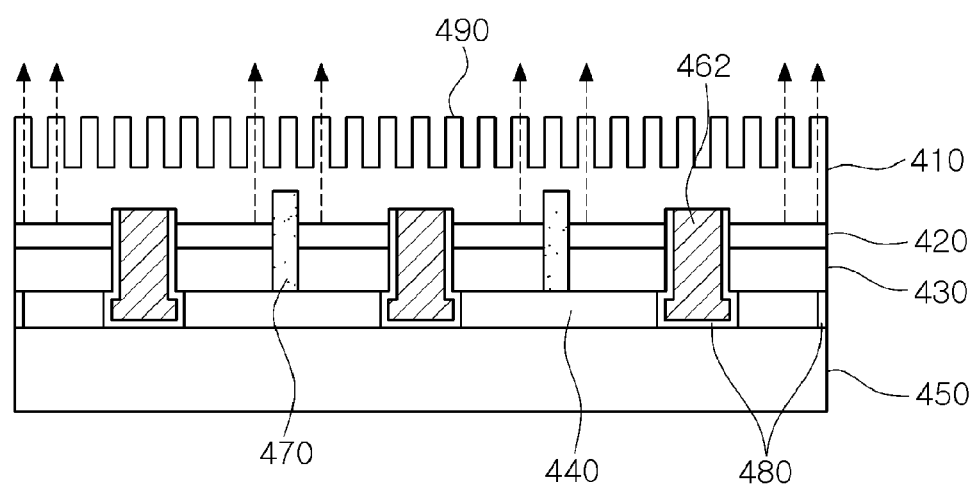

FIG. 18 illustrates the light emission of a semiconductor light emitting device having an uneven pattern on the surface thereof according to an embodiment of the present invention. In the semiconductor light emitting device according to this embodiment of the present invention, the outermost surface in the light traveling direction is formed of the second-conductivity type semiconductor layer 410. Therefore, the uneven pattern 490 on the surface of the semiconductor light emitting device may be formed using a known method such as lithography. In this case, the light emitted from the active layer 420 is extracted while passing through the uneven pattern 490 formed on the surface of the second-conductivity type semiconductor layer 410. Thus, the light extraction efficiency is increased by the uneven pattern 490.

The uneven pattern 490 may have a photonic crystal structure. A photonic crystal structure refers to a structure in which media having different refractive indexes are arranged regularly in a crystal-like manner. The photonic crystal structure may further increase the light extraction efficiency because it can adjust light on the basis of length unit corresponding to the multiple of the wavelength of light. The photonic crystal structure may be manufactured by forming the second-conductivity type semiconductor layer 410 and the first electrode structure 460 and performing a predetermined process. For example, the photonic crystal structure may be formed by an etching process.

When the uneven pattern 490 is formed on the second-conductivity type semiconductor layer 410, the barrier rib part 470 may be formed up to the inside of the second-conductivity type semiconductor layer 410, not to the surface of the second-conductivity type semiconductor layer 410. The barrier rib part 470 functions to separate the light emitting region into a plurality of sub light emitting regions, while not badly affecting the light extraction efficiency improvement performance of the uneven pattern 490.

A semiconductor light emitting device according to another embodiment of the present invention will be described below with reference to FIGS. 19 through 23.

Figure 19:
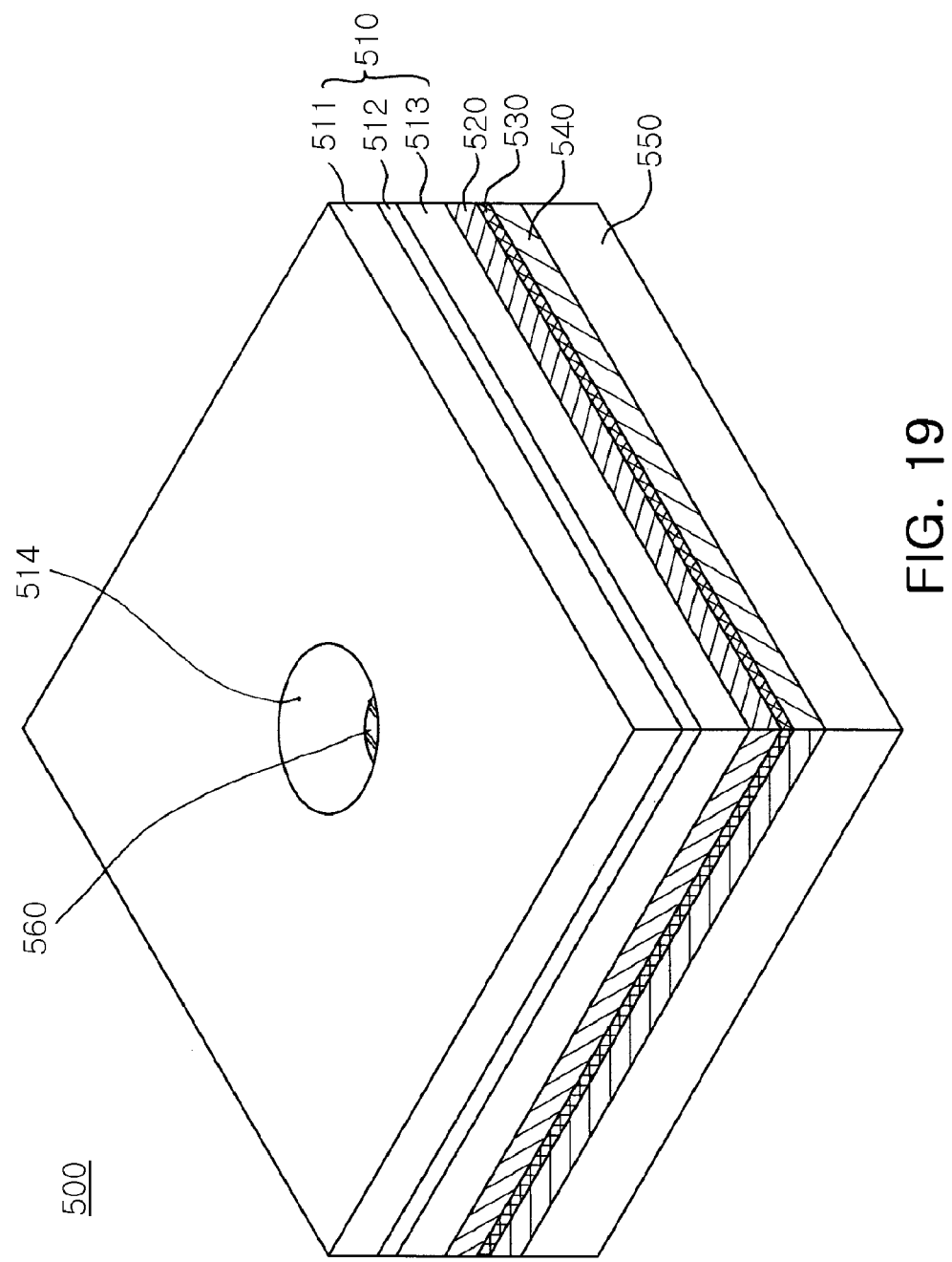
FIGS. 19 through 23 illustrate a semiconductor light emitting device according to another embodiment of the present invention.
Figure 20:
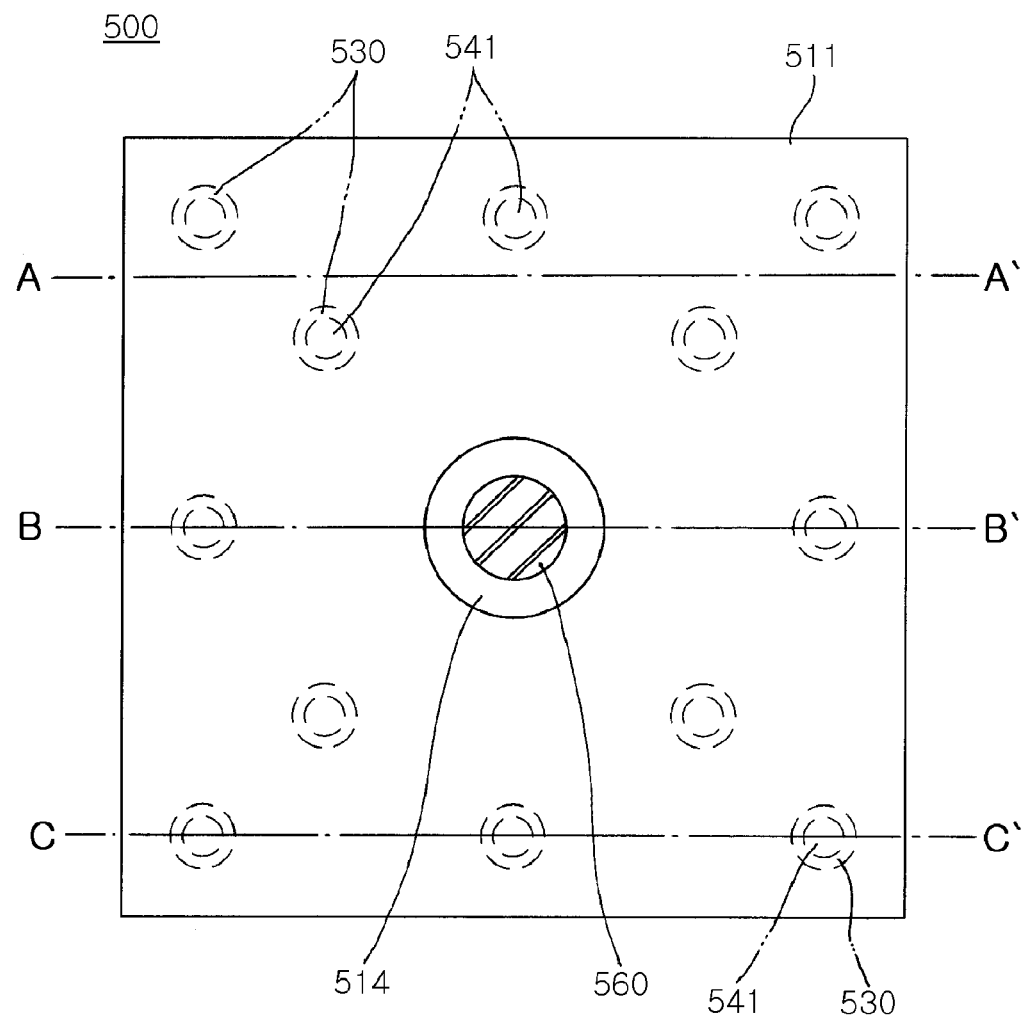

FIG. 19 is a perspective view of a semiconductor light emitting device according to another embodiment of the present invention, and FIG. 20 is a plan view of the semiconductor light emitting device illustrated in FIG. 19. The semiconductor light emitting device will be described below with reference to FIGS. 19 and 20.

The semiconductor light emitting device 500 according to this embodiment of the present invention includes a first-conductivity type semiconductor layer 511, an active layer 512, a second-conductivity type semiconductor layer 513, a second electrode layer 520, a first insulation layer 530, a first electrode layer 540, and a conductive substrate 550, which are stacked in sequence. The second electrode layer 520 includes a partially exposed region in the interface of the second-conductivity type semiconductor layer 513. The first electrode layer 540 includes at least one contact hole 541 which is electrically connected to the first-conductivity type semiconductor layer 511 and electrically insulated from the second-conductivity type semiconductor layer 513 and the active layer 512 so that the contact hole 541 extends from one surface of the first electrode layer 540 to at least a portion of the first-conductivity type semiconductor layer 511.

Since the light emission of the semiconductor light emitting device 500 is performed at the first-conductivity type semiconductor layer 511, the active layer 512 and the second-conductivity type semiconductor layer 513, they will be referred to as a light emitting stack structure 510. That is, the semiconductor light emitting device 500 includes the light emitting stack structure 510, the first electrode layer 540 electrically connected to the first-conductivity type semiconductor layer 511, the second electrode layer 520 electrically connected to the second-conductivity type semiconductor layer 513, and the first insulation layer 530 electrically insulating the electrode layers 520 and 540. Also, the conductive substrate 550 is included as a substrate for growth or support of the semiconductor light emitting device 500.

The semiconductor layers 511 and 513 may be formed of a semiconductor material, e.g., a GaN-based semiconductor, a SiC-based semiconductor, a ZnO-based semiconductor, a GaAs-based semiconductor, a GaP-based semiconductor, a GaAsP-based semiconductor, etc. The semiconductor layers 511 and 513 may be formed using a metal organic chemical vapor deposition (MOCVD) method, or a molecular beam epitaxy (MBE) method. Furthermore, the semiconductor layers 511 and 513 may be formed of a material selected from the group consisting of group III-V semiconductor, group IV-IV semiconductor, group II-VI semiconductor, group IV semiconductor such as Si, and combinations thereof. The semiconductor layers 511 and 513 are doped with proper impurities, considering the conductivity types thereof.

The active layer 512 is a layer which activates light emission, and is formed of a material having a smaller energy band gap than those of the first-conductivity type semiconductor layer 511 and the second-conductivity type semiconductor layer 513. For example, when the first-conductivity type semiconductor layer 511 and the second-conductivity type semiconductor layer 513 are formed of a GaN-based compound semiconductor, the active layer 512 may be formed of an InAlGaN-based compound semiconductor having a smaller energy band gap than that of GaN. That is, the active layer 512 may include $In_xAl_yGa_{(1-x-y)}N$ (where $0 \le x \le 1$, $0 \le y \le 1$, $0 \le x+y \le 1$).

The wavelength of the emitted light may be adjusted by controlling a mole ratio of the constituent materials of the active layer 512. Therefore, the semiconductor light emitting device 500 may emit infrared light, visible light, or ultraviolet light according to characteristics of the active layer 512.

Since the electrode layers 520 and 540 are layers which apply a voltage to the semiconductor layers having the same conductivity type, they may include a metal, considering electrical conductivity. That is, the electrodes 520 and 540 are electrodes which electrically connect the semiconductor layers 511 and 513 to an external power source (not shown). For example, the electrode layers 520 and 540 as n-type electrodes may be formed of Ti, Al, Cr, or Au, and the electrode layers 520 and 540 as p-type electrodes may be formed of Ni, Pd, Ag, Al, Pt, or Au.

The first electrode layer 540 is electrically connected to the first-conductivity type semiconductor layer 511, and the second electrode layer 520 is electrically connected to the second-conductivity type semiconductor layer 513. Since the first electrode layer 540 and the second electrode layer 520 are connected to different conductivity type, they are electrically separated from each other by the first insulation layer 530. The first insulation layer 530 may be formed of a material having a low electrical conductivity. For example, the first insulation layer 530 may include an oxide, e.g., $SiO_2$.

The second electrode layer 520 reflects light generated from the active layer 512. Since the second electrode layer 520 is disposed under the active layer 512, it is disposed on a plane opposite to the direction in which light from the semiconductor light emitting device 500 travels with respect to the active layer 520. Therefore, light traveling from the active layer 512 to the second electrode layer 520 is opposite to the light emitting direction of the semiconductor light emitting device 500. Thus, in order to increase luminous efficiency, light directed to the second electrode layer 520 must be reflected. Therefore, if the second electrode layer 520 has a light reflection characteristic, the reflected light is directed to the light emitting plane, thereby increasing the luminous efficiency of the semiconductor light emitting device 500.

In order to reflect the light emitted from the active layer 512, the second electrode layer 520 may be formed of a metal which is whitish in the visible light range. For example, the second electrode layer 520 may be formed of any one of Ag, Al, and Pt.

The second electrode layer 520 includes a partially exposed region in the interface with the second-conductivity type semiconductor layer 513. The first electrode layer 540 contacts the conductive substrate 550 on the bottom surface thereof, and is electrically connected to the external power source (not shown) through the conductive substrate 550. However, the second electrode layer 520 requires a separate connection region for connection with the external power source (not shown). Therefore, the second electrode layer 520 has a region exposed by etching a portion of the light emitting stack structure 510.

FIG. 19 illustrates an embodiment of a via hole 514 formed by etching the center portion of the light emitting stack structure 510 for the exposed region of the second electrode layer 520. An electrode pad part 560 may be further formed on the exposed region of the second electrode layer 520. The second electrode layer 520 may be electrically connected to the external power source (not shown) through the exposed region. At this time, the second electrode layer 520 may be electrically connected to the external power source (not shown) by the electrode pad part 560. The connection to the external power source (not shown) may be achieved using wires. Thus, for convenience, the diameter of the via hole 514 increases in a direction from the second electrode layer to the first-conductivity type semiconductor layer.

The via hole 514 is formed by a selective etching process which etches the light emitting stack structure 510, but does not etch the second electrode layer 520 including a metal. The diameter of the via hole 514 may be appropriately determined by those skilled in the art, considering the light emitting area, the electrical connection efficiency, and the current dispersion in the second electrode layer 520.

The first electrode layer 540 includes at least one contact hole 541 which is electrically connected to the first-conductivity type semiconductor layer 511 and electrically insulated from the second-conductivity type semiconductor layer 513 and the active layer 512 so that the contact hole 541 extends to at least a portion of the first-conductivity type semiconductor layer 511. In order to create a connection between the first-conductivity type semiconductor layer 511 and the external power source (not shown), the first electrode layer 540 includes at least one contact hole 541 passing through the second electrode layer 520 between the first electrode layer 540 and the second-conductivity type semiconductor layer 513, the second-conductivity type semiconductor layer 513, and the active layer 512, extending to the first-conductivity type semiconductor layer 511, and including an electrode material.

If the contact hole 541 is provided for the electrical connection only, the first electrode layer 540 may include only one contact hole 541. On the other hand, if the contact hole 541 is also provided for the uniform dispersion of the current transferred to the first-conductivity type semiconductor layer 511, the first electrode layer 540 may include a plurality of contact holes 541 at predetermined positions.

The conductive substrate 550 contacts the second electrode layer 520 and is electrically connected thereto. The conductive substrate 550 may be a metal substrate or a semiconductor substrate. When the conductive substrate 550 is a metal substrate, it may be formed of any one of Au, Ni, Cu, Al, and W. When the conductive substrate 550 is a semiconductor substrate, it may be formed of any one of Si, Ge, and GaAs. Also, the conductive substrate 550 may be formed of a material including Au, Ni, Al, Cu, W, Si, Se, and GaAs, for example, SiAl, which is a combination of Si and Al. The conductive substrate 550 may be a growth substrate, or a support substrate. In the case of the support substrate, after using a nonconductive substrate (e.g., a sapphire substrate) as a growth substrate, the nonconductive substrate is removed and the resulting structure is attached.

When the conductive substrate 550 is the support substrate, it may be formed using a plating method or a substrate bonding method. Specifically, the conductive substrate 550 is formed in the semiconductor light emitting device 500 by a plating method, which forms a substrate by forming a plating seed layer, or a substrate bonding method, which separately prepares the conductive substrate 550 and attaches it using a conductive adhesive, e.g., Au, Sn, Ni, Au—Sn, Ni—Sn, Ni—Au—Sn, Pb—Sr, etc.

FIG. 20 is a plan view of the semiconductor light emitting device 500. A via hole 514 is formed on the top surface of the semiconductor light emitting device 500, and an electrode pad part 560 is disposed in an exposed region formed in the second electrode layer 520. Although not shown on the top surface of the semiconductor light emitting device 500, the contact hole 541 is indicated by dotted lines in order to mark the position of the contact hole 541. A first insulation layer 530 may extend around the contact hole 541 in order to electrically separate the contact hole 541 from the second electrode layer 520, the second-conductivity type semiconductor layer 513, and the active layer 512. A further description will be made below with reference to FIGS. 21B and 21C.

Figure 21:
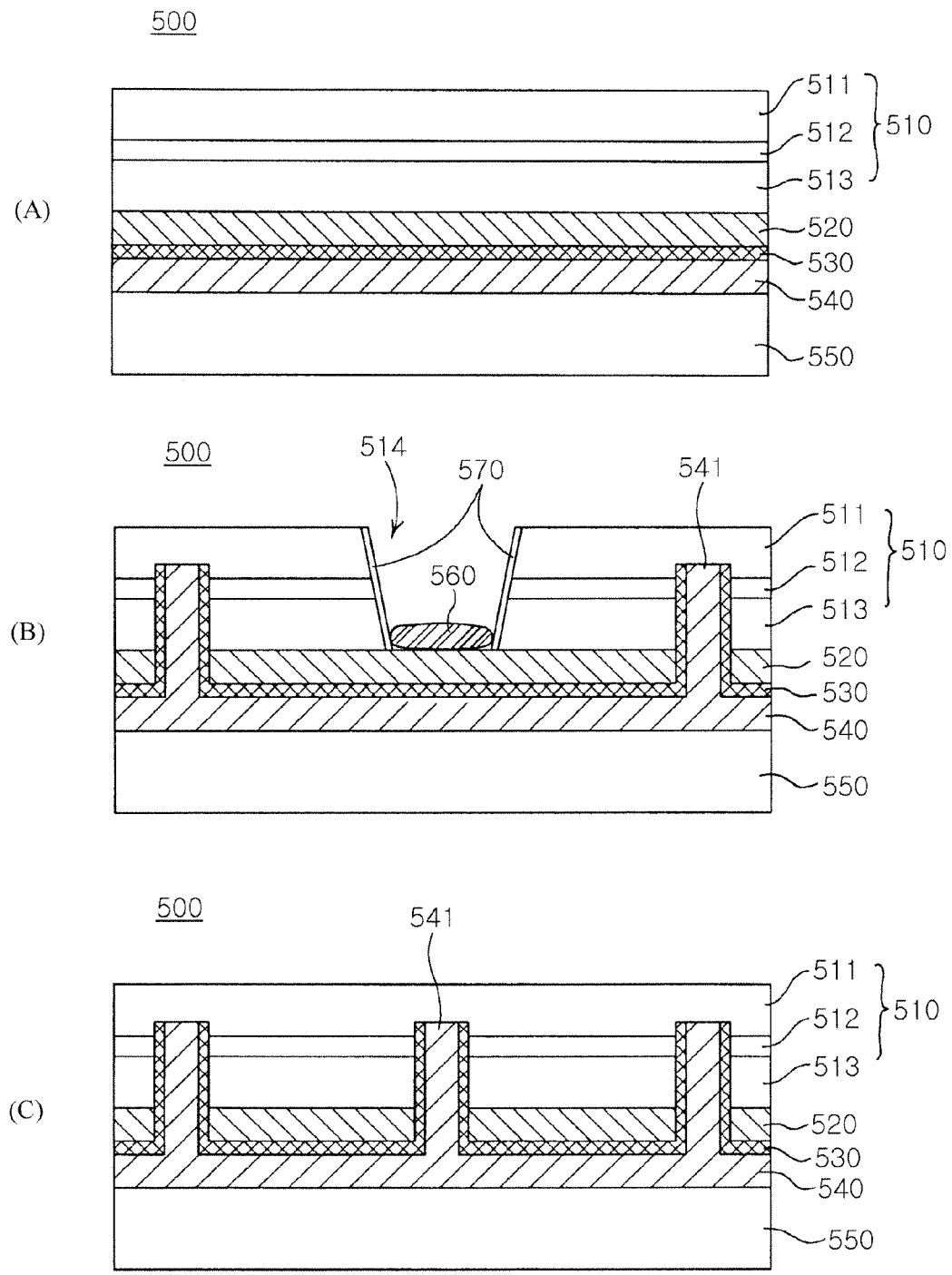

FIGS. 21A through 21C are cross-sectional views of the semiconductor light emitting device illustrated in FIG. 20, taken along lines A-A', B-B' and C-C', respectively. The line A-A' is selected to take the section of the semiconductor light emitting device 500, and the line B-B' is selected to take the section which includes the contact hole 541 and the via hole 514. The line C-C' is selected to take the section which includes the contact hole 541 only. The following description will be made with reference to FIGS. 19 through 21C.

Referring to FIG. 21A, the contact hole 541 or the via hole 514 is not shown. The contact hole 541 is not connected through a separate connection line, but electrically connected through the first electrode layer 540. Thus, the contact hole 541 is not shown in the A-A' section.

Referring to FIGS. 21B and 21C, the contact hole 541 extends from the interface between the first electrode layer 540 and the second electrode layer 520 to the inside of the first-conductivity type semiconductor layer 511. The contact hole 541 passes through the second-conductivity type semiconductor layer 513 and the active layer 512 and extends up to the first-conductivity type semiconductor layer 511. The contact hole 541 extends up to the interface between at least the active layer 512 and the first-conductivity type semiconductor layer 511. Since the contact hole 530 is provided for the purpose of electrical connection and current dispersion, the purpose is achieved only if the contact hole 541 contacts the first-conductivity type semiconductor layer 511. Hence, the contact hole 541 need not extend up to the outer surface of the first-conductivity type semiconductor layer 511.

The contact hole 541 must have a predetermined area because it is formed for dispersing the current to the first-conductivity type semiconductor layer 511. A predetermined number of contact holes 541 may be formed in such a small area that the current may be uniformly dispersed on the first-conductivity type semiconductor layer 511. If a very small number of contact holes 541 are formed, the current dispersion is difficult and the electrical characteristics are degraded. If a very large number of the contact holes 541 are formed, the fabrication process is difficult and the active layer is reduced, causing the reduction in the light emitting area. Thus, the number of contact holes 541 may be appropriately selected, taking into consideration those conditions. Therefore, the contact holes 541 are implemented in a shape which occupies an area as small as possible and is effective in current dispersion.

The contact hole 541 extends from the second electrode layer 520 to the inside of the first-conductivity type semiconductor layer 511. Since the contact hole 541 is formed for the current dispersion of the first-conductivity type semiconductor layer 511, the contact hole 541 needs to be electrically separated from the second-conductivity type semiconductor layer 513 and the active layer 512. Hence, the contact hole 541 is electrically separated from the second electrode layer 520, the second-conductivity type semiconductor layer 513, and the active layer 512. Thus, the first insulation layer 530 may extend while surrounding the contact hole 541. The electrical separation may be performed using an insulating material such as a dielectric.

Referring to FIG. 21B, the exposed region of the second electrode layer 520 is a region for the electrical connection to the external power source (not shown). The electrode pad part 560 may be disposed in the exposed region. At this time, a second insulation layer 570 may be formed at the inner surface of the via hole 541, so that the light emitting stack structure 510 and the electrode pad part 560 are electrically separated from each other.

Referring to FIG. 21A, since the first electrode layer 540 and the second electrode layer 520 are disposed on the same plane, the semiconductor light emitting device 500 may exhibit a characteristic of a horizontal type semiconductor light emitting device. In FIG. 21C, since the electrode pad part 560 is disposed on the surface of the first-conductivity type semiconductor layer 511, the semiconductor light emitting device 500 may exhibit a characteristic of a vertical type semiconductor light emitting device. Therefore, the semiconductor light emitting device 500 has a hybrid type structure having both the horizontal type and the vertical type.

In FIGS. 21A through 21C, the first-conductivity type semiconductor layer 511 may be an n-type semiconductor layer, and the first electrode layer 540 may be an n-type electrode. In this case, the second-conductivity type semiconductor layer 513 may be a p-type semiconductor layer, and the second electrode layer 520 may be a p-type electrode. Thus, the first electrode layer 540 being the n-type electrode and the second electrode layer 520 being the p-type electrode may be electrically insulated from each other, with the first insulation layer 530 disposed therebetween.

Figure 22:
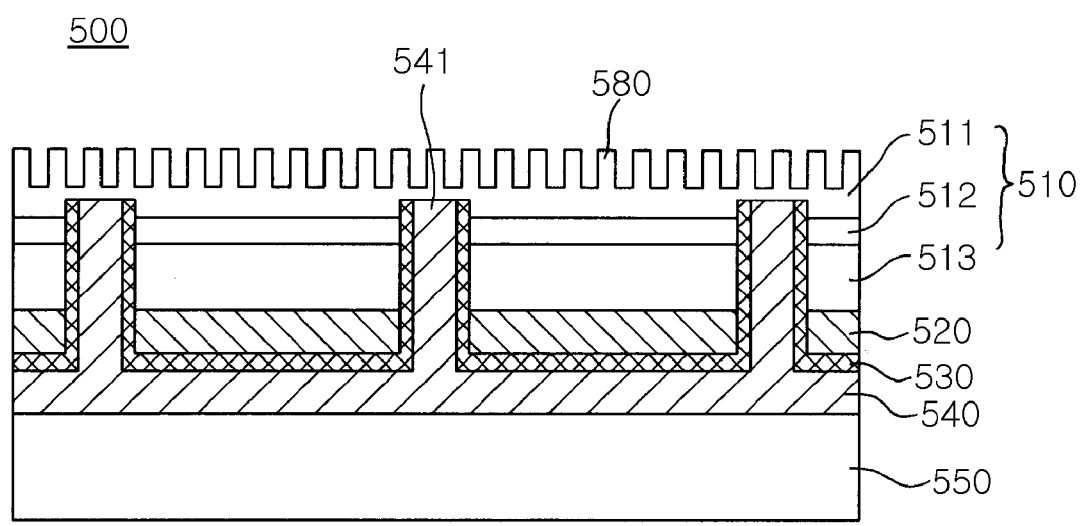

FIG. 22 illustrates the light emission of a semiconductor light emitting device having an uneven pattern on the surface thereof according to an embodiment of the present invention. The description of the elements having already been described above will be omitted.

In the semiconductor light emitting device 500 according to this embodiment of the present invention, the outermost surface in the light traveling direction is provided with the first-conductivity type semiconductor layer 511. Therefore, the uneven pattern 580 on the surface of the semiconductor light emitting device may be formed using a method known in the art such as lithography. In this case, the light emitted from the active layer 512 is extracted while passing through the uneven pattern 580 formed on the surface of the first-conductivity type semiconductor layer 511. Thus, the light extraction efficiency is increased by the uneven pattern 580.

The uneven pattern 580 may have a photonic crystal structure. A photonic crystal structure is a structure in which media having different refractive indexes are arranged regularly in a crystal-like manner. The photonic crystal structure may further increase light extraction efficiency because it can adjust light on the basis of length unit corresponding to the multiple of the wavelength of light.

Figure 23:
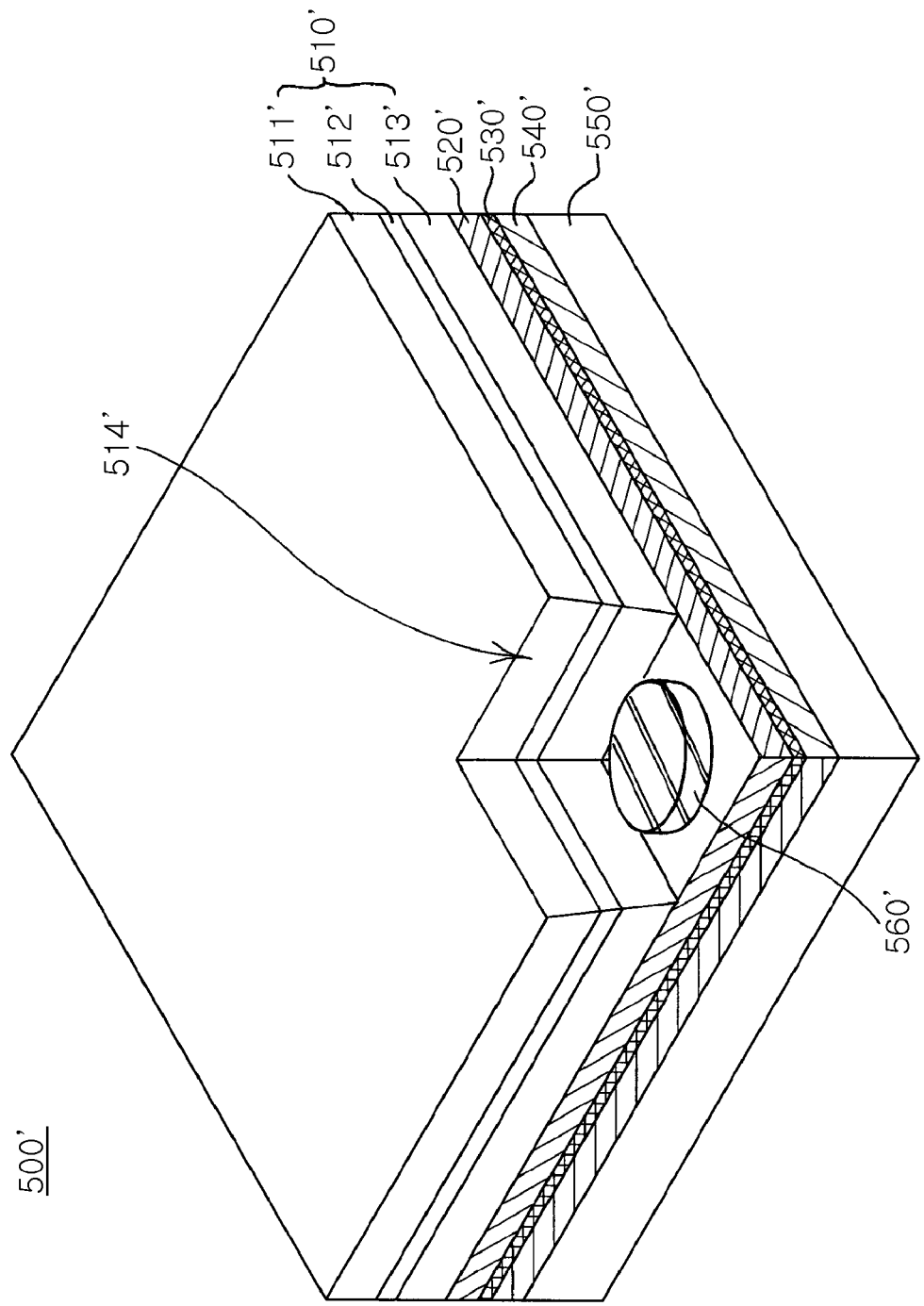

FIG. 23 illustrates the exposure of the second electrode layer at an edge in the semiconductor light emitting device according to this embodiment of the present invention.

According to one aspect of the present invention, there is provided a method for manufacturing a semiconductor light emitting device, including: sequentially forming a first-conductivity type semiconductor layer 511', an active layer 512', a second-conductivity type semiconductor layer 513', a second electrode layer 520', an insulation layer 530', a first electrode layer 540', and a conductive substrate 550'; forming a partially exposed region in the interface between the second electrode layer 520' and the second-conductivity type semiconductor layer 513'; and forming at least one contact hole 541' extending from one surface of the first electrode layer 540 to at least a portion of the first-conductivity type semiconductor layer 511', the first electrode layer 540' being electrically connected to the first-conductivity type semiconductor layer 511' and electrically insulated from the second-conductivity type semiconductor layer 513' and the active layer 512'.

In this case, the exposed region of the second electrode layer 520' may be provided by forming the via hole 514' in the light emitting stack structure 510' (see FIG. 19), or may be formed by mesa etching the light emitting stack structure 510' (see FIG. 23). A description of elements the same as those of the embodiment described above with reference to FIG. 19 will be omitted.

Referring to FIG. 23, an edge of the semiconductor light emitting device 500' is mesa etched. The etching is performed on the light emitting stack structure 510' so that the second electrode layer 520' is exposed in the interface with the second-conductivity type semiconductor layer 513'. Therefore, the exposed region of the second electrode layer 520' is formed at the edge of the semiconductor light emitting device 500'. When compared with the above-described embodiment which forms the via hole, the case of forming the exposed region of the second electrode layer 520' at the edge may be performed by a simple process and the subsequent electrical connection process may also be performed easily.

A semiconductor light emitting device according to another embodiment of the present invention will be described below with reference to FIGS. 24 through 34.

Figure 24:
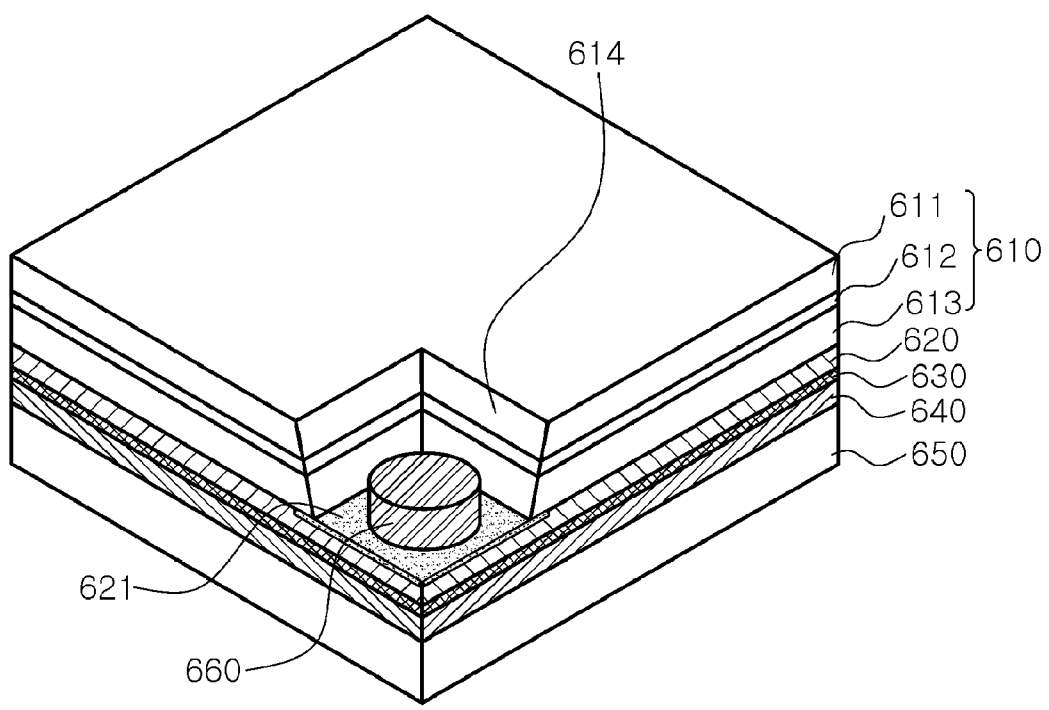
FIGS. 24 through 34 illustrate a semiconductor light emitting device according to another embodiment of the present invention.
Figure 25:
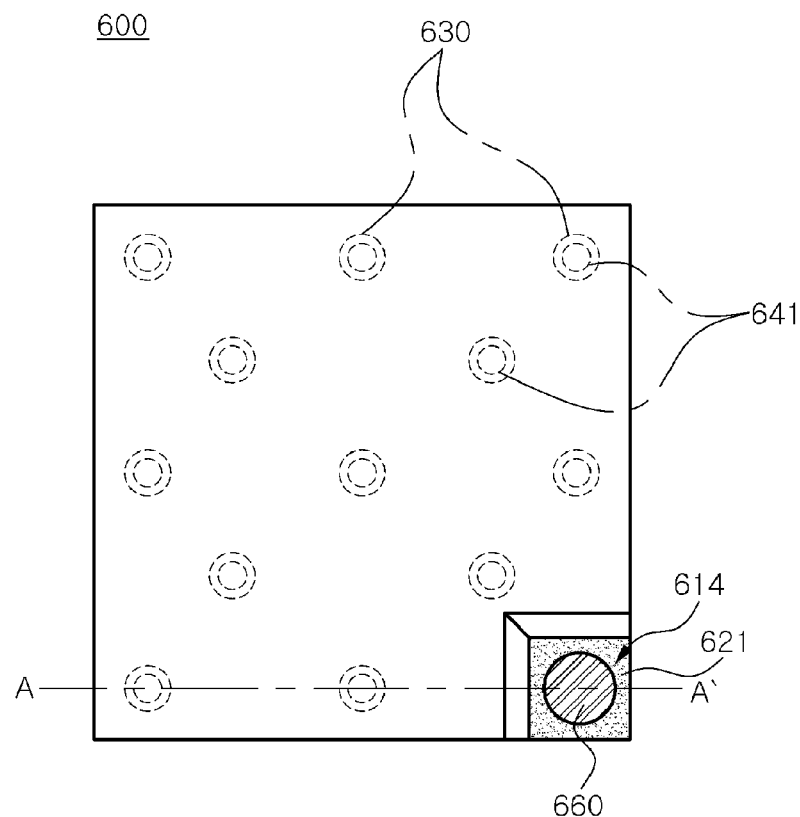
Figure 26:
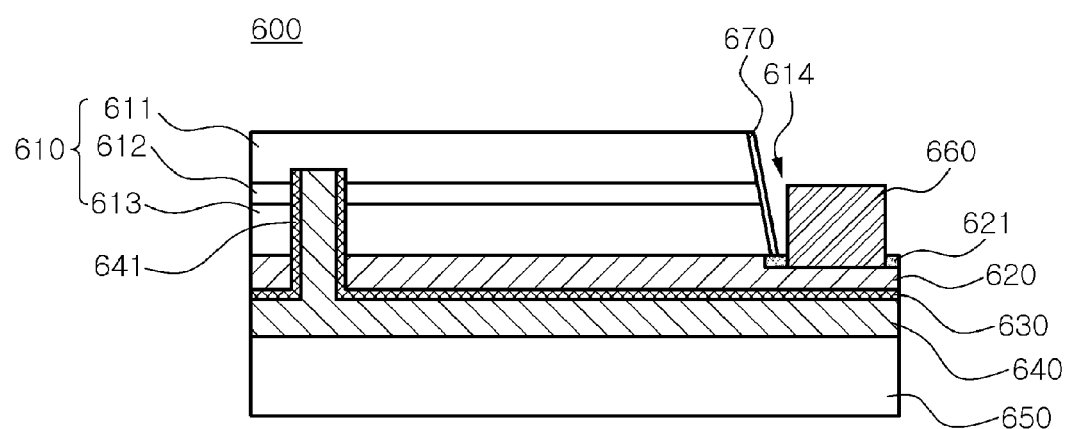

FIG. 24 is a schematic perspective view of a semiconductor light emitting device according to another embodiment of the present invention, and FIG. 25 is a top plan view of the semiconductor light emitting device illustrated in FIG. 24. FIG. 26 is a cross-sectional view of the semiconductor light emitting device illustrated in FIG. 25, taken along line A-A'. The semiconductor light emitting device will be described below with reference to FIGS. 24 and 26.

The semiconductor light emitting device 600 according to this embodiment of the present invention includes a first-conductivity type semiconductor layer 611, an active layer 612, a second-conductivity type semiconductor layer 613, a second electrode layer 620, an insulation layer 630, a first electrode layer 640, and a conductive substrate 650, which are stacked in sequence. In order for an electrical connection to be made with the first-conductive semiconductor layer 611, the first electrode layer 640 includes at least one contact hole 641 which is electrically insulated from the second-conductivity type semiconductor layer 613 and the active layer 612 so that the contact hole 641 extends from one surface of the first electrode layer 640 to at least a portion of the first-conductivity type semiconductor layer 611. In this embodiment, the first electrode layer 640 is not a requisite element. Although not shown, the semiconductor light emitting device 600 may not include the first electrode layer 640, and the contact hole 641 may be formed from one surface of the conductive substrate 650. That is, in order for electrical connection to the first-conductivity type semiconductor layer 611, the conductive substrate 650 may include at least one contact hole 641 which is electrically insulated from the second-conductivity type semiconductor layer 613 and the active layer 612 and extends from one surface of the first electrode layer 640 to at least a portion of the first-conductivity type semiconductor layer 611. In this case, the conductive substrate 650 is electrically connected to the external power source (not shown), and a voltage is applied to the first-conductivity type semiconductor layer 611 through the conductive substrate 650.

The second electrode layer 620 includes a partially exposed region 614 in the interface with the second-conductivity type semiconductor layer 613. The exposed region 614 may be formed by etching the first-conductivity type semiconductor layer 611, the active layer 612, and the second-conductivity type semiconductor layer 613. An etch stop layer 621 is formed in the exposed region 614.

Since the light emission of the semiconductor light emitting device 600 is performed at the first-conductivity type semiconductor layer 611, the active layer 612 and the second-conductivity type semiconductor layer 613, they will be referred to as a light emitting stack structure 610. That is, the semiconductor light emitting device 600 includes the light emitting stack structure 610, the first electrode layer 640 electrically connected to the first-conductivity type semiconductor layer 611 through the contact hole 641, the second electrode layer 620 electrically connected to the second-conductivity type semiconductor layer 613, and the insulation layer 630 electrically insulating the electrode layers 620 and 640. Also, the conductive substrate 650 is included in order for supporting the semiconductor light emitting device 600.

The semiconductor layers 511 and 513 may be formed of, but are not limited to, a semiconductor material, e.g., a GaN-based semiconductor, a SiC-based semiconductor, a ZnO-based semiconductor, a GaAs-based semiconductor, a GaP-based semiconductor, a GaAsP-based semiconductor, etc. Furthermore, the semiconductor layers 611 and 613 may be formed of a material selected from the group consisting of a group III-V semiconductor, a group IV-IV semiconductor, a group II-VI semiconductor, a group IV semiconductor such as Si, and combinations thereof. Moreover, the semiconductor layers 611 and 613 are doped with n-type impurity or p-type impurity, considering the conductivity types thereof.

The active layer 612 is a layer which activates light emission, and is formed of a material having a small energy band gap than those of the first-conductivity type semiconductor layer 611 and the second-conductivity type semiconductor layer 613. For example, when the first-conductivity type semiconductor layer 611 and the second-conductivity type semiconductor layer 613 are formed of a GaN-based compound semiconductor, the active layer 612 may be formed of an InAlGaN-based compound semiconductor having a smaller energy band gap than that of GaN. That is, the active layer 612 may include $In_xAl_yGa_{(1-x-y)}N$ (where $0 \le x \le 1$, $0 \le y \le 1$, $0 \le x+y \le 1$).

In this case, in view of the characteristics of the active layer 612, impurities are not doped. The wavelength of the emitted light may be adjusted by controlling a mole ratio of the constituent materials of the active layer 612. Therefore, the semiconductor light emitting device 600 may emit infrared light, visible light, or ultraviolet light according to characteristics of the active layer 612.

Since the first electrode layer 640 and the second electrode layer 620 are layers which apply a voltage to the semiconductor layers having the same conductivity type, the semiconductor layers 611 and 613 are electrically connected to the external power source (not shown) by the electrode layers 620 and 640.

The first electrode layer 640 is electrically connected to the first-conductivity type semiconductor layer 611, and the second electrode layer 620 is electrically connected to the second-conductivity type semiconductor layer 613. Thus, the first electrode layer 640 and the second electrode layer 620 are electrically separated from each other by the insulation layer 630. The insulation layer 630 may be formed of a material having a low electrical conductivity. For example, the insulation layer 630 may include oxide, e.g., $SiO_2$.

In order for an electrical connection to be made with to the first-conductivity type semiconductor layer 611, the first electrode layer 640 includes at least one contact hole 641 which is electrically insulated from the second-conductivity type semiconductor layer 613 and the active layer 612 (the insulation layer 630 disposed between the first electrode layer and the second electrode layer may extend) and extends up to a portion of the first-conductivity type semiconductor layer 611. The contact hole 641 passes through the second electrode layer 620, the insulation layer 630, and the active layer 612 and extends to the first-conductivity type semiconductor layer 611. The contact hole 641 includes an electrode material. Due to the contact hole 641, the first electrode layer 640 and the first-conductivity type semiconductor layer 611 are electrically connected together, so that the first-conductivity type semiconductor layer 611 is connected to the external power source (not shown).

If the contact hole 641 is provided only for the electrical connection of the first-conductivity type semiconductor layer 611, the first electrode layer 640 may include only one contact hole 641. On the other hand, if the contact hole 641 is also provided for the uniform dispersion of the current transferred to the first-conductivity type semiconductor layer 611, the first electrode layer 640 may include a plurality of contact holes 641 at predetermined positions.

Since the second electrode layer 620 is disposed under the active layer 612, it is disposed on a plane opposite to the light emitting direction of the semiconductor light emitting device 600 with respect to the active layer 612. Therefore, in order to increase the luminous efficiency, light directed to the second electrode layer 620 must be reflected.

In order to reflect the light emitted from the active layer 612, the second electrode layer 620 may be formed of a metal which is whitish in the visible light range. For example, the second electrode layer 620 may be formed of any one of Ag, Ni, Al, Rh, Pd, Ir, Ru, Mg, Zn, Pt, and Au.

A portion of the second electrode layer 620 is exposed in the interface with the second-conductivity type semiconductor layer 613 by the etching of the first-conductivity type semiconductor layer 611, the active layer 612, and the second-conductivity type semiconductor layer 613. The etch stop layer 621 is formed in the exposed region 614. The first electrode layer 640 contacts the conductive substrate 650 on the bottom surface thereof, so that it is electrically connected to the external power source (not shown). On the other hand, the second electrode layer 620 requires a separate connection region for connection with the external power source (not shown). Therefore, the second electrode layer 620 has the exposed region 614 at a portion of the interface with the second-conductivity type semiconductor layer 613. The exposed region 614 is formed by etching a portion of the light emitting stack structure 610. In this way, the second-conductivity type semiconductor layer 613 is electrically connected to the external power source (not shown) by the second electrode layer 620.

The area of the exposed region 614 may be appropriately determined by those skilled in the art, considering the light emitting area, the electrical connection efficiency, and the current dispersion in the second electrode layer 620. An embodiment where the edge of the light emitting stack structure 610 is etched so that the exposed region 614 of the second electrode layer 620 is disposed at the edge is illustrated in FIGS. 24 through 26.

The exposed region 614 is formed by a selective etching process which etches a portion of the light emitting stack structure 610, but does not etch the second electrode layer 620 including a metal. However, since it is difficult to exactly control the selective etching process of etching a portion of the light emitting stack structure 610, the second electrode layer 620 disposed under the light emitting stack structure 610 may be partially etched. When a portion of the second electrode layer 620 is etched, the metal material of the second electrode layer 620 is attached to the second-conductivity type semiconductor layer 613, causing a leakage current. Therefore, the etch stop layer 621 is formed in the region of the light emitting stack structure 610 to which the etching process is performed, that is, the exposed region of the second electrode layer 620.

The etch stop layer 621 prevents the metal of the second electrode layer 620 from being attached to the side surface of the light emitting stack structure 610. Consequently, leakage current may be reduced and the etching process may be easily performed. The etch stop layer 621 may be formed of a material suppressing the etching of the light emitting stack structure 610. For example, the etch stop layer 621 may be formed of, but is not limited to, an insulating material, e.g., silicon oxide or silicon nitride, such as $SiO_2$, $SiO_xN_y$, $Si_xN_y$, etc. The etch stop layer 621 is not necessarily formed of an insulating material. Even though the etch stop layer 621 is formed of a conductive material, it does not affect the operation of the semiconductor light emitting device 600. Therefore, the etch stop layer 621 may be formed of an appropriate conductive material only if the conductive material can perform the etch stop function.

Alternatively, an electrode pad part 660 passing through the etch stop layer 621 may be formed in the exposed region 614. The electrode pad part 660 passes through the etch stop layer 621 and is electrically connected to the second electrode layer 620. In this case, it is easy to electrically connect the second electrode layer 620 to the external power source (not shown).

The conductive substrate 650 is disposed on the bottom surface of the first electrode layer 640. The conductive substrate 650 contacts the first electrode layer 640 and is electrically connected thereto. The conductive substrate 650 may be a metal substrate or a semiconductor substrate. The conductive substrate 650 may be formed of any one of Au, Ni, Cu, Al, W, Si, Se, and GaAs, for example, pure Cu or SiAl, a combination of Si and Al. In this case, the conductive substrate 650 may be formed using a plating method or a bonding method. The conductive substrate 650 may be a support substrate. In the case of the support substrate, after using a sapphire substrate as a growth substrate, the sapphire substrate is removed and the resulting structure is attached.

FIG. 25 is a top plan view of the semiconductor light emitting device 600. Although not shown in the top surface of the semiconductor light emitting device 600, the contact hole 641 is indicated by dotted lines in order to mark the position of the contact hole 641. The insulation layer 630 may extend around the contact hole 641 in order to electrically separate the contact hole 641 from the second electrode layer 620, the second-conductivity type semiconductor layer 613, and the active layer 612. A further description will be made below with reference to FIG. 26.

FIG. 26 is a cross-sectional view of the semiconductor light emitting device 600 illustrated in FIG. 25, taken along line A-A'. The line A-A' is selected to take the section which includes the contact hole 641 and the exposed region 614.

Referring to FIG. 26, the contact hole 641 extends from the interface of the first electrode layer 640 to the inside of the first-conductivity type semiconductor layer 611 while passing through the second electrode layer 620, the second-conductivity type semiconductor layer 613, and the active layer 612. The contact hole 641 extends up to the interface between at least the active layer 612 and the first-conductivity type semiconductor layer 611, preferably, a portion of the first-conductivity type semiconductor layer 611. Since the contact hole 641 is provided for the purpose of the electrical connection and current dispersion of the first-conductivity type semiconductor layer 611, the purpose is achieved only if the contact hole 641 contacts the first-conductivity type semiconductor layer 611. Hence, the contact hole 641 need not extend up to the outer surface of the first-conductivity type semiconductor layer 611.

Furthermore, the contact hole 641 must have a predetermined area because it is formed for dispersing the current to the first-conductivity type semiconductor layer 611. A predetermined number of the contact holes 641 may be formed in such a small area that current may be uniformly dispersed on the first-conductivity type semiconductor layer 611. If a very small number of the contact holes 641 are formed, the current dispersion is difficult and the electrical characteristics are degraded. If a very large number of the contact holes 641 are formed, the fabrication process is difficult and the active layer is reduced, causing the reduction in the light emitting area. Thus, the number of the contact holes 641 may be appropriately selected, taking into consideration those conditions. Therefore, the contact holes 641 are implemented in a shape which occupies an area as small as possible and is effective in the current dispersion.

The contact hole 641 extends from the first electrode layer 640 to the inside of the first-conductivity type semiconductor layer 611. Since the contact hole 641 is formed for the current dispersion of the first-conductivity type semiconductor layer 611, the contact hole 641 needs to be electrically separated from the second-conductivity type semiconductor layer 613 and the active layer 612. Hence, the insulation layer 630 may extend while surrounding the contact hole 641.

Referring to FIG. 26, the second electrode layer 620 includes a partially exposed region 614 in the interface with the second-conductivity type semiconductor layer 613. The exposed region 614 is a region for an electrical connection between the second electrode layer 620 and the external power source (not shown). The etch stop layer 621 is formed in the exposed region 614. The semiconductor light emitting device 600 may further include the electrode pad part 660 which passes through the etch stop layer 621 and is electrically connected to the second electrode layer 620. At this time, an insulation layer 670 may be formed in the inner surface of the exposed region 614 in order for electrically separating the light emitting stack structure 610 from the electrode pad part 660.

In FIG. 26, since the first electrode layer 640 and the second electrode layer 620 are disposed on the same plane, the semiconductor light emitting device 600 may exhibit a characteristic of a horizontal type semiconductor light emitting device. Since the electrode pad part 660 is disposed on the surface of the first-conductivity type semiconductor layer 611, the semiconductor light emitting device 600 may exhibit a characteristic of a vertical type semiconductor light emitting device. Therefore, the semiconductor light emitting device 600 has a hybrid type structure having both the horizontal type and the vertical type.

Figure 27:
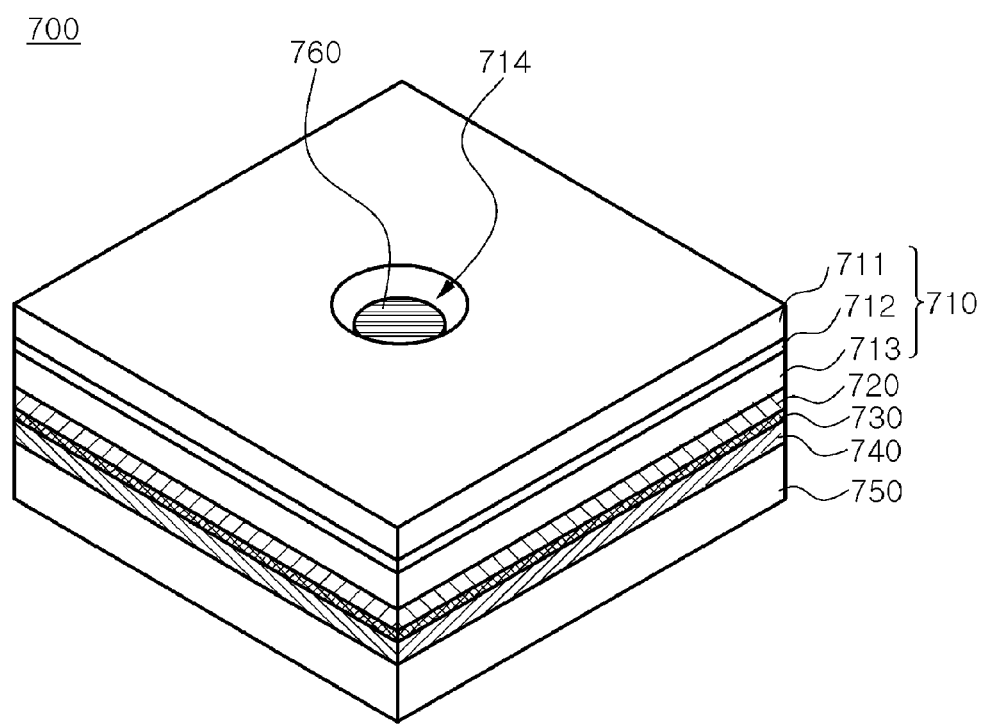
Figure 28:
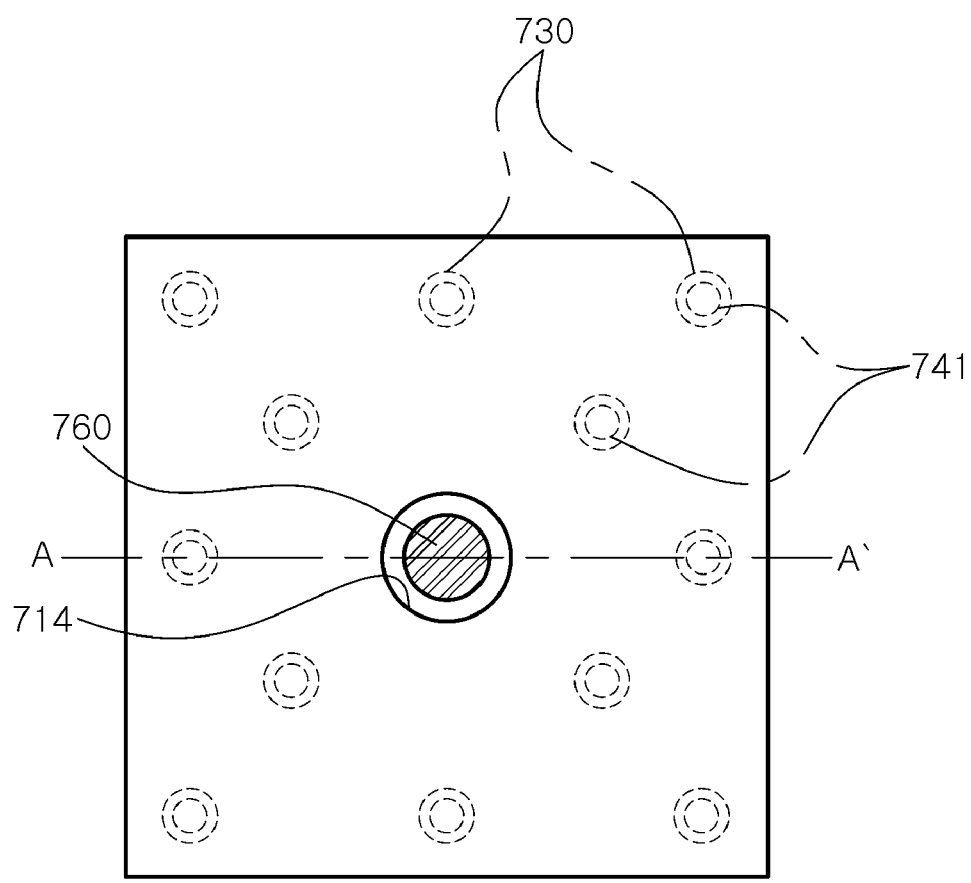
Figure 29:
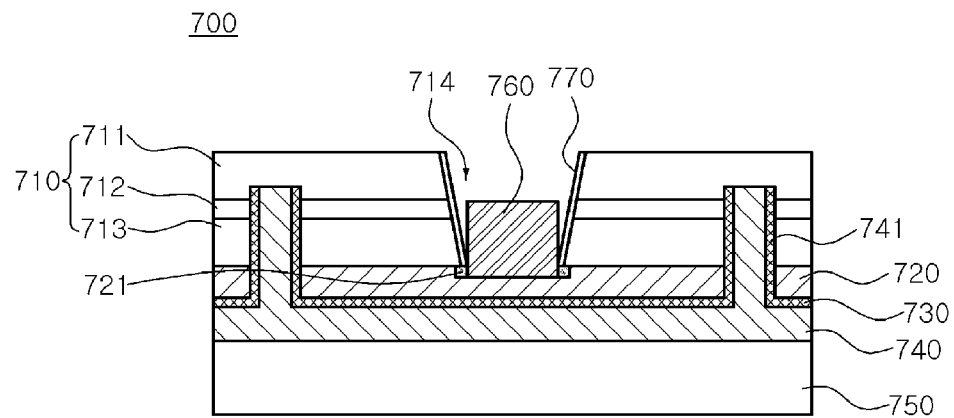

FIGS. 27 through 29 illustrate a semiconductor light emitting device according to another embodiment of the present invention. Specifically, FIG. 27 is a perspective view of the semiconductor light emitting device and FIG. 28 is a top plan view of the semiconductor light emitting device. FIG. 29 is a cross-sectional view of the semiconductor light emitting device illustrated in FIG. 28, taken along line A-A'.

Referring to FIGS. 27 through 29, a center portion of a light emitting stack structure 710 is etched. Thus, a partially exposed region 714 in the interface between a second electrode layer 720 and a second-conductivity type semiconductor layer is disposed at the center portion of the semiconductor light emitting device 700. The description of the same elements having already been described above will be omitted. The semiconductor light emitting device 700 may include an electrode pad part 760 which is formed by removing a portion of an etch stop layer 721 formed in the exposed region. The electrode pad part 760 may be electrically connected to an external power source (not shown), and may pass through the etch stop layer 721 and be electrically connected to the second electrode layer 720. The connection to the external power source (not shown) may be achieved using wires. Thus, for convenience of connection, the exposed region 714 may be formed so that it increases in a direction from the second electrode layer 720 to the first-conductivity type semiconductor layer.

Figure 30:
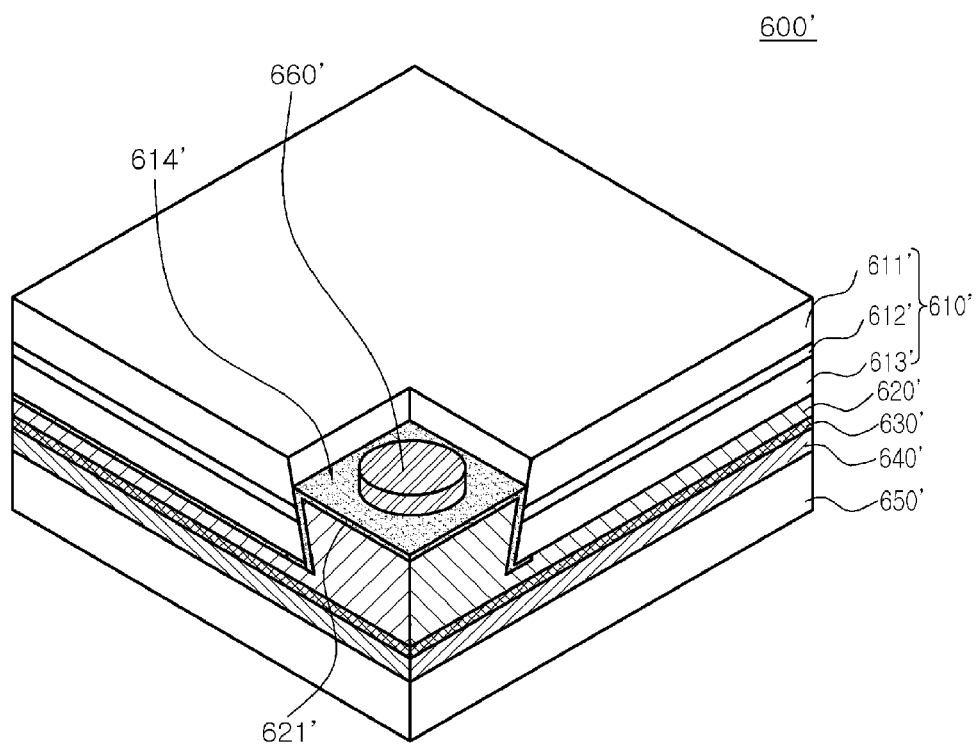
Figure 31:
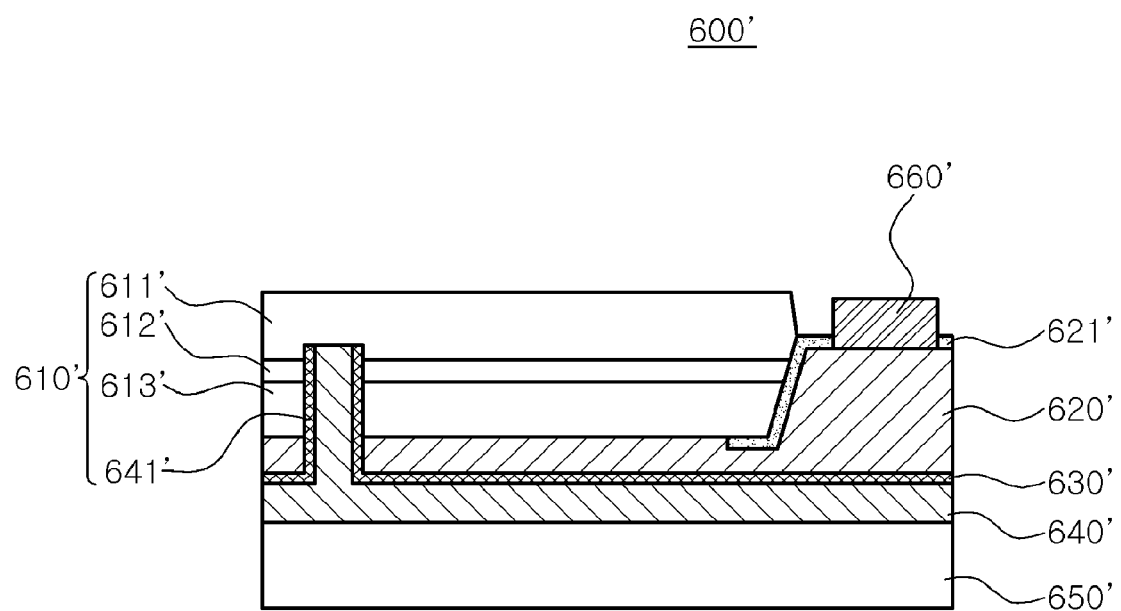
Figure 32:
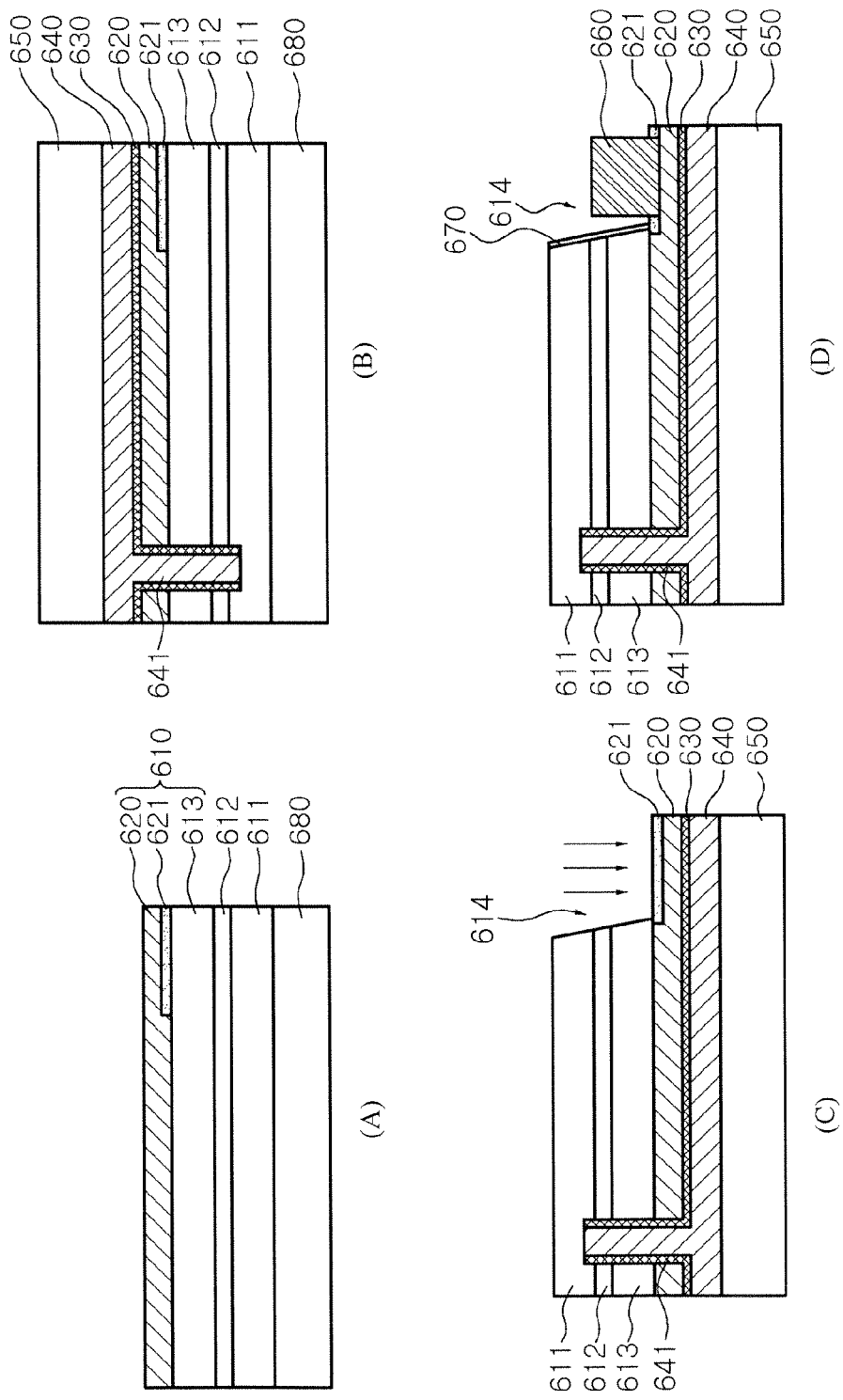
Figure 33:
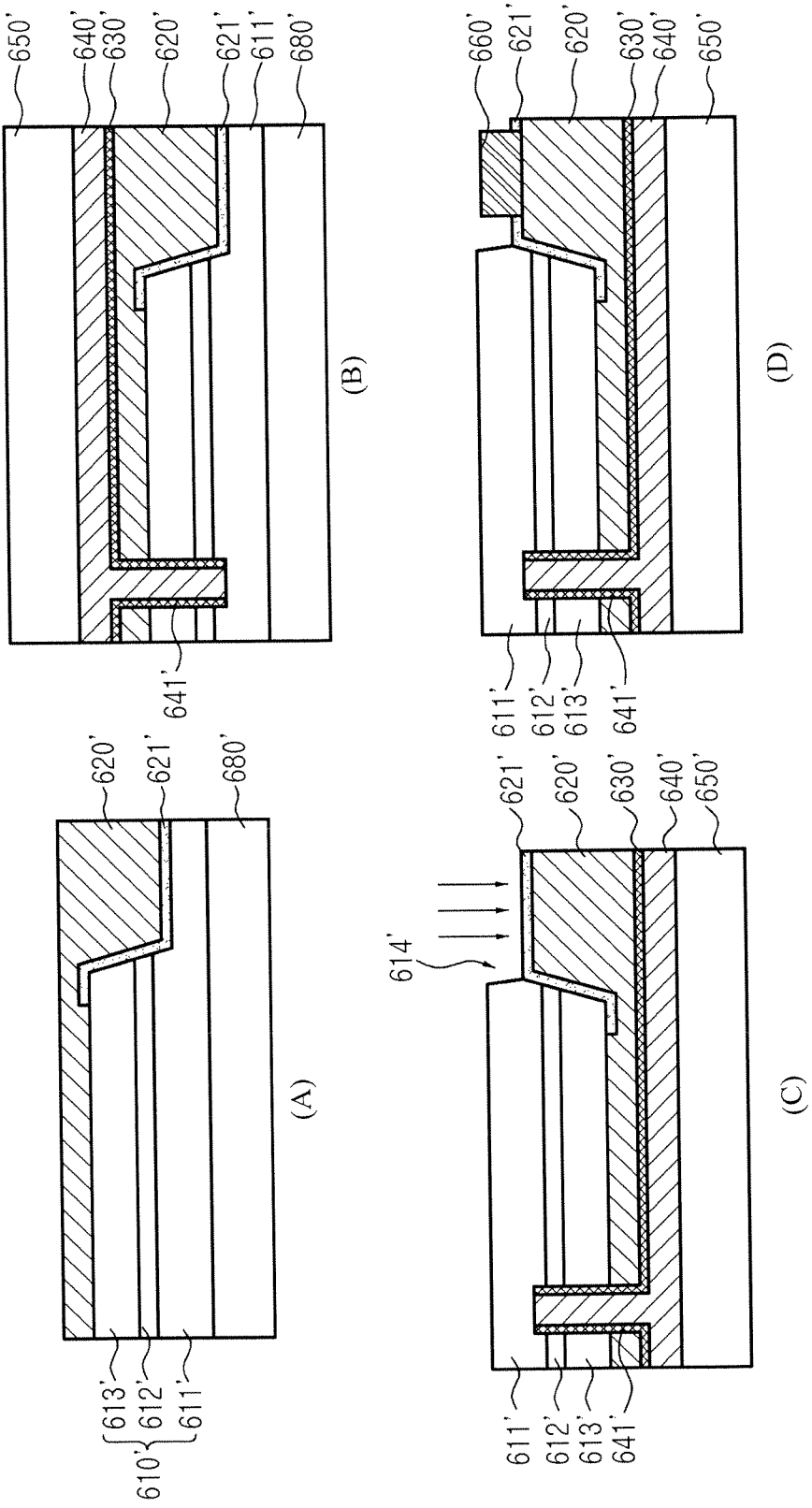
Figure 39:
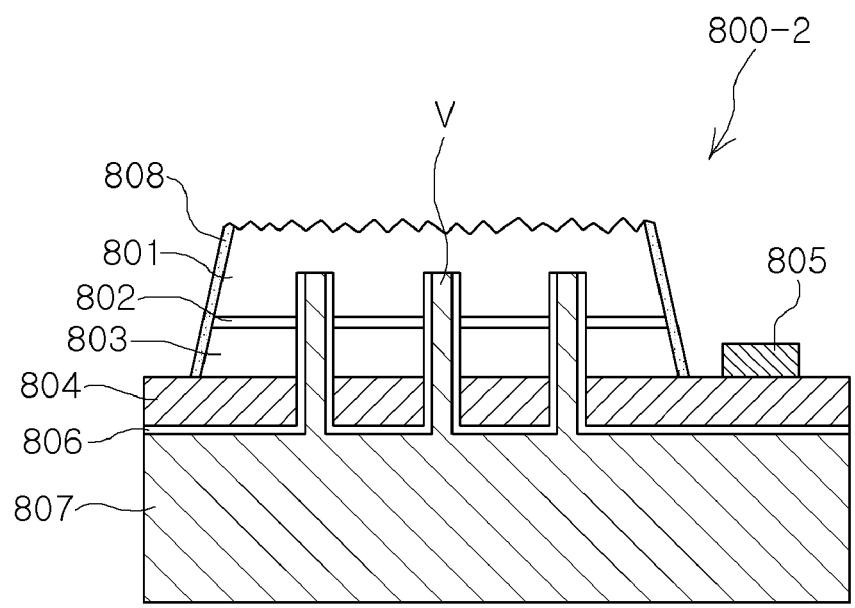

FIGS. 30 and 31 illustrate a semiconductor light emitting device according to a modified embodiment of the present invention. Specifically, FIGS. 39 and 31 are a perspective view and a cross-sectional view of the semiconductor light emitting device, respectively. In this case, the top plan view of the semiconductor light emitting device is similar to that of FIG. 25, and FIG. 31 is a cross-sectional view taken along line A-A', which is similar to that of FIG. 26. The description of the same elements having already been described above will be omitted.

Referring to FIGS. 30 and 31, a second electrode layer is exposed by the etching of a light emitting stack structure 610', and an etch stop layer 621' formed in the exposed region extends to the sides of a second-conductivity type semiconductor layer 613' and an active layer 612'. In this case, it is possible to prevent a metal material of the second electrode layer from being attached to the semiconductor side during the etching of the first-conductivity type semiconductor layer 611' as described above. Furthermore, the active layer 612' is protected.

Such a semiconductor light emitting structure will be described below.

FIGS. 32A through 32D are cross-sectional views illustrating a method for manufacturing a semiconductor light emitting device according to an embodiment of the present invention, more specifically, the semiconductor light emitting device of FIGS. 24 through 26.

Referring to FIG. 32A, a first-conductivity type semiconductor layer 611, an active layer 612, a second-conductivity type semiconductor layer 613, and a second electrode layer 620 are sequentially formed on a nonconductive substrate 680.

In this case, the semiconductor layers 611 and 613 and the active layer 612 may be formed using a known process, e.g., a metal organic chemical vapor deposition (MOCVD) process, a molecular beam epitaxy (MBE) process, a hybrid vapor phase epitaxy (HYPE) process, etc. A sapphire substrate may be used as the nonconductive substrate 680 because it is easy to grow a nitride semiconductor layer thereupon.

The second electrode layer 620 is stacked while forming an etch stop layer 621 in a region to be exposed by the etching of the first-conductivity type semiconductor layer 611, the active layer 612, and the second-conductivity type semiconductor layer 613.

Next, an insulation layer 630 and a conductive substrate 650 are formed on the second electrode layer 620. As illustrated in FIG. 32B, a first electrode layer 640 may be formed between the insulation layer 630 and the conductive substrate 650.

In order for an electrical connection to be made with the first-conductivity type semiconductor layer 611, the conductive substrate 650 is formed so that it includes at least one contact hole 641 which is electrically insulated from the second-conductivity type semiconductor layer 613 and the active layer 612 and extends from one surface of the conductive substrate 650 to a portion of the first-conductivity type semiconductor layer 611.

As illustrated in FIG. 32A, when the first electrode layer 640 is formed between the insulation layer 630 and the conductive substrate 650, the contact hole 641 is formed from one surface of the first electrode layer 640. That is, in order for the electrical connection to the first-conductivity type semiconductor layer 611 to be made, the first electrode layer 640 is formed so that it includes at least one contact hole 641 which is electrically insulated from the second-conductivity type semiconductor layer 613 and the active layer 612 and extends from one surface of the first electrode layer 640 to a portion of the first-conductivity type semiconductor layer 611.

Since the contact hole 641 is provided for the current dispersion of the first-conductivity type semiconductor layer 611, the contact hole 641 needs to be electrically separated from the second-conductivity type semiconductor layer 613 and the active layer 612. Therefore, the insulation layer 630 may extend while surrounding the contact hole 641.

Next, referring to FIG. 32C (which is illustrated by inverting FIG. 32B), the nonconductive substrate 680 is removed, and the first-conductivity type semiconductor layer 611, the active layer 612, and a portion of the second-conductivity type semiconductor layer 613 are etched to form an exposed region 614 at a portion of the interface between the second electrode layer 620 and the second-conductivity type semiconductor layer 613.

The exposed region 614 is formed by a selective etching process which etches a portion of the light emitting stack structure 610 but does not etch the second electrode layer 620 including a metal.

As described above, since it is difficult to exactly control the selective etching process of etching a portion of the light emitting stack structure 610, the second electrode layer 620 disposed under the light emitting stack structure 610 may be partially etched. However, in accordance with this embodiment of the present invention, the etching process may be easily performed by forming the etch stop layer 621 in the region to which the etching process is performed. Consequently, it is possible to prevent the metal of the second electrode layer 620 from being attached to the side of the light emitting stack structure 610, thereby reducing a leakage current.

Next, referring to FIG. 32D, a portion of the etch stop layer 621 may be removed in order for electrical connection between the second electrode layer 620 and an external power source (not shown). In this case, an electrode pad part 660 may be formed in the region where the etch stop layer 621 is removed. Furthermore, in order to electrically separate the light emitting stack structure 610 from the electrode pad part 660, an insulation layer 670 may be formed at the inner surface of the light emitting stack structure to which the etching process is performed.

FIGS. 32A through 32D illustrate an example in which an edge of the light emitting stack structure 610 is etched and the exposed region of the second electrode layer 620 is formed at the edge. When the center portion of the light emitting stack structure 610 is etched, the semiconductor light emitting device illustrated in FIG. 27 may be manufactured.

FIGS. 33A through 33D are cross-sectional views illustrating a method for manufacturing a semiconductor light emitting device according to a modified embodiment of the present invention, more specifically, a method for manufacturing the semiconductor light emitting device illustrated in FIGS. 30 and 31. A description of elements the same as those of FIGS. 32A through 32D will be omitted.

Referring to FIG. 33A, a first-conductivity type semiconductor layer 611', an active layer 612', a second-conductivity type semiconductor layer 613', and a second electrode layer 620' are sequentially formed on a nonconductive substrate 680'.

The second electrode layer 620' is stacked while forming an etch stop layer 621 in a region to be exposed by the etching of the first-conductivity type semiconductor layer 611', the active layer 612', and the second-conductivity type semiconductor layer 613'. As illustrated in FIG. 33A, before etching a light emitting stack structure 610' for forming an exposed region 614', the second-conductivity type semiconductor layer 621', the active layer 612', and a portion of the first-conductivity type semiconductor layer 613' are primarily etched. An etch stop layer 621' extends in the second-conductivity type semiconductor layer 621', the active layer 612', and the portion of the first-conductivity type semiconductor layer 613' which are exposed by the primary etching process.

In this case, as illustrated in FIG. 33C, the first-conductivity type semiconductor layer 611' only may be etched during the etching of the light emitting stack structure 610' for forming the exposed region 614' in the second electrode layer 620', thereby obtaining an additional effect that protects the active layer 612'.

Referring to FIG. 33B, an insulation layer 630', a first electrode layer 640', and a conductive substrate 650' are formed on the second electrode layer 620'.

In order for an electrical connection to be made with the first-conductivity type semiconductor layer 611', the first electrode layer 640' is formed so that it includes at least one contact hole 641' which is electrically insulated from the second-conductivity type semiconductor layer 613' and the active layer 612' and extends from one surface of the first electrode layer 640' to a portion of the first-conductivity type semiconductor layer 611'. Since the contact hole 641' is provided for the current dispersion of the first-conductivity type semiconductor layer 611', the contact hole 641' needs to be electrically separated from the second-conductivity type semiconductor layer 613' and the active layer 612'. Therefore, an insulation layer 630' may extend while surrounding the contact hole 641'.

Next, referring to FIG. 33C (which is illustrated by inverting FIG. 33B), an exposed region 614' is formed on the second electrode layer 620' so that a portion of the interface with the second-conductivity type semiconductor layer 613' is exposed. The nonconductive substrate 680' is removed, and the first-conductivity type semiconductor layer 611' is etched. Since the active layer 612' and the second-conductivity type semiconductor layer 613' are etched as illustrated in FIG. 33A, the exposed region 614' may be formed by the etching of the first-conductivity type semiconductor layer 611' only.

As described above, the etching process may be easily performed by forming the etch stop layer 621' in the exposed region of the second electrode layer 620' during the etching of the light emitting stack structure 610'. Furthermore, the active layer 612' may be protected because the first-conductivity type semiconductor layer 611' only is etched by the primary etching process in FIG. 33A.

Next, referring to FIG. 33D, a portion of the etch stop layer 621' formed on the exposed region 614' may be removed in order for an electrical connection between the second electrode layer 620' and the external power source (not shown) to be made. In this case, in order for an electrical connection to the second electrode layer 620' to be made, an electrode pad part 660' may be formed in the region where the etch stop layer 621' is removed. Unlike the process of FIG. 32, only the first-conductivity type semiconductor layer 611' is exposed, and thus it is unnecessary to form an insulation layer in order for electrical separation from the electrode pad part 660'.

When the semiconductor light emitting devices 600, 600' and 700 according to the embodiments of the present invention are packaged, the conductive substrates 650, 650 and 750 are electrically connected to a first lead frame, and the electrode pad parts 660, 660' and 760 are electrically connected to a second lead frame through wires. That is, since the semiconductor light emitting devices 600, 600' and 700 may be packaged in a combined manner of die bonding and wire bonding, maximum luminous efficiency may be ensured and the manufacturing process may be performed at a relatively low cost.

Figure 34:
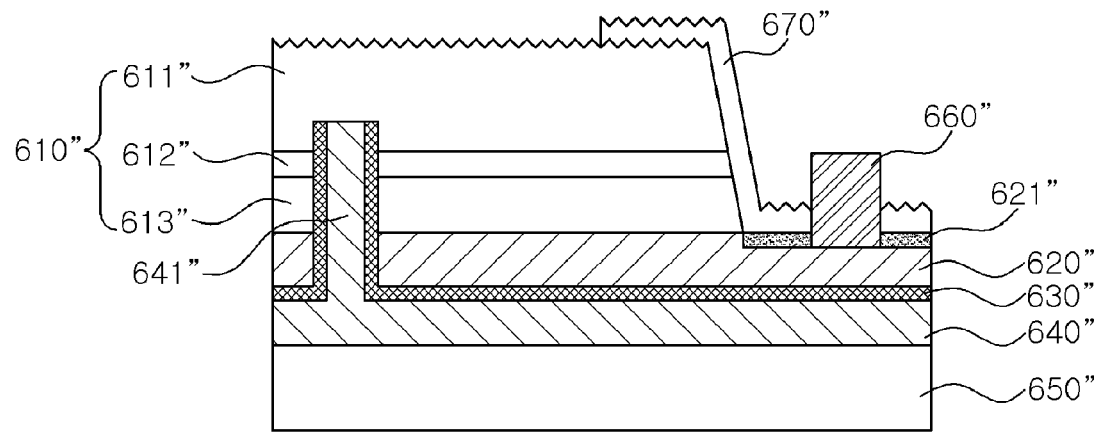

FIG. 34 is a schematic cross-sectional view of a semiconductor light emitting device according to another modified embodiment of the present invention. Referring to FIG. 34, like the above-described embodiments, the semiconductor light emitting device 600" according to the modified embodiment of the present invention includes a first-conductivity type semiconductor layer 611", an active layer 612", a second-conductivity type semiconductor layer 613", a second electrode layer 620", an insulation layer 630", a first electrode layer 640", a conductivity substrate 650", an etch stop layer 621", and an electrode pad part 660", which are sequentially stacked. In order for an electrical connection to be made with the first-conductivity type semiconductor layer 611", the first electrode layer 640" includes at least one contact hole 641" which is electrically insulated from the second-conductivity type semiconductor layer 613" and the active layer 612" and extends from one surface of the first electrode layer 640" to at least a portion of the first-conductivity type semiconductor layer 612". In this modified embodiment, a passivation layer 670" having an uneven structure is further provided. The description of the same elements as those described above will be omitted, and the passivation layer 670" only will be described below.

When the structure provided with the first-conductivity type semiconductor layer 611", the active layer 612", and the second-conductivity type semiconductor layer 613" is defined as a light emitting structure, the passivation layer 670" is formed to cover the side surface of the light emitting structure. Thus, the passivation layer 670" functions to protect the light emitting structure, specifically, the active layer 612". In this case, as illustrated in FIG. 34, the passivation layer 670" may be formed on the top surface of the light emitting structure, as well as the side surface of the light emitting structure, or may also be formed on the top surface of the etch stop layer 620".

In order to perform the function of protecting the light emitting structure, the passivation layer 670" may be formed of silicon oxide or silicon nitride, e.g., $SiO_2$, $SiO_xN_y$, $Si_xN_y$, etc., and may have a thickness of approximately 0.1-2 µm. Accordingly, the passivation layer 670" may have a refractive index of approximately 1.4-2.0. Due to air or package mold structure and refractive index differences, it may be problematic for light emitted from the active layer 670" to be released. In this embodiment, external light extraction efficiency is improved by forming the uneven structure in the passivation layer 670". In particular, as illustrated in FIG. 34, when the uneven structure is formed in a region through which light emitted in a lateral direction relative to the active layer 612" passes, the amount of light emitted to the side surface of the semiconductor light emitting device 600" may increases. Specifically, in a comparison between the case in which the uneven structure is employed in the passivation layer 670"

and the case in which no uneven structure is employed therein, in a state where all elements other than the uneven structure are identical, the light extraction efficiency was improved more than 5%. Meanwhile, although not necessarily required, the uneven structure of the passivation layer 670″ may be formed in a region corresponding to the top surface of the first-conductivity type semiconductor layer 611″. In this case, the light extraction efficiency in a vertical direction may be improved. Furthermore, the uneven structure may be formed in the side surface of the passivation layer 670″.

A semiconductor light emitting device according to another embodiment of the present invention will be described below with reference to FIGS. 35 through 55.

Figure 35:
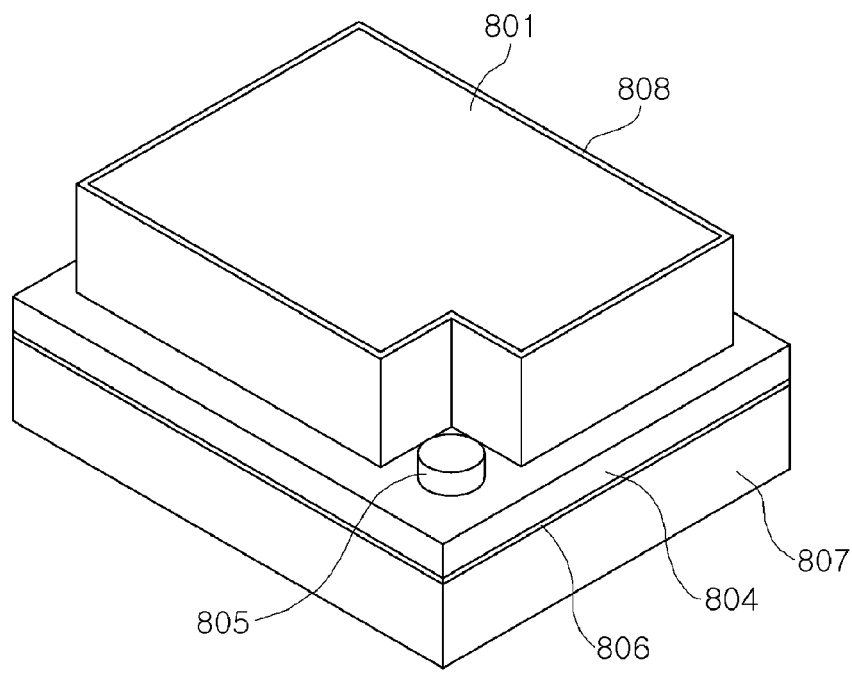
FIGS. 35 through 55 illustrate a semiconductor light emitting device according to another embodiment of the present invention.
Figure 36:
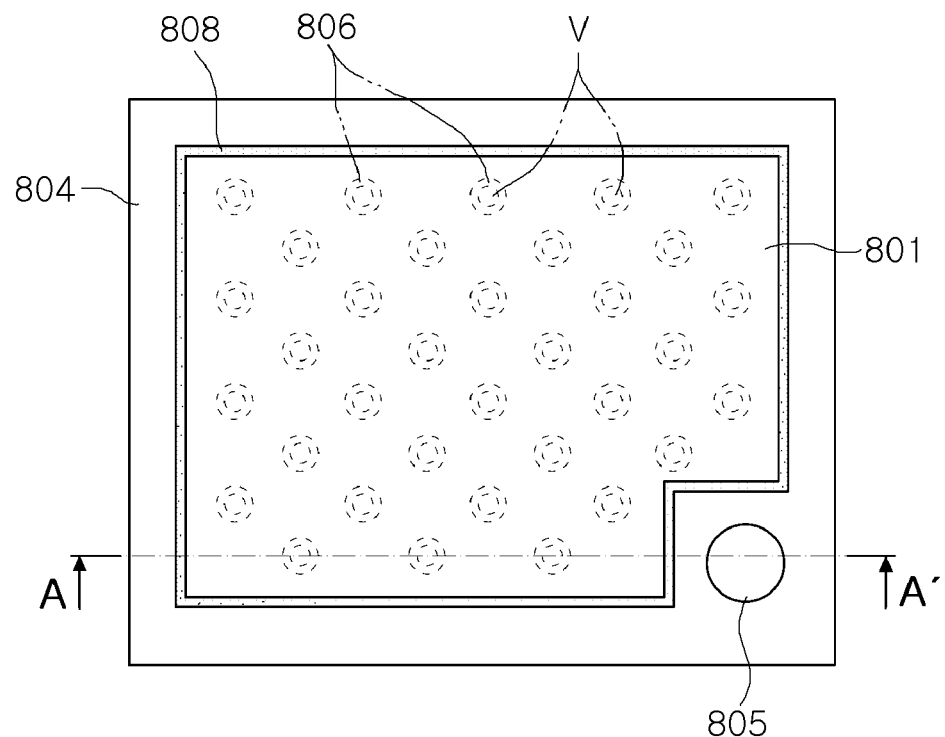
Figure 37:
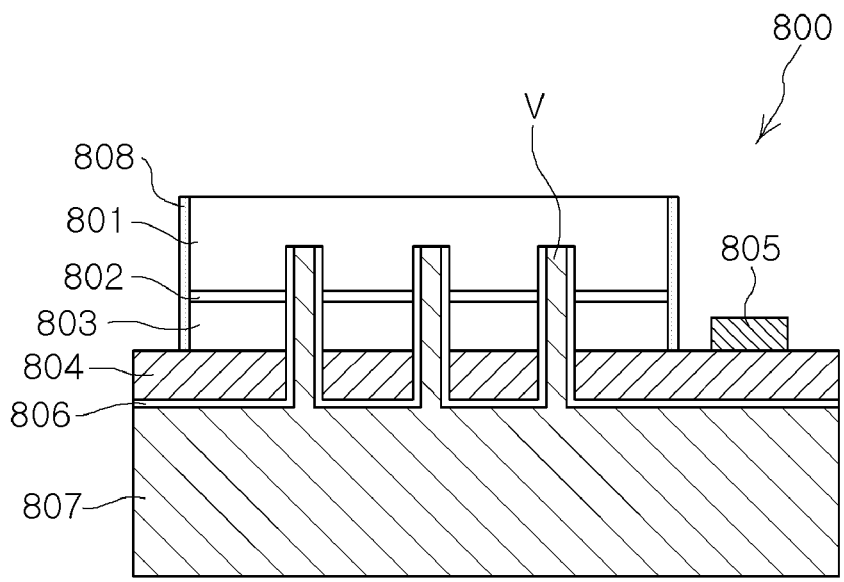

FIG. 35 is a schematic perspective view of a semiconductor light emitting device according to another embodiment of the present invention. FIG. 36 is a top plan view of the semiconductor light emitting device illustrated in FIG. 35. FIG. 37 is a cross-sectional view taken along line A-A' of FIG. 36. Referring to FIGS. 35 through 37, the semiconductor light emitting device 800 according to this embodiment of the present invention includes a first-conductivity type contact layer 804 on a conductive substrate 807. A light emitting structure is formed on the first-conductivity type contact layer 804. The light emitting structure includes a first-conductivity type semiconductor layer 803, an active layer 802, and a second-conductivity type semiconductor layer 801. A high resistance part 808 is formed at the side surface of the light emitting structure. As will be described later, the high resistance part 808 may be obtained by injecting ions into the side surface of the light emitting structure. The first-conductivity type contact layer 804 is electrically separated from the conductive substrate 807. To this end, an insulator 806 is disposed between the first-conductivity type contact layer 804 and the conductive substrate 807.

In this embodiment, the first-conductivity type semiconductor layer 803 and the second-conductivity type semiconductor layer 801 may be a p-type semiconductor layer and an n-type semiconductor layer, respectively, and may be formed of nitride semiconductors. In this embodiment, the first-conductivity type and the second-conductivity type may be understood as, but are not limited to, p-type and n-type, respectively. The first-conductivity type semiconductor layer 803 and the second-conductivity type semiconductor layer 801 have a composition of $Al_xIn_yGa_{(1-x-y)}N$ (where $0 \leq x \leq 1$, $0 \leq y \leq 1$, $0 \leq x+y \leq 1$), e.g., GaN, AlGaN, InGaN, etc. The active layer 802 formed between the first-conductivity type semiconductor layer 803 and the second-conductivity type semiconductor layer 801 emits light having a predetermined energy due to the recombination of electrons and holes and may have a multiple quantum well (MQW) structure in which a quantum well layer and a quantum barrier layer are alternately stacked. For example, an InGaN/GaN structure may be used for the multiple quantum well structure.

The first-conductivity type contact layer 804 may reflect light emitted from the active layer 802 toward the top of the semiconductor light emitting device 800, i.e., the second-conductivity type semiconductor layer 801. Furthermore, the first-conductivity type contact layer 804 may form an ohmic contact with the first-conductivity type semiconductor layer 803. Considering this function, the first-conductivity type contact layer 804 may include Ag, Ni, Al, Rh, Pd, Ir, Ru, Mg, Zn, Pt, or Au. In this case, although not illustrated in detail, the first-conductivity type contact layer 804 may have a structure capable of improving the reflection efficiency. Specifically, the first-conductivity type contact layer 804 may have a structure including at least one of Al, Ag, Ni/Ag, Zn/Ag, Ni/Al, Zn/Al, Pd/Ag, Pd/Al, Ir/Ag, Ir/Au, Pt/Ag, Pt/Al, Ni/Ag/Pt, and combinations thereof. In this embodiment, a portion of the first-conductivity type contact layer 804 may be exposed to the outside. As illustrated, the exposed region may be a region where the light emitting structure is not formed. The exposed region of the first-conductivity type contact layer 804 corresponds to an electrical connection part for applying an electric signal, and an electrode pad 805 may be formed on the exposed region of the first-conductivity type contact layer 804.

Figure 38:
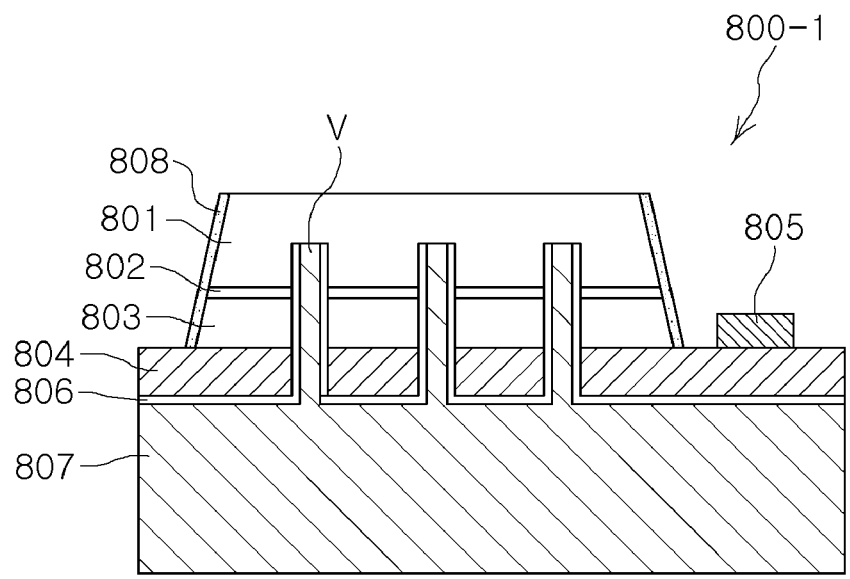

As will be described later, the conductive substrate 807 functions as a support body which supports the light emitting structure in a laser lift-off process or the like. The conductive substrate 807 may include at least one material selected from the group consisting of Au, Ni, Al, Cu, W, Si, Se, and GaAs, for example, pure Cu or AlSi, a combination of Si and Al. In this case, the conductive substrate 807 may be formed using a plating method or a bonding method according to the selected material. In this embodiment, the conductive substrate 807 is electrically connected to the second-conductivity type semiconductor layer 801. Accordingly, the electric signal may be applied to the second-conductivity type semiconductor layer 801 through the conductive substrate 807. To this end, as illustrated in FIGS. 37 and 38, it is necessary to provide a conductive via v which extends from the conductive substrate 807 and is electrically connected to the second-conductivity type semiconductor layer 801.

The conductive via v is connected to the inside of the second-conductivity type semiconductor layer 801. To reduce the contact resistance, the number, shape and pitch of the conductivity via v and its contact area with the second-conductivity type semiconductor layer 801 may be appropriately adjusted. In this case, since the conductive via v needs to be electrically separated from the active layer 802, the first-conductivity type semiconductor layer 803, and the first-conductivity type contact layer 804, an insulator 806 is formed between the conductive via v and the respective layers 802, 803 and 804. The insulator 806 may be formed of any material if it has an electrical insulation characteristic. Preferably, the insulator 806 is formed of a material which absorbs low amounts of light. For example, the insulator 806 may be formed of silicon oxide, silicon nitride, or another insulating material, e.g., $SiO_2$, $SiO_xN_y$, $Si_xN_y$, etc.

As described above, in this embodiment, the conductive substrate 807 is electrically connected to the second-conductivity type semiconductor layer 801 through the conductive via v, and it is unnecessary to separately form an electrode on the top surface of the second-conductivity type semiconductor layer 801. Accordingly, the amount of light emitted to the top surface of the second-conductivity type semiconductor layer 801 may increase. In this case, since the conductive via v is formed at a portion of the active layer 802, the light emitting region is reduced. However, since no electrode is formed on the top surface of the second-conductivity type semiconductor layer 801, light extraction efficiency may be further improved. Meanwhile, in the semiconductor light emitting device 800 according to this embodiment of the present invention, since no electrode is disposed on the top surface of the second-conductivity type semiconductor layer 801, the entire electrode arrangement is similar to a horizontal electrode structure rather than a vertical electrode structure. However, the current dispersion effect may be sufficiently ensured by the conductive via v formed in the inside of the second-conductivity type semiconductor layer 801.

The high resistance part 808 is formed on the side surface of the light emitting structure and functions to protect the light emitting structure, in particular, the active layer 802, from the outside, thereby improving the electrical reliability of the semiconductor light emitting device. Since the active layer 802 exposed to the outside may act as a current leakage path during the operation of the semiconductor light emitting device 800, current leakage may be prevented by forming the high resistance part 808 with a relatively high electric resistance on the side surface of the light emitting structure. In this case, the high resistance part 808 may be formed by ion implantation. Specifically, when ions accelerated by a particle accelerator are injected into the light emitting structure, the crystals of the semiconductor layer constituting the light emitting structure are damaged and electrical resistance is increased. Since the injected ions may be recovered by a thermal treatment, ions having a relatively large particle size may be used so that they are not recovered during a general thermal treatment temperature of the semiconductor layer. For example, ions of atoms such as Ar, C, N, Kr, Xe, Cr, O, Fe, or Ti may be used as the ions which are injected into the light emitting structure.

FIGS. 38 and 39 are schematic cross-sectional views of a semiconductor light emitting device according to a modified embodiment of the present invention. In the case of the semiconductor light emitting device 800-1 illustrated in FIG. 38, the side surface of the light emitting structure is inclined with respect to the first-conductivity type contact layer 804. Specifically, the side surface of the light emitting structure is inclined toward the top surface of the light emitting structure. As described above, the inclined shape of the semiconductor light structure may be naturally formed by a process of etching the light emitting structure in order to expose the first-conductivity type contact layer 804. In the case of the light emitting device 800-2 illustrated in FIG. 39, an uneven structure is formed on the top surface of the light emitting structure provided in the embodiment of FIG. 38, specifically, the top surface of the second-conductivity type semiconductor layer 801. Although the uneven structure may be formed by a dry etching process or a wet etching process, it is preferable that the uneven structure having an irregular size, shape and period is formed by a wet etching process. Such an uneven structure may increase the probability light incident from the active layer 802 be emitted the outside. Meanwhile, the modified embodiments of FIGS. 38 and 39 may also be applied to other embodiments of FIGS. 40 through 42.

Figure 40:
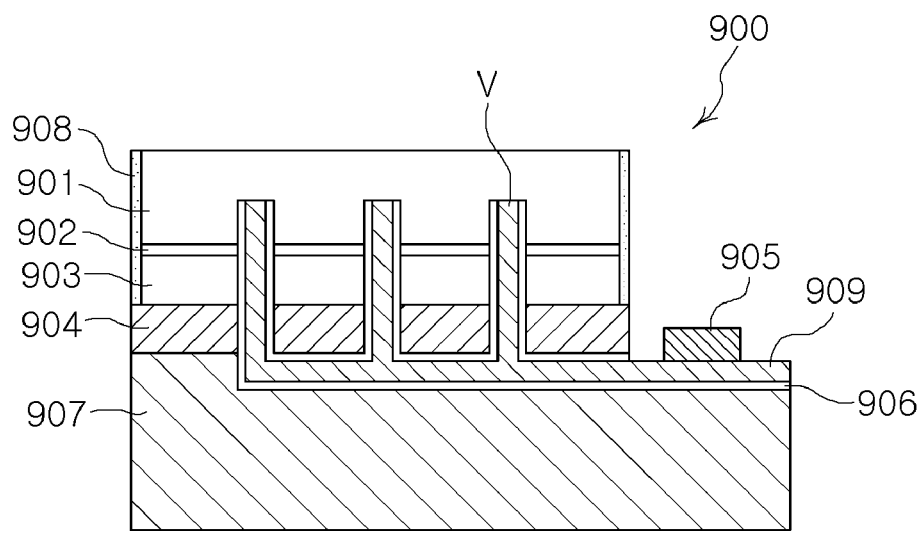

FIG. 40 is a schematic cross-sectional view of a semiconductor light emitting device according to another embodiment of the present invention. Referring to FIG. 40, the semiconductor light emitting device 900 according to this embodiment of the present invention includes a first-conductivity type contact layer 904 on a conductive substrate 907. A light emitting structure is formed on the first-conductivity type contact layer 904. The light emitting structure includes a first-conductivity type semiconductor layer 903, an active layer 902, and a second-conductivity type semiconductor layer 901. A high resistance part 908 is formed on the side surface of the light emitting structure by ion implantation. A structural difference from the foregoing embodiment is that the conductive substrate 907 is electrically connected to the first-conductivity type semiconductor layer 903, not the second-conductivity type semiconductor layer 901. Hence, the first-conductivity type contact layer 904 is not necessarily required. In this case, the first-conductivity type semiconductor layer 903 and the conductive substrate 907 may directly contact each other.

The second-conductivity type semiconductor layer 901 and the conductive via v connected to the inside thereof pass through the active layer 902, the first-conductivity type semiconductor layer 903, and the first-conductivity type contact layer 904 and are electrically connected to a second-conductivity type electrode 909. The second-conductivity type electrode 909 may include an electrical connection part which extends from the conductive via v to the lateral direction of the light emitting structure and is exposed to the outside. An electrode pad 905 may be formed on the electrical connection part. In this case, an insulator 906 is formed for electrically separating the second-conductivity type electrode 909 and the conductive via v from the active layer 902, the first-conductivity type semiconductor layer 903, the first-conductivity type contact layer 904, and the conductive substrate 907.

Figure 41:
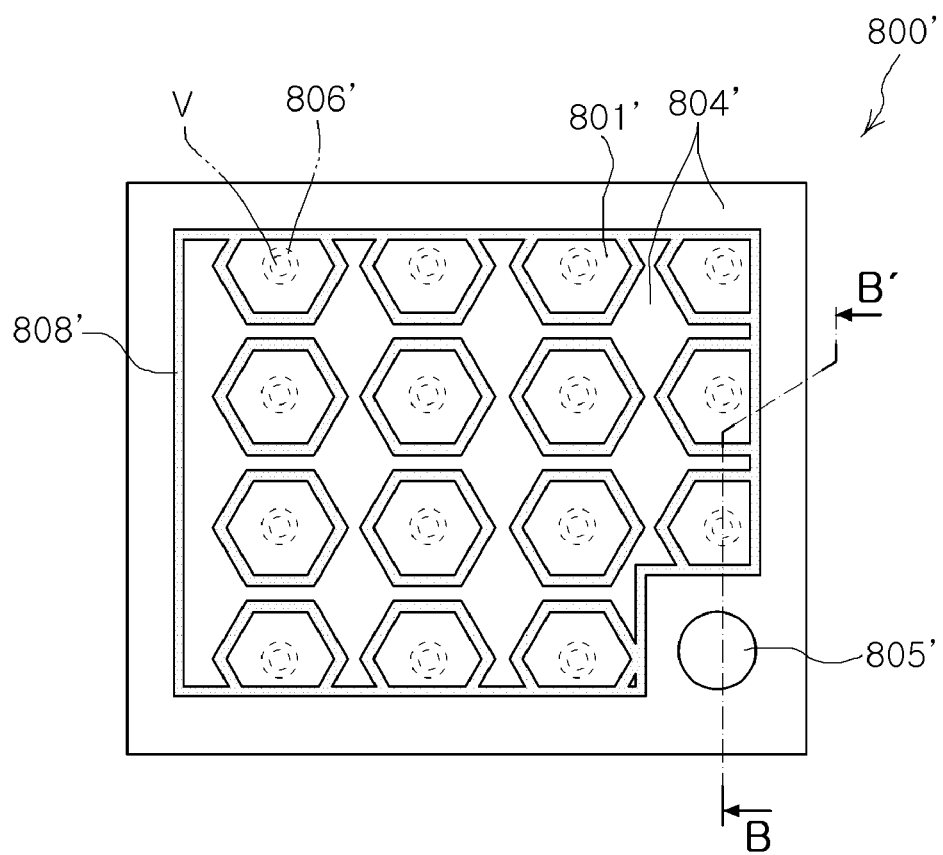
Figure 42:
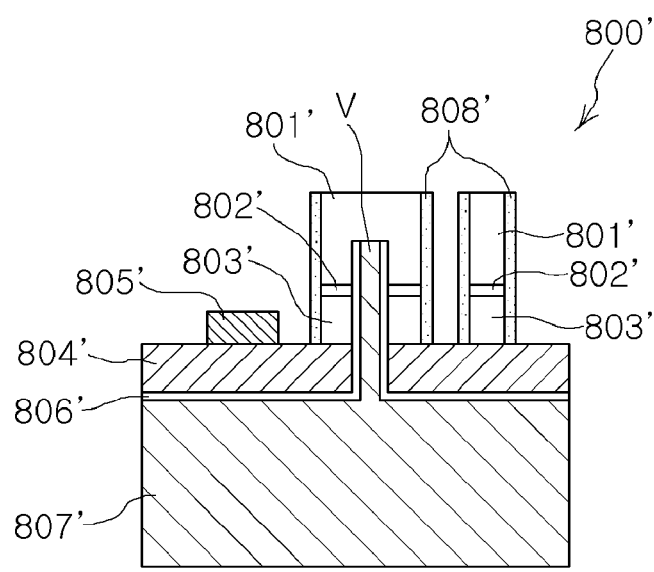

FIG. 41 is a schematic plan view of a semiconductor light emitting device according to another embodiment of the present invention, and FIG. 42 is a schematic cross-sectional view taken along line B-B' of FIG. 41. Like the embodiment of FIGS. 35 through 37, the semiconductor light emitting device according to this embodiment of the present invention includes a first-conductivity type contact layer 804' on a conductive substrate 807'. A light emitting structure is formed on the first-conductivity type contact layer 804'. The light emitting structure includes a first-conductivity type semiconductor layer 803', an active layer 802', and a second-conductivity type semiconductor layer 801'. A high resistance part 808' is formed on the side surface of the light emitting structure by ion implantation. In addition, the first-conductivity type contact layer 804' is electrically separated from the conductive substrate 807'. To this end, an insulator 806' is disposed between the first-conductivity type contact layer 804' and the conductive substrate 807'. In this embodiment, the light emitting structure on the conductive substrate 807' is divided into a plurality of structures. The divided light emitting structures increase the light scattering effect, thereby improving the light extraction efficiency. In order to ensure a sufficient external area, the light emitting structure may be formed in a hexagonal shape, in a top view, as illustrated in FIG. 41. In this case, as the interval between the light emitting structures increases, the area of the active layer 802' itself is reduced, causing a degradation of luminous efficiency. Thus, the divided light emitting structures may be arranged as closely as possible. As described above, when an etching process is performed for dividing the light emitting structure, it is necessary to protect the side surface of the light emitting structure. Therefore, the high resistance part 808' may be formed on the side surfaces of the divided light emitting structures by ion implantation.

Hereinafter, a method of manufacturing the semiconductor light emitting device having the above-described structure will be described in detail.

FIGS. 43 through 51 are cross-sectional views illustrating a method of manufacturing the semiconductor light emitting device. Specifically, FIGS. 43 through 51 illustrate a method of manufacturing the semiconductor light emitting device described above with reference to FIGS. 35 through 37.

Figure 43:
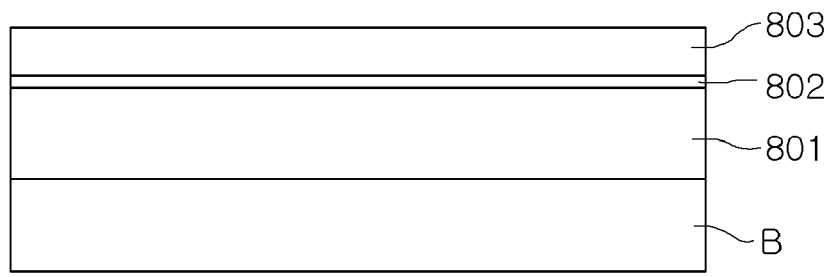

Referring to FIG. 43, a light emitting structure is formed on a semiconductor growth substrate B by sequentially growing a second-conductivity type semiconductor layer 801, an active layer 802, and a first-conductivity type semiconductor layer 803 through a semiconductor layer growth process, e.g., MOCVD, MBE, HYPE, etc. The semiconductor growth substrate B may be formed of sapphire, SiC, $MgAl_2O_4$, MaO, $LiAlO_2$, $LiGaO_2$, or GaN. Sapphire is a crystal having a Hexa-Rhombo R3c symmetry, and has a lattice constant of 13,001 Å along a c-axis and a lattice constant of 4,758 Å along an a-axis. Sapphire has a C(0001) plane, an A(1120) plane, and an R(1102) plane. In this case, the C plane is mainly used as a nitride growth substrate because it facilitates the growth of a nitride thin film and is stable at a high temperature.

Figure 44:
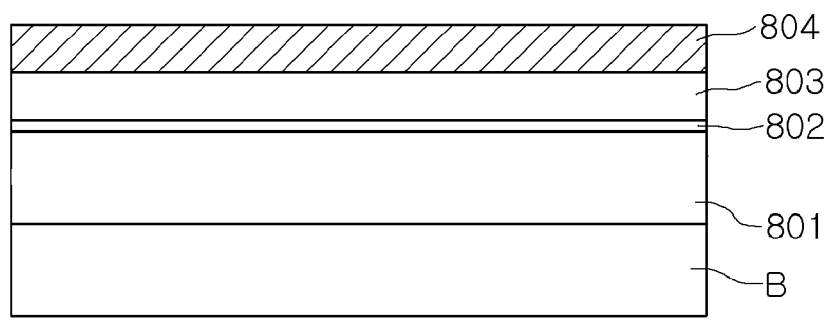
Figure 45:
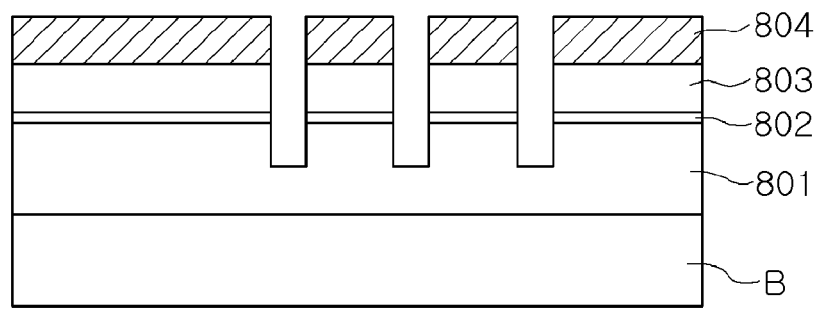

Referring to FIG. 44, a first-conductivity type contact layer 804 is formed on the first-conductivity type semiconductor layer 803. The first-conductivity type contact layer 804 may be formed of Ag, Ni, Al, Rh, Pd, Ir, Ru, Mg, Zn, Pt, or Au, considering the light reflection function and the ohmic contact function with the first-conductivity type semiconductor layer 803. A known process, e.g., a sputtering process or a deposition process, may be appropriately used. Referring to FIG. 45, grooves are formed in the first-conductivity type contact layer 804 and the light emitting structure. Specifically, the grooves are filled with a conductive material in a subsequent process to form a conductive via which is electrically connected to the second-conductivity type semiconductor layer 801. The grooves pass through the first-conductivity type contact layer 804, the first-conductivity type semiconductor layer 803, and the active layer 802, and the second-conductivity type semiconductor layer 801 is exposed at the bottom surfaces of the grooves. The process of forming the grooves in FIG. 45 may also be performed using a known etching process, e.g., ICP-RIE.

Figure 46:
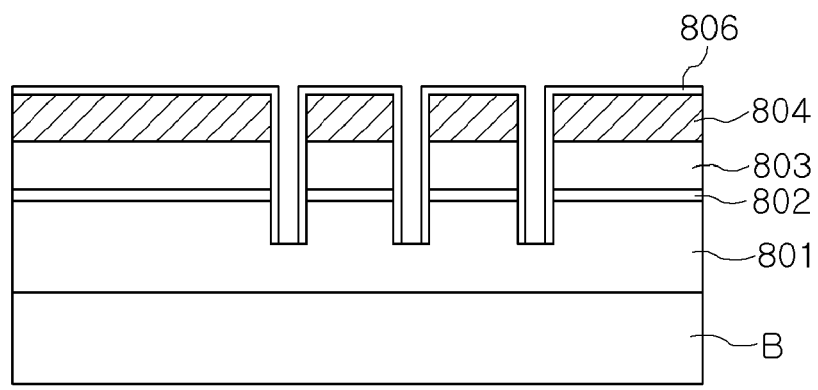

Referring to FIG. 46, a material such as $SiO_2$, $SiO_xN_y$, or $Si_xN_y$ is deposited to form an insulator 806 which covers the top surface of the first-conductivity type contact layer 804 and the sidewalls of the grooves. In this case, at least a portion of the second-conductivity type semiconductor layer 801 corresponding to the bottom surface of the grooves needs to be exposed. Hence, the insulator 806 may be formed so as not to cover the entire bottom surfaces of the grooves.

Figure 47:
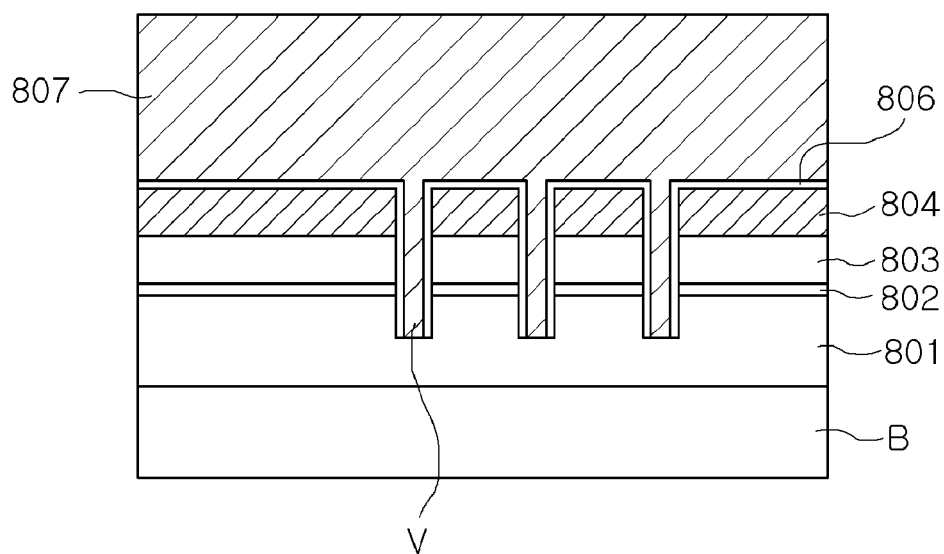

Referring to FIG. 47, a conductive material is formed on the inside of the grooves and the insulator 806 to form a conductive via v and a conductive substrate 807. Accordingly, the conductive substrate 807 is connected to the conductive via v which is connected to the second-conductivity type semiconductor layer 801. The conductive substrate 807 may be formed of a material including any one of Au, Ni, Al, Cu, W, Si, Se, and GaAs. The conductive substrate 807 may be formed using a plating process, a sputtering process, a deposition process, or a bonding process. In this case, the conductive via v and the conductive substrate 807 may be formed of the same material. However, in some cases, the conductive via v and the conductive substrate 807 may be formed of different materials and may be formed by separate processes. For example, after the conductive via v is formed by a deposition process, the conductive substrate 807 having already been formed may be bonded with the light emitting structure.

Figure 48:
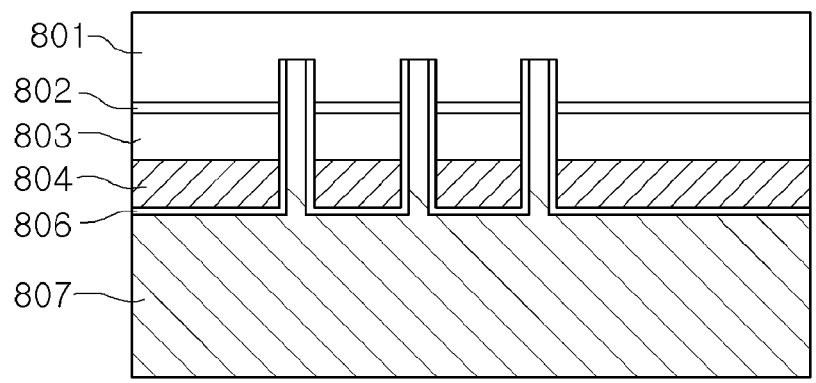

Referring to FIG. 48, the semiconductor growth substrate B is removed to expose the second-conductivity type semiconductor layer 801. In this case, the semiconductor growth substrate B may be removed using a laser lift-off process or a chemical lift-off process. FIG. 48 illustrates the semiconductor light emitting device when the semiconductor growth substrate B is removed. Also, FIG. 48 is turned by 180 degrees compared with FIG. 47.

Figure 49:
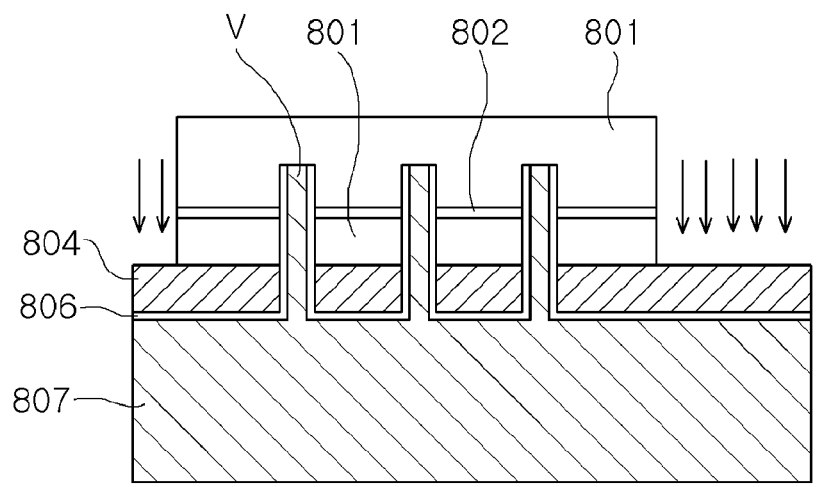
Figure 50:
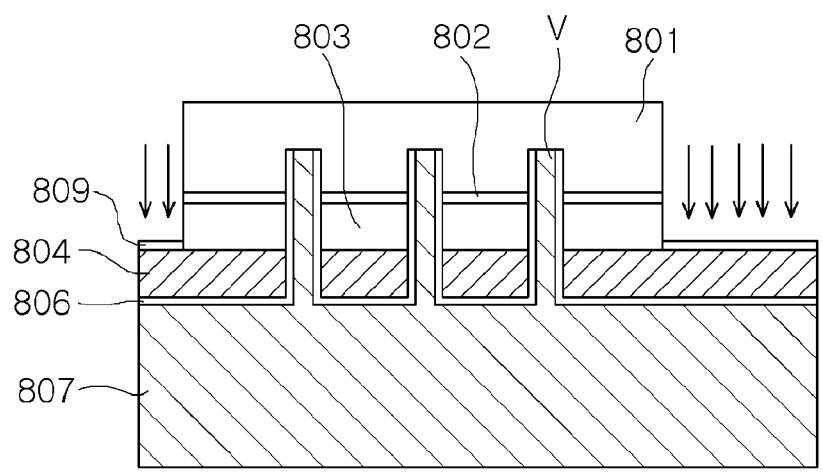

Referring to FIG. 49, a portion of the light emitting structure, i.e., the first-conductivity type semiconductor layer 803, the active layer 802, and the second-conductivity type semiconductor layer 801, is removed to expose the first-conductivity type contact layer 804. This is done for applying the electric signal through the exposed first-conductivity type contact layer 804. As described above, the processing of removing the light emitting structure may be used to divide the light emitting structure into a plurality of structures. Meanwhile, although not illustrated, a process of forming an electrode pad on the exposed region of the first-conductivity type contact layer 804 may be further performed. In order to expose the first-conductivity type contact layer 804, the light emitting structure may be etched using ICP-RIE or the like. In this case, as illustrated in FIG. 50, an etch stop layer 809 may be formed in advance within the light emitting structure in order to prevent the material of the first-conductivity type contact layer 804 from being moved and attached to the side surface of the light emitting structure during the etching process.

Figure 51:
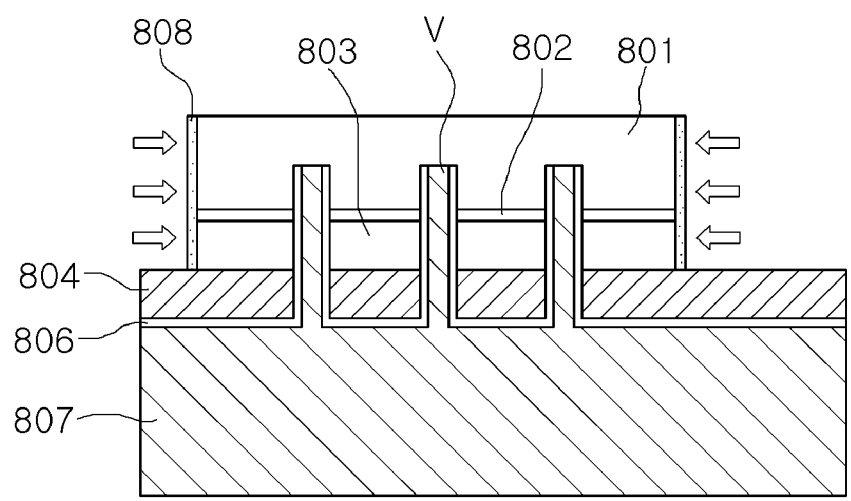

Referring to FIG. 51, a high resistance part 808 having an electrical insulation characteristic is formed on the side surface of the light emitting structure. The high resistance part 808 corresponds to a region where crystals are damaged by ions injected into the side surface of the semiconductor layer constituting the light emitting structure. In this case, since the injected ions may be recovered by a thermal treatment, ions having a relatively large particle size may be used so that they are not recovered during a general thermal treatment temperature of the semiconductor layer. For example, ions of atoms such as Ar, C, N, Kr, Xe, Cr, O, Fe, or Ti may be used as the ions which are injected into the light emitting structure.

FIGS. 52 through 55 are cross-sectional views illustrating a method of manufacturing a semiconductor light emitting device according to another embodiment of the present invention. Specifically, FIGS. 52 through 55 illustrate a method of manufacturing the semiconductor light emitting device described above with reference to FIG. 40. In this case, the processes described above with reference to FIGS. 43 through 45 may be employed in this embodiment. Hereinafter, a subsequent process after forming the grooves in the first-conductivity type contact layer 904 and the light emitting structure will be described below.

Figure 52:
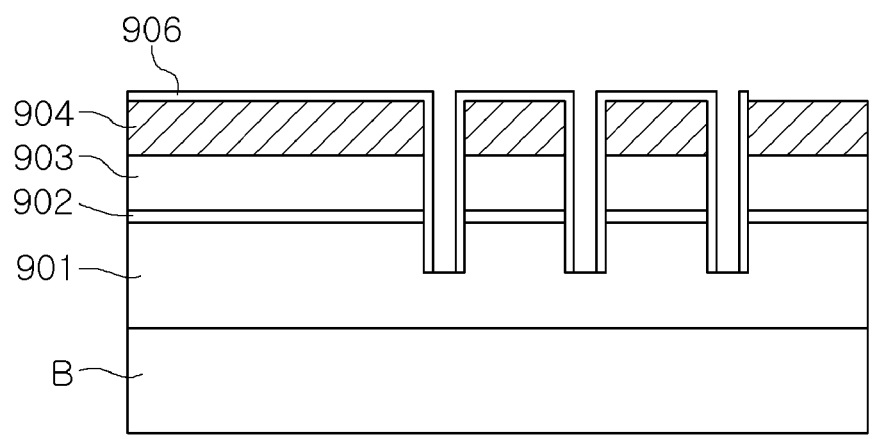

Referring to FIG. 52, a material such as $SiO_2$, $SiO_xN_y$, or $Si_xN_y$ is deposited to form an insulator 906 which covers the top surface of the first-conductivity type contact layer 904 and the sidewalls of the grooves. The insulator 906 may be referred to as a first insulator in order to distinguish from an insulator which is formed to cover a second-conductivity type electrode 909 in a subsequent process. A difference from the foregoing embodiment is that the insulator 906 is not formed on the entire top surface of the first-conductivity type contact layer 904 because the conductive substrate 907 and the first-conductivity type contact layer 904 must be electrically connected together. That is, the insulator 906 may be formed by previously considering a portion of the top surface of the first-conductivity type contact layer 904; specifically, a region where the second-conductivity type electrode 909 connected to the second-conductivity type semiconductor layer 901 will be formed.

Figure 53:
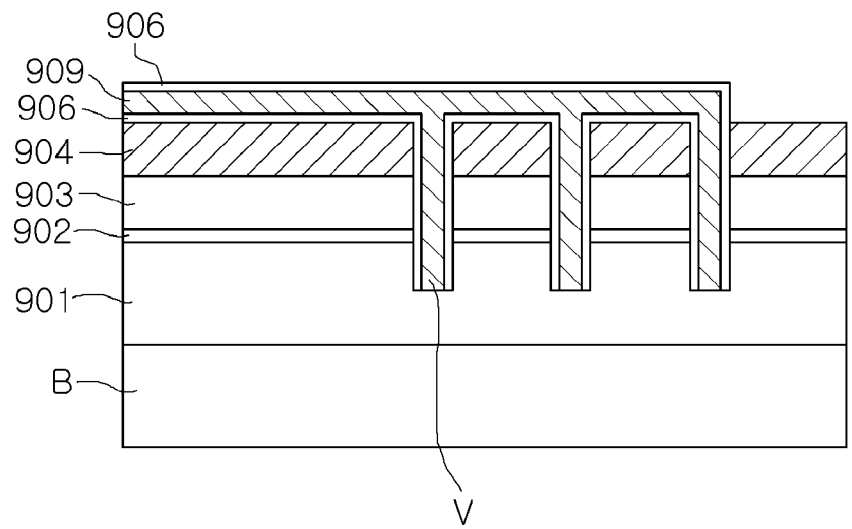

Referring to FIG. 53, a conductive material is formed on the inside of the grooves and the insulator 906 to form the second-conductivity type electrode 909. Accordingly, the second-conductivity type electrode 909 may include a conductive via v which is connected to the second-conductivity type semiconductor layer 901. At this step, the insulator 906 is previously formed in a region where the second-conductivity type electrode 909 will be formed. Thus, the second-conductivity type electrode 909 may be formed along the insulator 906. In particular, the second-conductivity type electrode 909 may extend from the conductive via v in a horizontal direction so that it is exposed to the outside and functions as an electrical connection part.

Figure 54:
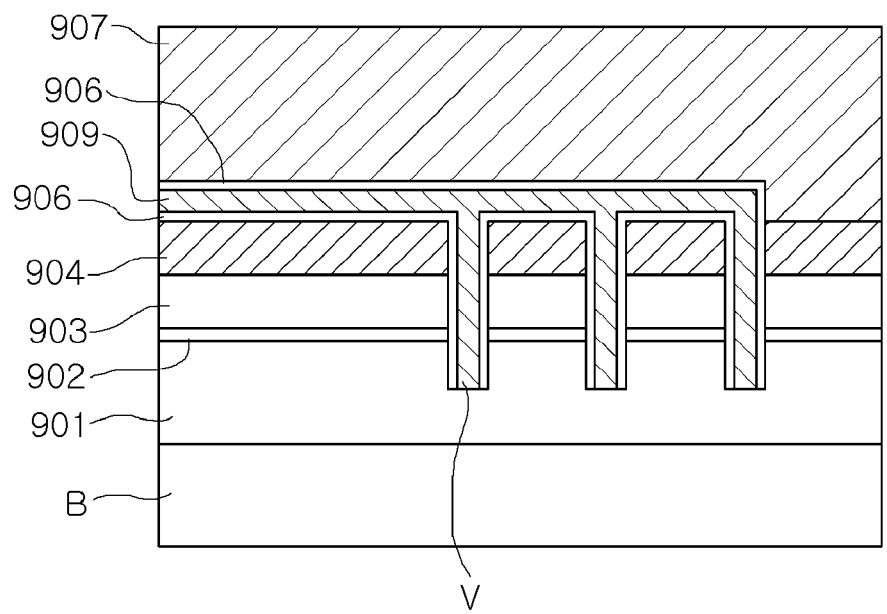
Figure 55:
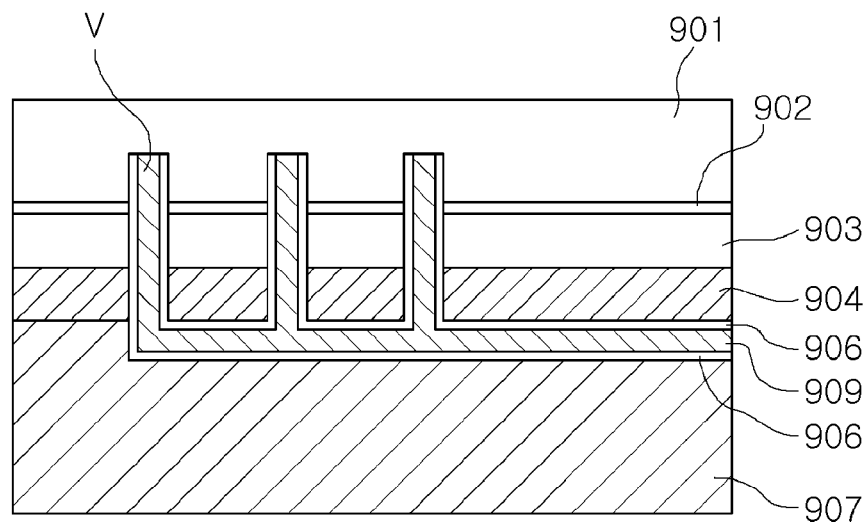

Referring to FIG. 54, an insulator 906 is formed to cover the second-conductivity type electrode 909, and a conductive substrate 907 is formed on the insulator 906 so that it is electrically connected to the first-conductivity type contact layer 904. In this case, the insulator 906 formed in this process may be referred to as a second insulator. The second insulator and the first insulator may constitute a single insulation structure. Due to this process, the second-conductivity type electrode 909 may be electrically separated from the first-conductivity type contact layer 904, the conductive substrate 907, and so on. Referring to FIG. 55, the semiconductor growth substrate B is removed to expose the second-conductivity type semiconductor layer 901. Although not illustrated, a process of removing a portion of the light emitting structure to expose the second-conductivity type electrode 909 and a process of forming a high resistance part 908 by ion implantation into the side surface of the light emitting structure may be performed using the above-described processes.

A semiconductor light emitting device according to another embodiment of the present invention will be described below with reference to FIGS. 56 through 75.

Figure 56:
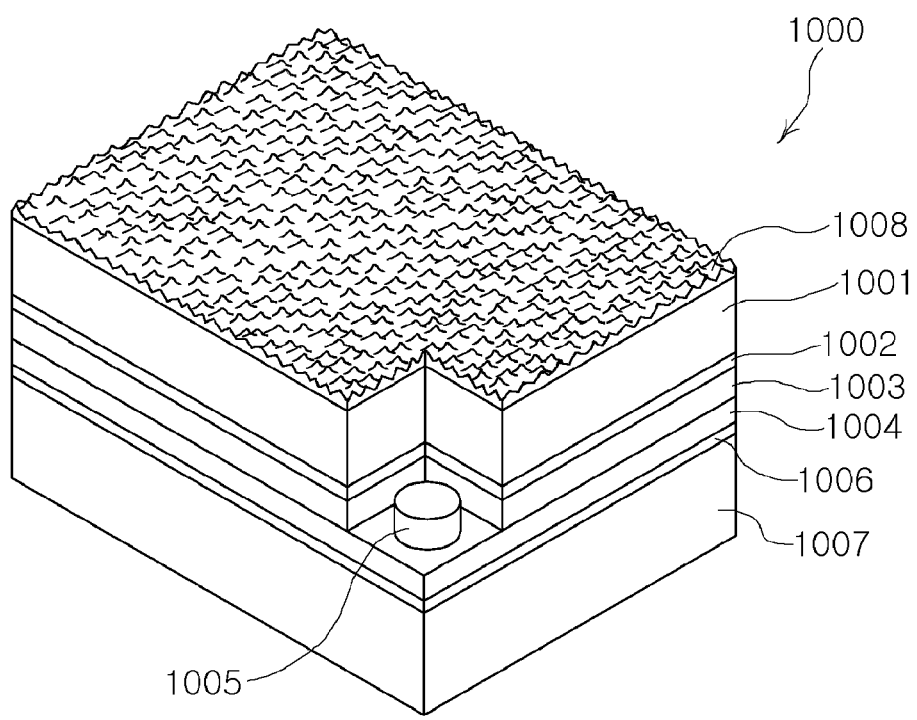
FIGS. 56 through 75 illustrate a semiconductor light emitting device according to another embodiment of the present invention.
Figure 57:
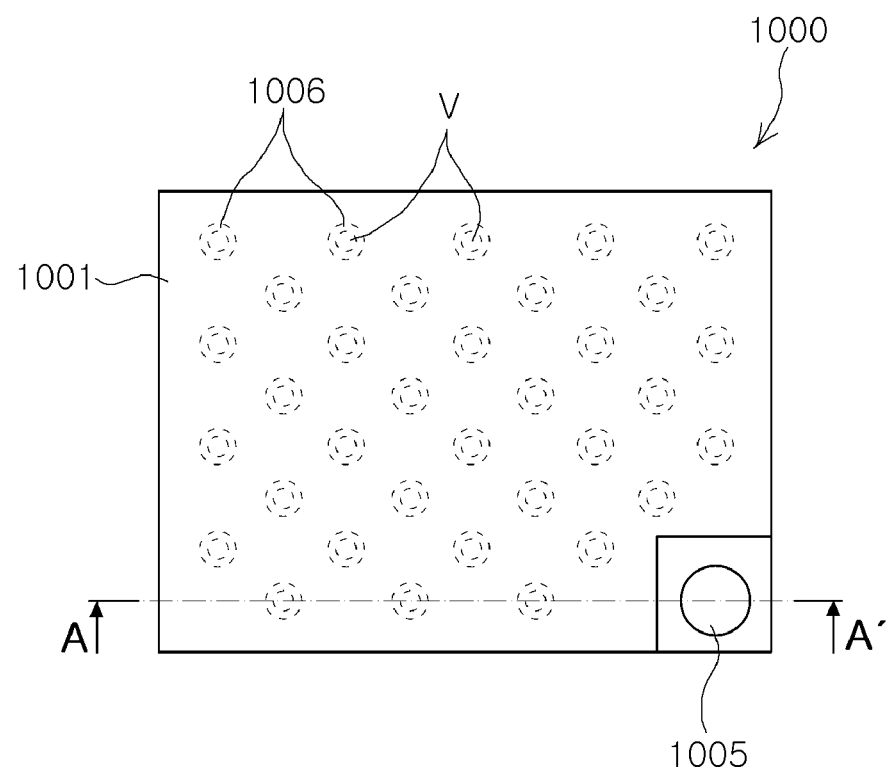
Figure 58:
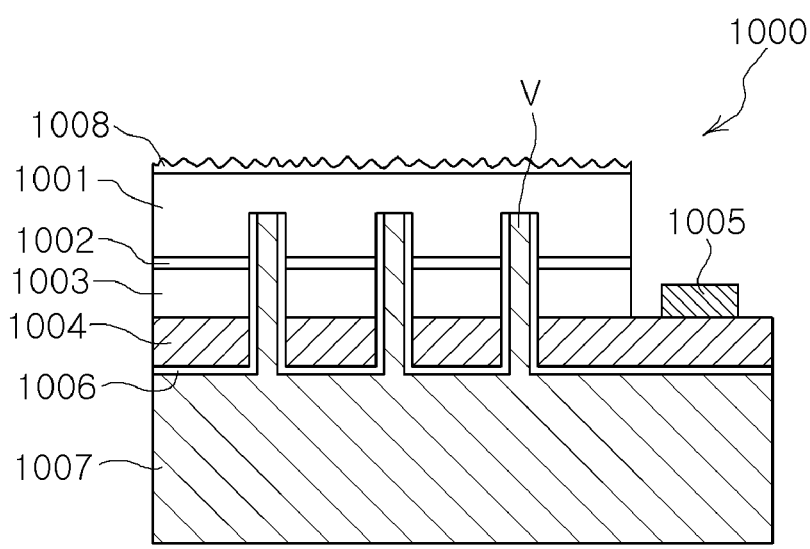

FIG. 56 is a schematic perspective view of a semiconductor light emitting device according to this embodiment of the present invention. FIG. 57 is a schematic plan view illustrating a second-conductivity type semiconductor layer of the semiconductor light emitting device of FIG. 56. FIG. 58 is a schematic cross-sectional view taken along line A-A' of FIG. 57. The semiconductor light emitting device 1000 according to this embodiment of the present invention includes a first-conductivity type contact layer 1004 on a conductive substrate 1007. A light emitting structure is formed on the first-conductivity type contact layer 1004. The light emitting structure includes a first-conductivity type semiconductor layer 1003, an active layer 1002, and a second-conductivity type semiconductor layer 1001. An undoped semiconductor layer 1008 is formed on the second-conductivity type semiconductor layer 1001. Since the undoped semiconductor layer 1008 has an uneven top surface, it is possible to improve the external extraction efficiency of light emitted from the active layer 1002. The first-conductivity type contact layer 1004 is electrically separated from the conductive substrate 1007. To this end, an insulator 1006 is disposed between the first-conductivity type contact layer 1004 and the conductive substrate 1007.

In this embodiment, the first-conductivity type semiconductor layer 1003 and the second-conductivity type semiconductor layer 1001 may be a p-type semiconductor layer and an n-type semiconductor layer, respectively, and may be formed of nitride semiconductors. In this embodiment, the first-conductivity type and the second-conductivity type may be understood as, but are not limited to, p-type and n-type semiconductors, respectively. The first-conductivity type semiconductor layer 1003 and the second-conductivity type semiconductor layer 1001 have a composition of $Al_xIn_yGa_{(1-x-y)}N$ (where $0\leq x\leq 1$, $0\leq y\leq 1$, $0\leq x+y\leq 1$), e.g., GaN, AlGaN, InGaN, etc. The active layer 1002 formed between the first-conductivity type semiconductor layer 1003 and the second-conductivity type semiconductor layer 1001 emits light having a predetermined energy due to the recombination of electrons and holes and may have a multiple quantum well (MQW) structure in which a quantum well layer and a quantum barrier layer are alternately stacked. For example, an InGaN/GaN structure may be used for the multiple quantum well structure.

The first-conductivity type contact layer 1004 may reflect light emitted from the active layer 1002 toward the top of the semiconductor light emitting device 1000, i.e., the second-conductivity type semiconductor layer 1001. Furthermore, the first-conductivity type contact layer 1004 may form an ohmic contact with the first-conductivity type semiconductor layer 1003. Considering this function, the first-conductivity type contact layer 1004 may include Ag, Ni, Al, Rh, Pd, Ir, Ru, Mg, Zn, Pt, or Au. In this case, although not illustrated in detail, the first-conductivity type contact layer 1004 may have a structure capable of improving the reflection efficiency. Specifically, the first-conductivity type contact layer 1004 may have a structure including at least one of Al, Ag, Ni/Ag, Zn/Ag, Ni/Al, Zn/Al, Pd/Ag, Pd/Al, Ir/Ag, Ir/Au, Pt/Ag, Pt/Al, Ni/Ag/Pt, and combinations thereof. In this embodiment, a portion of the first-conductivity type contact layer 1004 may be exposed to the outside. As illustrated, the exposed region may be a region where the light emitting structure is not formed. The exposed region of the first-conductivity type contact layer 1004 corresponds to an electrical connection part for applying an electric signal, and an electrode pad 1005 may be formed on the exposed region of the first-conductivity type contact layer 1004.

As will be described later, the conductive substrate 1007 functions as a support body which supports the light emitting structure in a laser lift-off process or the like. The conductive substrate 1007 may include at least one material selected from the group consisting of Au, Ni, Al, Cu, W, Si, Se, and GaAs, for example, pure Cu or AlSi which is a combination of Si and Al. In this case, the conductive substrate 1007 may be formed using a plating method or a bonding method according to the selected material. In this embodiment, the conductive substrate 1007 is electrically connected to the second-conductivity type semiconductor layer 1001. Accordingly, the electric signal may be applied to the second-conductivity type semiconductor layer 1001 through the conductive substrate 1007. To this end, as illustrated in FIGS. 57 and 58, it is necessary to provide a conductive via v which extends from the conductive substrate 1007 and is electrically connected to the second-conductivity type semiconductor layer 1001.

The conductive via v is connected to the inside of the second-conductivity type semiconductor layer 1001. To reduce the contact resistance, the number, shape and pitch of the conductivity via v and its contact area with the second-conductivity type semiconductor layer 1001 may be appropriately adjusted. In this case, since the conductive via v needs to be electrically separated from the active layer 1002, the first-conductivity type semiconductor layer 1003, and the first-conductivity type contact 1004, an insulator 1006 is formed between the conductivity via v and the respective layers 1002, 1003 and 1004. The insulator 1006 may be formed of any material if it has an electrical insulation characteristic. Preferably, the insulator 1009 is formed of a material which absorbs low amounts of light. For example, the insulator 1006 may be formed of silicon oxide, silicon nitride, or another insulating material, e.g., $SiO_2$, $SiO_xN_y$, $Si_xN_y$, etc.

As described above, in this embodiment, the conductive substrate 1007 is electrically connected to the second-conductivity type semiconductor layer 1001 through the conductive via v, and it is unnecessary to separately form an electrode on the top surface of the second-conductivity type semiconductor layer 1001. Accordingly, the amount of light emitted to the top surface of the second-conductivity type semiconductor layer 1001 may increase. In this case, since the conductive via v is formed at a portion of the active layer 1002, the light emitting region is reduced. However, since no electrode is formed on the top surface of the second-conductivity type semiconductor layer 1001, the light extraction efficiency may be further improved. Meanwhile, in the semiconductor light emitting device 1000 according to this embodiment of the present invention, since no electrode is disposed on the top surface of the second-conductivity type semiconductor layer 1001, the entire electrode arrangement is similar to the horizontal electrode structure rather than the vertical electrode structure. However, the current dispersion effect may be sufficiently ensured by the conductive via v formed in the inside of the second-conductivity type semiconductor layer 1001.

An undoped semiconductor layer 1008 is formed on the top surface of the second-conductivity type semiconductor layer 1001. As will be described later, the undoped semiconductor layer 1008 is used as a buffer layer before the growth of the semiconductor layer constituting the light emitting structure. In this case, the term "undoped" means that no impurity doping process is performed on the semiconductor layer. The impurity concentration originally existing in the semiconductor layer is included. For example, when a nitride gallium semiconductor is grown using MOCVD, an impurity concentration of approximately $10^{16}$-$10^{18}$/cm$^2$ is included, even though Si used as dopant is not intended. In this embodiment, since it is unnecessary to form an electrode on the top surface of the second-conductivity type semiconductor layer 1001, the undoped layer 1008 is not removed. Accordingly, the undoped semiconductor layer 1008 may be formed to cover the entire top surface of the second-conductivity type semiconductor layer 1001. Furthermore, the probability that light incident from the active layer 1002 will be emitted to the outside is increased by forming the uneven structure in the undoped semiconductor layer 1008. Although the structure where the uneven pattern is formed only on the undoped semiconductor layer 1008 has been described above, the uneven pattern may also be formed to a portion of the second-conductivity type semiconductor layer 1001, depending on an etching condition.

If the undoped semiconductor layer 1008 is removed and the uneven structure is formed on the second-conductivity type semiconductor layer 1001, a portion of the second-conductivity type semiconductor layer 1001 may be damaged. In particular, if the process of forming the uneven structure is not controlled precisely, the thickness of the second-conductivity type semiconductor layer 1001 may not be uniform according to product. In this embodiment, in order to solve this problem, the electrode connection structure of the second-conductivity type semiconductor layer 1001 is formed at the lower portion through the inside of the second-conductivity type semiconductor layer 1001, and the uneven pattern is formed on the undoped semiconductor layer 1008 which is not removed.

Figure 59:
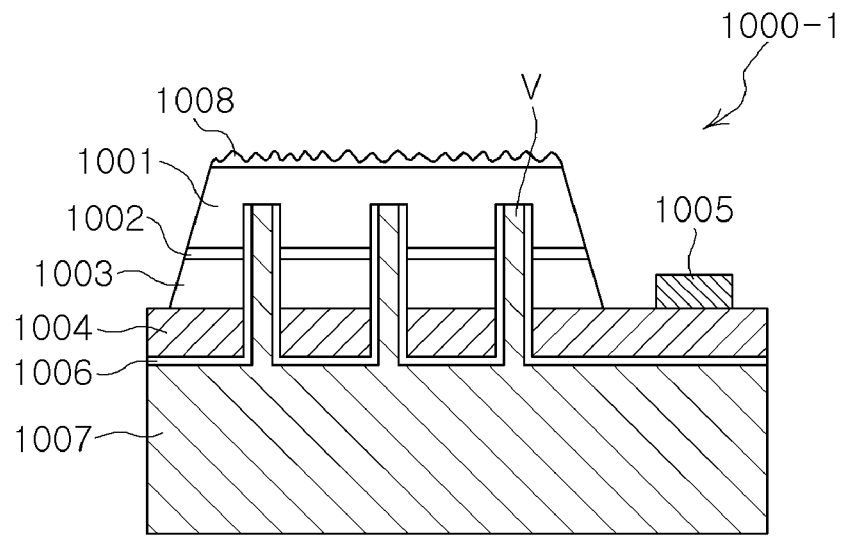
Figure 60:
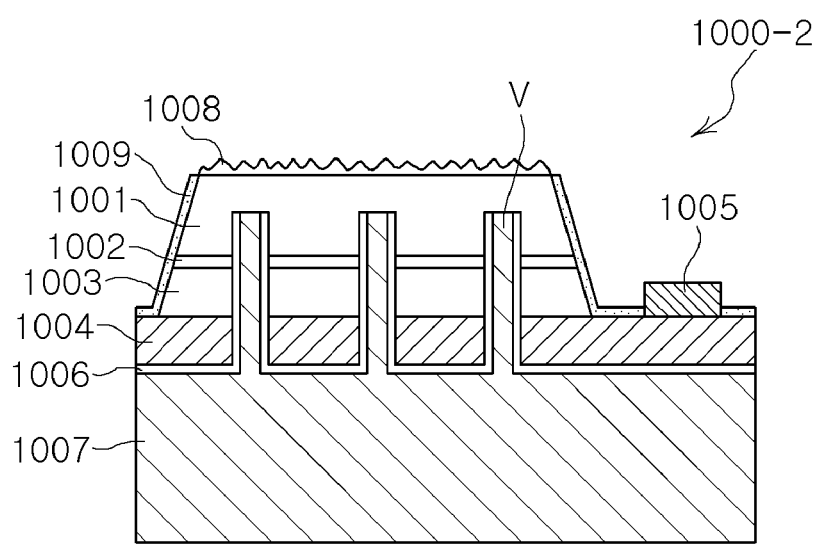

FIGS. 59 and 60 are schematic cross-sectional views illustrating modified embodiments of the semiconductor light emitting device of FIG. 56. In the case of a semiconductor light emitting device 1000-1 illustrated in FIG. 59, the side surface of the light emitting structure is inclined with respect to the first-conductivity type contact layer 1004. Specifically, the side surface of the light emitting structure is inclined toward the top surface of the light emitting structure. As described above, the inclined shape of the semiconductor light structure may be naturally formed by a process of etching the light emitting structure in order to expose the first-conductivity type contact layer 1004. In the case of the light emitting device 1000-2 illustrated in FIG. 60, a passivation layer 1009 is formed to cover the side surface of the light emitting structure illustrated in FIG. 59. The passivation layer 1009 protects the light emitting structure, specifically the active layer 1002, from the outside. The passivation layer 1009 may be formed of silicon oxide or silicon nitride, e.g., SiO$_2$, SiO$_x$N$_y$, or Si$_x$N$_y$ and may be approximately 0.1-2 μm in thickness.

The active layer 1002 exposed to the outside may act as a current leakage path during the operation of the semiconductor light emitting device 1000. However, such a problem can be prevented by forming the passivation layer 1009 on the sides of the light emitting structure. Considering this, as illustrated in FIG. 60, the passivation layer 1009 may extend on the exposed top surface of the first-conductivity type contact layer 1004. Meanwhile, the modified embodiments of FIGS. 59 and 60 may also be applied to other embodiments of FIGS. 61 and 62.

Figure 61:
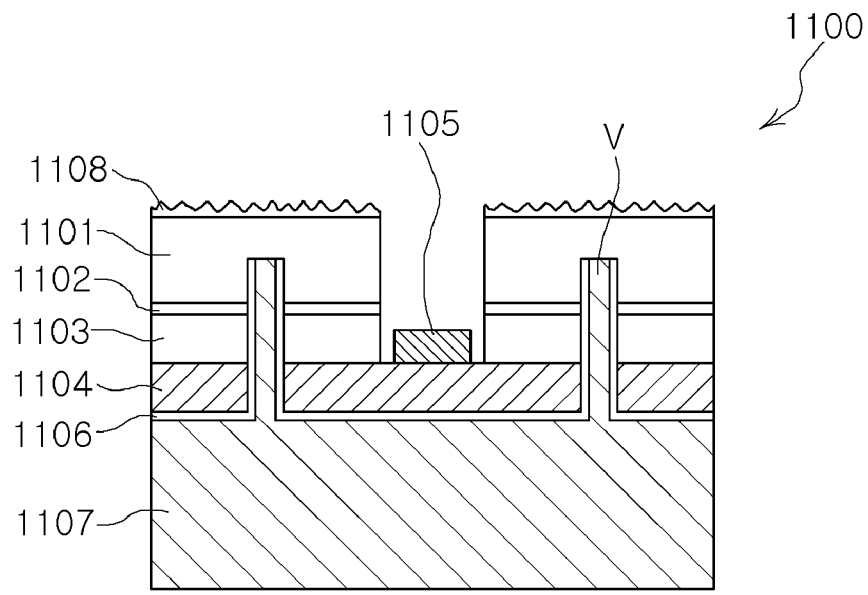

FIG. 61 is a schematic cross-sectional view of a semiconductor light emitting device according to another embodiment of the present invention. Referring to FIG. 61, the semiconductor light emitting device 1100 according to this embodiment of the present invention includes a first-conductivity type contact layer 1104 on a conductive substrate 1107. A light emitting structure is formed on the first-conductivity type contact layer 1104. The light emitting structure includes a first-conductivity type semiconductor layer 1103, an active layer 1102, and a second-conductivity type semiconductor layer 1101. An undoped semiconductor layer 1108 is formed on the second-conductivity type semiconductor layer 1101. The undoped semiconductor layer 1108 has an uneven top surface. In addition, the first-conductivity type contact layer 1104 is electrically separated from the conductive substrate 1107. To this end, an insulator 1106 is disposed between the first-conductivity type contact layer 1104 and the conductive substrate 1107.

Unlike the foregoing embodiment in which the electrical connection part of the first-conductivity type contact layer 1004 is formed in the edge portion of the light emitting structure in a top plan view, the electrical connection part of the first-conductivity type contact layer 1104 according to this embodiment is formed in a region corresponding to the center portion of the light emitting structure in a top plan view. As such, if necessary, the position of the region where the first-conductivity type contact layer 1104 is exposed may be changed. An electrode pad 1105 is formed in the electrical connection part of the first-conductivity type contact layer 1104.

Figure 62:
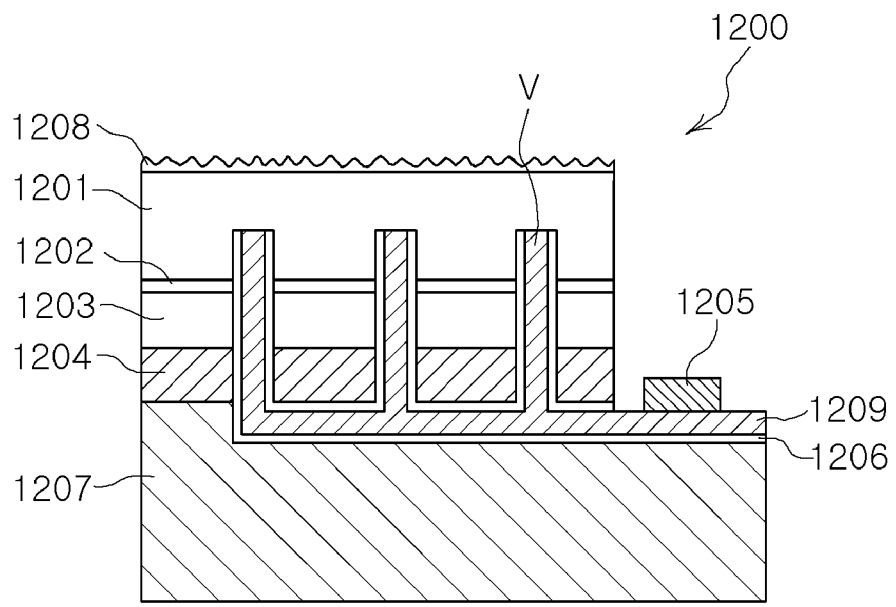

FIG. 62 is a schematic cross-sectional view of a semiconductor light emitting device according to another embodiment of the present invention. Referring to FIG. 62, the semiconductor light emitting device 1200 according to this embodiment of the present invention includes a first-conductivity type contact layer 1204 on a conductive substrate 1207. A light emitting structure is formed on the first-conductivity type contact layer 1204. The light emitting structure includes a first-conductivity type semiconductor layer 1203, an active layer 1202, and a second-conductivity type semiconductor layer 1201. An undoped semiconductor layer 1208 is formed on the light emitting structure, i.e., the second-conductivity type semiconductor layer 1201. A structural difference from the previous embodiment is that the conductive substrate 1207 is electrically connected to the first-conductivity type semiconductor layer 1203, not the second-conductivity type semiconductor layer 1201. Therefore, the first-conductivity type semiconductor layer 1203 is not necessarily required. In this case, the first-conductivity type semiconductor layer 1203 and the conductive substrate 1207 may directly contact each other.

The second-conductivity type semiconductor layer 1201 and the conductive via v connected to the inside thereof pass through the active layer 1202, the first-conductivity type semiconductor layer 1203, and the first-conductivity type contact layer 1204 and are electrically connected to a second-conductivity type electrode 1209. The second-conductivity type electrode 1209 may include an electrical connection part which extends from the conductive via v to the lateral direction of the light emitting structure and is exposed to the outside. An electrode pad 1205 may be formed on the electrical connection part. In this case, an insulator 1206 is formed for electrically separating the second-conductivity type electrode 1209 and the conductive via v from the active layer 1202, the first-conductivity type semiconductor layer 1203, the first-conductivity type contact layer 1204, and the conductive substrate 1207.

Hereinafter, a method of manufacturing the semiconductor light emitting device having the above-described structure will be described in detail.

FIGS. 63 through 71 are cross-sectional views illustrating a method of manufacturing the semiconductor light emitting device according an embodiment of the present invention. Specifically, FIGS. 63 through 71 illustrate a method of manufacturing the semiconductor light emitting device described above with reference to FIGS. 56 through 58.

Figure 63:
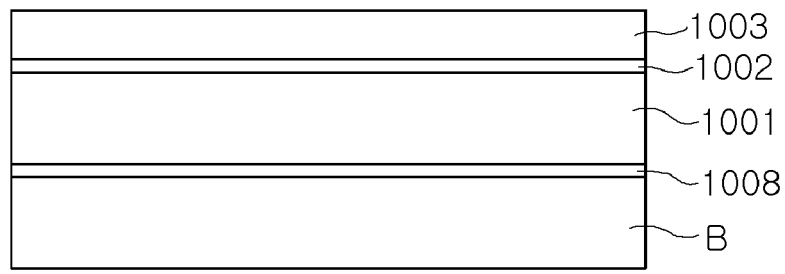

Referring to FIG. 63, a light emitting structure is formed on a semiconductor growth substrate B by sequentially growing a buffer layer 1008, a second-conductivity type semiconductor layer 1001, an active layer 1002, and a first-conductivity type semiconductor layer 1003 through a semiconductor layer growth process, e.g., MOCVD, MBE, HYPE, etc. In this case, although the light emitting structure is defined as a structure including the second-conductivity type semiconductor layer 1001, the active layer 1002, and the first-conductivity type semiconductor layer 1003 in a structural view, but the buffer layer 1008 may be considered as an element of the light emitting structure in view of the growth and etching process. Therefore, hereinafter, the light emitting structure is defined as a structure including the buffer layer 1008, the second-conductivity type semiconductor layer 1001, the active layer 1002, and the first-conductivity type semiconductor layer 1003.

The semiconductor growth substrate B may be formed of sapphire, SiC, $MgAl_2O_4$, MaO, $LiAlO_2$, $LiGaO_2$, or GaN. Sapphire is a crystal having a Hexa-Rhombo R3c symmetry, and has a lattice constant of 13,001 Å along a c-axis and a lattice constant of 4,758 Å along an a-axis. Sapphire has a C(0001) plane, an A(1120) plane, and an R(1102) plane. In this case, the C plane is mainly used as a nitride growth substrate because it facilitates the growth of a nitride thin film and is stable at a high temperature. As described above, the buffer layer 1008 may be provided with an undoped semiconductor layer formed of nitride, and may reduce the lattice defect in the light emitting structure grown thereupon.

Figure 64:
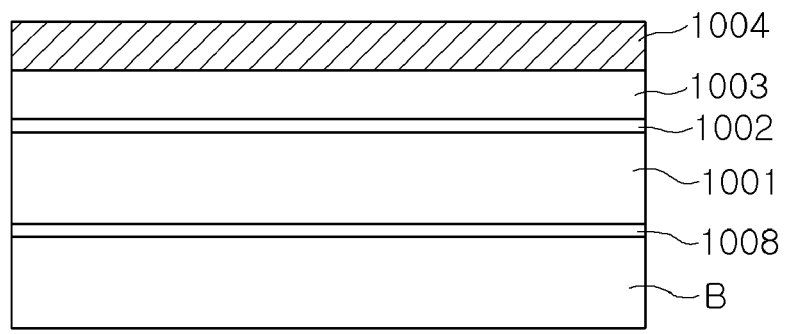
Figure 65:
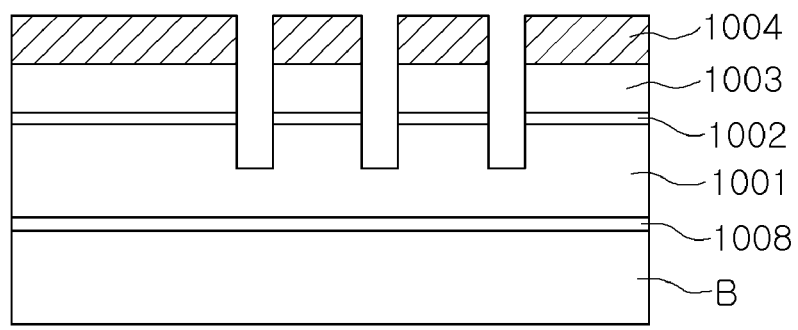

Referring to FIG. 64, a first-conductivity type contact layer 1004 is formed on the first-conductivity type semiconductor layer 1003. The first-conductivity type contact layer 1004 may be formed of Ag, Ni, Al, Rh, Pd, Ir, Ru, Mg, Zn, Pt, or Au, considering the light reflection function and the ohmic contact function with the first-conductivity type semiconductor layer 1003. A known process, e.g., a sputtering process or a deposition process, may be appropriately used. Referring to FIG. 65, grooves are formed in the first-conductivity type contact layer 1004 and the light emitting structure. Specifically, the grooves are filled with a conductive material in a subsequent process to form a conductive via which is electrically connected to the second-conductivity type semiconductor layer 1001. The grooves pass through the first-conductivity type contact layer 1004, the first-conductivity type semiconductor layer 1003, and the active layer 1002, and the second-conductivity type semiconductor layer 1001 is exposed at the bottom surfaces of the grooves. The process of forming the grooves in FIG. 65 may also be performed using a known etching process, e.g., ICP-RIE.

Figure 66:
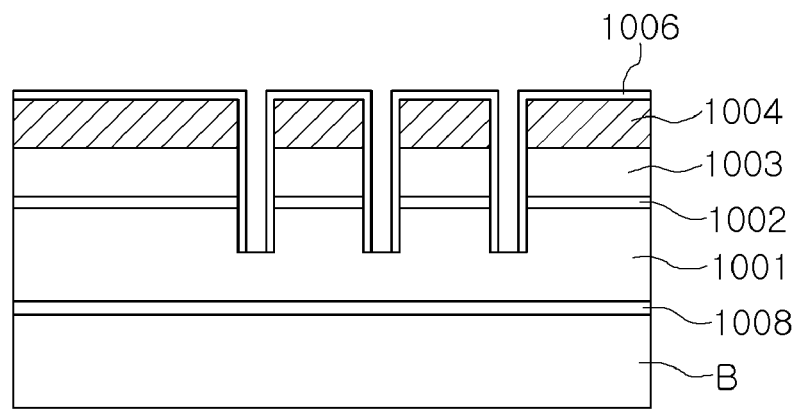

Referring to FIG. 66, a material such as $SiO_2$, $SiO_xN_y$, or $Si_xN_y$ is deposited to form an insulator 1006 which covers the top surface of the first-conductivity type contact layer 1004 and the sidewalls of the grooves. In this case, at least a portion of the second-conductivity type semiconductor layer 1001 corresponding to the bottom surface of the grooves needs to be exposed. Hence, the insulator 1006 may be formed so as not to cover the entire bottom surfaces of the grooves.

Figure 67:
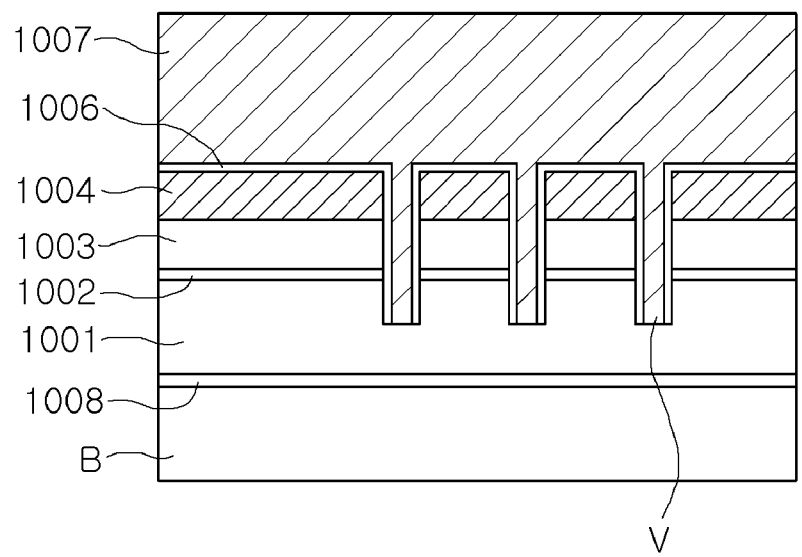

Referring to FIG. 67, a conductive material is formed on the inside of the grooves and the insulator 1006 to form a conductive via v and a conductive substrate 1007. Accordingly, the conductive substrate 1007 is connected to the conductive via v which is connected to the second-conductivity type semiconductor layer 1001. The conductive substrate 1007 may be formed of a material including any one of Au, Ni, Al, Cu, W, Si, Se, and GaAs. The conductive substrate 807 may be formed using a plating process, a sputtering process, a deposition process, or a bonding process. In this case, the conductive via v and the conductive substrate 1007 may be formed of the same material. However, in some cases, the conductive via v and the conductive substrate 1007 may be formed of different materials and may be formed by separate processes. For example, after the conductive via v is formed by a deposition process, the conductive substrate 1007 having already been formed may be bonded with the light emitting structure.

Figure 68:
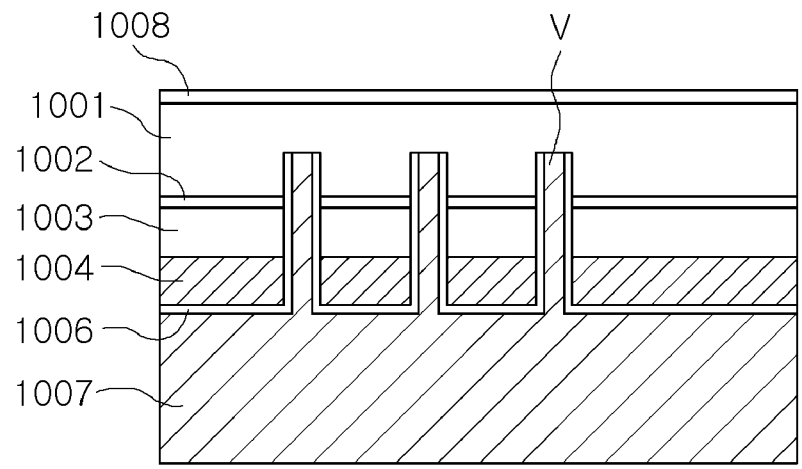

Referring to FIG. 68, the semiconductor growth substrate B is removed to expose the buffer layer 1008. In this case, the semiconductor growth substrate B may be removed using a laser lift-off process or a chemical lift-off process. FIG. 68 illustrates the semiconductor light emitting device when the semiconductor growth substrate B is removed. Also, FIG. 68 is turned by 180 degrees as compared with FIG. 67.

Figure 69:
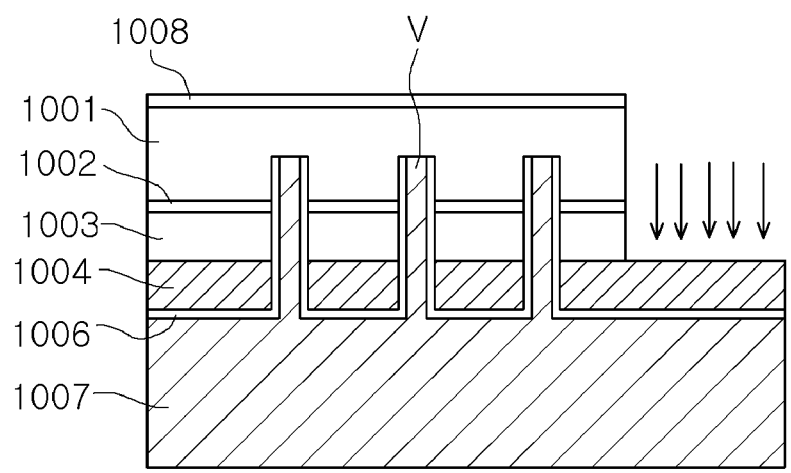
Figure 70:
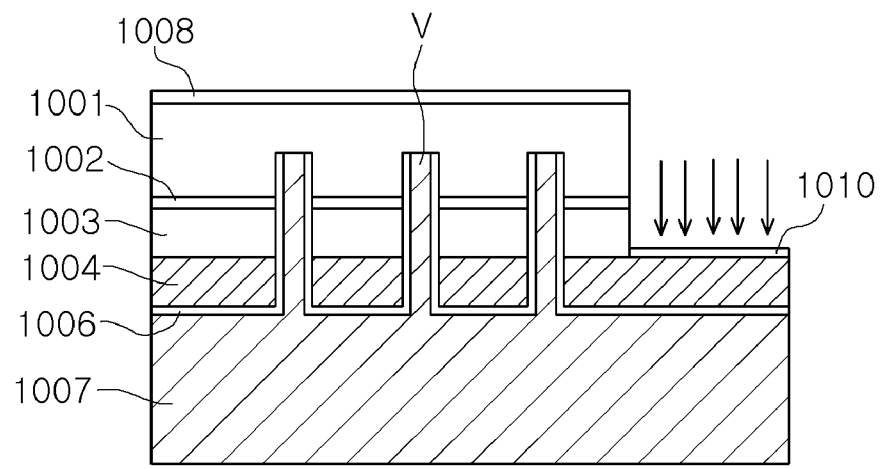

Referring to FIG. 69, a portion of the light emitting structure, i.e., the first-conductivity type semiconductor layer 1003, the active layer 1002, and the second-conductivity type semiconductor layer 1001, is removed to expose the first-conductivity type contact layer 1004. This is done for applying the electric signal through the exposed first-conductivity type contact layer 1004. Although not illustrated, a process of forming an electrode pad on the exposed region of the first-conductivity type contact layer 1004 may be further performed. In order to expose the first-conductivity type contact layer 1004, the light emitting structure may be etched using ICP-RIE or the like. In this case, as illustrated in FIG. 70, an etch stop layer 1010 may be formed in advance within the light emitting structure in order to prevent the material of the first-conductivity type contact layer 1004 from being moved and attached to the side surface of the light emitting structure during the etching process. Furthermore, in order to further ensure the insulation structure, a passivation layer 1009 of FIG. 60 may be formed on the side surface of the light emitting structure after etching the light emitting structure.

Figure 71:
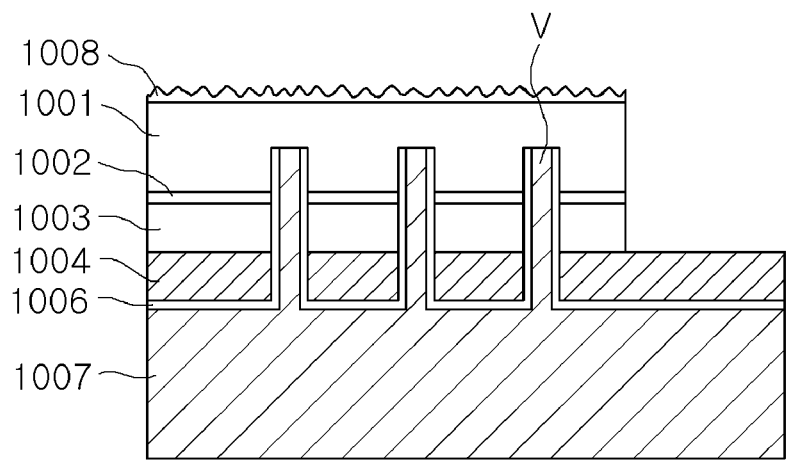

Referring to FIG. 71, an uneven structure is formed in the buffer layer 1008. In this case, the region where the uneven structure is mainly formed is the top surface of the buffer layer 1008 which is exposed by the removal of the semiconductor growth substrate B. The uneven structure may improve light extraction efficiency. In this case, the uneven structure may be formed using a dry etching process or a wet etching process. The uneven structure having facets of an irregular size, shape and period may be formed using a wet etching process. In this embodiment, even though the buffer layer 1008 having a low electrical conductivity is not removed, there is no problem in applying an electric signal to the first-conductivity type semiconductor layer 1001. By forming the uneven structure in the buffer layer 1008, the uniform thickness of the first-conductivity type semiconductor layer 1001 may be ensured.

FIGS. 72 through 75 are cross-sectional views illustrating a method of manufacturing a semiconductor light emitting device according to another embodiment of the present invention. Specifically, FIGS. 72 through 75 illustrate a method of manufacturing the semiconductor light emitting device described above with reference to FIG. 62. In this case, the processes described above with reference to FIGS. 63 through 65 may be employed in this embodiment. Hereinafter, a subsequent process after forming the grooves in the first-conductivity type contact layer 1204 and the light emitting structure will be described below.

Figure 72:
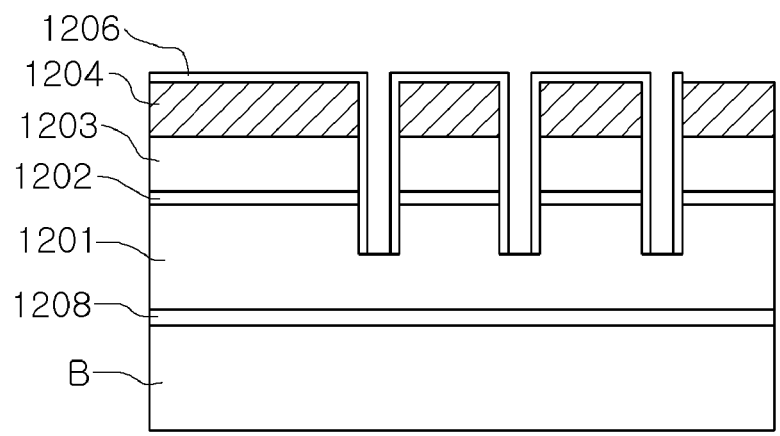

Referring to FIG. 72, a material such as $SiO_2$, $SiO_xN_y$, or $Si_xN_y$ is deposited to form an insulator 1206 which covers the top surface of the first-conductivity type contact layer 1204 and the sidewalls of the grooves. The insulator 1206 may be referred to as a first insulator in order to distinguish it from an insulator which is formed to cover a second-conductivity type electrode 1209 in a subsequent process. A difference from the foregoing embodiment is that the insulator 1206 is not formed on the entire top surface of the first-conductivity type contact layer 1204 because the conductive substrate 1207 and the first-conductivity type contact layer 1204 must be electrically connected together. That is, the insulator 1206 may be formed by previously considering a portion of the top surface of the first-conductivity type contact layer 1204; specifically, a region where the second-conductivity type electrode 1209 connected to the second-conductivity type semiconductor layer 1201 will be formed.

Figure 73:
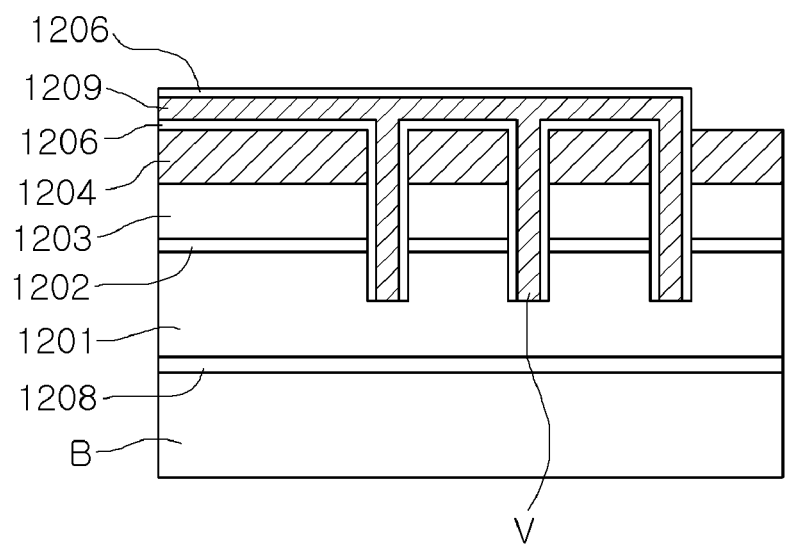

Referring to FIG. 73, a conductive material is formed on the inside of the grooves and the insulator 1206 to form the second-conductivity type electrode 1209. Accordingly, the second-conductivity type electrode 1209 may include a conductive via v which is connected to the second-conductivity type semiconductor layer 1201. At this step, the insulator 1206 is previously formed in a region where the second-conductivity type electrode 1209 will be formed. Thus, the second-conductivity type electrode 1209 may be formed along the insulator 1206. In particular, the second-conductivity type electrode 1209 may extend from the conductive via v in a horizontal direction so that it is exposed to the outside and functions as an electrical connection part.

Figure 74:
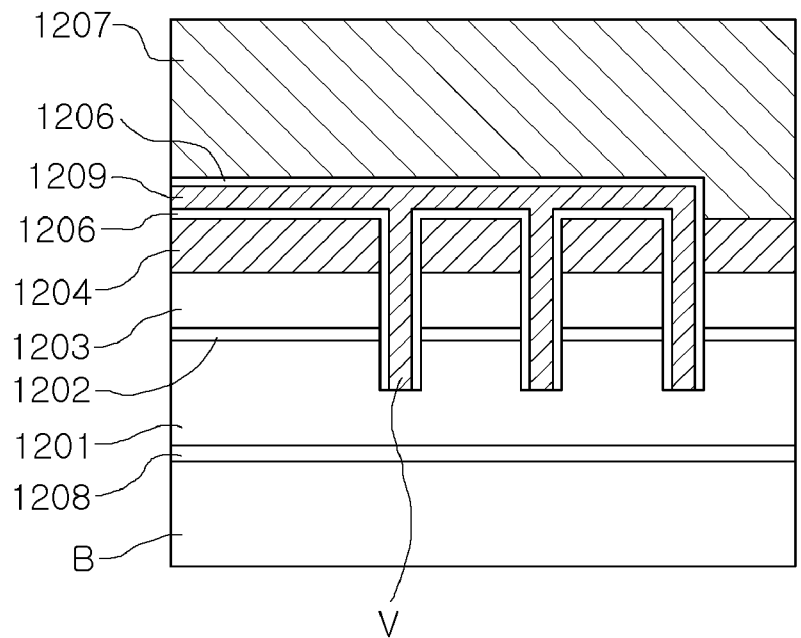
Figure 75:
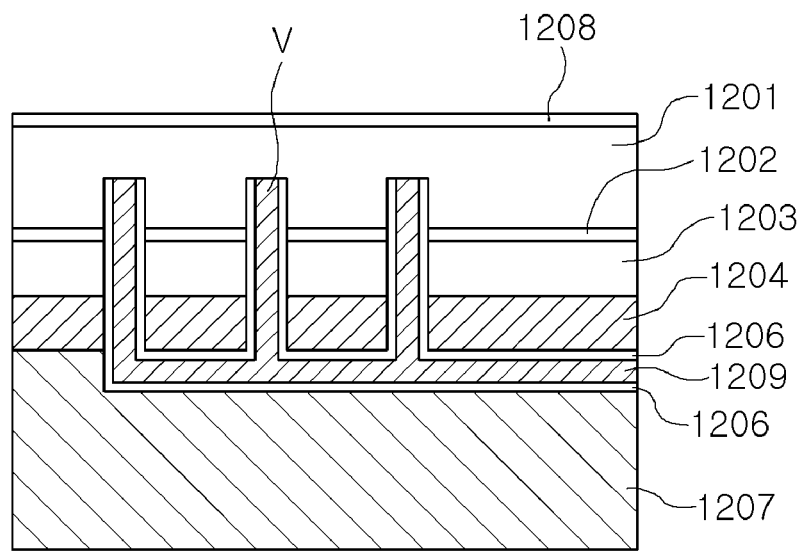

Referring to FIG. 74, an insulator 1206 is formed to cover the second-conductivity type electrode 1209, and a conductive substrate 1207 is formed on the insulator 1206 so that it is electrically connected to the first-conductivity type contact layer 1204. In this case, the insulator 1206 formed in this process may be referred to as a second insulator. The second insulator and the first insulator may constitute a single insulation structure. Due to this process, the second-conductivity type electrode 1209 may be electrically separated from the first-conductivity type contact layer 1204, the conductive substrate 1207, and so on. Referring to FIG. 75, the semiconductor growth substrate B is removed to expose the buffer layer 1208. Although not illustrated, a process of removing a portion of the light emitting structure to expose the second-conductivity type electrode 1209 and a process of forming an uneven structure in the buffer layer 1208 may be performed using the above-described processes.

A semiconductor light emitting device according to another embodiment of the present invention will be described below with reference to FIGS. 76 through 89.

Figure 76:
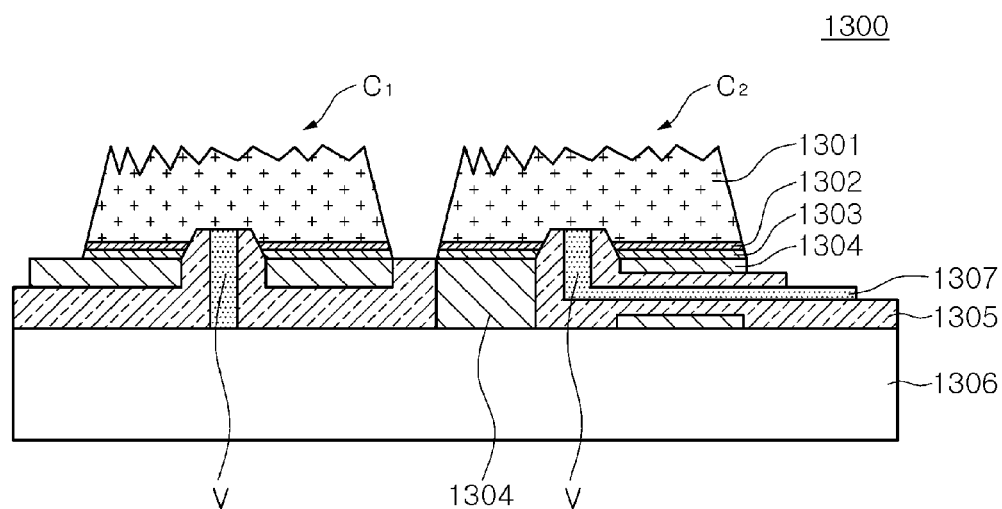
FIGS. 76 through 89 illustrate a semiconductor light emitting device according to another embodiment of the present invention.
Figure 77:
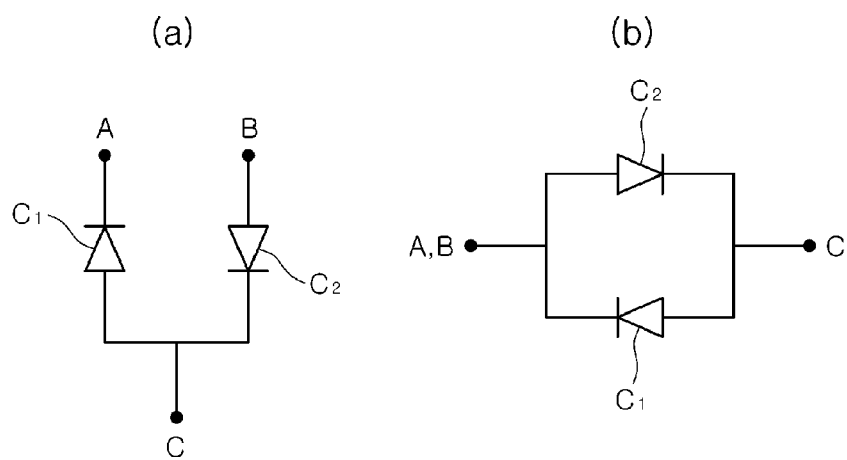

FIG. 76 is a schematic cross-sectional view of a semiconductor light emitting device according to another embodiment of the present invention, and FIG. 77 is a circuit diagram of the semiconductor light emitting device of FIG. 76. Referring to FIG. 76, the semiconductor light emitting device 1300 according to this embodiment of the present invention includes a plurality of light emitting structures C1 and C2 on a substrate 1306. The light emitting structures C1 and C2 are electrically connected together. Hereinafter, the two light emitting structures will be referred to as a first light emitting structure C1 and a second light emitting structure C2, respectively. Each of the first and second light emitting structures C1 and C2 includes a first-conductivity type semiconductor layer 1303, an active layer 1302, and a second-conductivity type semiconductor layer 1301, which are stacked in sequence. Also, the first and second light emitting structures C1 and C2 include a first electrical connection part 1304 and a second electrical connection part 1307 for electrical connection.

The first electrical connection part 1304 is formed under the first-conductivity type semiconductor layer 1303 and may perform an ohmic contact and light reflection function as well as the electrical connection function. The second electrical connection part 1307 is electrically connected to the second-conductivity type semiconductor layer 1301. The second electrical connection part 1307 includes a conductive via v passing through the first electrical connection part 1304, the first-connectivity type semiconductor layer 1303, and the active layer 1302, and thus it may be connected to the second-conductivity type semiconductor layer 1301. The second electrical connection part of the first light emitting structure C1, i.e., the conductive via v is electrically connected to the first electrical connection part 1304 of the second light emitting structure C2 are electrically connected together through the substrate 1306. To this end, the substrate 1306 is formed of a conductive material. Due to such an electrical connection structure, the semiconductor light emitting structure 1300 is operable even though an external AC voltage is applied.

In this embodiment, the first-conductivity type semiconductor layer 1303 and the second-conductivity type semiconductor layer 1301 may be a p-type semiconductor layer and an n-type semiconductor layer, respectively, and may be formed of nitride semiconductors. In this embodiment, the first-conductivity type and the second-conductivity type may be understood as, but are not limited to, p-type and n-type, respectively. The first-conductivity type semiconductor layer 1303 and the second-conductivity type semiconductor layer 1301 have a composition of $Al_xIn_yGa_{(1-x-y)}N$ (where $0 \leq x \leq$, $0 \leq y \leq 1$, $0 \leq x+y \leq 1$), e.g., GaN, AlGaN, InGaN, etc. The active layer 1302 formed between the first-conductivity type semiconductor layer 1303 and the second-conductivity type semiconductor layer 1301 emits light having a predetermined energy due to the electron/hole recombination and may have a multiple quantum well (MQW) structure in which a quantum well layer and a quantum barrier layer are alternately stacked. For example, an InGaN/GaN structure may be used for the multiple quantum well structure.

As described above, the first electrical connection part 1304 may reflect light emitted from the active layer 1302 toward the top of the semiconductor light emitting device 1300, i.e., the second-conductivity type semiconductor layer 1301. Furthermore, the first electrical connection part 104 may form an ohmic contact with the first-conductivity type semiconductor layer 1303. Considering this function, the first electrical connection part 1304 may include Ag, Ni, Al, Rh, Pd, Ir, Ru, Mg, Zn, Pt, or Au. In this case, although not illustrated in detail, the first electrical connection part 1304 may have a structure capable of improving reflection efficiency. Specifically, the first electrical connection part 1304 may have a structure including at least one of Al, Ag, Ni/Ag, Zn/Ag, Ni/Al, Zn/Al, Pd/Ag, Pd/Al, Ir/Ag, Ir/Au, Pt/Ag, Pt/Al, Ni/Ag/Pt, and combinations thereof.

In manufacturing the semiconductor light emitting device 1300, the substrate 1306 functions as a support body which supports the first and second light structures C1 and C2 in a laser lift-off process or the like. A conductive substrate may be used for the electrical connection of the first and second light emitting structures C1 and C2. The substrate 1306 may be formed of a conductive material including any one of Au, Ni, Al, Cu, W, Si, Se, and GaAs, for example, pure Cu or AlSi, a combination of Si and Al. In this case, the substrate 1306 may be formed using a plating method, a deposition method, or a bonding method according to the selected material.

The conductive via v provided in the second electrical connection part 1307 is connected to the inside of the second-conductivity type semiconductor layer 1301. To reduce the contact resistance, the number, shape and pitch of the conductivity via v and its contact area with the second-conductivity type semiconductor layer 1301 may be appropriately adjusted. In this case, since the conductive via v needs to be electrically separated from the active layer 1302, the first-conductivity type semiconductor layer 1303, and the first electrical connection part 1304, an insulator 1305 is formed between the conductivity via v and the respective layers 1302, 1303 and 1304. The insulator 1305 may be formed of any material if it has an electrical insulation characteristic. Preferably, the insulator 806 is formed of a material absorbing low amounts of light. For example, the insulator 1305 may be formed of silicon oxide, silicon nitride, or other insulating material, e.g., $SiO_2$, $SiO_xN_y$, $Si_xN_y$, etc.

In this embodiment, when the second electrical connection part 1307 is formed at a lower portion of the second-conductivity type semiconductor layer 1301, it is unnecessary to separately form an electrode on the top surface of the second-conductivity type semiconductor layer 1301. Accordingly, an amount of light emitted to the top surface of the second-conductivity type semiconductor layer 1301 may increase. In this case, since the conductive via v is formed at a portion of the active layer 1302, the light emitting region is reduced. However, since no electrode is formed on the top surface of the second-conductivity type semiconductor layer 1301, the light extraction efficiency may be further improved. Meanwhile, in the semiconductor light emitting device 1300 according to this embodiment of the present invention, since no electrode is disposed on the top surface of the second-conductivity type semiconductor layer 1301, the entire electrode arrangement is more similar to a horizontal electrode structure rather than a vertical electrode structure. However, the current dispersion effect may be sufficiently ensured by the conductive via v formed in the inside of the second-conductivity type semiconductor layer 1301. In addition, the uneven structure may be formed on the top surface of the second-conductivity type semiconductor layer 1301. Such a structure may increase the probability that light incident from the active layer 1302 will be emitted to the outside.

As described above, the semiconductor light emitting device may be driven at an AC voltage. To this end, as illustrated in FIG. 77, the first light emitting structure C1 and the second light emitting structure C2 form an n-p junction. For example, the n-p junction may be implemented by connecting the second electrical connection part v of the first light emitting structure C1 to the first electrical connection part 1304 of the second light emitting structure C2, and applying an external voltage to the first electrical connection part 1304 of the first light emitting structure C1 and the second electrical connection part 1307 of the second light emitting structure C2. Specifically, in FIG. 77A, terminals A and B correspond to the first electrical connection part 1304 of the first light emitting structure C1 and the second electrical connection part 1307 of the second light emitting structure C2, respectively. A terminal C corresponds to the substrate 1306. In this case, as illustrated in FIG. 77B, an AC light emitting device may be implemented by connecting the terminals A and B and applying an AC signal to the connection node of the terminals A and B and the terminal C.

Figure 78:
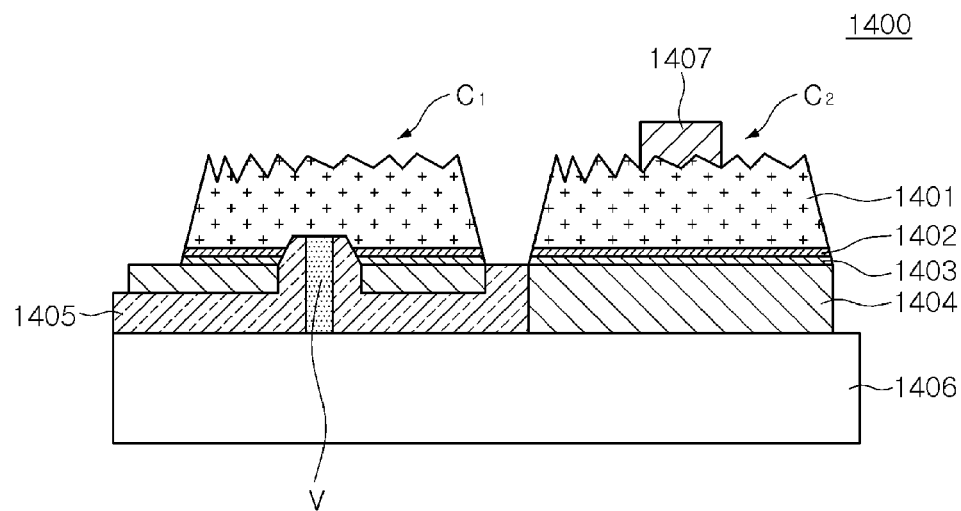
Figure 79:
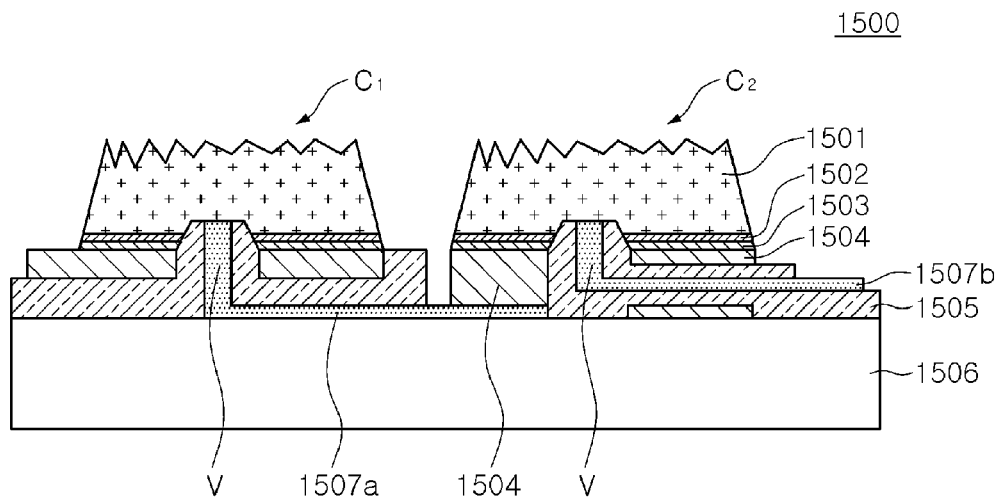
Figure 80:
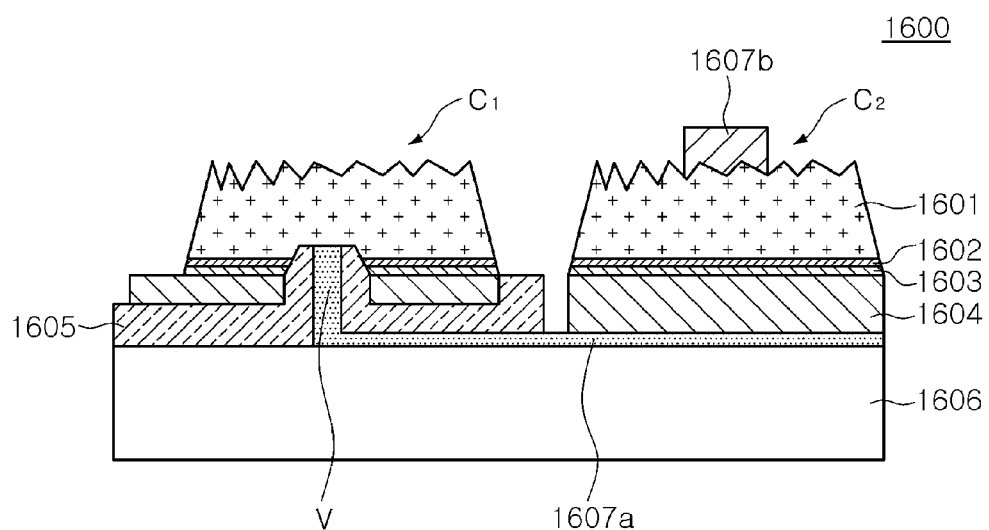

FIGS. 78 through 80 are schematic cross-sectional views illustrating a modified embodiment of the semiconductor light emitting device of FIG. 76. The modified embodiment of FIGS. 78 through 80 is different from the foregoing embodiments in the electrical connection structure between the light emitting structures, but its circuit diagram is identical to FIG. 77. In the semiconductor light emitting device 1400 of FIG. 78, first and second light emitting structures C1 and C2 are disposed on a substrate 1406. The first light emitting structure C1 has the same structure as the first light emitting structure of FIG. 76. Unlike the foregoing embodiment, a vertical electrode structure may be employed at a portion of the light emitting structure. In this embodiment, the second light emitting structure C2 has a vertical electrode structure. Specifically, the first-conductivity type semiconductor layer 1403, the active layer 1402, and the second-conductivity type semiconductor layer 1401 are sequentially formed on the first electrical connection part 1404 connected to the substrate 1406, and the second electrical connection part 1407 is formed on the second-connectivity type semiconductor layer 1401.

FIGS. 79 and 80 illustrate a structure in which the substrates in FIGS. 76 and 78 are formed of a material having an electrical insulation characteristic. The semiconductor light emitting device 1500 of FIG. 79 includes first and second light emitting structures C1 and C2 on a substrate 1506 having an electrical insulation characteristic. In this case, like the embodiment of FIG. 76, each of the first and second light emitting structures C1 and C2 includes a first-conductivity type semiconductor layer 1503, an active layer 1502, and a second-conductivity type semiconductor layer 1501, which are stacked on the first electrical connection part 1504. The second electrical connection parts 1507a and 1507b have conductive vias v connected to the second-conductivity type semiconductor layers 1501. Also, an insulator 1505 is formed in order to electrically separate the second electrical connection parts 1507a and 1507b from the first electrical connection part 1504, the first-conductivity type semiconductor layer 1503, and the active layer 1502. With the use of the electrically insulating substrate 1506, the second electrical connection part 1507a of the first light emitting structure C1 is connected to the first electrical connection part 1504 of the second light emitting structure C2 by a region which extends from the conductive via v in a direction parallel to the substrate 1506.

Like the embodiment of FIG. 78, in the case of the semiconductor light emitting device 1600 of FIG. 80, a second light emitting structure C2 includes a first-conductivity type semiconductor layer 1603, an active layer 1602, and a second-conductivity type semiconductor layer 1601 which are sequentially formed on a first electrical connection part 1604. A second electrical connection part 1607 is formed on the second-conductivity type semiconductor layer 1601. With the use of the electrically insulating substrate 1606, a second electrical connection part 1607a of the first light emitting structure C1 extends from the conductive via v, which is connected to the second-conductivity type semiconductor layer 1601, to the second light emitting structure C2 in a direction parallel to the substrate 1606. Accordingly, the first and second light emitting structures C1 and C2 may share the second electrical connection part 1607a.

Figure 81:
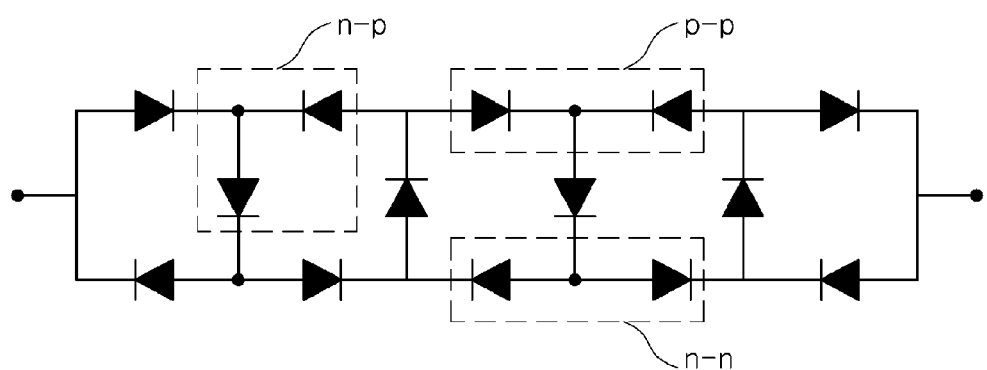

Meanwhile, although the AC-driving light emitting device is implemented with two light emitting structures in the above-described embodiments, various modifications may be made in the number and connection structure of the light emitting structure, i.e., the light emitting diode (LED). FIG. 81 is a circuit diagram of the semiconductor light emitting device according to this embodiment of the present invention. In FIG. 81, each diode corresponds to an LED, i.e., the light emitting structure. The circuit diagram of FIG. 81 corresponds to a so-called ladder network circuit which has fourteen light emitting structures. In this case, when a forward voltage is applied, nine light emitting structures are operated. Even when a reverse voltage is applied, nine light emitting structures are operated. To this end, as illustrated in FIG. 81, there are three basic electrical connection structures, i.e., an n-p junction, an n-n junction, and a p-p junction. Examples of the n-p junction, the n-n junction, and the p-p junction will be described below. Using those basic junctions, it is possible to obtain an AC driving light emitting device having a various number of LEDs and various circuit configurations.

Figure 82:
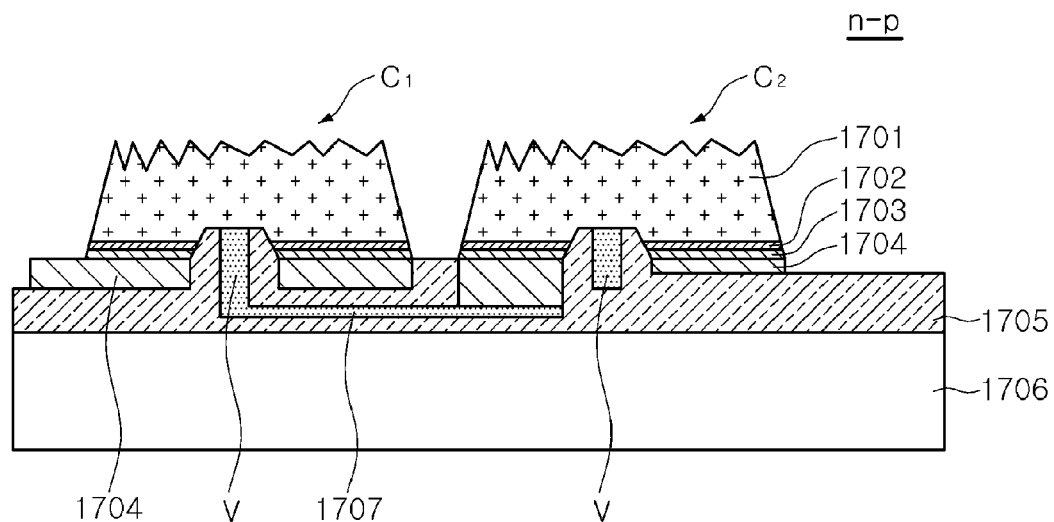
Figure 83:
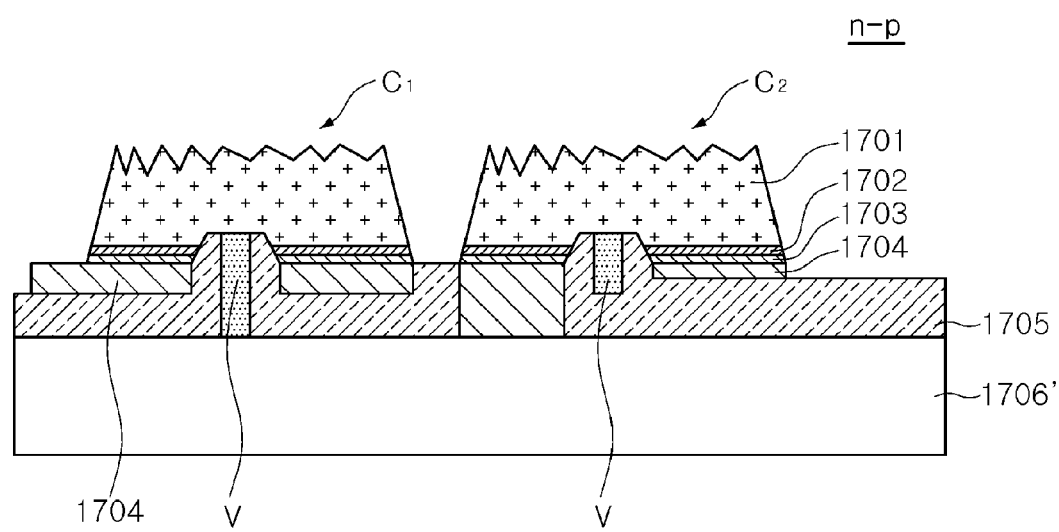

FIGS. 82 and 83 are schematic cross-sectional views illustrating the implementation example of the n-p junction. Referring to FIGS. 82 and 83, first and second light emitting structures C1 and C2 which form the n-p junction are disposed on substrates 1706 and 1706'. Each of the first and second light emitting structures C1 and C2 includes a first-conductivity type semiconductor layer 1703, an active layer 1702, and a second-conductivity type semiconductor layer 1701 which are sequentially stacked on a first electrical connection part 1704. A conductive via v is connected to the inside of the second-conductivity type semiconductor layer 1701, and an insulator 1705 is formed for separately separating the conductive via v from a first electrical connection part 1704, the first-conductivity type semiconductor layer 1703, and the active layer 1702. A second electrical connection part 1707 of the first light emitting structure C1 is connected to the first electrical connection part 1704 of the second light emitting structure C2. In this case, the structure of FIG. 82 using the conductive substrate 1706 and the structure of FIG. 83 using the electrically insulating substrate 1706' are different in the form of the second electrical connection part 1707, and are similar to those of FIGS. 76 and 97, respectively. Since the case of the n-p junction constitutes the entire device by connection to other light emitting structures, rather than having its sole use in AC driving, it can be understood that the second electrical connection part provided in the second light emitting structure C2, i.e., the conductive via v, is not the structure for applying an external electric signal but it is in such a state that it is electrically connected to other light emitting structure.

Figure 84:
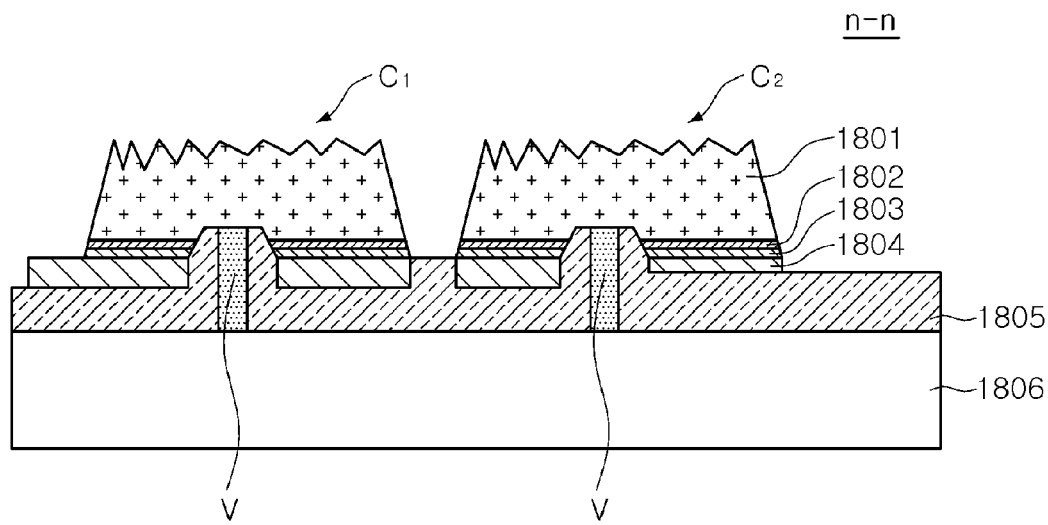
Figure 85:
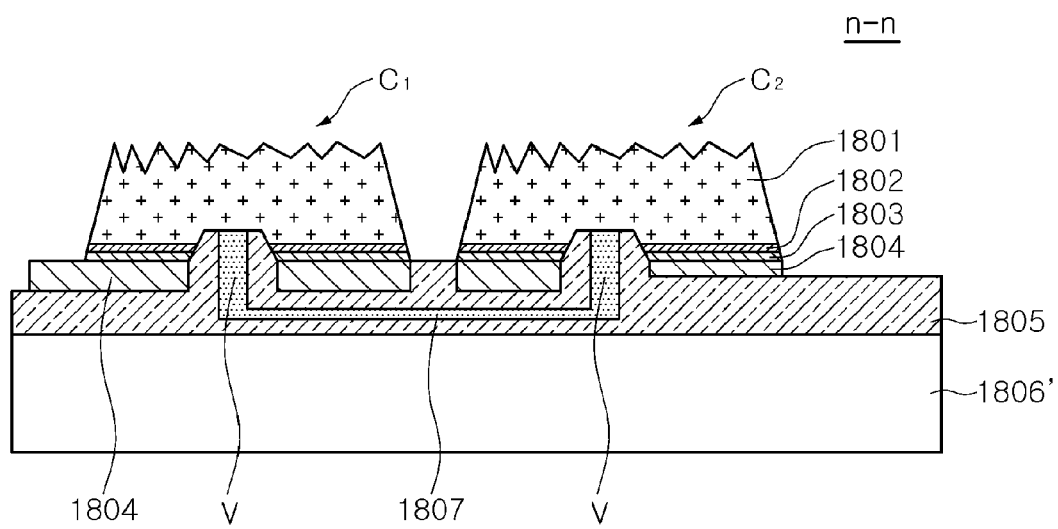
Figure 86:
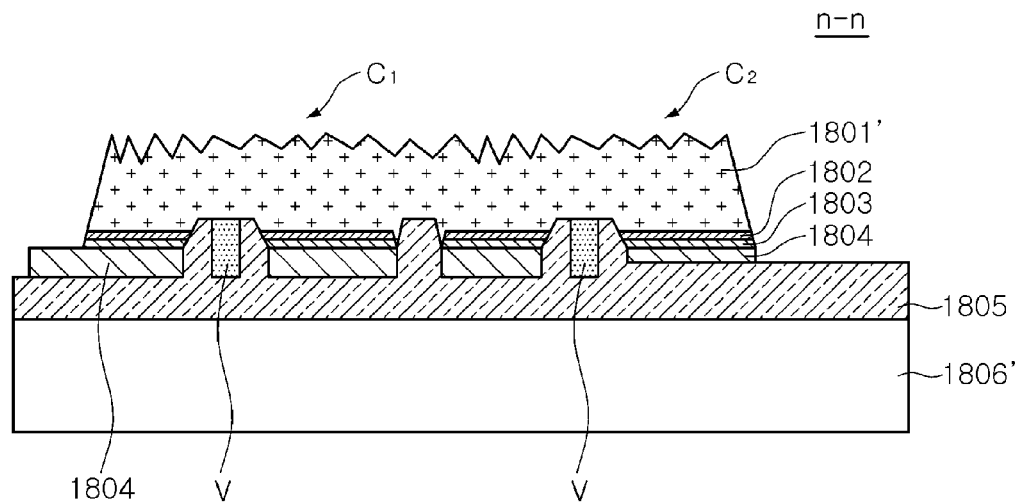

FIGS. 84 through 86 are schematic cross-sectional views illustrating the implementation example of the n-n junction. Referring to FIGS. 84 through 86, first and second light emitting structures C1 and C2 which form the n-n junction are disposed on substrates 1806 and 1806'. Each of the first and second light emitting structures C1 and C2 includes a first-conductivity type semiconductor layer 1803, an active layer 1802, and a second-conductivity type semiconductor layer 1801 which are sequentially stacked on a first electrical connection part 1804. A conductive via v is connected to the inside of the second-conductivity type semiconductor layer 1801, and an insulator 1805 is formed for separately separating the conductive via v from a first electrical connection part 1804, the first-conductivity type semiconductor layer 1803, and the active layer 1802. In order to form the n-n junction, it is necessary to connect second electrical connection parts 1807 of the first and second light emitting structures C1 and C2. As one example, as illustrated in FIG. 84, conductive vias v provided in the first and second light emitting structures C1 and C2 may be connected together through the conductive substrate 1806. In addition, as illustrated in FIG. 85, in a case in which an electrically insulating substrate 1806' is used, the second electrical connection part 1807 may connect the conductive vias v provided in the first and second light emitting structures C1 and C2 by a region which extends in a direction parallel to the substrate 1806'. In addition to the connection method using the electrical connection part, the second-conductivity type semiconductor layer 1801' may be used as illustrated in FIG. 86. The first and second light emitting structures C1 and C2 may share the second-conductivity type semiconductor layer 1801'. In this case, the n-n junction may be implemented without separately connecting the conductive vias provided in the first and second light emitting structures C1 and C2.

Figure 87:
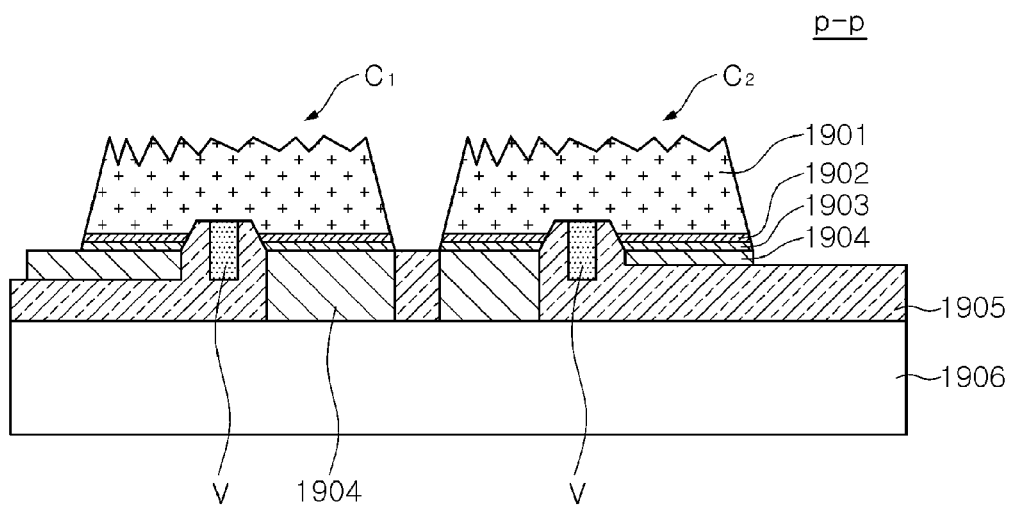
Figure 88:
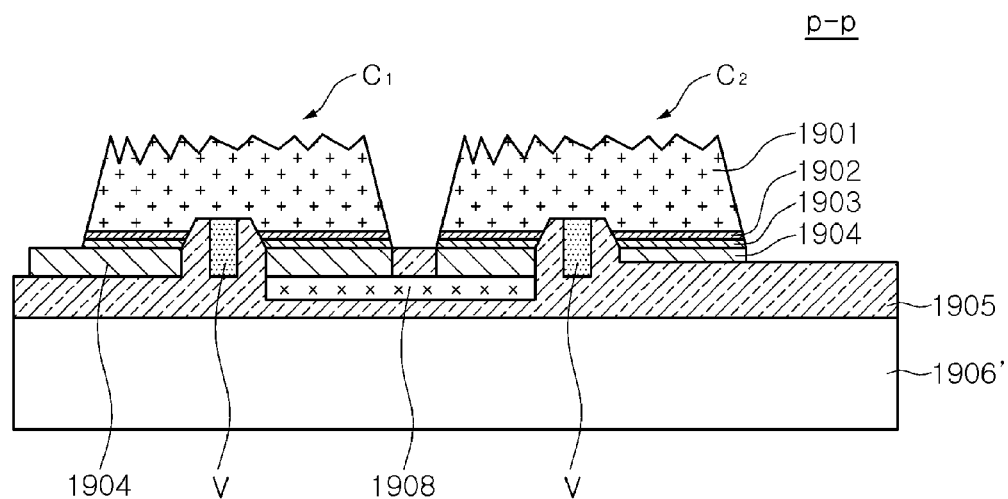
Figure 89:
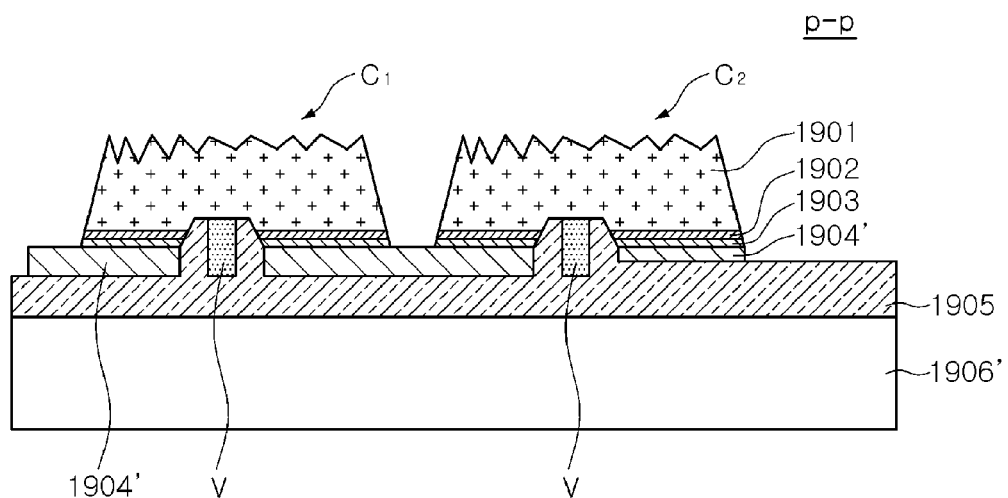

FIGS. 87 through 89 are schematic cross-sectional views illustrating the implementation example of the p-p junction. Referring to FIGS. 87 through 89, first and second light emitting structures C1 and C2 which form the p-p junction are disposed on substrates 1806 and 1806'. Each of the first and second light emitting structures C1 and C2 includes a first-conductivity type semiconductor layer 1903, an active layer 1902, and a second-conductivity type semiconductor layer 1901 which are sequentially stacked on a first electrical connection part 1904. A conductive via v is connected to the inside of the second-conductivity type semiconductor layer 1901, and an insulator 1905 is formed for separately separating the conductive via v from a first electrical connection part 1904, the first-conductivity type semiconductor layer 1903, and the active layer 1902. In order to form the p-p junction, it is necessary to connect first electrical connection parts 1904 of the first and second light emitting structures C1 and C2. In this case, conductive vias v may be connected to other light emitting structures (not shown) constituting the entire AC light emitting device. As one example of the p-p junction, as illustrated in FIG. 87, the first electrical connection parts 1904 provided in the first and second light emitting structures C1 and C2 may be connected together through the conductive substrate 1906. In addition, as illustrated in FIG. 89, in a case in which an electrically insulating substrate 1906' is used, the first electrical connection parts 1904 may be connected together through a separate metallic connection layer 1908. Furthermore, as illustrated in FIG. 89, a structure which commonly uses the first electrical connection parts 1904, instead of providing the separate connection metal layer, may be employed for the first and second light emitting structures C1 and C2.

A semiconductor light emitting device according to another embodiment of the present invention will be described below with reference to FIGS. 90 through 100.

Figure 90:
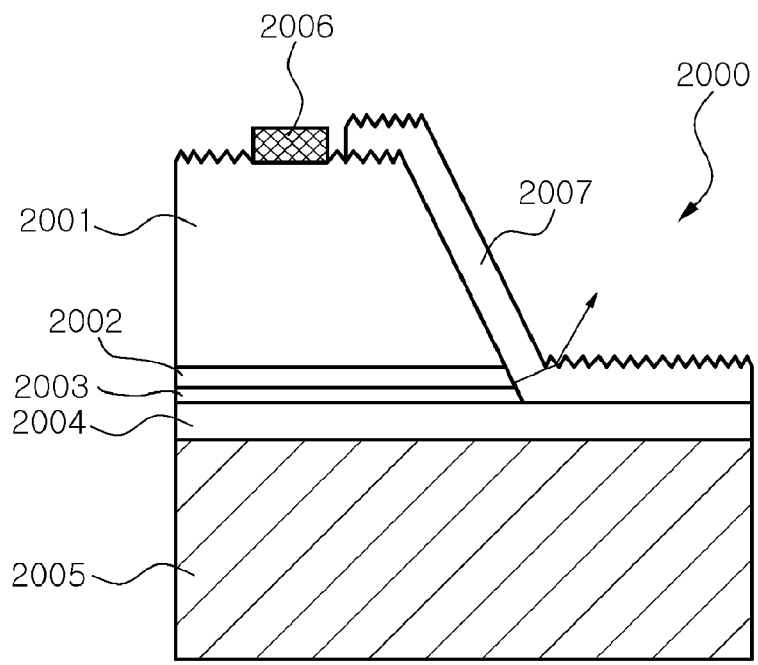
FIGS. 90 through 100 illustrate a semiconductor light emitting device according to another embodiment of the present invention.
Figure 91:
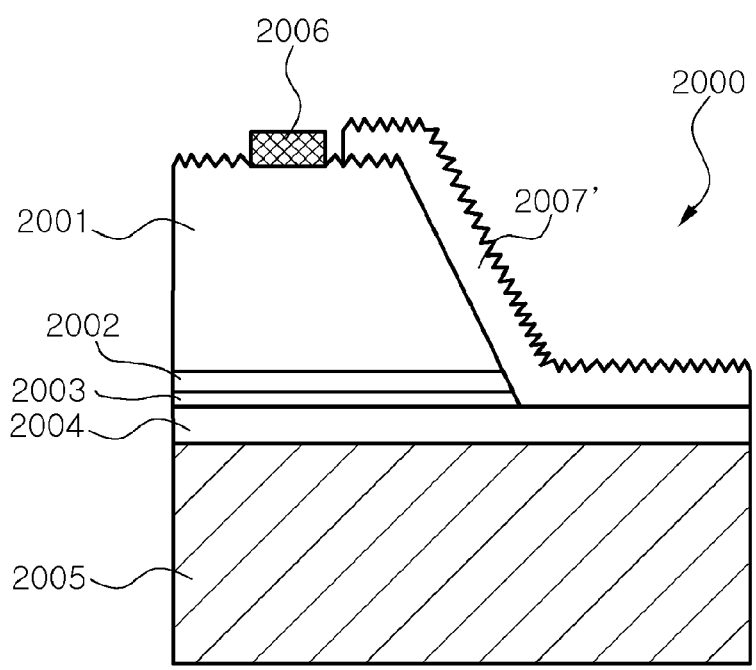
Figure 92:
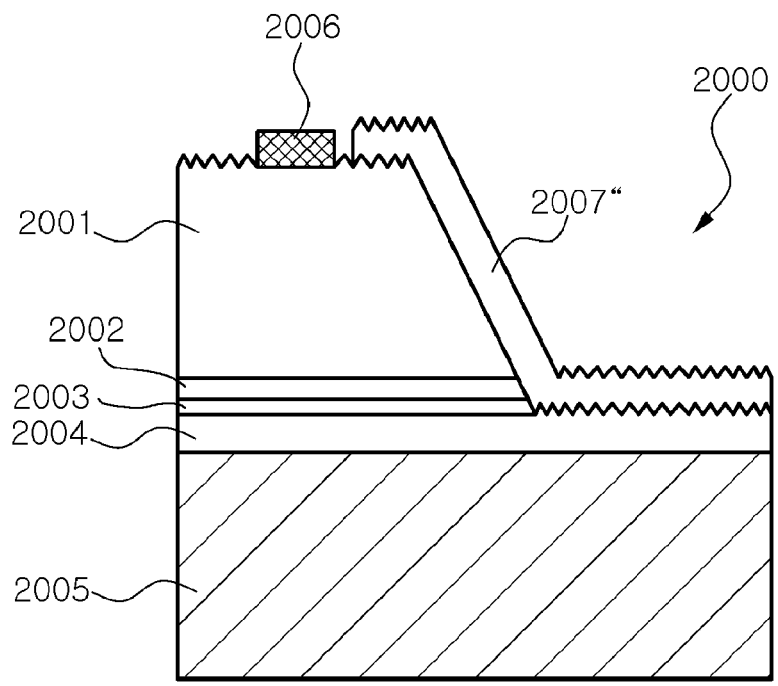

FIG. 90 is a cross-sectional view of a vertical type semiconductor light emitting device according to this embodiment of the present invention, and FIGS. 91 and 92 are cross-sectional views illustrating modified embodiments of the vertical type semiconductor light emitting structures of FIG. 90.

Referring to FIG. 90, the vertical type semiconductor light emitting device 2000 according to this embodiment of the present invention includes a light emitting structure which is constituted by an n-type semiconductor layer 2001, a p-type semiconductor layer 2003, and an active layer 2002 formed between the n-type semiconductor layer 2001 and the p-type semiconductor layer 2003. A reflective metal layer 2004 and a conductive substrate 2005 are formed under the light emitting structure. In addition, an n-type electrode 2006 is formed on the n-type semiconductor layer 2001, and a passivation layer 2007 having an uneven structure is formed to cover the side surface of the light emitting structure.

The n-type semiconductor layer 2001 and the p-type semiconductor layer 2003 may be formed of nitride semiconductors. That is, the n-type semiconductor layer 2001 and the p-type semiconductor layer 2003 may be formed of semiconductor materials into which n-type impurity and p-type impurity are doped, which have a composition of $Al_xIn_yGa_{(1-x-y)}N$ (where $0 \le x \le 1$, $0 \le y \le 1$, $0 \le x+y \le 1$), e.g., GaN, AlGaN, InGaN, etc. Examples of the n-type impurity include Si, Ge, Se, Te, and so on, and examples of the p-type impurity include Mg, Zn, Be, and so on. Meanwhile, in order to improve the efficiency of light emitted in a vertical direction, an uneven structure may be formed on the top surface of the n-type semiconductor layer 101.

The active layer 2002 formed between the n-type nitride semiconductor layer 2001 and the p-type nitride semiconductor layer 2003 emits light having a predetermined energy due to electron/hole recombination and may have a multiple quantum well (MQW) structure in which a quantum well layer and a quantum barrier layer are alternately stacked. For example, an InGaN/GaN structure may be used for the multiple quantum well structure.

The reflective metal layer 2004 may reflect light emitted from the active layer 2002 toward the n-type nitride semiconductor layer 2001 and may be formed of Ag, Ni, Al, Rh, Pd, Ir, Ru, Mg, Zn, Pt, or Au. In this case, although not illustrated in detail, the reflective metal layer 2004 may have a structure capable of improving the reflection efficiency. Specifically, the reflective metal layer 2004 may include any one of Ag, Al, Ni/Ag, Zn/Ag, Ni/Al, Zn/Al, Pd/Ag, Pd/Al, Ir/Ag, Ir/Au, Pt/Ag, Pt/Al, Ni/Ag/Pt, and combinations thereof. In this embodiment, the reflective metal layer 2004 is not a requisite element. In some cases, the reflective metal layer 2004 may be omitted.

The conductive substrate 2005 functions as a p-type electrode and functions as a support body which supports the light emitting structure, i.e., the n-type semiconductor layer 2001, the active layer 2002, and the p-type semiconductor layer 2003, in a laser lift-off process, which will be described later. In this case, the conductive structure 2005 may include at least one material selected from the group consisting of Si, Cu, Ni, Au, W, and Ti. The conductive substrate 2005 may be formed using a plating method, a deposition method, or a bonding method, depending on the selected material.

The passivation layer 2007 is an insulation layer for protecting the light emitting structure, in particular, the active layer 2002. The passivation layer 2007 is formed in the region where a portion of the light emitting structure is removed. Specifically, as illustrated in FIG. 90, the passivation layer 2007 may extend to a portion of the top surface of the n-type semiconductor layer 2001 and the top surface of the reflective metal layer 2004, as well as the side surface of the light emitting structure. In a case in which the reflective metal layer 2004 is not employed, the passivation layer 2007 is formed on the top surface of the conductive substrate 2005. In a case in which a portion of the light emitting structure is removed and exposed, as illustrated in FIG. 90, the exposed side may be inclined upward. Such a structure may lead to the improvement in the light emitting area. Furthermore, the passivation layer 2007 may be formed more easily.

In order to perform the protection function, the passivation layer 2007 may be formed of silicon oxide or silicon nitride, e.g., $SiO_2$, $SiO_xN_y$, $Si_xN_y$, etc., and may have a thickness of approximately 0.01-2 μm. Accordingly, the passivation layer 2007 may have a refractive index of approximately 1.4-2.0. Due to air or package mold structure and refractive index difference, it may be difficult for light emitted from the active layer 2002 to be emitted to the outside. In particular, in the case of the vertical type semiconductor light emitting device 2000 according to this embodiment of the present invention, since the p-type semiconductor layer 2003 is relatively thin, light emitted in a lateral direction of the active layer 2002 may pass through the passivation layer 2007 and be emitted to the outside. However, it is difficult for light emitted from the active layer 2002 toward the passivation layer 2007 in a lateral direction to be emitted to the outside because an incident angle with respect to the outer surface of the passivation layer 2007 is very small.

In this embodiment, the external light extraction efficiency is improved by forming the uneven structure in the passivation layer 2007. In particular, as illustrated in FIG. 90, when the uneven structure is formed in a region through which light emitted in a lateral direction of the active layer 2002 passes, the amount of light emitted to the side surface of the vertical type semiconductor light emitting device 2000 may increase. The region through which the light emitted in the lateral direction of the active layer 2002 may be considered as a portion of the top surface of the reflective metal layer 2004 where the light emitting structure is not formed. Specifically, when comparing the case in which the uneven structure is employed in the passivation layer 2007 with the case in which no uneven structure is employed therein, in a state where all elements other than the uneven structure are identical, the light extraction efficiency was improved by more than approximately 5%. Meanwhile, although not necessarily required, the uneven structure of the passivation layer 2007 may be formed in a region corresponding to the top surface of the n-type semiconductor layer 2001. In this case, the light extraction efficiency in a vertical direction may be improved.

As illustrated in FIGS. 91 and 92, the uneven structure formation region of the passivation layer may be modified in various manners in order to maximize the external light extraction efficiency. Referring to FIG. 91, the uneven structure may be formed up to the side surface of the passivation layer 2007'. Also, referring to FIG. 92, the uneven structure may also be formed on the bottom surface of the passivation layer 2007", i.e., the surface directing the reflective metal layer 2004. In this case, a pattern having a corresponding shape may be formed on the reflective metal layer 2004.

FIGS. 93 through 96 are cross-sectional views illustrating a method of manufacturing the vertical type semiconductor light emitting device described above with reference to FIG. 90.

Figure 93:
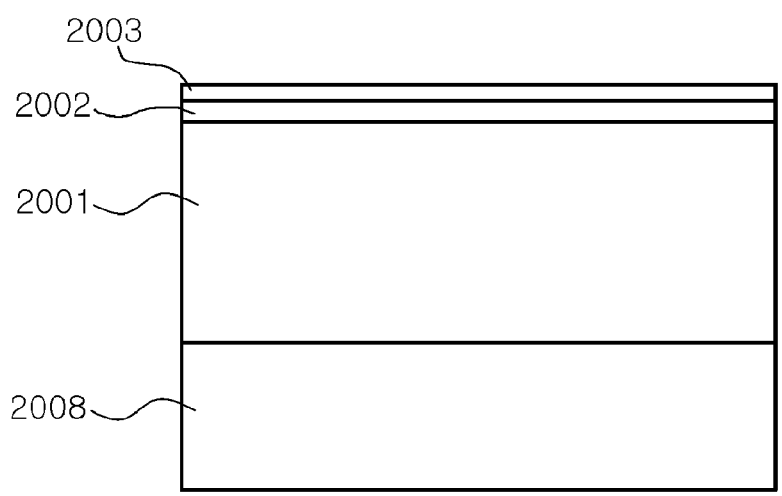

Referring to FIG. 93, a light emitting structure is formed on a substrate 2008 for semiconductor single-crystal growth by sequentially growing an n-type semiconductor layer 2001, an active layer 2002, and a p-type semiconductor layer 2003 through a semiconductor layer growth process, e.g., MOCVD, MBE, HYPE, etc. The substrate B may be formed of sapphire, SiC, $MgAl_2O_4$, MaO, $LiAlO_2$, $LiGaO_2$, or GaN. Sapphire is a crystal having a Hexa-Rhombo R3c symmetry, and has a lattice constant of 13,001 Å along a c-axis and a lattice constant of 4,758 Å along an a-axis. Sapphire has a C(0001) plane, an A(1120) plane, and an R(1102) plane. In this case, the C plane is mainly used as a nitride growth substrate because it facilitates the growth of a nitride thin film and is stable at high temperatures.

Figure 94:
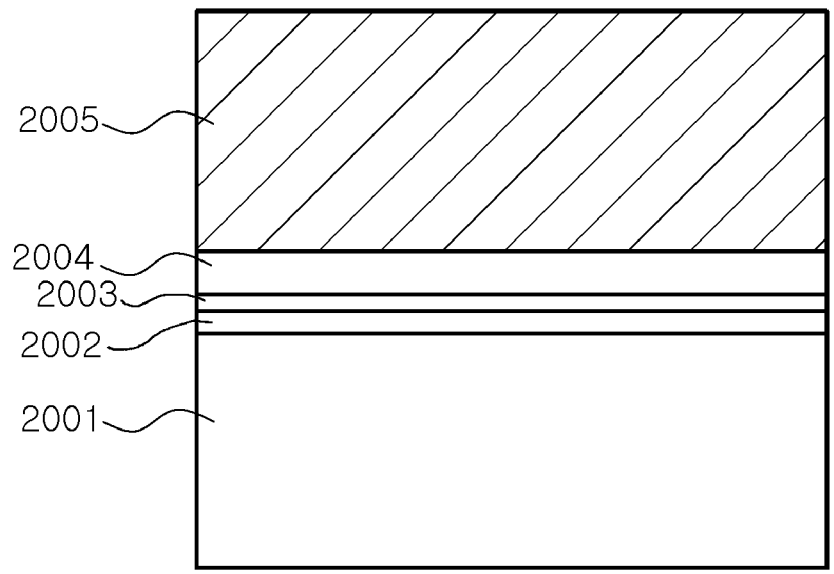

Referring to FIG. 94, a reflective metal layer 2004 and a conductive substrate 2005 are formed on the p-type semiconductor layer 2003 through a plating process or a submount bonding process. Although not illustrated in detail, the substrate 2008 is removed by an appropriate lift-off process, e.g., a laser lift-off process or a chemical lift-off process.

Figure 95:
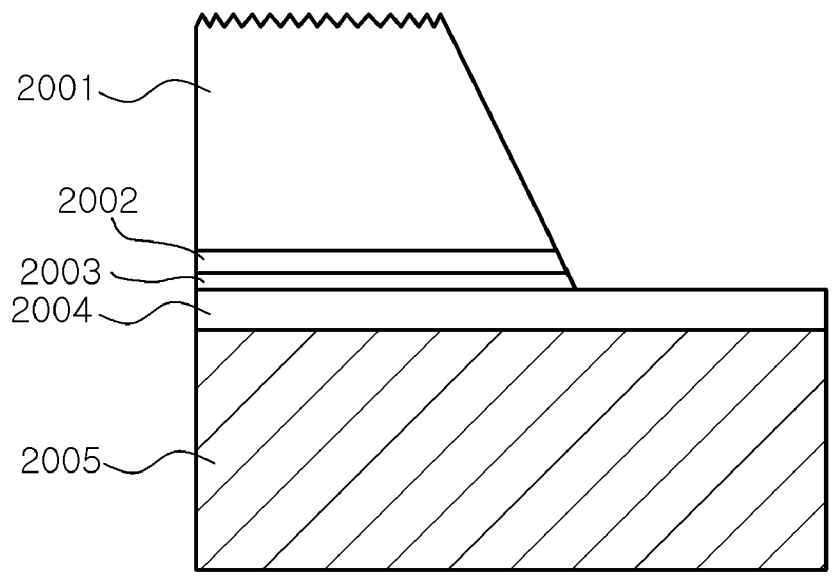

Referring to FIG. 95, a portion of the light emitting structure is removed for device-based dicing and the formation of a passivation layer. In this case, the side surface exposed by the removal may be inclined upward. Also, in order to improve the light extraction efficiency in a vertical direction, an uneven structure may be formed by a wet etching process on the top surface of the n-type semiconductor layer 2001, i.e., the surface exposed by the removal of the substrate 2008 for a semiconductor single-crystal growth.

Figure 96:
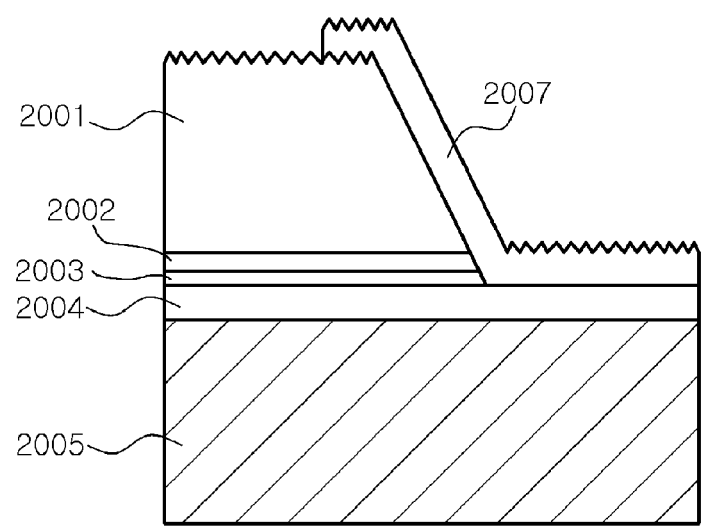

Referring to FIG. 96, a passivation layer 2007 is formed for protecting the light emitting structure. At this step, for example, the passivation layer 2007 may be formed by appropriately depositing silicon oxide or silicon nitride. The lateral light emission efficiency may be improved by forming the uneven structure on a light emission surface of the passivation layer 2007. In this case, the uneven structure may be formed by using a dry etching process or a wet etching process which is known to those skilled in the art. Also, if necessary, the uneven structure may be formed on another light emission surface of the passivation layer 2007. After forming the passivation layer 2007, the structure of FIG. 92 may be obtained by forming an n-type electrode on the top surface of the n-type semiconductor layer 2001.

This embodiment of the present invention provides a modified vertical type semiconductor light emitting device in order to further improve electrical characteristics and optical characteristics.

Figure 97:
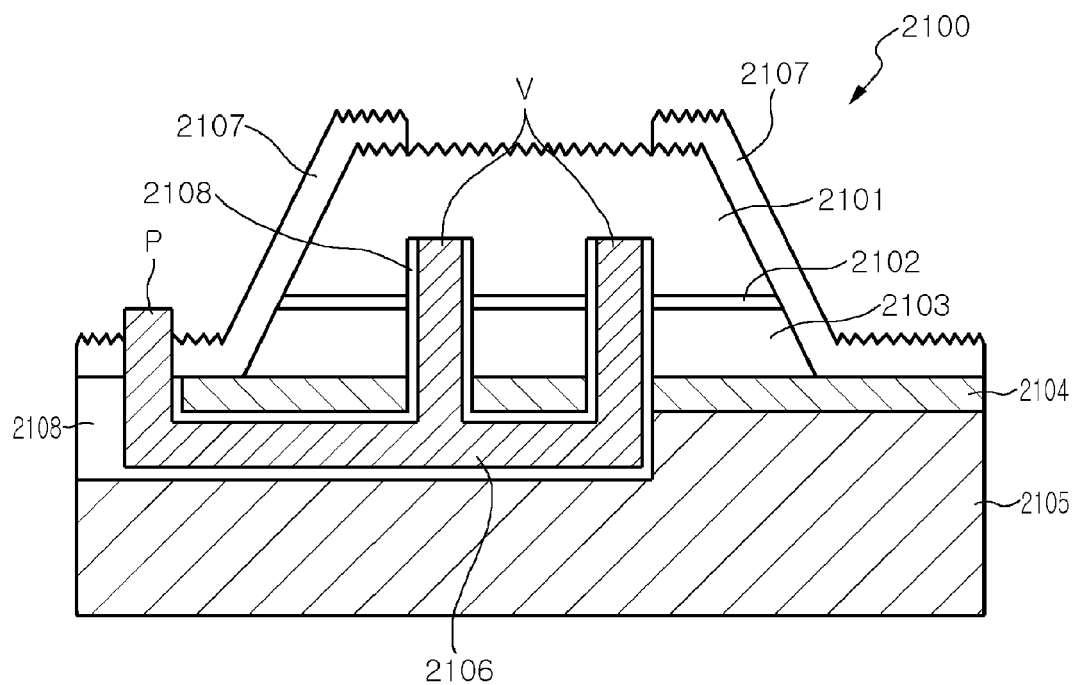

FIG. 97 is a schematic cross-sectional view of a semiconductor light emitting device according to another embodiment of the present invention. Referring to FIG. 97, the semiconductor light emitting device 2210 includes a conductive substrate 2105, a light emitting structure, a second-conductivity type electrode 2106, and a passivation layer 2107. The light emitting structure a first-conductivity type semiconductor layer 2103, an active layer 2102, and a second-conductivity type semiconductor layer 2101, which are sequentially formed on the conductive substrate 2105. The second-conductivity type electrode 2106 applies an electric signal to the second-conductivity type semiconductor layer 2101. The passivation layer 2107 has an uneven structure on the side surface of the light emitting structure. Compared with the structures of FIG. 90 and so on, the active layer 2102 in FIG. 97 is disposed at a relatively upper portion, but the position of the active layer 2102 may be changed in various manners. For example, the active layer 2102 may be formed at a similar height to the bottom surface of the passivation layer 2107.

Unlike the foregoing embodiments in which the n-type electrode is formed on the exposed surface of the n-type semiconductor layer where the sapphire substrate is removed, the n-type electrode is exposed to the outside in a direction of the lower portion of the n-type semiconductor layer by using a conductive via. Specifically, the second-conductivity type electrode 2106 includes a conductive via v and an electrical connection part P. The conductive via v passes through the first-conductivity type semiconductor layer 2104 and the active layer 2102 and is connected to the second-conductivity type semiconductor layer 2101 at the inside thereof. The electrical connection part P extends from the conductive via v and is exposed to the outside of the light emitting structure. In this case, since the second-conductivity type electrode 2106 needs to be electrically separated from the first-conductivity type semiconductor layer 2103 and the active layer 2102, an insulator 2108 is formed appropriately around the second-conductivity type electrode 2106. The insulator 2108 may be formed of any material if it has a low electrical conductivity. Preferably, a material having a low light absorption is used for the insulator 2108. For example, the insulator 2108 may be formed of the same material as the passivation layer 2107.

The second-conductivity type electrode 2106 may be formed of a metallic material which forms an ohmic contact with the second-conductivity type semiconductor layer 2101. Also, the entire second-conductivity type electrode 2106 may be formed of the same material. However, since the electrical connection part P may be used as a bonding pad part, the electrical connection part may be formed of a material different from other parts. Meanwhile, considering the above-described manufacturing process, the first-conductivity type semiconductor layer 2101 and the second-conductivity type semiconductor layer 2103 may be, but are not limited to, a p-type semiconductor layer and an n-type semiconductor layer, respectively. As illustrated in FIG. 97, a first contact layer 2104 may be further formed between the first-conductivity type semiconductor layer 2103 and the conductive substrate 2105. The first contact layer 2104 may be formed of a high reflectivity metal, such as Ag or Al. In this case, the first contact layer 2104 and the second-conductivity type electrode 2106 are electrically separated by the insulator 2108.

Due to such an electrical connection structure, an electric signal may be applied not from the top surface but rather from the inside of the second-conductivity type semiconductor layer 2101. In particular, since no electrode is formed on the top surface of the second-conductivity type semiconductor layer 2101, the light emitting area may increase, and the current dispersion effect may be improved by the conductive via v formed inside the second-conductivity type semiconductor layer 2101. In this case, the desired electrical characteristic may be obtained by appropriately adjusting the number, area and shape of the conductive via v. In this embodiment, the main processes, e.g., a process of forming the conductive substrate or a process of removing the sapphire substrate, use processes commonly used in manufacturing a vertical type semiconductor light emitting device. However, the structure obtained by the processes may be considered to be closer to a horizontal structure. Thus, the semiconductor light emitting device according to this embodiment of the present invention may be referred to as a vertical/horizontal type structure in which the vertical structure and the horizontal structure are combined.

Like the foregoing embodiments, the passivation layer 2107 is formed on the side surface of the light emitting structure, and the uneven structure is formed on the path of light emitted from the active layer 2102, thereby improving the extraction efficiency of light emitted from the active layer 2102 toward the passivation layer 2107 in the lateral direction. In addition, as illustrated in FIG. 97, the uneven structure may also be formed on the top surface of the second-conductivity type semiconductor layer 2101. Although not illustrated, the uneven structure may also be formed on the inclined side surface of the passivation layer 2107.

Figure 98:
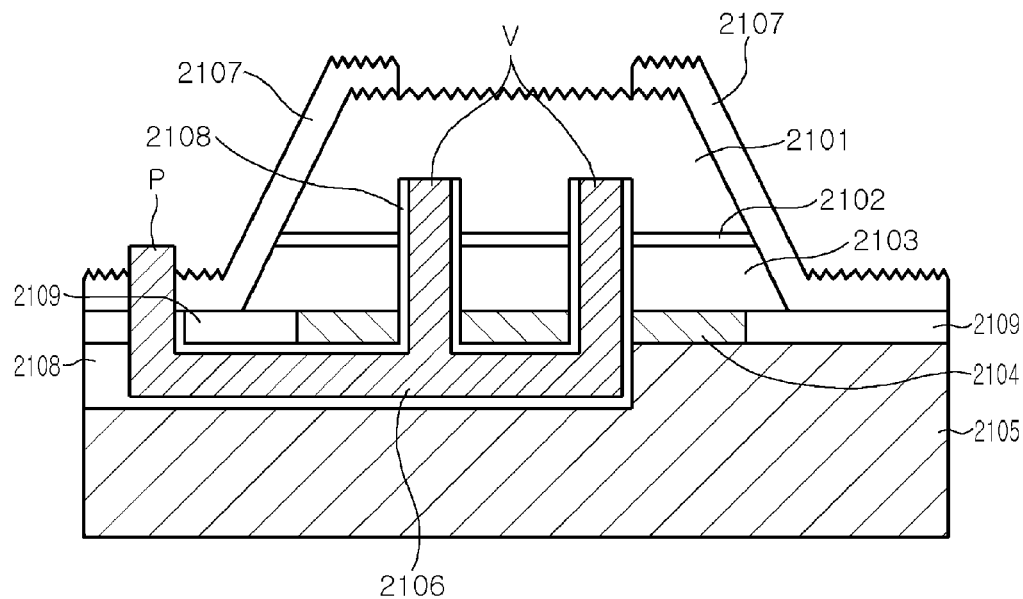

FIG. 98 is a schematic cross-sectional view illustrating a modified embodiment of the semiconductor light emitting device of FIG. 97. The embodiment of FIG. 98 has a structure in which an etch stop layer 2109 is further included in the structure of FIG. 97. Hence, the etch stop layer 2109 only will be described below. The etch stop layer 2109 is formed in a region of the top surface of at least the conductive substrate 2105 where the light emitting structure is not formed. The etch stop layer 2109 is formed of a material (e.g., oxide such as $SiO_2$) having a different etching characteristic from a semiconductor material (nitride semiconductor) constituting the light emitting structure with respect to a specific etching process. Since it may be possible to etch up to the region where the etch stop layer 2109 is disposed during the etching of the light emitting structure, the etching depth can be controlled by the etch stop layer 2109. In this case, the etch stop layer 2109 and the insulator 2108 may be formed of the same material in order for the facilitation of the etching process. When the light emitting structure is etched because it is necessary to expose the second-conductivity type electrode 2106 to the outside, the material constituting the conductive substrate 2105 or the first contact layer 2104 is deposited on the side surface of the light emitting structure, causing the occurrence of a leakage current. Such a problem may be minimized by previously forming the etch stop layer 2109 under the light emitting structure which will be etched and removed.

Figure 99:
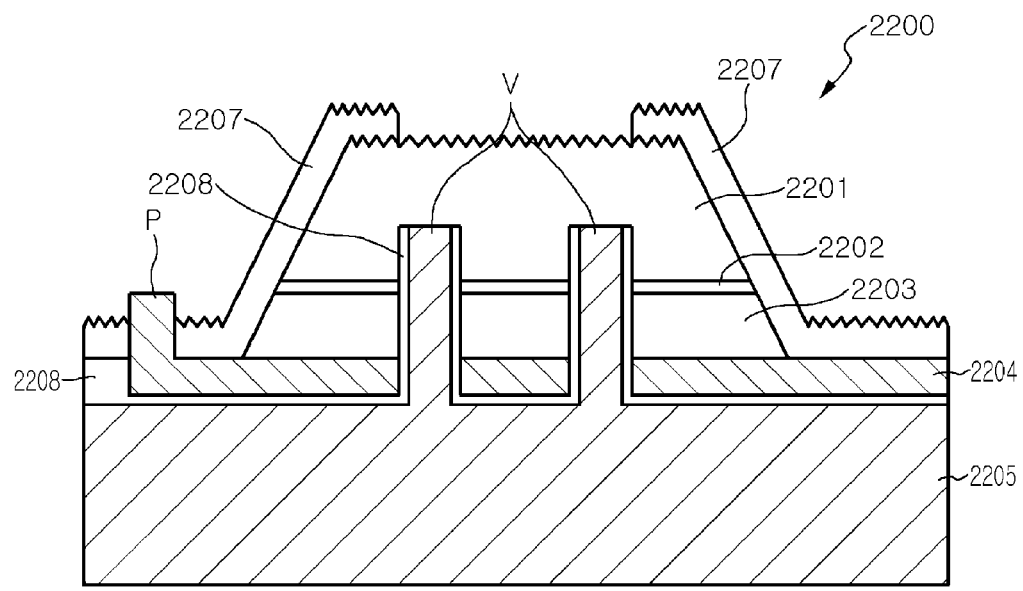
Figure 100:
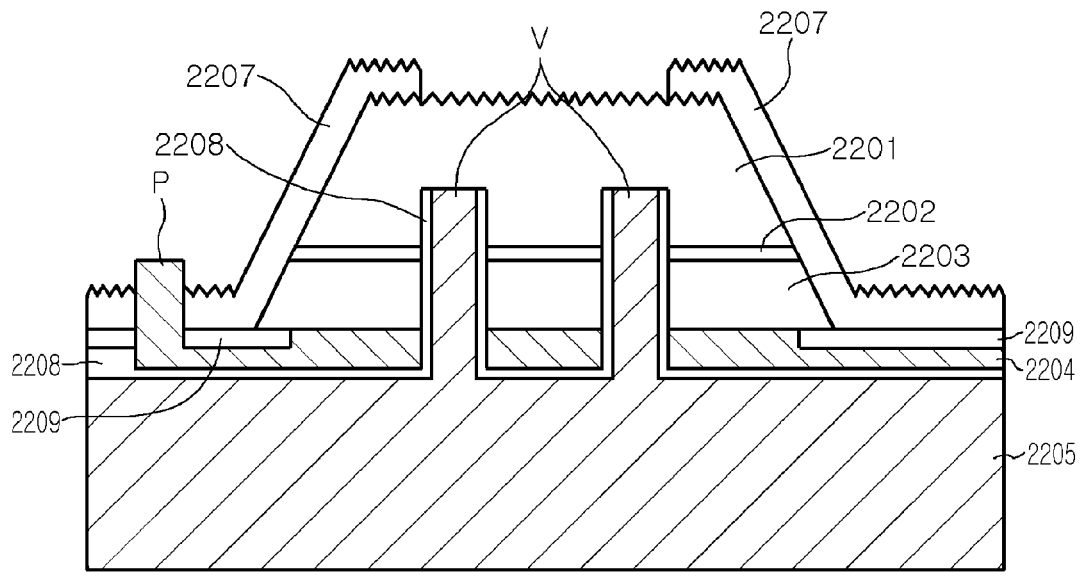

FIG. 99 is a schematic cross-sectional view of a semiconductor light emitting device according to another embodiment of the present invention. FIG. 100 illustrates a structure in which an etch stop layer is further included in the structure of FIG. 99. Referring to FIG. 99, the semiconductor light emitting device 2200 includes a conductive substrate 2205, a light emitting structure, a second contact layer 2204, a conductive via v, and a passivation layer 2207. The light emitting structure includes a first-conductivity type semiconductor layer 2203, an active layer 2202, and a second-conductivity type semiconductor layer 2201 which are sequentially formed on the conductive substrate 2205. The second contact layer 2204 applies an electric signal to the second-conductivity type semiconductor layer 2201. The conductive via v extends from the conductive substrate 2205 up to the inside of the second-conductivity type semiconductor layer 2201. The passivation layer 2207 has an uneven structure on the side surface of the light emitting structure.

Unlike the structure of FIG. 97, the conductive substrate 2205 is electrically connected to the second-conductivity type semiconductor layer 2201, and the first contact layer 2204 connected to the first-conductivity type semiconductor layer 2203 has an electrical connection part P and is exposed to the outside. The conductive substrate 2205 may be electrically separated from the first contact layer 2204, the first-conductivity type semiconductor layer 2203, and the active layer 2202 by the insulator 2208. That is, unlike the embodiment of FIG. 97 in which the second-conductivity type electrode 2106 connected to the second-conductivity type semiconductor layer 2101 is exposed to the outside to thereby provide the electrical connection part P, the first contact layer 2204 connected to the first-conductivity type semiconductor layer 2203 is exposed to the outside to thereby provide the electrical connection part P. The effects obtained from the structures, except for the electrical connection method, are identical to those of FIG. 97. As illustrated in FIG. 100, an etch stop layer 2209 may be adopted. Compared with the embodiment of FIG. 97, the embodiment of FIG. 99 in which the first contact layer 2204 is exposed to the outside is easier in the process of forming the insulator 2208.

A semiconductor light emitting device according to another embodiment of the present invention will be described below with reference to FIGS. 101 through 119.

Figure 101:
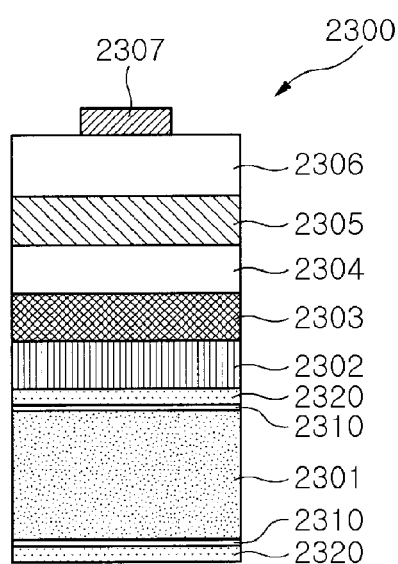
FIGS. 101 through 119 illustrate a semiconductor light emitting device according to another embodiment of the present invention.

Referring to FIG. 101, the semiconductor light emitting device 2300 according to this embodiment of the present invention may have the following semiconductor stack structure. A substrate formed of an Si—Al alloy (hereinafter, referred to as an Si—Al alloy substrate) 2301, a passivation layer 2320 formed on the top and bottom surfaces of the Si—Al alloy substrate 2301, a bonding metal layer 2302, a reflective metal layer 2303, a p-type semiconductor layer 2304, an active layer 2305, and an n-type semiconductor layer 2306 are stacked in sequence. The p-type semiconductor layer 2304, the n-type semiconductor layer 2306, and the active layer 2305 may be formed of GaN-based semiconductor, e.g., $Al_xGa_yIn_{(1-x-y)}N$ (where, $0 \leq x \leq 1$, $0 \leq y \leq 1$, $0 \leq x+y \leq 1$) and form the light emitting structure.

An n-type electrode 2307 is formed on the n-type semiconductor layer 2306. The reflective metal layer 2303 disposed between the bonding metal layer 2302 and the p-type semiconductor layer 2304 reflects light incident from the semiconductor layer in an upward direction, thereby further increasing the brightness of the semiconductor light emitting device. The reflective metal layer 2303 may be formed of a high reflectivity metal, e.g., Ag, Ni, Al, Rh, Pd, Ir, Ru, Mg, Zn, Pt, Au, Ni/Ag, Zn/Ag, Ni/Al, Zn/Al, Pd/Ag, Pd/Al, Ir/Ag, Ir/Au, Pt/Ag, Pt/Al, and Ni/Ag/Pt, or at least one material including the high reflectivity metal. However, in some cases, the reflective metal layer 2303 may not be formed. The bonding metal layer 2302 functions to bond the Si—Al alloy substrate 2301 with the light emitting structure, and a conductive adhesive may be used therein. Examples of the conductive adhesive include Au, Sn, Ni, Au—Sn, Ni—Sn, Ni—Au—Sn, and Pb—Sr. In this embodiment, although the semiconductor light emitting device 2300 includes the bonding metal layer 2302, the Si—Al alloy substrate 2301 may be directly bonded on the p-type semiconductor layer 2304, without the bonding metal layer 2302. Accordingly, the semiconductor light emitting device 2300 uses a conductive substrate as the Si—Al alloy substrate 2301.

The Si—Al alloy is advantageous in view of its thermal expansion coefficient, heat conductivity, mechanical process, and price. That is, the thermal expansion coefficient of the Si—Al alloy substrate 2301 is similar to that of the sapphire substrate. Thus, the use of Si—Al alloy substrate 2301 in the manufacture of the semiconductor light emitting device 2300 reduces warpage of the substrate and crack in the light emitting structure, which have previously occurred in the process of bonding the existing Si conductive substrate and the process of separating the sapphire substrate by the laser irradiation. Consequently, the high-quality low-defect semiconductor light emitting device 2300 may be obtained.

Also, the Si—Al alloy substrate 2301 has an excellent heat dissipation characteristic because its heat conductivity is in the range of approximately 120-180 W/m·k. Furthermore, since the Si—Al alloy substrate 2301 can be easily manufactured by melting Si and Al at a high pressure, it can be easily obtained at low cost.

In particular, the semiconductor light emitting device 2300 according to this embodiment of the present invention further includes the passivation layer 2320 on the top and bottom surfaces of the Si—Al alloy substrate 2301. The passivation layer 2320 prevents the penetration of chemicals into the Si—Al alloy substrate 2301 during a cleaning process. The passivation layer 2320 may be formed of a metal or a conductive dielectric. When the passivation layer 2320 is formed of a metal, it may include any one of Ni, Au, Cu, W, Cr, Mo, Pt, Ru, Rh, Ti, Ta, and alloys thereof. In this case, the passivation layer 2320 may be formed using an electroless plating process, a metal deposition process, a sputter process, or a CVD process. A seed metal layer 2310 acting as a seed during the process of plating the passivation layer 2320 may be further formed between the Si—Al alloy substrate 2301 and the metal passivation layer 2320. The seed metal layer 2310 may be formed of Ti/Au. Furthermore, the passivation layer 2320 may be formed of a conductive dielectric, e.g., indium tin oxide (ITO), indium zinc oxide (IZO), or copper indium oxide (CIO). In this case, the passivation layer 2320 may be formed using a deposition process or a sputter process. The passivation layer 2320 may be formed in the thickness range of approximately 0.01-20 μm. Preferably, the passivation layer 2320 is formed in the thickness range of approximately 1-10 μm.

A method of manufacturing a semiconductor light emitting device according to an embodiment of the present invention will be described below with reference to FIGS. 102 through 109. FIGS. 102 through 109 are cross-sectional views illustrating a method of manufacturing a semiconductor light emitting device according to an embodiment of the present invention.

Figure 102:
Figure 103:
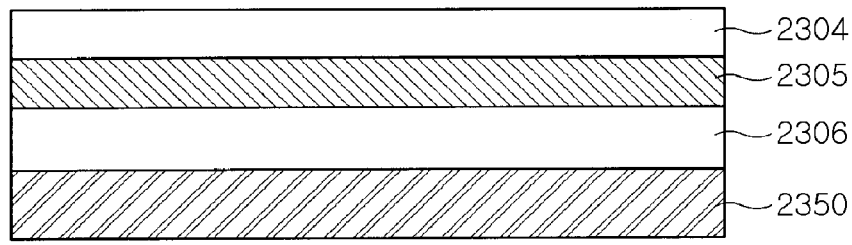
Figure 104:
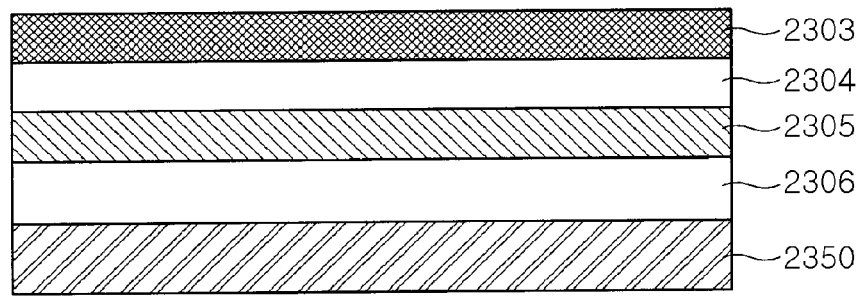
Figure 105:
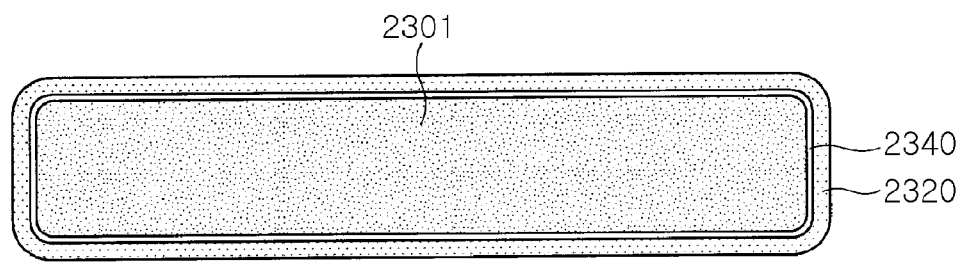

As illustrated in FIG. 102, a sapphire substrate 2350 is prepared as a growth substrate. As illustrated in FIG. 103, an n-type semiconductor layer 2306, an active layer 2305, and a p-type semiconductor layer 2304 are sequentially formed on the sapphire substrate 2350. As illustrated in FIG. 104, a reflective metal layer 2303 is formed on the p-type semiconductor layer 2304. The reflective metal layer 2303 is formed of a high reflectivity metal, e.g., Au, Al, Ag, or Ru. In some cases, the reflective metal layer 2303 may not be formed. As illustrated in FIG. 105, a passivation layer 2320 is formed on the surface of the Si—Al alloy substrate 2301. The passivation layer 2302 may be formed using a metal or a conductive dielectric.

When the passivation layer 2320 is formed of a metal, it may include any one of Ni, Au, Cu, W, Cr, Mo, Pt, Ru, Rh, Ti, Ta, and alloys thereof. In this case, the passivation layer 2320 may be formed using an electroless plating process, a metal deposition process, a sputter process, or a CVD process. When the metal passivation layer 2320 is formed using the electroless plating process, a seed metal layer 2310 acting as a seed during the process of plating the passivation layer 2320 may be further formed before the forming of the passivation layer 2320 on the surface of the Si—Al alloy substrate 2301.

When the passivation layer 2320 is formed of a conductive dielectric, it may be formed of ITO, IZO, or CIO. In this case, the passivation layer 2320 may be formed using a deposition process or a sputter process. The passivation layer 2320 may be formed in the thickness range of approximately 0.01-20 μm. Preferably, the passivation layer 2320 is formed in the thickness range of approximately 1-10 μm. If the thickness of the passivation layer 2320 is less than 0.01 μm, the passivation layer 2320 may not prevent the penetration of chemicals, e.g., HCl, HF, KOH, etc., which will be described later. If the thickness of the passivation layer 2320 is greater than 20 μm, the thermal expansion coefficient of the Si—Al alloy substrate 2301 may be changed. Thus, the passivation layer 2320 is formed to the above thickness range.

Although not illustrated, after forming the passivation layer 2320, the surface roughness may be improved by performing a chemical mechanical polishing (CMP) process on the surface of the passivation layer 2320.

Figure 106:
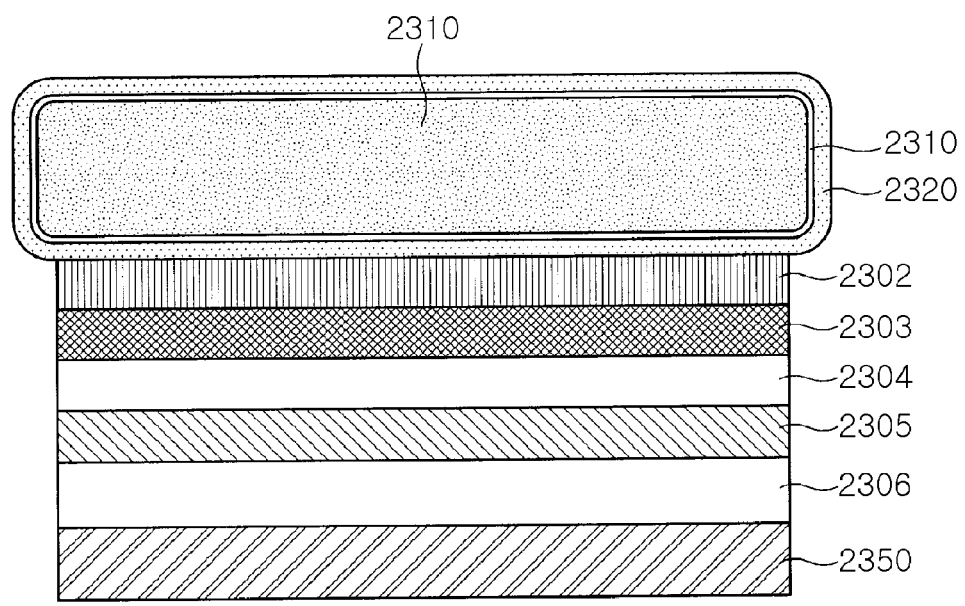

As illustrated in FIG. 106, the Si—Al alloy substrate 2301 where the passivation layer 2320 is formed on the surface thereof is bonded to the reflective metal layer 2303 by using the bonding metal layer 2302. Although the Si—Al alloy substrate 2301 may be bonded using the bonding metal layer 2302, the Si—Al alloy substrate 2301 where the passivation layer 2320 is formed on the surface thereof may be directly bonded on the reflective metal layer 2303.

Figure 107:
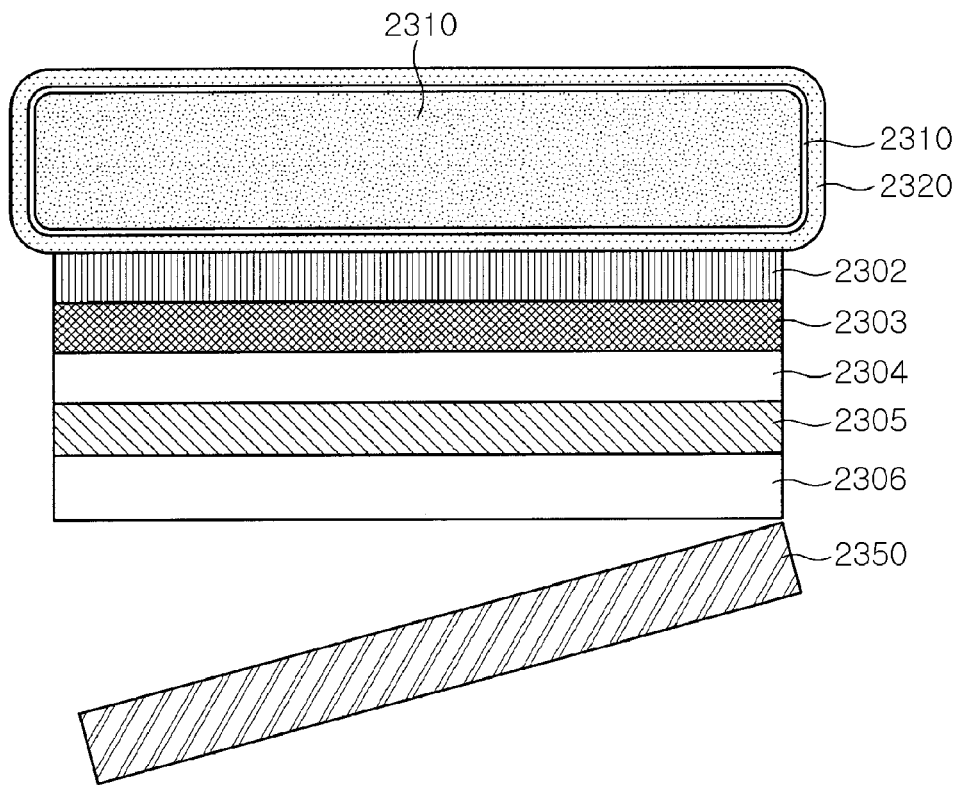

As illustrated in FIG. 107, the sapphire substrate 2350 is separated from the n-type semiconductor layer 2306 by a laser lift-off (LLO) process. After separating the sapphire substrate 2350, a cleaning process may be performed using chemicals such as HCl, HF, or KOH.

Figure 108:
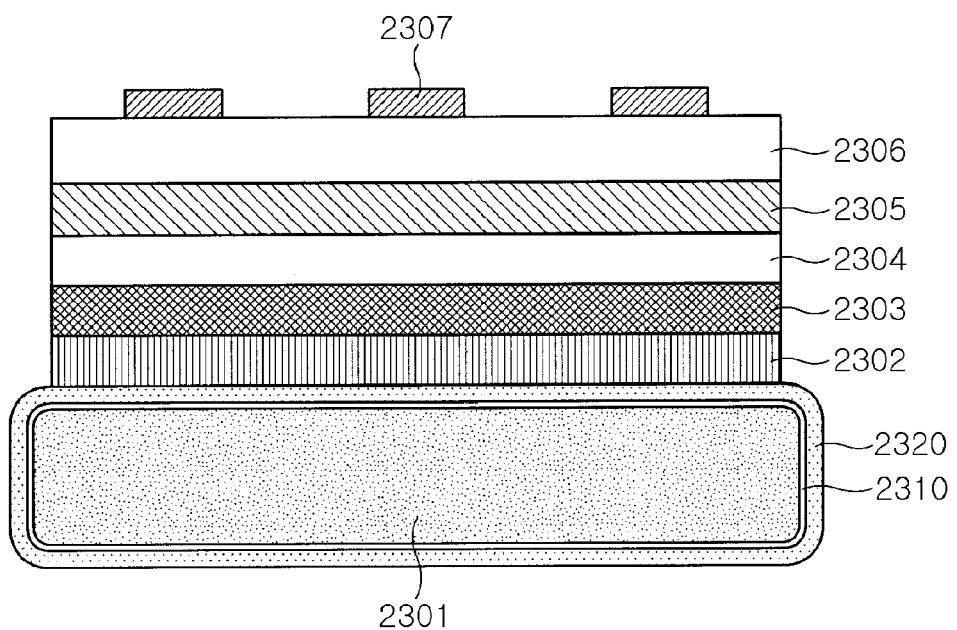

As illustrated in FIG. 108, a plurality of n-type electrodes 2307 are formed on the n-type semiconductor layer 2306 exposed by the separation of the sapphire substrate 2350. Before forming the n-type electrodes 2307, a texturing process using HOH or the like may be performed on the surface of the n-type semiconductor layer 2306 in order to improve the light extraction efficiency of the semiconductor light emitting device.

Figure 109:
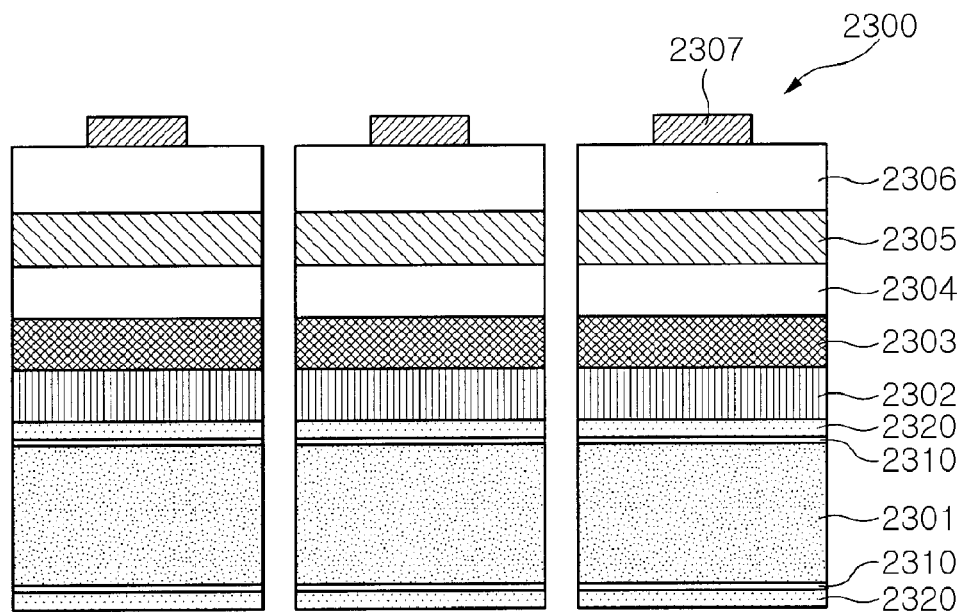

As illustrated in FIG. 109, the n-type semiconductor layer 2306, the active layer 2305, the p-type semiconductor layer 2304, the reflective metal layer 2303, the bonding metal layer 2302, the passivation layer 2320, the seed metal layer 2310, and the Si—Al alloy substrate 2301 between the n-type electrodes 2307 are diced into chips. Consequently, the semiconductor light emitting device 2300 may be obtained.

In the semiconductor light emitting device according to this embodiment of the present invention, the formation of the passivation layer 2320, such as Ni, on the surface of the Si—Al alloy substrate 2301 may prevent the aluminum (Al) of the Si—Al alloy substrate 2301 from being etched by chemicals such as HCl, HF or KOH used in the cleaning process, after the separation of the sapphire substrate 2350, or KOH used in the texturing process on the surface of the n-type semiconductor layer 2306. Accordingly, the semiconductor light emitting device according to this embodiment of the present invention may prevent the formation of uneven patterns on the surface of the Si—Al alloy substrate 2301. Consequently, it may be possible to prevent the peeling of the light emitting structure attached on the Si—Al alloy substrate 2301.

When a metal such as Ni is used for the passivation layer 2320, the surface roughness of the Si—Al alloy substrate 2301 is improved, so that the Si—Al alloy substrate 2301 and the light emitting structure are firmly attached. In the conventional art, before forming the bonding metal layer 2302, the cleaning process using chemicals such as acid is performed for removing a natural oxide layer, and the surface uneven pattern of approximately 200-500 nm is formed while aluminum (Al) on the surface of the Si—Al alloy substrate 2301 is etched. However, according to this embodiment of the present invention, if the Ni CMP process is performed after forming the passivation layer 2320 of a metal such as Ni on the surface of the Si—Al alloy substrate 2301, the uneven pattern is reduced to less than 5 nm, thereby improving the surface roughness like a mirror plane.

Figure 110:
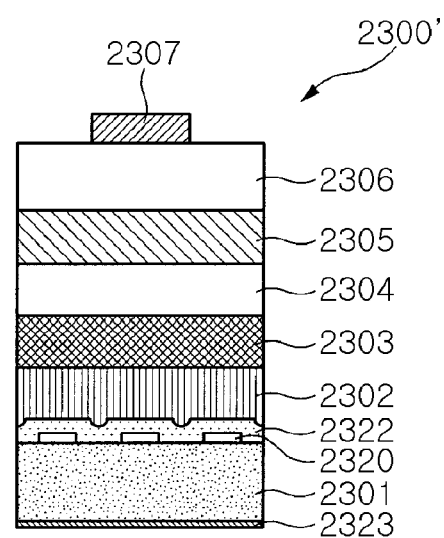

As illustrated in FIG. 110, a semiconductor light emitting device 2300' as a modified embodiment is substantially identical to the foregoing embodiment. However, the passivation layer 2320 is not formed on the entire top and bottom surfaces of the Si—Al alloy substrate 2301. Specifically, the passivation layer 2320 is formed on the top surface of the Si—Al alloy substrate 2301 so that a portion of the Si—Al alloy substrate 2301 is exposed. A conductive layer 2322 is further formed on the passivation layer 2320 and the top surface of the Si—Al alloy substrate 2301 which is exposed by the passivation layer 2320. A contact metal layer 2323 is formed on the bottom surface of the Si—Al alloy substrate 2301. In particular, the passivation layer 2320 may be formed of an insulating material, instead of a metal or a conductive dielectric. That is, in the semiconductor light emitting device according to the modified embodiment of the present invention, the passivation layer 2320 is formed of an insulating material, instead of a metal or a conductive dielectric, and the passivation layer 2320 is formed to expose a portion of the top surface of the Si—Al alloy substrate 2301 in order to electrify the Si—Al alloy substrate 2301, where the passivation layer 2320 is formed, and the light emitting structure formed on the passivation layer 2320. Also, the conductive layer 2322 is further formed on the passivation layer 2320 and the Si—Al alloy substrate 2301. The conductive layer 2322 may be formed of a metal.

Hereinafter, a method of manufacturing a compound semiconductor light emitting device according to a modified embodiment of the present invention will be described in detail. The description of the same parts as the foregoing embodiment will be omitted, and the different contents only will be described below.

Referring to FIGS. 102 through 104, an n-type semiconductor layer 2306, an active layer 2305, a p-type semiconductor layer 2304, and a reflective metal layer 2303 are sequentially formed on a sapphire substrate 2350. In some cases, the reflective metal layer 2303 may not be formed.

Figure 111:
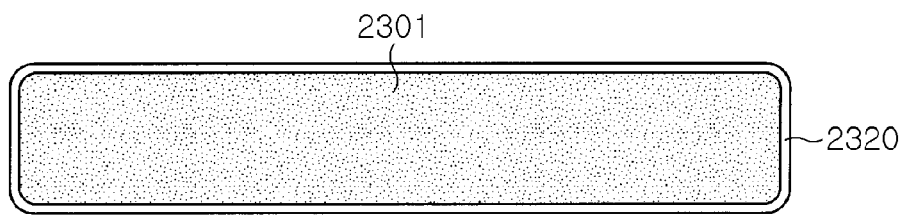

Referring to FIG. 111, a passivation layer 2320 is formed over an Si—Al alloy substrate 2301. The passivation layer 2320 may be formed of an insulating material. The insulating passivation layer 2320 may be formed to a thickness of approximately 0.01-1 µm by using a CVD process or a coating process. Although not illustrated, after forming the passivation layer 2320, a CMP process may be performed on the surface of the passivation layer 2320.

Figure 112:
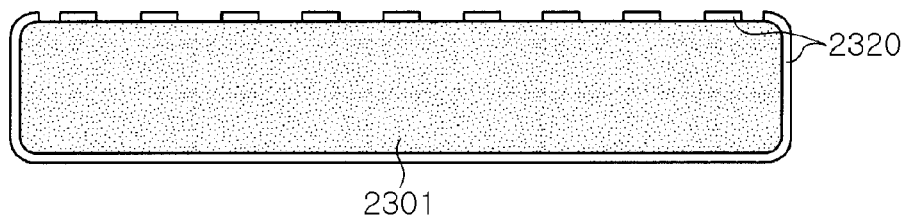
Figure 113:
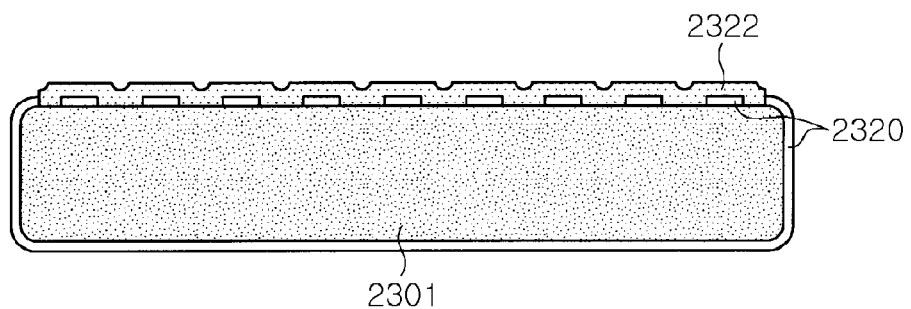
Figure 114:
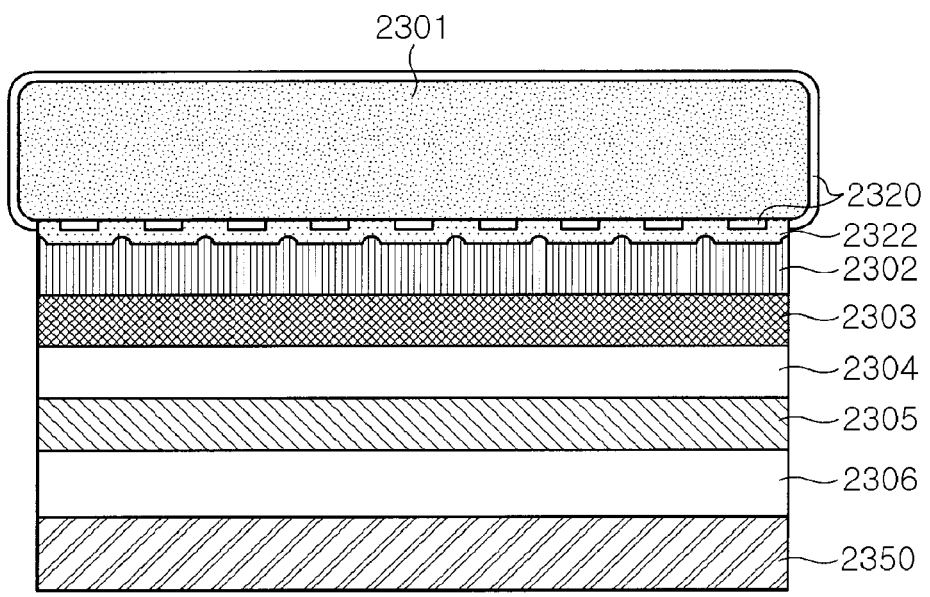

Referring to FIG. 112, a portion of the passivation layer 2320 is removed by an etching process to expose a portion of the top surface of the Si—Al alloy substrate 2301. Referring to FIG. 113, a conductive layer 2322 is formed on the passivation layer 2320 and the Si—Al alloy substrate 2301. Referring to FIG. 114, the conductive layer 2322 formed on the top surface of the Si—Al alloy substrate 2301 is attached on the reflective metal layer 2303 by using the bonding metal layer 2302.

Figure 115:
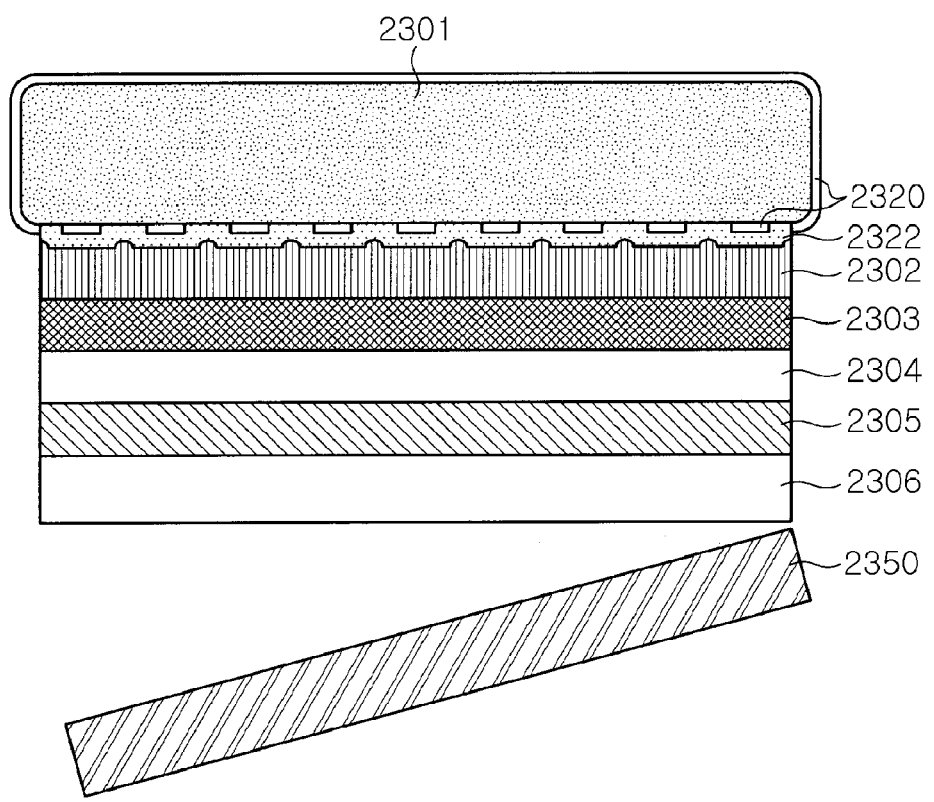

Referring to FIG. 115, the sapphire substrate 2350 is separated from the n-type semiconductor layer 2306 by a laser lift-off process. After separating the sapphire substrate 2350, a cleaning process may be performed using chemicals such as HCl, HF or KOH. Since the passivation layer 2320 and the conductive layer 2322 are formed on the surface of the Si—Al alloy substrate 2301, it is possible to prevent aluminum (Al) of the Si—Al alloy substrate 2301 from being etched by the chemicals used in the cleaning process.

Figure 116:
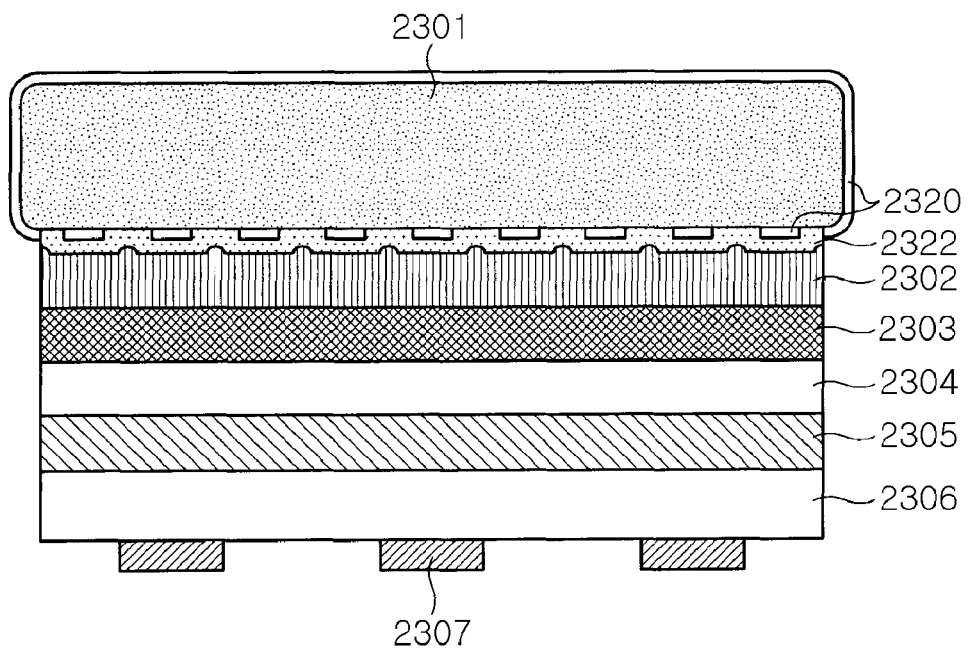

Referring to FIG. 116, a plurality of n-type electrodes 2307 are formed on the n-type semiconductor layer 2306 exposed by the separation of the sapphire substrate 2350. Before forming the n-type electrodes 2307, a texturing process using HOH or the like may be performed on the surface of the n-type semiconductor layer 2306 in order to improve the light extraction efficiency of the semiconductor light emitting device. Since the passivation layer 2320 and the conductive layer 2322 are formed on the Si—Al alloy substrate 2301, it is possible to prevent the aluminum (Al) of the Si—Al alloy substrate 2301 from being etched by the chemical used in the texturing process.

Figure 117:
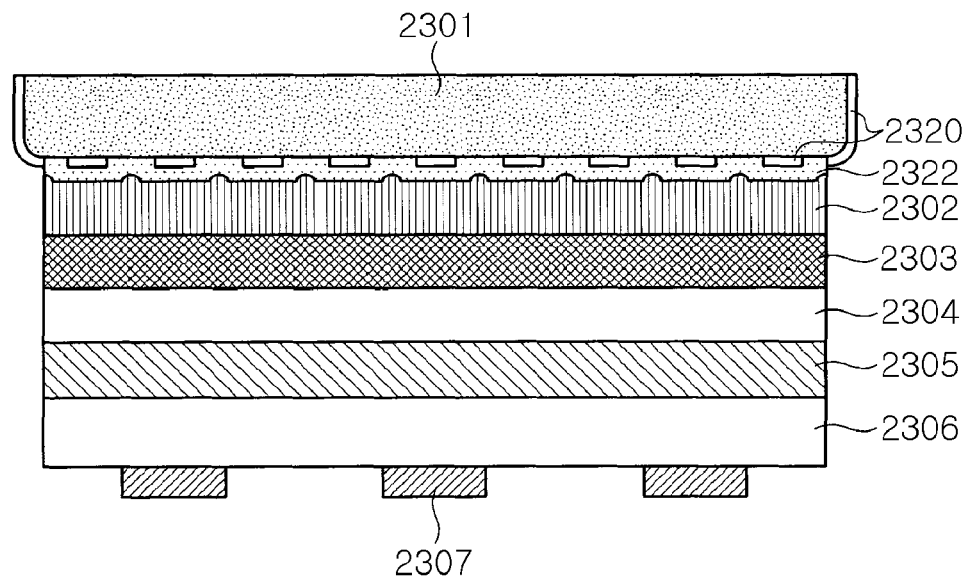
Figure 118:
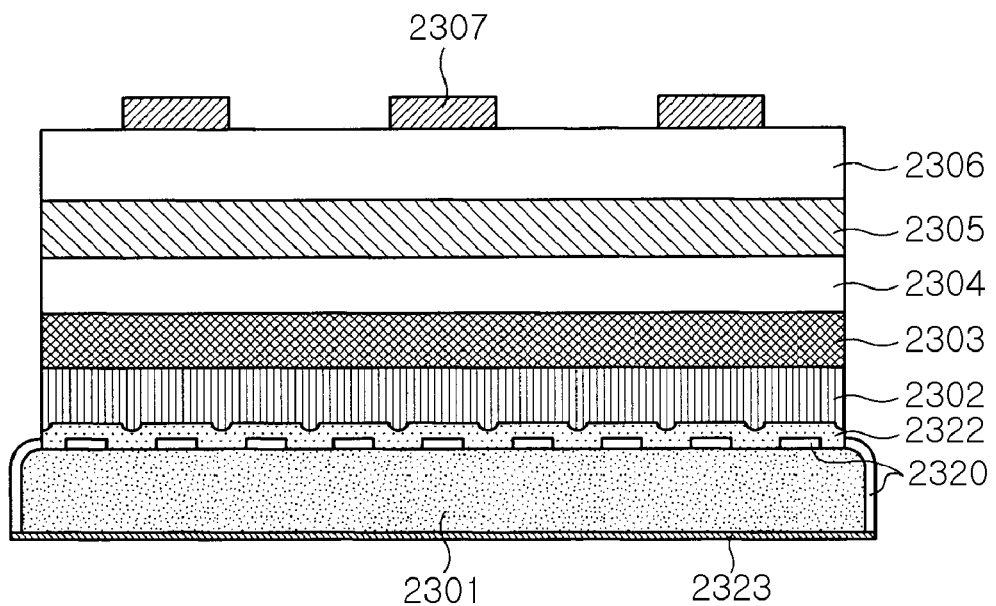

Referring to FIG. 117, a lapping process is performed to remove the bottom surface of the Si—Al alloy substrate 2301, including the passivation layer 2320, by a predetermined thickness. Referring to FIG. 118, a contact metal layer 2323 is formed on the bottom surface of the Si—Al alloy substrate 2301 exposed by the lapping process.

Figure 119:
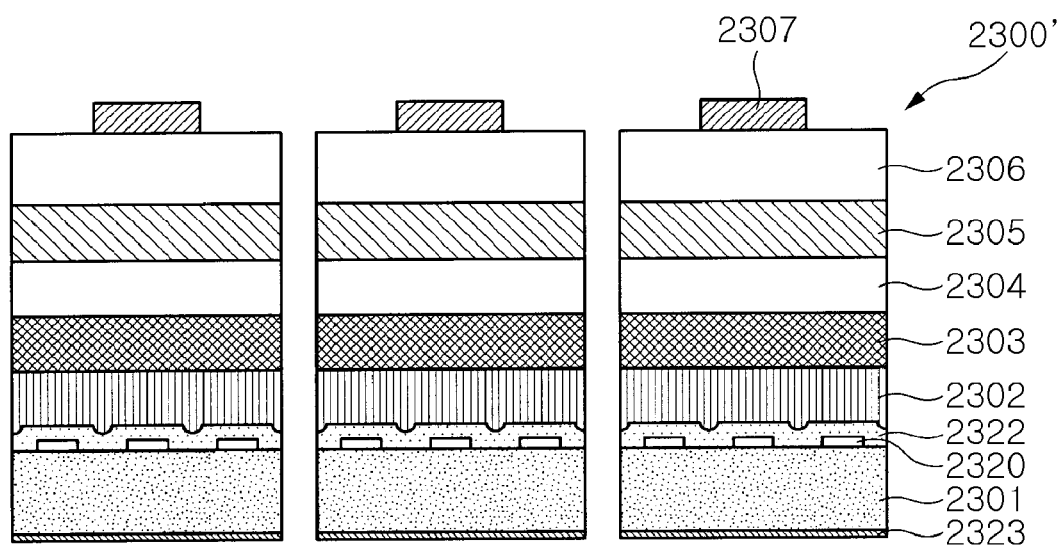

Referring to FIG. 119, the n-type semiconductor layer 2306, the active layer 2305, the p-type semiconductor layer 2304, the reflective metal layer 2303, the bonding metal layer 2302, the conductive layer 2322, the passivation layer 2320, the Si—Al alloy substrate 2301, and the contact metal layer 2323 between the n-type electrodes 2307 are diced into chips. Consequently, the semiconductor light emitting device 2300' according to the modified embodiment of the present invention may be obtained.

<Light Emitting Device Package and Light Source Module>

A light emitting device package according to an embodiment of the present invention may include the above-described semiconductor light emitting device.

The following description will be made with regard to light emitting device packages including the semiconductor light emitting devices according to various embodiments of the present invention.

Figure 120:
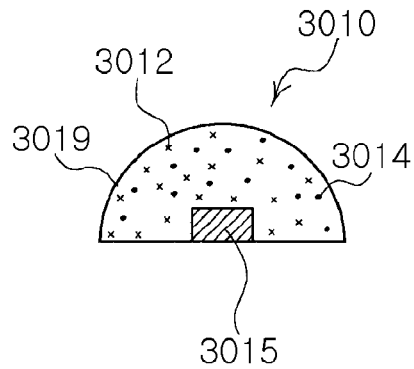
FIGS. 120 through 122 illustrate white light emitting device packages according to various embodiments of the present invention.

FIG. 120 is a schematic view of a white light emitting device package according to an embodiment of the present invention.

Referring to FIG. 120, the white light emitting device package 3010 according to this embodiment of the present invention includes a blue light emitting device 3015 and a resin encapsulation part 3019 packaging the blue light emitting device 3015 and having the top surface with a convex lens shape.

As illustrated, the resin encapsulation part 3019 used in this embodiment has a hemispherical lens shape in order to ensure a wide orientation. The blue light emitting device 3015 may be directly packaged on a separate circuit board. The resin encapsulation part 3019 may be formed of a silicon resin, an epoxy resin, or other transparent resins. A mixed material including a yellow phosphor, a green phosphor 3012, a red phosphor 3014, a quantum dot (QD) phosphor, or at least one kind of the phosphors is dispersed or stacked in a layer structure in the inside or outside of the resin encapsulation part 3019.

The green phosphor 3012 may be at least one phosphor selected from the group consisting of $M_2SiO_4$:Re silicate-based phosphor, $MA_2D_4$:Re sulfide-based phosphor, β-SiAlON:Re phosphor, and $MA'_2O_4$:Re' oxide-based phosphor.

Herein, M is at least one element selected from Ba, Sr, Ca, and Mg, and A is at least one element selected from Ga, Al, and In. D is at least one element selected from S, Se, and Te, and A' is at least one element selected from Sc, Y, Gd, La, Lu, Al, and In. Re is at least one element selected from Eu, Y, La, Ce, Nd, Pm, Sm, Gd, Tb, Dy, Ho, Er, Tm, Yb, Lu, F, Cl, Br, and I. Re's is at least one element selected from Ce, Nd, Pm, Sm, Tb, Dy, Ho, Er, Tm, Yb, F, Cl, Br, and I.

Meanwhile, the red phosphor 3014 may be at least one selected from $MAlSiN_x$:Re nitride-based phosphor (1×5) and MD:Re sulfide-based phosphor.

M is at least one selected from Ba, Sr, Ca, and Mg, and D is at least one selected from S, Se, and Te. Re is at least one selected from Eu, Y, La, Ce, Nd, Pm, Sm, Gd, Tb, Dy, Ho, Er, Tm, Yb, Lu, F, Cl, Br, and I.

The QD phosphor is a nano crystal particle composed of a core and a shell, and a core size is in the range of approximately 2-100 nm. The QD phosphor may be used as phosphor materials to emit various colors, e.g., blue (B), yellow (Y), green (G) and red (R) by adjusting the core size. The core and shell structure of the QD phosphor may be formed by heterojunction of at least two kinds of semiconductors among group II-VI compound semiconductors (ZnS, ZnSe, ZnTe, CdS, CdSe, CdTe, HgS, HgSe, HgTe, MgTe, etc.), group III-V compound semiconductors (GaN, GaP, GaAs, GaSb, InN, InP, InAs, InSb, AlAs, AlP, AlSb, AlS, etc.), and group IV semiconductors (Ge, Si, Pb, etc.). An organic ligand using a material such as oleic acid may be formed at the outer shell of the QD phosphor in order to terminate the molecular bonding of the shell surface, suppress the aggregation between the QD particles, improve the dispersion inside the resin such as a silicon resin or an epoxy resin, or improve the phosphor function.

As such, considering half bandwidth, peak wavelength and/or conversion efficiency, a combination of a specific red, green, yellow, or QD phosphor is provided. Thus, a white light having a high color rendering index of 70 or more may be provided. Also, since light of several wavelength bands is obtained through the plurality of phosphors, color reproduction may be improved.

The main wavelength of the light emitting device may be in the range of approximately 360-460 nm. In this case, in order to obtain a higher color rendering index by ensuring a wide spectrum in a visible light band, the peak emission wavelength of the green phosphor 3012 may be in the range of approximately 500-550 nm, and the peak emission wavelength of the red phosphor 3014 may be in the range of approximately 610-660 nm.

Preferably, when the light emitting device has the main wavelength range of approximately 430-460 nm, the blue light emitting device has a half bandwidth of approximately 10-30 nm, the green phosphor has a half bandwidth of approximately 30-100 nm, and the red phosphor has a half bandwidth of approximately 50-150 nm.

According to another embodiment of the present invention, in addition to the red phosphor 3012 and the green phosphor 3014, an orange yellow phosphor may be further included. In this case, the color rendering index may be further improved. Such an embodiment is illustrated in FIG. 102.

Figure 121:
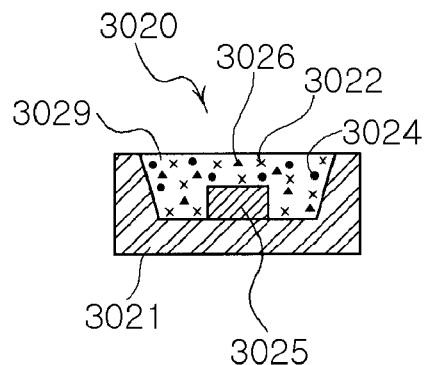

Referring to FIG. 121, the white light emitting device package 3020 according to this embodiment of the present invention includes a package main body 3021, a blue light emitting device 3025, and a transparent resin encapsulation part 3029. A reflection cup is formed in the center of the package main body 3021, and the blue light emitting device 3025 is mounted on the bottom of the reflection cup. The transparent package part 3029 encapsulates the blue light emitting device 3025 within the reflection cup.

For example, the resin encapsulation part 3029 may be formed using a silicon resin, an epoxy resin, or a combination thereof. In this embodiment, in addition to the green phosphor 3012 and the red phosphor 3014 described in FIG. 101, an orange yellow phosphor 3026 is further included in the resin encapsulation part 3029.

That is, the green phosphor 3022 may be at least one phosphor selected from the group consisting of $M_2SiO_4$:Re silicate-based phosphor, $MA_2D_4$:Re sulfide-based phosphor, β-SiAlON:Re phosphor, and $MA'_2O_4$:Re' oxide-based phosphor. The red phosphor 3024 may be at least one selected from the group consisting of nitride-based phosphor, e.g., $MAlSiN_x$:Re ($1 \leq x \leq 5$), $Sr2-a-xBaaSi4-yO4-2yN4$:$Eux2+$ (where, $0.001<x<0.2$, $0 \leq y < 2$, $0 \leq a \leq 1.3$), $M_2Si_{3-x}Al_xO_{2+x}N_{4-x}$:Re (where, $0 \leq x \leq 0.5$), or $M_2Si_5N_{8-x}O_x$:Re (where, $0 \leq x \leq 0.5$), and MD:Re sulfide-based phosphor.

The β-SiAlON:Re phosphor may be $Si_{6-x}Al_xO_zN_{8-z}$:$Eu_y$, $Sr_x$ (where, $0 \leq x < 0.011$, $0.018 < y < 0.025$, $0.23 < z < 0.35$). The β-SiAlON:Re phosphor may include a crystal phase of nitride or oxynitride having a β-$Si_3N_4$ crystal structure, and emit fluorescent light having a peak at a green to red color wavelength of approximately 500-670 nm according to radiation of an excitation light source which is in an ultraviolet to blue color range having a frequency range of approximately 360-460 nm. Also, the nitride phosphor $M_xSi_yN_z$:Eu (where, $1 \leq x \leq 2$, $5 \leq y \leq 7$, $z=2x/3+4y/3$) may also be used as the light emitting phosphor ranging from the green color to the red color.

Additionally, in this embodiment, a third phosphor 3026 is further included. The third phosphor may be an orange yellow phosphor which can emit light in a wavelength band disposed at the middle of the green color wavelength band and the red color wavelength band. The orange yellow phosphor may be a silicate-based phosphor or a nitride-based phosphor, e.g., α-SiAlON:Re phosphor.

The α-SiAlON:Re phosphor may be an oxynitride phosphor formed by activating rare earth elements, which is characterized in that a part or all of a metal Me (where Me is Ca, or one or two kinds of Y) solid-solved in the α-SiAlON expressed as MeXSi12−(m+2)Al(m+n)OnN16−n:Re (where x, y, m and m are coefficients) is replaced with a lanthanide metal Re which is the center of light emission.

Also, the nitride phosphor $M_xSi_yN_z$:Eu (where, $1 \leq x \leq 2$, $5 \leq y \leq 7$, $z=2x/3+4y/3$) may be used as the orange yellow phosphor.

In the above-described embodiment, two or more kinds of phosphor powders are mixed and dispersed in the single resin encapsulation part region. However, various modifications may also be made. More specifically, the two or three kinds of phosphors may be provided in different layer structures. In one example, the green phosphor, the red phosphor, and the yellow or orange yellow phosphor may be provided as a multi-layer phosphor layer by dispersing their phosphor powders at a high pressure.

Figure 122:
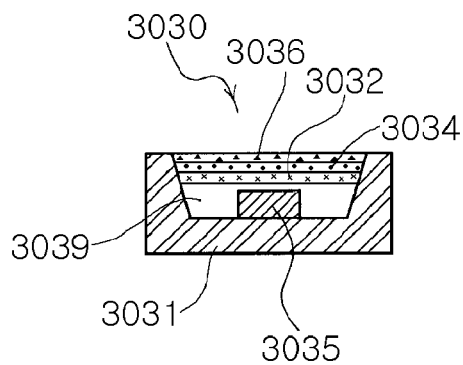

As illustrated in FIG. 122, a plurality of phosphor containing resin layer structures may be provided.

Referring to FIG. 122, like the foregoing embodiment, the white light emitting device package 3030 according to this embodiment of the present invention includes a package main body 3031, a blue light emitting device 3035, and a transparent rein package part 3039. A reflection cup is formed at the center of the package main body 3031. The blue light emitting device 3035 is mounted on the bottom of the reflection cup. The transparent resin encapsulation part 3039 encapsulates the blue light emitting device 3035 within the reflection cup.

A resin layer including different phosphors is provided on the resin encapsuulation part 3039. That is, a wavelength conversion part may be provided with a first resin layer 3032 containing the green phosphor, a second resin layer 3034 containing the red phosphor, and a third resin layer 3036 containing the yellow or orange yellow phosphor.

The phosphors used in this embodiment may be identical or similar to those of FIG. 121.

The white light from the combination of the phosphors used herein may obtain a high color rendering index. A further detailed description will be made with reference to FIG. 123.

Figure 123:
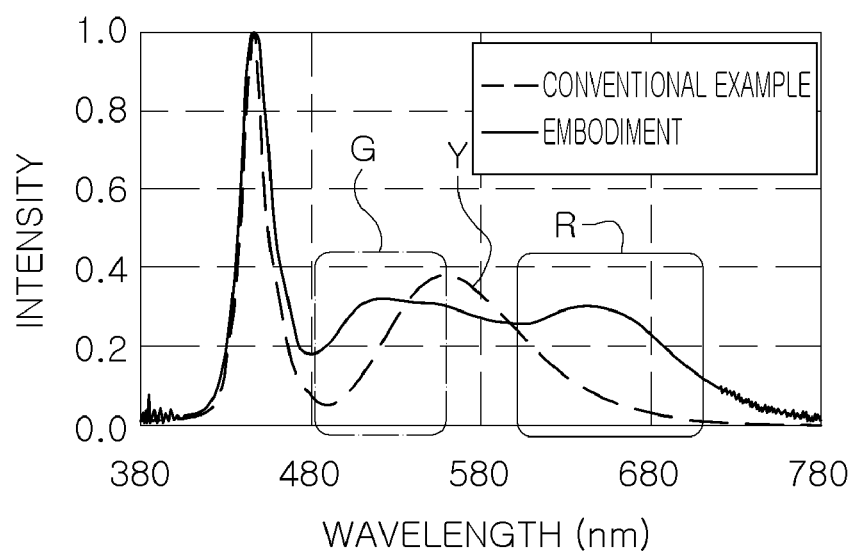
FIG. 123 is an emission spectrum of a white light emitting device according to an embodiment of the present invention.

As illustrated in FIG. 123, in the case of the existing example, when the yellow phosphor is combined with the blue light emitting device, yellow light converted together with blue wavelength light may be obtained. Since there is almost no light in the green and red wavelength bands when light containing entire visible light spectrum is viewed, it is difficult to ensure a color rendering index close to a natural light. In particular, the converted yellow light has a narrow half bandwidth in order to obtain high conversion efficiency. Thus, in this case, the color rendering index may be further lowered.

Furthermore, in the existing example, since the white light characteristic exhibited according to the single yellow color conversion degree is easily changed, it is difficult to ensure excellent color reproduction.

On the contrary, in the embodiment in which the blue light emitting device, the green phosphor (G), and the red phosphor (R) are combined, the light is emitted in the green and red color bands. Thus, a wider spectrum may be obtained in the visible light band, thereby remarkably improving the color rendering index. Additionally, the color rendering index may be improved even more markedly by further including the yellow or orange yellow phosphor capable of providing the middle wavelength band between the green color band and the red color band.

The green phosphor, the red phosphor, and the yellow or orange yellow phosphor which may be optionally added will be described below with reference to FIGS. 124 through 126.

Figure 124:
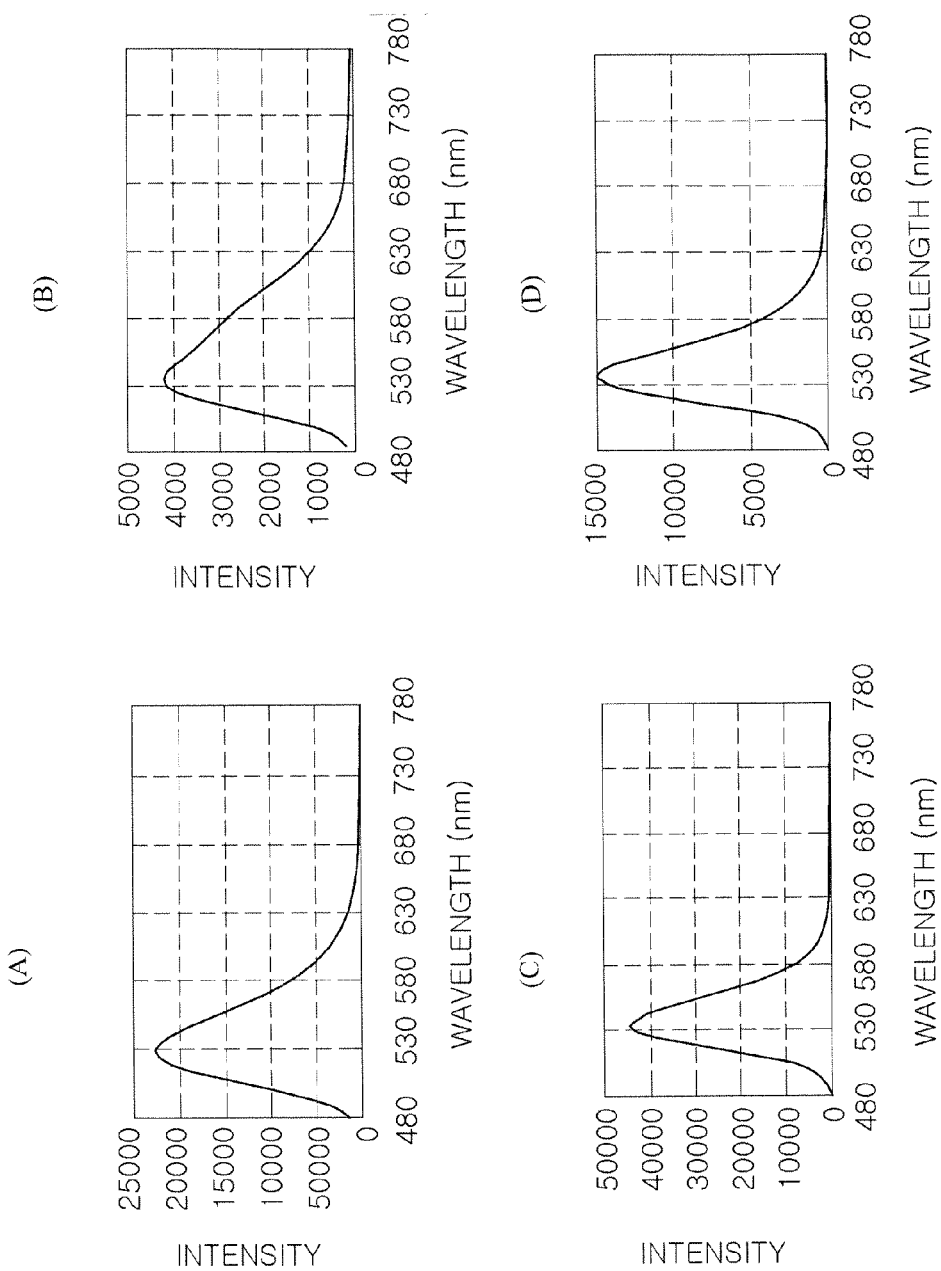
FIGS. 124A through 124D are wavelength spectrums illustrating an emission characteristic of a green phosphor used herein.
Figure 125:
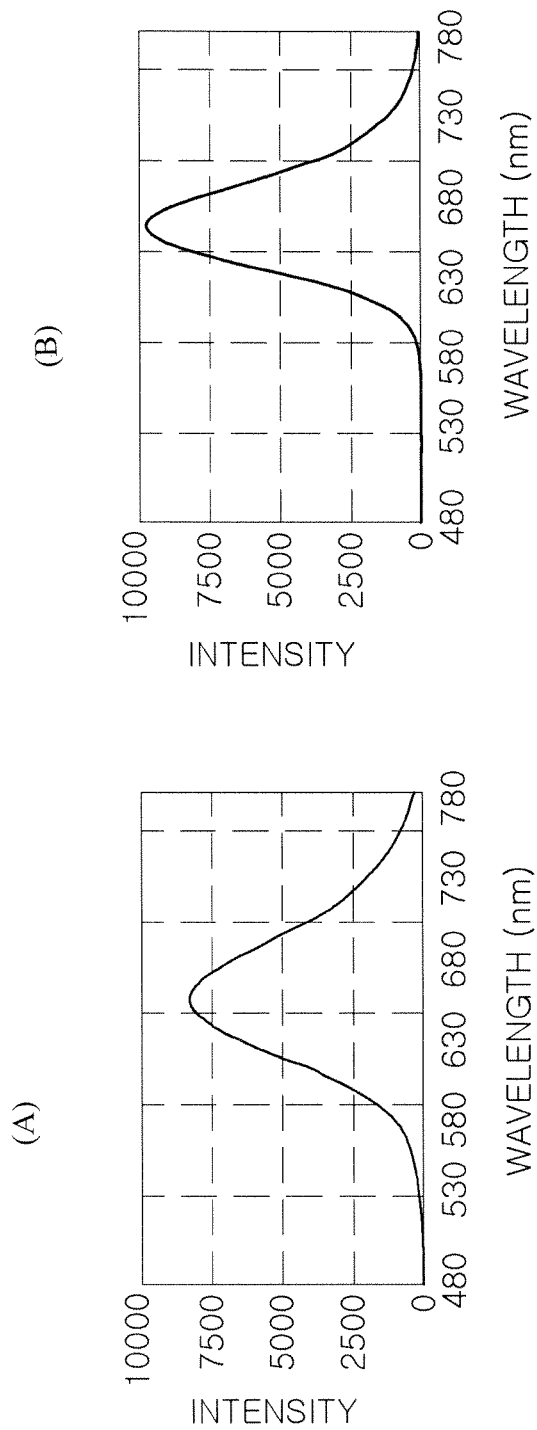
FIGS. 125A and 125B are wavelength spectrums illustrating an emission characteristic of a red phosphor used herein.
Figure 126:
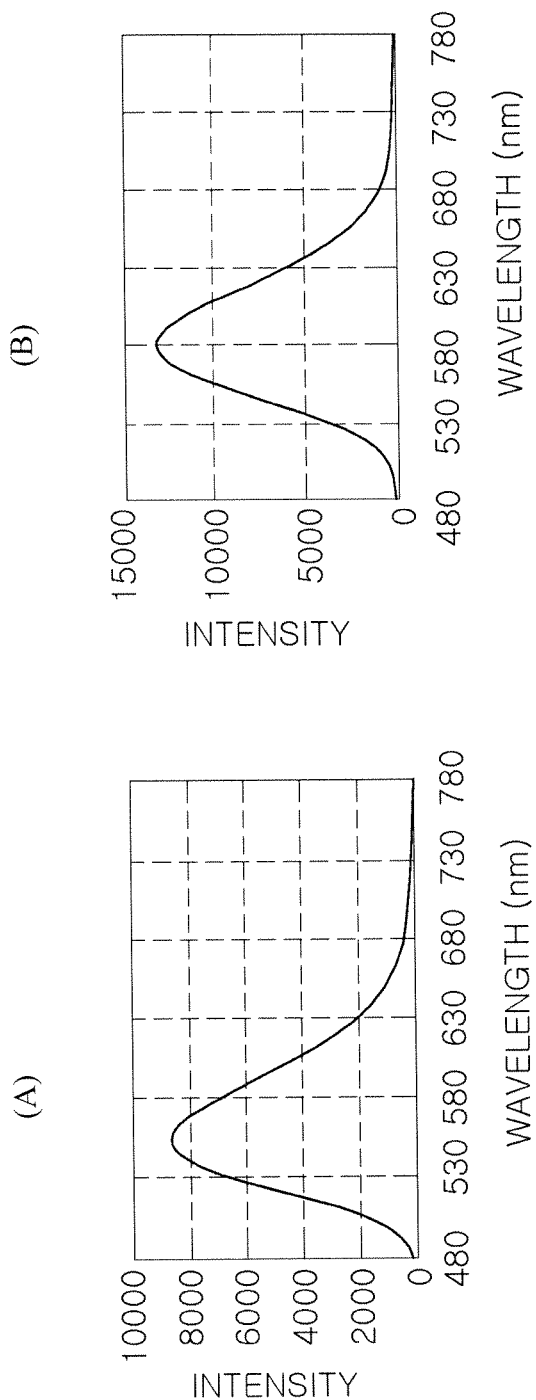
FIGS. 126A and 126B are wavelength spectrums illustrating an emission characteristic of a yellow phosphor used herein.

FIGS. 124 through 126 illustrate wavelength spectrums of the phosphors used herein; specifically, the results of light generated the blue light emitting device (approximately 440 nm).

FIGS. 124A through 124D illustrate the spectrums of the green phosphor used herein.

FIG. 124A illustrates a spectrum of the $M_2SiO_4$:Re silicate-based phosphor (where, M is at least two kinds of elements selected from Ba, Sr, Ca, and Mg, and Re is at least one selected from Eu, Y, La, Ce, Nd, Pm, Sm, Gd, Tb, Dy, Ho, Er, Tm, Yb, Lu, F, Cl, Br, and I). The converted green light has a peak wavelength of approximately 530 nm and a half bandwidth of approximately 65 nm.

FIG. 124B illustrates a spectrum of the $M'A'_2O_4$:Re' oxide-based phosphor (where, M' is at least one selected from Ba, Sr, Ca, and Mg, A' is at least one selected from Sc, Y, Gd, La, Lu, Al, and In, and Re' is at least one selected from Ce, Nd, Pm, Sm, Tb, Dy, Ho, Er, Tm, Yb, F, Cl, Br, and I). The converted green light has a peak wavelength of approximately 515 nm and a half bandwidth of approximately 100 nm.

FIG. 124C illustrates a spectrum of the $MA_2D_4$:Re sulfide-based phosphor (where, M is at least two kinds of elements selected from Ba, Sr, Ca, and Mg, A is at least one selected from Ga, Al, and In, D is at least one selected from S, Se, and Te, and Re is at least one selected from Eu, Y, La, Ce, Nd, Pm, Sm, Gd, Tb, Dy, Ho, Er, Tm, Yb, Lu, F, Cl, Br, and I). The converted green light has a peak wavelength of approximately 535 nm and a half bandwidth of approximately 60 nm.

FIG. 124D illustrates a spectrum of the β-SiAlON:Re phosphor (where, Re is at least one selected from Eu, Y, La, Ce, Nd, Pm, Sm, Gd, Tb, Dy, Ho, Er, Tm, Yb, Lu, F, Cl, Br, and I). The converted green light has a peak wavelength of approximately 540 nm and a half bandwidth of approximately 45 nm.

FIGS. 125A and 125B illustrate spectrums of the red phosphor used herein.

FIG. 125A illustrates a spectrum of the $M'AlSiN_x$:Re (where $1 \leq x \leq 5$) nitride-based phosphor (where, M's is at least one selected from Ba, Sr, Ca, and Mg, and Re is at least one selected from Eu, Y, La, Ce, Nd, Pm, Sm, Gd, Tb, Dy, Ho, Er, Tm, Yb, Lu, F, Cl, Br, and I). The converted red light has a peak wavelength of approximately 640 nm and a half bandwidth of approximately 85 nm.

FIG. 125B illustrates a spectrum of the M'D:Re sulfide-based phosphor (where, M' is at least one selected from Ba, Sr, Ca, and Mg, D is at least one selected from S, Se, and Te, and Re is at least one selected from Eu, Y, La, Ce, Nd, Pm, Sm, Gd, Tb, Dy, Ho, Er, Tm, Yb, Lu, F, Cl, Br, and I). The converted red light has a peak wavelength of approximately 655 nm and a half bandwidth of approximately 55 nm.

FIGS. 126A and 126B illustrate spectrums of the orange yellow phosphor which can be optionally used herein.

FIG. 126A illustrates a spectrum of the silicate-based phosphor. The converted yellow light has a peak wavelength of approximately 555 nm and a half bandwidth of approximately 99 nm.

FIG. 126B illustrates a spectrum of the α-SiAlON:Re phosphor (where, Re is at least one selected from Eu, Y, La, Ce, Nd, Pm, Sm, Gd, Tb, Dy, Ho, Er, Tm, Yb, Lu, F, Cl, Br, and I). The converted yellow light has a peak wavelength of approximately 580 nm and a half bandwidth of approximately 35 nm.

As such, the white light having a high color rendering index of more than 70 may be provided by a combination of a specific green phosphor and a specific red phosphor or an addition of a yellow or orange yellow phosphor to the combination, considering the bandwidth, the peak wavelength and/or the conversion efficiency.

When the main wavelength of the blue light emitting device is in the range of 430-460 nm, the peak emission wavelength of the green phosphor is in a range of 500-550 nm. The peak emission wavelength of the red phosphor is in the range of 610-660 nm. The peak emission wavelength of the orange yellow phosphor is in the range of 550-600 nm.

Also, when the blue light emitting device has a half bandwidth of 10 to 30 nm, the green phosphor may have a half bandwidth of 30 to 100 nm, and the red phosphor may have a half bandwidth of 50 to 150 nm. The yellow or orange yellow phosphor may have a half bandwidth of 20 to 100 nm.

A wide spectrum may be ensured in a visible light band through the selection and combination of the phosphors having those conditions, and the superior white light having a higher color rendering index may be provided.

Meanwhile, the red phosphor according to another embodiment of the present invention uses an inorganic crystal of $(Sr, M)_2SiO_{4-x}N_y$ as a host material. Also, Eu is used as an activator which generates a red energy level. Thus, a long-wavelength red light having a peak emission wavelength in the range of 600-700 nm may be emitted. A main metal element constituting the host material is strontium (Sr), and a metal element M which may replace the strontium (Sr) is at least one element among monad and dyad elements. The emitted light color and brightness are changed according to electron states around the main light emitting element Eu. Therefore, the emission characteristics and physical characteristics of the red phosphor may be varied by changing the composition of the inorganic crystal host material.

The red phosphor includes an inorganic compound expressed as the composition of $(Sr, M)_2SiO_{4-x}N_y$:Eu. Herein, M is at least one metal element, and x is selected within a range meeting the condition of $0<x<4$. Since a total charge of $Sr_2SiO_{4-x}N_y$ must be zero, $y=2x/3$. Preferably, in order to a high-brightness red light, $0.15 \leq x \leq 3$. If x is less than 0.15 or greater than 3, it is difficult to obtain a red light having a desired brightness and peak emission wavelength.

Here, since M includes at least one kind of element selected from group I elements consisting of Li, Na, K, Rb and Cs or group II elements consisting of Mg, Ca, Sr, and Ba, the peak emission of the red phosphor may be adjusted. In the above composition, the peak emission of the red phosphor may be adjusted by replacing a portion of Si with at least one kind of element selected from the group consisting of B, Al, Ga and In, or the group consisting of Ti, Zr, Gf, Sn, and Pb. A replacement ratio of the Si to the element may be $\frac{1}{10}$.

In this embodiment, crystals different from silicon oxide, silicon nitride, and oxynitride are used as the host material. In this way, it is possible to obtain a long-wavelength red phosphor having a peak emission in a red color wavelength range, e.g., a wavelength range of approximately 600-700 nm. By replacing oxygen with nitrogen in an appropriate range in the composition, it is possible to obtain a high-brightness red phosphor having a peak emission in a wavelength range of approximately 600-620 nm.

Furthermore, compared with the existing oxide phosphor material, the red phosphor according to this embodiment of the present invention has high emission characteristics and superior thermal chemical stability because nitrogen has a higher covalent bond characteristic than oxygen. The excellent thermal stability may be obtained through the stiffer crystal structure. The splitting of the energy level within the lanthanide elements is increased by the stiff crystal structure due to nitrogen, thereby emitting light having a longer wavelength than the oxide phosphor material. That is, since the red phosphor according to this embodiment of the present invention has high emission characteristics and superior thermal chemical stability, the high-power high-reliability white light emitting device package may be manufactured.

Meanwhile, the method of manufacturing the red phosphor includes: preparing at least one of an Sr-containing compound, an M-containing compound, an Eu-containing compound, an Si-containing oxide, and Si-containing nitride as a source material; and preparing source materials to be measured and mixed according to a desired stoichiometry. The mixture of the source materials may be performed using one of a dry method and a wet method.

According to the wet mixing method, the measured mixture, a ball, and a solvent are mixed. The ball is helpful in the process of mixing and grinding the source materials. The ball used herein is a ball which is formed of silicon oxide ($Si_3N_4$) or zirconia ($ZrO_2$) or a ball which is generally used in mixing materials. D.I. water, alcohol such as ethanol, or an organic solvent such as n-Hexane may be used as the solvent. That is, the source material, the solvent, and the ball are inserted and then the container is sealed. The source material is then uniformly mixed for 1-24 hours by using a miller or the like. After the mixing process, the mixed source material is separated from the ball, and most solvent is dried at an oven through a drying process for 1-48 hours. The dried powder is uniformly classified in a size of less than 100 micrometers by using a metal or polymer sieve.

Meanwhile, according to the dry mixing method, source materials are inserted into a container, without using a solvent. The source materials are uniformly mixed using a milling machine. The mixing time is approximately 1-24 hours. At this time, if a ball is inserted into the container together with the source materials, it is easier to mix the source materials. Hence, the mixing time may be reduced. Compared with the wet mixing method, the dry mixing method requires no solvent drying process, thereby reducing the entire processing time. Like the wet mixing method, when the mixture of the source materials is completed, the mixed powders are uniformly classified in a size of less than 100 micrometers by using a metal or polymer sieve.

The finally classified mixed powders are packed into a boron nitride (BN) furnace and a sintering process is performed thereupon. At this time, the sintering process is performed in a heating furnace at a temperature of approximately 100-1,800° C. for approximately 1-24 hours. A sintering takes place in an atmosphere of 100% nitrogen gas (N2) or in a mixed nitrogen gas containing 1-10% of hydrogen gas. The synthesized phosphor powder is uniformly ground using a grinding mixer or a grinder. Then, a post-heat treatment is performed one to three in a manner similar to the above-described synthesizing process, thereby improving the brightness of the phosphors.

Through those processes, the final red phosphor containing the inorganic compound expressed as the composition of $(Sr, M)_2SiO_{4-x}N_y$ is manufactured. Here, at least one of M is a monad element and a dyad element, $0 < x < 4$, and $y=2x/3$.

The finally sintered phosphor powder is ground by a grinding mixer or a grinder, and grain size is controlled through a classification process in order to obtain an optimal grain size. In this case, a sieve having a size of 16 micrometers is used to obtain a red phosphor powder comprised of particles having a uniform size of 16 micrometers or less. The obtained phosphor powder is post-processed using D.I. water, an inorganic acid, an organic acid, or a base. In this way, it is possible to remove impurities such as an extra glass phase contained in the phosphor, a non-reacted metal material, etc. For example, 0.1-60% of nitric acid is added and a stirring process is performed for 1-10 hours to extract or remove the extra impurities. Examples of the inorganic acid include a nitric acid, a sulfuric acid, a hydrogen fluoride, and an inorganic mixed solution. Meanwhile, impurities which are not removed through the acid processing may be removed using a base. Examples of the base include an inorganic base, such as sodium hydroxide or potassium hydroxide, or a mixed solution thereof. After the acid processing and the base processing, the remaining acid or base in the phosphor slurry is cleaned using D.I. water, and a final desired phosphor powder is obtained by performing a wet classification process, a filtering process, and a drying process. At this time, the drying process is sufficiently performed at a temperature of approximately 50-150° C.

In an embodiment of the present invention, the Sr-containing compound may be $SrCO_3$, and the Eu-containing compound may be $Eu_2O_3$. Also, the Si-containing oxide may be $SiO_2$, and the Si-containing nitride may be $Si_3N_4$. In the red phosphor according to the embodiment of the present invention, $Eu_2O_3$ is added to the composition of $SrCO_3$—$SiO_2$—$Si_3N_4$ to obtain the inorganic compound expressed as the composition of $Eu_zSr_{2-z}SiO_{4-x}N_y$. In this composition, z is in the range of $0.01 \le z \le 0.2$. At the concentration where the value of z is more than 0.2, the light emitting intensity is reduced by a concentration quenching. Also, at concentrations where the value of z is less than 0.01, the light emitting intensity is reduced by the concentration deficiency of the activator acting as the main light emitting element.

Hereinafter, various embodiments of the present invention will be described in more detail, but it will be readily apparent that the technical spirit and scope of the present invention is not limited to those embodiments.

Embodiment 1

Figure 127:
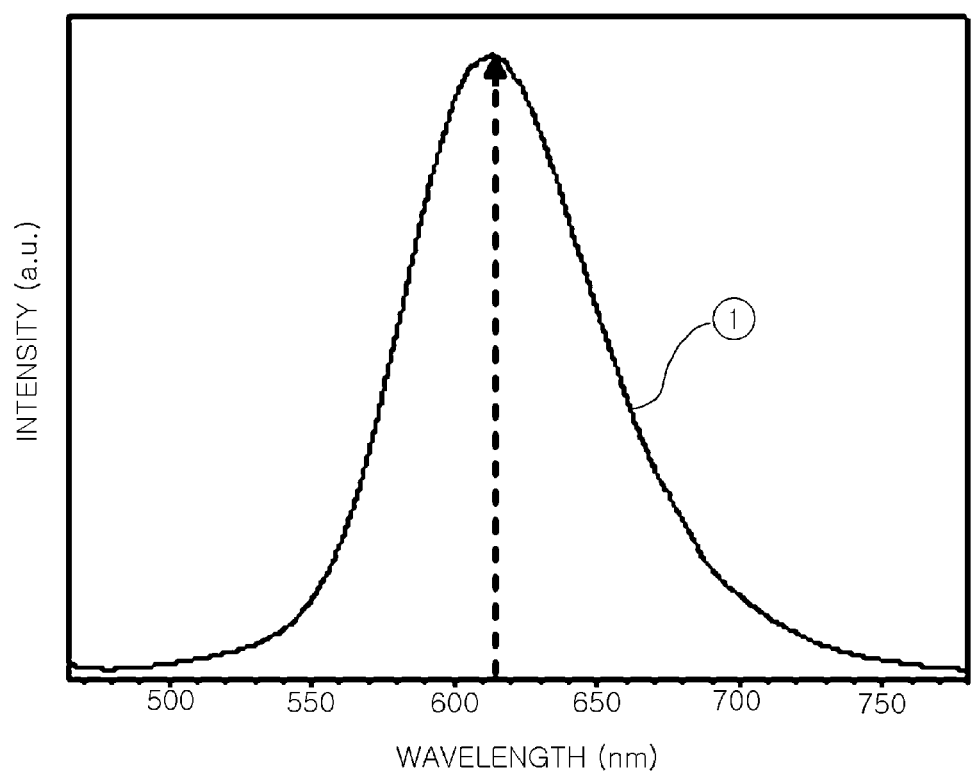
FIGS. 127 through 129 illustrate an emission spectrum, an XRD spectrum, and an EDX component analysis result of a phosphor expressed as $(Sr, M)_2SiO_{4-x}N_y$ according to a first embodiment of the present invention.
Figure 128:
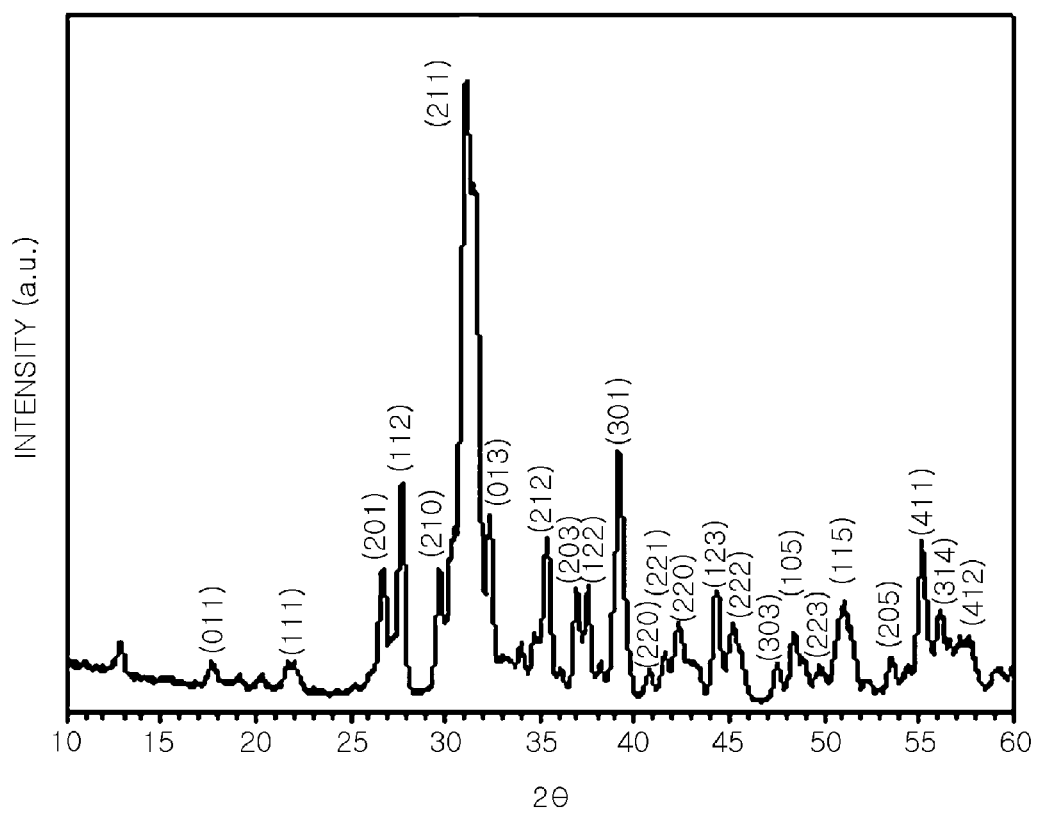
Figure 129:
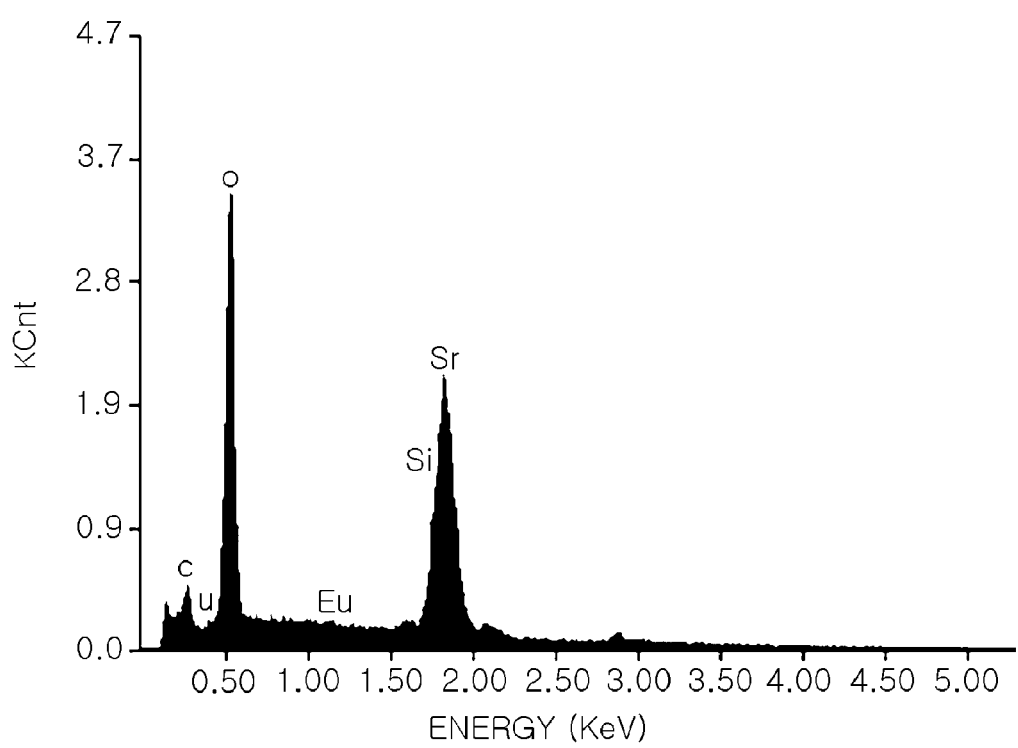

$SrCO_3$, $SiO_2$, $Eu_2O_3$, and $Si_3N_4$ as the source materials were mixed with an ethanol solvent at a stoichiometric ratio by using a ball mill. Using a drier, the ethanol solvent was volatilized from the source-material-containing mixture. The dried source-material-containing mixture was filled into the boron nitride furnace. The boron nitride furnace where the source-material-containing mixture was filled was inserted into a heating furnace, and an $(Sr, M)_2SiO_{4-x}N_y$:Eu phosphor was manufactured by performing a sintering process in a gaseous state of an $N_2$ atmosphere at a temperature of 1,600° C. for 10 hours. At this time, the base crystal structure of the $(Sr, M)_2SiO_{4-x}N_y$:Eu phosphor is $Sr_2SiO_4$, and the composition of the host material may be changed by replacing strontium with the metal element M. FIGS. 127 through 129 illustrate the emission spectrum, the XRD spectrum, and the EDX component analysis result of the $(Sr, M)_2SiO_{4-x}N_y$:Eu phosphor, respectively. The red phosphor exhibits the red light emitting characteristic ① which has the peak emission of 613 nm when the excitation light source is in the wavelength range of 200-500 nm. The red phosphor has an orthorhombic crystal structure equal to that of the conventional $Sr_2SiO_4$ phosphor. It can be seen from the EXD component analysis result that the oxygen atoms and the nitrogen atoms are contained at a ratio of 44.91 At %:4.58 At %, and a part of the oxygen atoms are replaced with the nitrogen atoms.

Embodiments 2 and 3

Figure 130:
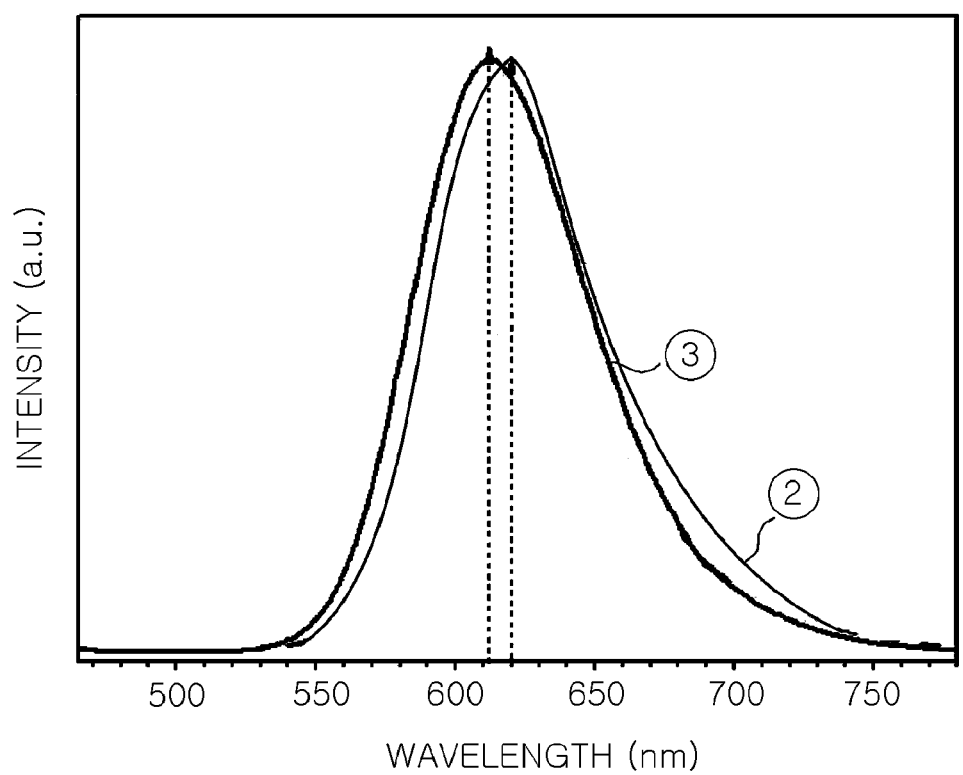
FIGS. 130, 131(A) and 131(B) illustrate an emission spectrum and an EDX component analysis result of a phosphor expressed as $(Sr, M)_2SiO_{4-x}N_y$ according to first and second embodiments of the present invention.
Figure 131:
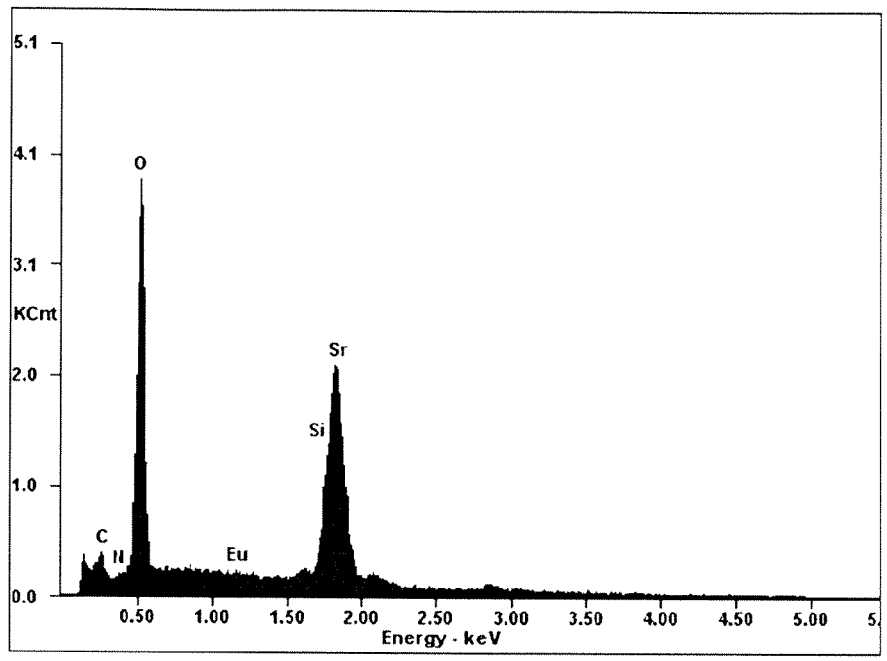
Figure 131:
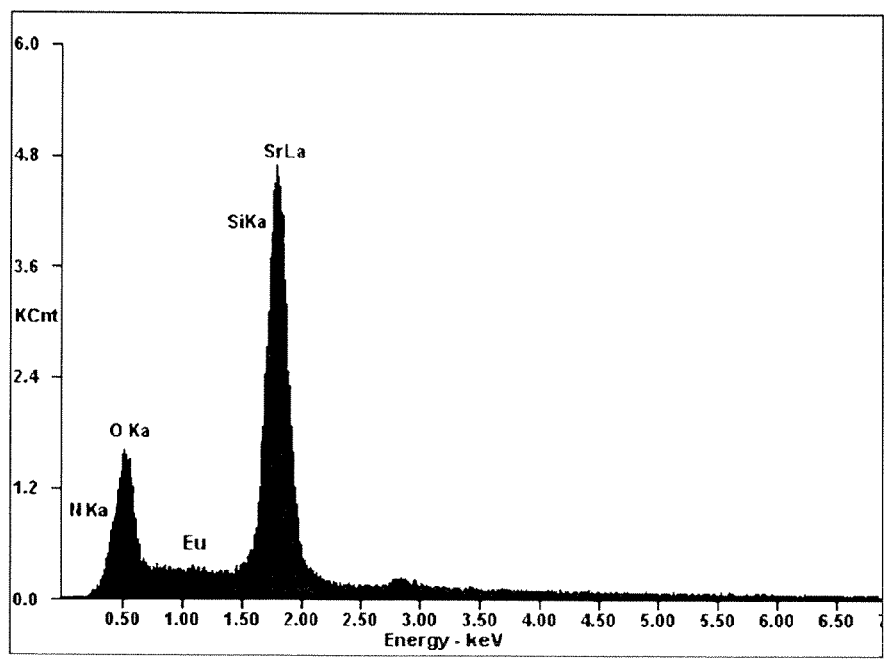

The $(Sr, M)_2SiO_{4-x}N_y$:Eu phosphor was manufactured in the same manner as described in embodiment 1, except that an addition amount of nitrogen was changed. FIGS. 130 and 131 illustrate the emission spectrum and the EDX component analysis result of the $(Sr, M)_2SiO_{4-x}N_y$:Eu phosphor when an excitation light source having a wavelength range of 200-500 nm was used. As can be seen from FIGS. 130 and 131, the graph ② shows the emission spectrum when At % of oxygen:

nitrogen was 56.82:4.85 (x=0.43) (embodiment 2), and the graph ③ shows the emission spectrum when At % of oxygen: nitrogen was 42.91:25 (x=1.86) (embodiment 3). When the value of replacing oxygen with nitrogen was x=0.43, the peak emission of the embodiment 2 was 610 nm. When x=1.86, the peak emission of the embodiment 3 was 620 nm. That is, as the addition amount of nitrogen increased, the peak emission of the (Sr, M)$_2$SiO$_{4-x}$N$_y$:Eu phosphor manufactured herein had a longer wavelength.

Embodiments 4 Through 6

Figure 132:
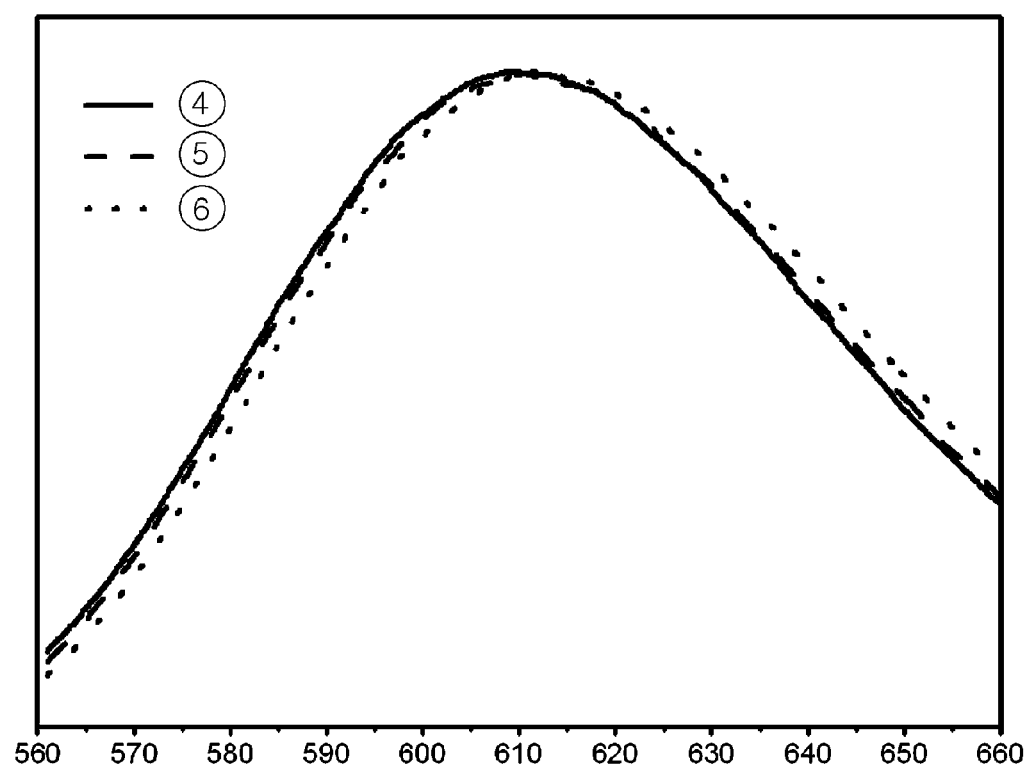
FIG. 132 illustrates an emission spectrum of a phosphor expressed as $(Sr, M)_2SiO_{4-x}N_y$ according to fourth through sixth embodiments of the present invention.

The (Sr, M)$_2$SiO$_{4-x}$N$_y$:Eu phosphor was manufactured in the same manner as described in embodiment 1, except that an addition amount (z) of europium (Eu) was increased from 0.04 to 0.06 by units of 0.01. At this time, the red phosphor is expressed as the composition of Eu$_z$Sr$_{2-z}$SiO$_{4-z}$SiO$_{4-z}$N$_y$. Europium (Eu) was replaced with strontium and the red phosphor acts as the main light emitting element. FIG. 132 illustrates the emission spectrum of the (Sr, M)$_{2-z}$SiO$_{4-x}$N$_y$:Eu$_z$ phosphor when the wavelength range of 200-500 nm was used as the excitation light source. As can be seen from FIG. 132, the graphs ③, ④ and ⑤ illustrate the emission spectrums when z=0.04 (embodiment 4), z=0.05 (embodiment 5), and z=0.06 (embodiment 6), respectively. The peak emission of embodiment 4 was 610 nm; the peak emission of embodiment 5 was 612 nm; and the peak emission of the embodiment 6 was 614 nm. That is, as the addition amount of europium (Eu) increased, the wavelength of the red phosphor became longer.

Embodiments 7 and 8

The (Sr, M)$_2$SiO$_{4-x}$N$_y$:Eu phosphor was manufactured in the same manner as the embodiment 1, except that at least one of the compounds containing dyad metal elements such as Ba or Ca was added. Sr may be partially replaced with dyad metal elements such as Ba or Ca. The addition ratio of Sr:(Ba, Ca) was 9:1.

Figure 133:
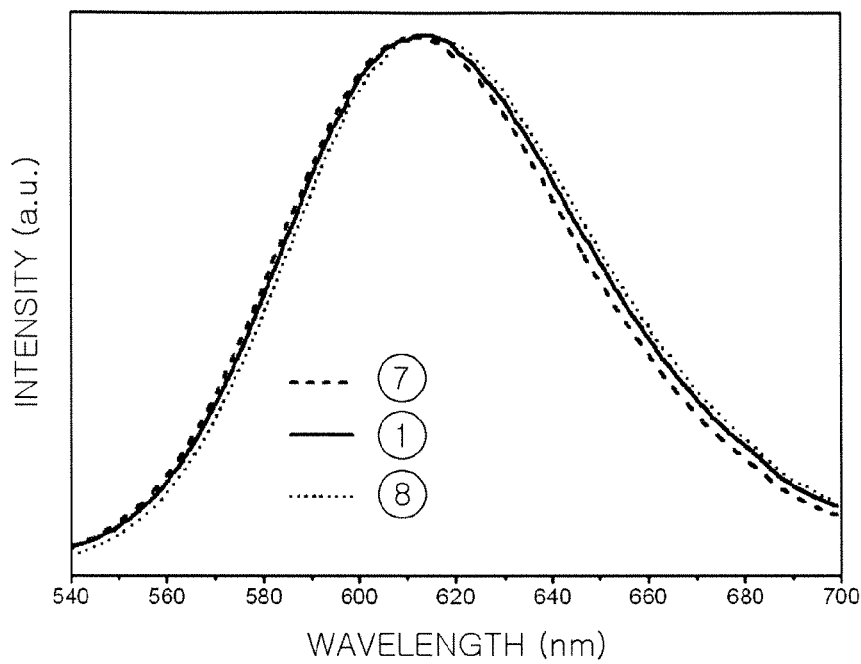
FIGS. 133(A) and 133(B) illustrate an emission spectrum of a phosphor expressed as $(Sr, M)_2SiO_{4-x}N_y$ according to seventh through tenth embodiments of the present invention.
Figure 133:
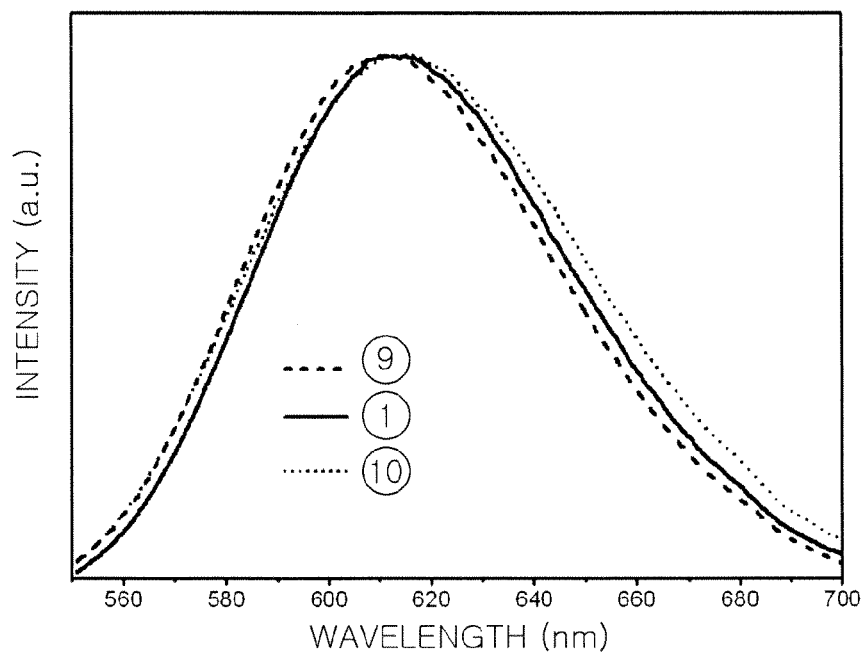

FIG. 133A illustrates the emission spectrum of the (Sr, M)$_2$SiO$_{4-x}$N$_y$:Eu phosphor when the excitation light source having the wavelength range of 200-500 nm was used. As can be seen from FIG. 133A, the peak emission was 613 nm when Sr was 100% (①); the peak emission was 610 nm when Sr:Ba were added at a ratio of 90%:10% (⑦; and the peak emission was 615 when Sr:Ca were added at a ratio of 90%: 10% ⑧).

Embodiments 9 and 10

The (Sr, M)$_2$SiO$_{4-x}$N$_y$:Eu phosphor was manufactured in the same manner as the embodiment 1, except that at least one of the compounds containing triad metal elements such as Al or Ga was added. Si may be partially replaced with triad metal elements such as Al or Ga. The addition ratio of Si:(Al, Ga) was 9:1.

FIG. 133B illustrates the emission spectrum of the (Sr, M)$_2$SiO$_{4-x}$N$_y$:Eu phosphor when the excitation light source having the wavelength range of 200-500 nm was used. As can be seen from FIG. 133B, the peak emission was 610 nm when Si:Ga were added at a ratio of 90%:10% (⑨), and the peak emission was 615 when Si:Al were added at a ratio of 90%: 10% (⑩).

As can be seen from embodiments 7 through 10, if Ga and Al having a small atomic radius are replaced around europium atom the wavelength becomes longer; and, if Ba and Ga having a large atomic radius are replaced, the wavelength becomes shorter.

Embodiment 11

Figure 134:
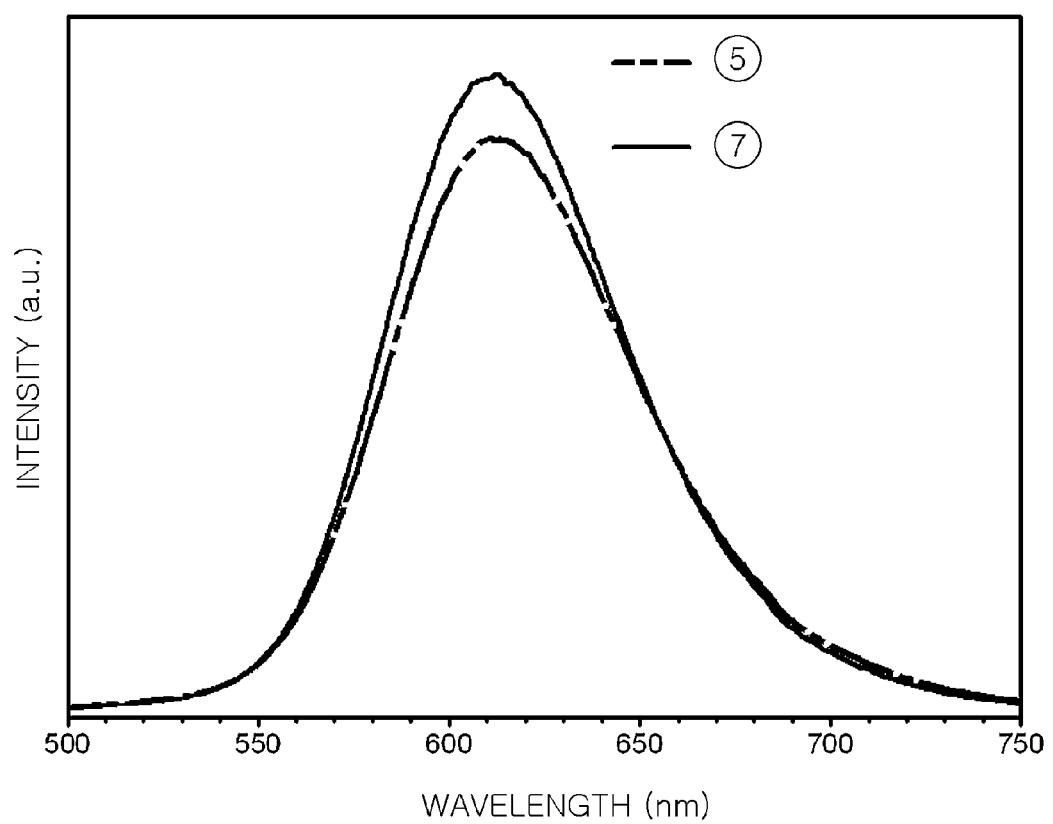
FIG. 134 illustrates an emission spectrum of a phosphor expressed as $(Sr, M)_2SiO_{4-x}N_y$ according to an eleventh embodiment of the present invention.

The (Sr, M)$_2$SiO$_{4-x}$N$_y$:Eu phosphor was manufactured in the same manner as described the embodiment 1, except that manganese (Mn) was added together with europium (Eu). An addition amount (z) of europium (Eu) was fixed at 0.05, and an addition amount of manganese (Mn) was 0.1. FIG. 134 illustrates the emission spectrum of the (Sr, M)$_2$SiO$_{4-x}$N$_y$:Eu phosphor when the excitation light source having the wavelength range of 200-500 nm was used. In FIG. 134, the graph ⑤ illustrates a case in which an addition amount (z) of europium (Eu) was 0.05 and manganese was not added, and the graph ⑦ illustrates a case in which an addition amount (z) of europium (Eu) was 0.05 and an addition amount of manganese (Mn) was 0.1. As can be seen from FIG. 134, the peak emission was 613 nm in both cases ⑤ and ⑦. However, the light emitting intensity was further improved in the case ⑤ where europium (Eu) only was added than the case ⑦ where manganese (Mn) was added.

The following description will be made on a method of manufacturing a β-SiAlON phosphor which can be controlled to have high brightness and desired grain size characteristics in the above-described phosphors.

According to this embodiment of the present invention, there is provided a method of manufacturing a β-SiAlON phosphor which has a chemical formula expressed as Si$_{(6-x)}$Al$_x$O$_y$N$_{(8-y)}$:Ln$_z$, where Ln is a rare earth element, 0<x≤4.2, 0<y≤4.2, and 0<z≤1.0. In the manufacturing method according this embodiment of the present invention, a host source material includes a silicon source material containing silicon, and an aluminum source material containing at least one of a metal aluminum and an aluminum compound. A source material mixture is manufactured by mixing the host source material and an activator source material which activates the host material. Then, the source material mixture is heated in a nitrogen-containing atmosphere.

According to this embodiment of the present invention, the β-SiAlON phosphor is manufactured by mixing the source material and heating the source material in the nitrogen-containing atmosphere. The source material includes silicon, aluminum, and rare earth metal acting as an activator.

The silicon source material is a silicon-containing source material. A silicon metal, silicon nitride, or silicon oxide may be used as the silicon source material.

The silicon metal may be a high-purity silicon metal which is a powder phase and contains a small amount of impurities, e.g., Fe. The particle diameter or distribution of the silicon metal powder does not directly affect the phosphor particles. However, due to the sintering condition or the mixed source material, the particle diameter or distribution of the silicon powder affects particle size characteristics such as a particle size or shape of the phosphor. In addition, since the emission characteristic of the phosphor is affected, it is preferable that the particle size of the silicon metal powder is 300 μm or less.

In view of the reaction, as the particle diameter of the silicon metal is getting smaller, the reaction becomes higher. However, since the emission characteristic of the phosphor is also affected by the material to be mixed or the sintering rate, the particle diameter of the silicon metal need not be necessarily small, and the silicon metal is not limited to the powder phase.

One of a metal alumina and an aluminum compound containing aluminum may be used as the aluminum source material. Alternatively, a metal aluminum and an aluminum compound may be used together as the aluminum source material. Examples of the aluminum compound containing aluminum may include aluminum nitride, aluminum oxide, and aluminum hydroxide. When a silicon metal is used as the silicon source material, a metal alumina need not be necessarily used as the aluminum source material, and the aluminum compound only may be used.

When the metal alumina is used, it is preferable that the metal alumina is a high-purity metal alumina which is in the powder phase and contains a small amount of impurities, e.g., Fe. In the above-described view, it is preferable that the particle diameter of the metal alumina is 300 μm or less. However, since the light emission characteristics are also affected by the material to be mixed or the sintering rate, the particle diameter of the metal alumina need not necessarily be small, and the metal alumina is not limited to the powder phase.

The activator source material may be any one of rare earth metals selected from the group consisting of Eu, Ce, Sm, Yb, Dy, Pr, and Tb. Specifically, the activator source material may be oxide, such as $Eu_2O_3$, $Sm_2O_3$, $Yb_2O_3$, CeO, $Pr_7O_{11}$ and $Tb_3O_4$, or $Eu(NO_3)_3$, or $EuCl_3$. Preferably, the activator source material may be Eu or Ce.

The particle characteristics of the β-SiAlON phosphor can be controlled by adjusting the mixing ratio of the silicon source material and the aluminum source material. Furthermore, the particle characteristics of the β-SiAlON phosphor can also be controlled by adjusting the mixing ratio of the silicon metal, which is contained in the silicon source material, and the silicon nitride or silicon oxide, which is contained in the silicon compound, or by adjusting the mixing ratio of the metal alumina, which is contained in the metal alumina, and the aluminum compound. The effects of the silicon or aluminum on the source material will be described below in more detail in the following embodiments.

The β-SiAlON phosphor manufactured according to the embodiments of the present invention may be a phosphor having the chemical formula 1 below.

$$Si_{(6-z)}Al_zO_yN_{(8-y)}:Ln_z \qquad \text{[Chemical Formula 1]}$$

In the chemical formula 1 above, it is preferable that Ln is a rare earth element, 0<x≤4.2, 0<y≤4.2, and 0<z≤1.0. The β-SiAlON phosphor may be a green phosphor and have a peak wavelength in the range of approximately 500-570 nm.

As described above, the actuator source material, which includes the rare earth element, e.g., Eu, Sm, Yb, Ce, Pr, Tb, etc., as the activator, is measured and mixed with the aluminum source material, which includes at least one of the silicon source material containing silicon, the metal alumina, and the aluminum compound. Then, the source material mixture is packed into a boron nitride furnace and is sintered at a high temperature in a nitrogen-containing atmosphere. In this way, the β-SiAlON phosphor is manufactured.

The source material mixture is sintered in a high-temperature nitrogen atmosphere, and is manufactured as the phosphor. In this case, the $N_2$ concentration in the nitrogen-containing ambient gas may be 90% or more. Also, the nitrogen-containing ambient gas pressure may be in the range of approximately 0.1-20 Mpa. The nitrogen atmosphere may be formed by creating a vacuum state and introducing nitrogen-containing ambient gas. Alternatively, the nitrogen-containing ambient gas may be introduced, without making the vacuum state. The gas introduction may be discontinuously performed.

If the source material mixture containing silicon is sintered in the nitrogen atmosphere, nitrogen reacts with silicon, and thus silicon is nitrified to thereby form SiAlON. Thus, the nitrogen gas acts as a nitrogen supply source. At this time, silicon, aluminum, and an activator source react with one another before or during the nitrification. Therefore, since SiAlON with uniform composition may be manufactured, the brightness of the β-SiAlON phosphor is improved.

The heating at the sintering process may be performed at a high temperature of approximately 1,850-2,150° C. In order to manufacture a high-brightness phosphor, the sintering process may be performed at a high temperature of approximately 1900-2,100° C. at a gas pressure of approximately 0.8 Mpa or more, although it is changed according to the composition of the source material. After the heating process, the heated source material mixture may be ground or classified in order to control the grain size characteristics. The ground or classified source material compound may be re-sintered at a high temperature.

Hereinafter, the present invention will be described in more detail with reference to the embodiment of the β-SiAlON phosphor manufactured by the above-described manufacturing method.

In the following embodiments, a predetermined amount of the silicon source material and the aluminum source material as the host material and the activator source material are mixed by a ball mill or mixer to manufacture a mixture. The source material mixture is put into a high-temperature resistant container such as a BN furnace, and is inserted into an electric furnace where a high-pressure sintering and vacuum sintering are performed. The temperature is increased to 1,800° C. or more in the nitrogen-containing atmosphere under a gas pressure of approximately 0.2-2 Mpa at a temperature rise rate of 20° C./min or less, and the β-SiAlON phosphor is manufactured by heating the source material mixture to 1,800° C. or more.

The phosphors of the embodiments 12 through 20, which are manufactured using the silicon source material and the aluminum source material while changing their mixing ratio, and the phosphors of the comparative examples 1 through 3, which are manufactured using the silicon source material containing no silicon metal, are all the Eu-activated β-SiAlON phosphors, and the green phosphors having the peak wavelength in the range of approximately 520-560 nm.

Embodiment 12

Silicon nitride ($Si_3N_4$) and silicon metal (Si) were used as the silicon source material, and alumina ($Al_2O_3$) was used as the aluminum source material. Europium oxide ($Eu_2O_3$) was used as the activator. 4.047 g $Si_3N_4$, 5.671 g Si, 0.589 g $Al_2O_3$, and 0.141 g $Eu_2O_3$ were mixed using a mixer and a sieve. Then, the mixture was filled into a BN furnace and set in a pressure-resistant electric furnace. The sintering was performed at 500° C. under the vacuum state, and $N_2$ gas was introduced at 500° C. The temperature was increased from 500° C. to 1,950° C. at a rate of 5° C./min in an $N_2$ gas atmosphere. The mixture was sintered at a gas pressure of 0.8 Mpa or more at 1,950° C. for 5 hours.

After sintering, the furnace was cooled and taken out from the electric furnace. Then, the sintered phosphor was ground, and the phosphor was obtained using a 100-mesh sieve. The manufactured phosphor was cleaned using hydrofluoric acid and hydrochloric acid, dispersed and then dried sufficiently. Then, the phosphor of the embodiment 12 was obtained by classifying the phosphor by using a 50-mesh sieve.

Embodiment 13

A β-SiAlON phosphor was manufactured in the same manner as that of embodiment 12, except that 1.349 g $Si_3N_4$ and 7.291 g Si were used.

Embodiment 14

A β-SiAlON phosphor was manufactured in the same manner as that of embodiment 12, except that 6.744 g $Si_3N_4$ and 4.051 g Si were used.

Embodiment 15

A β-SiAlON phosphor was manufactured in the same manner as that of embodiment 12, except that 9.442 g $Si_3N_4$ and 2.430 g Si were used.

Embodiment 16

A β-SiAlON phosphor was manufactured in the same manner as that of embodiment 12, except that $Si_3N_4$ was not used, and 8.101 g Si only was used as the silicon source material.

Comparative Example 1

A β-SiAlON phosphor was manufactured in the same manner as that of embodiment 12, except that Si was not used, and 13.488 g $Si_3N_4$ only was used as the silicon source material.

Embodiment 17

Silicon nitride ($Si_3N_4$) and silicon metal (Si) were used as the silicon source material, and aluminum nitride (AlN) was used as the aluminum source material. Europium oxide ($Eu_2O_3$) was used as the activator. 5.395 g $Si_3N_4$, 3.241 g Si, 0.397 g AlN, and 0.137 g $Eu_2O_3$ were mixed using a mixer and a sieve. Then, the mixture was packed into a BN furnace and set in a pressure-resistant electric furnace. Sintering was performed at 1,450° C. for more than 5 hours in a nitrogen atmosphere. After cooling, the sintered material was ground. The ground sintered material was packed into a BN furnace and set in the pressure-resistant electric furnace. The electric furnace was heated to 500° C. under a vacuum state, and $N_2$ gas was introduced at 500° C. The temperature was increased from 500° C. to 2,000° C. at a rate of 5° C./min in an $N_2$ gas atmosphere. The mixture was sintered at a gas pressure of 0.8 Mpa or more at 2,000° C. for 5 hours.

After sintering, the furnace was cooled and taken out from the electric furnace. Then, the sintered phosphor was ground, and the ground phosphor was obtained using a 100-mesh sieve. The manufactured phosphor was cleaned using hydrofluoric acid and hydrochloric acid, dispersed and then dried sufficiently. Then, the phosphor of the embodiment 17 was obtained by classifying the phosphor by using a 50-mesh sieve.

Embodiment 18

A β-SiAlON phosphor was manufactured in the same manner as that of embodiment 17, except that 7.554 g $Si_3N_4$ and 1.944 g Si were used.

Embodiment 19

A β-SiAlON phosphor was manufactured in the same manner as that of embodiment 17, except that $Si_3N_4$ was not used, and 6.481 g Si only was used as the silicon source material.

Comparative Example 2

A β-SiAlON phosphor was manufactured in the same manner as that of embodiment 17, except that Si was not used, and 10.791 g $Si_3N_4$ only was used as the silicon source material.

Embodiment 20

A β-SiAlON phosphor was manufactured in the same manner as that of embodiment 17, except that 6.744 g $Si_3N_4$, and 4.051 g Si, 0.312 g aluminum metal (Al) (neither $Al_2O_3$ nor AlN was used as the aluminum source material), and 0.172 g $Eu_2O_3$ were used.

Comparative Example 3

A β-SiAlON phosphor was manufactured in the same manner as the embodiment 20, except that Si was not used as the silicon source material, 13.488 g $Si_3N_4$ was used, and 0.473 g Al was used.

Table 2 below shows the mixing ratios of the source materials used in the above-described embodiments and comparative examples.

TABLE 2

| Embodiment No. | $Si_3N_4$ (g) | Si (g) | $Al_2O_3$ (g) | AlN (g) | Al (g) | $Eu_2O_3$ (g) |
|---|---|---|---|---|---|---|
| Embodiment 12 | 4.047 | 5.671 | 0.589 | — | — | 0.141 |
| Embodiment 13 | 1.349 | 7.291 | 0.589 | — | — | 0.141 |
| Embodiment 14 | 6.744 | 4.051 | 0.589 | — | — | 0.141 |
| Embodiment 15 | 9.442 | 2.430 | 0.589 | — | — | 0.141 |
| Embodiment 16 | — | 8.101 | 0.589 | — | — | 0.141 |
| Comparative Example 1 | 13.488 | — | 0.589 | — | — | 0.141 |
| Embodiment 17 | 5.395 | 3.241 | — | 0.379 | — | 0.137 |
| Embodiment 18 | 7.554 | 1.944 | — | 0.379 | — | 0.137 |
| Embodiment 19 | — | 6.481 | — | 0.379 | — | 0.137 |

TABLE 2-continued

| Embodiment No. | $Si_3N_4$ (g) | Si (g) | $Al_2O_3$ (g) | AlN (g) | Al (g) | $Eu_2O_3$ (g) |
|---|---|---|---|---|---|---|
| Comparative Example 2 | 10.791 | — | — | 0.379 | — | 0.137 |
| Embodiment 20 | 6.744 | 4.051 | — | — | 0.312 | 0.172 |
| Comparative Example 3 | 13.488 | — | — | — | 0.473 | 0.172 |

Figure 135:
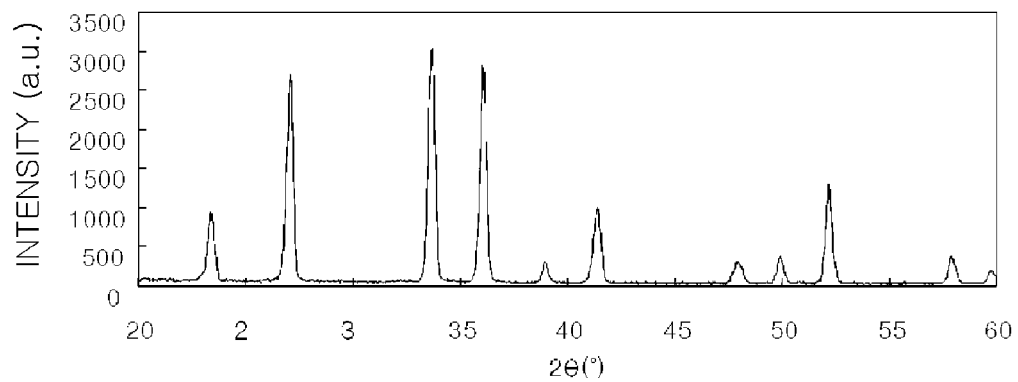
FIGS. 135 through 137 are graphs illustrating an X-ray diffraction analysis result, an emission spectrum, and an excitation spectrum of a β-SiAlON phosphor manufactured according to a twelfth embodiment of the present invention.

FIG. 135 illustrates the result when the phosphor of the embodiment 12 was classified by the powder XRD. By referring to FIG. 135 and using JCPDS data, it was confirmed that the manufactured phosphor was the β-SiAlON phosphor.

Figure 136:
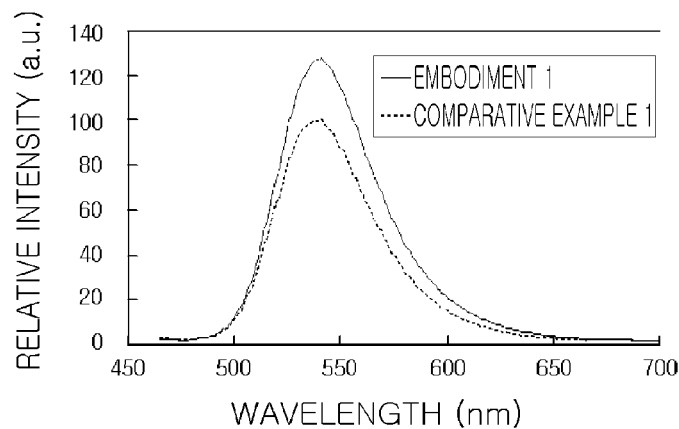

The emission characteristic was measured by irradiating excited light of 460 nm of the β-SiAlON phosphor. FIG. 136 illustrates the emission spectrum results of the β-SiAlON phosphor of the embodiment 12 and the β-SiAlON phosphor of the comparative example 1. The β-SiAlON phosphor of the embodiment 12 is a green phosphor which exhibits a peak emission at 541 nm and has a half bandwidth of 54.7 nm. The brightness of the β-SiAlON phosphor of the embodiment 12 is higher that that of the comparative example 1 by 27%.

Figure 137:
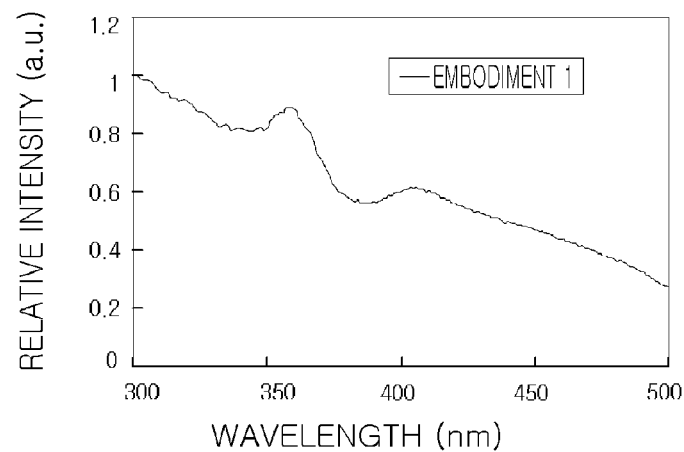

The excitation spectrum of the β-SiAlON phosphor of the embodiment 12 was measured using the light emitting color of 541 nm as detection light. The result is illustrated in FIG. 137. It can be seen that the excitation band exists in the ultraviolet and visible light region around 500 nm.

7 parts by weight of the β-SiAlON phosphor of the embodiments 12 through 20 and the comparative examples 1 through 3, 3 parts by weight of $CaAlSiN_3$:Eu red phosphor, and 10 parts by weight of silicon resin were mixed to form a slurry. The slurry was injected into the cup on a mount lead where a blue LED device was mounted. The injected slurry was hardened at 130° C. for 1 hour. In this way, a white LED was manufactured using the phosphor. The brightness of the manufactured white LED was measured.

Table 3 below shows the peak emission wavelength of the β-SiAlON phosphor of the embodiments 12 through 20 and the comparative examples 1 through 3, and the brightness of the white LED manufactured using the same (parts by weight).

TABLE 3

| Embodiment No. | Silicon source material | | Aluminum source material Kind | Peak emission wavelength | Brightness |
|---|---|---|---|---|---|
| | Kind | $Si/Si_3N_4$ (parts by weight) | | | |
| Embodiment 12 | $Si/Si_3N_4$ | 70/30 | $Al_2O_3$ | 541 | 127 |
| Embodiment 13 | $Si/Si_3N_4$ | 90/10 | $Al_2O_3$ | 541 | 124 |
| Embodiment 14 | $Si/Si_3N_4$ | 50/50 | $Al_2O_3$ | 541 | 124 |
| Embodiment 15 | $Si/Si_3N_4$ | 30/70 | $Al_2O_3$ | 541 | 107 |
| Embodiment 16 | Si | — | $Al_2O_3$ | 541 | 118 |
| Comparative Example 1 | $Si_3N_4$ | — | $Al_2O_3$ | 541 | 100 |
| Embodiment 17 | $Si/Si_3N_4$ | 50/50 | AlN | 540 | 113 |
| Embodiment 18 | $Si/Si_3N_4$ | 30/70 | AlN | 538 | 115 |
| Embodiment 19 | Si | — | AlN | 540 | 106 |
| Comparative Example 2 | $Si_3N_4$ | — | AlN | 540 | 100 |
| Embodiment 20 | $Si/Si_3N_4$ | 50/50 | Al | 540 | 119 |
| Comparative Example 3 | $Si_3N_4$ | — | AlN | 536 | 100 |

It can be seen that the peak emission wavelengths of embodiments 12 through 20 and the comparative examples 1 through 3 are approximately 540 nm and thus the phosphors are green phosphors. The white LED using the phosphors of embodiments 12 through 14 exhibited a relatively high brightness of 124 to 127.

However, the case of the embodiment 15 in which the ratio of the silicon metal was lower than the ratio of the silicon nitride exhibited a lower brightness than the case of the embodiments 12 through 14 in which the ratio of the silicon metal was higher than the ratio of the silicon nitride. The case of the embodiments 16 and 19 in which only Si was used as the silicon source material exhibited a lower brightness than the case of the embodiments 12 through 14 and 17, but exhibited a higher brightness than the case of the embodiments 15, 17 and 18 in which the ratio of the silicon metal was lower than the ratio of the silicon nitride. Thus, the higher-brightness β-SiAlON phosphor can be manufactured using the appropriately mixed silicon source material.

The comparative examples 1 through 3 in which only $Si_3N_4$ is used as the silicon source material correspond to the case in which no silicon metal is used as the host source material.

Furthermore, a high level of brightness was also obtained when the silicon metal and the aluminum metal were used together such as in embodiment 20.

The β-SiAlON phosphor may be usefully applied to a light emitting device and module which provides a white light through the combination of other phosphors.

Figure 138:
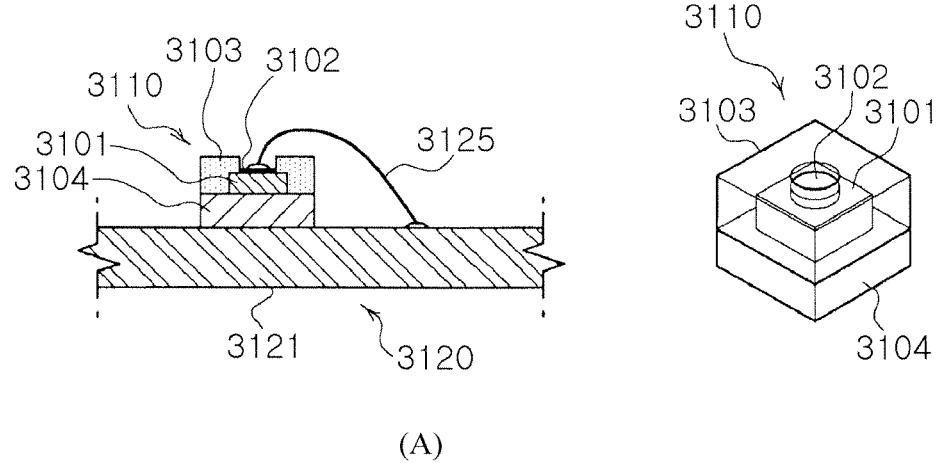
FIGS. 138A and 138B illustrate a light emitting device package according to another embodiment of the present invention.
Figure 138:
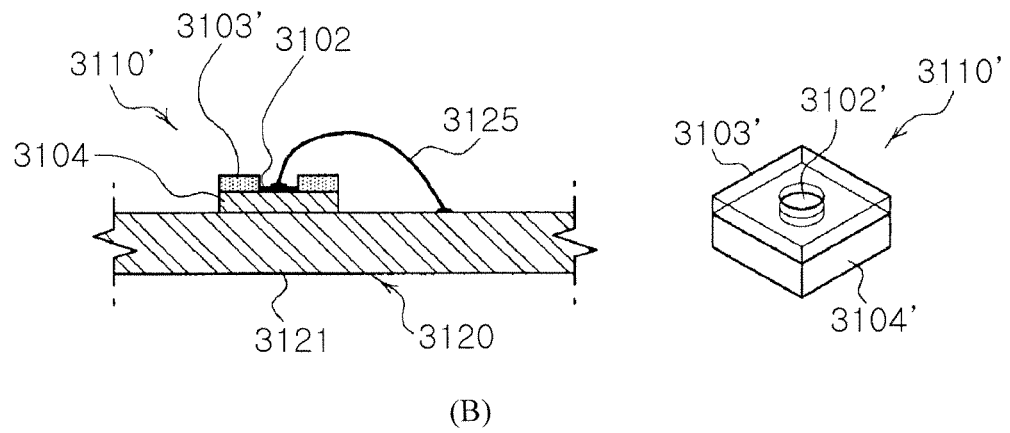

FIGS. 138A and 138B are cross-sectional views of light emitting devices according to another embodiment and modified embodiment of the present invention.

Referring to FIG. 138A, a bonding pad 3102 electrically connected to a bonding wire 3125 is provided on the top surface of a light emitting device 3110. One or two bonding pads 3102 may be provided according to the structure of the horizontal or vertical type semiconductor light device, that is, a chip die 3101. Specifically, the number of the bonding pads 3102 is changed according to the structure of the chip die 3101. When the chip die 3101 is provided in a vertical or vertical/horizontal structure where P polarity and N polarity are formed on the top surface and the bottom surface, respectively, the single bonding pad 3101 is provided to be electrically connected to the P polarity formed on the top surface of the chip die 3101.

Also, when the chip die 3101 is provided in a horizontal or vertical/horizontal structure where both of P polarity and N polarity are formed on the top surface, two bonding pads 3102 are provided to be electrically connected to the P polarity and the N polarity formed on the top surface of the chip die 3101, respectively. Furthermore, the wavelength conversion part 3103 is formed of a mixture of a phosphor and a transparent resin material, such as epoxy, silicon and resin, to uniformly cover the outer surface of the chip die 3101 which is die-attached to the sub mount 3104. At this time, the wavelength conversion part 3103 is formed by a printing method of printing a transparent resin such as silicon or epoxy, with which the phosphor is mixed, to a constant thickness. The wavelength conversion part 3103 may be formed to cover the entire chip die 3101, or may be cured by heat or UV light which is manually provided.

The wavelength conversion part 3103 may include a phosphor material which is a wavelength conversion means selected from a garnet-based phosphor such as YAG and TAG, a silicate-based phosphor, a sulfide-based phosphor, a nitride-based phosphor, and a QD phosphor, which is capable of converting light emitted from the chip die into a white light. Specifically, the red phosphor may include the inorganic compound or at least one of the silicate-based phosphor, the sulfide-based phosphor, the nitride-based phosphor, and the QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$. The lead frame 3121 is electrically connected through the wire bonding 3125 to at least one bonding pad 3102 exposed to the outside through the top surface of the wavelength conversion part 3103.

Referring to FIG. 138A, the light emitting device package according to this embodiment of the present invention may include the lead frame 3121 and the bonding wire 3125. The lead frame 3121 is integrally provided inside a package main body (not shown), i.e., a resin structure of an injection-molded resin material. The bonding wire 3125 has one end wire-bonded to the bonding pad 3102, and the other end wire-bonded to the lead frame 3121.

Referring to FIG. 138B, according to a modified embodiment of the light emitting device package, a wavelength conversion part 3103' is formed only on the top surface of a chip die 3101'.

The light emitting device 3110' is mounted on the top surface of the lead frame 3121 having a negative lead and a positive lead, and the lead frame 3121 is integrally provided in the injection-molded resin encapsulation main body (not shown) in order to form a cavity which is opened upward. The light emitting device 310' exposed to the outside through the cavity of the package main body is electrically connected to the lead frame 3121 through the metal wire 3125 with one end bonded to the bonding pad 3102'. In this way, the light emitting device package is constituted.

When the vertical or vertical/horizontal type light emitting device is used in the high-power light emitting device package, the phosphor layer directly contacts the emission surface, and thus, the phosphor is degraded by heat generated from the light emitting device. However, since the nitride-based red phosphor or QD phosphor according to the embodiment of the present invention is more chemically stable than the sulfide-based phosphor, the reliability to the external environment such as heat or moisture is superior and the discoloration risk is low. Therefore, the red phosphor according to the embodiment of the present invention may directly form the wavelength conversion part on the emission surface of the light emitting device, and the high-power high-reliability white light emitting device package may be manufactured.

Figure 139:
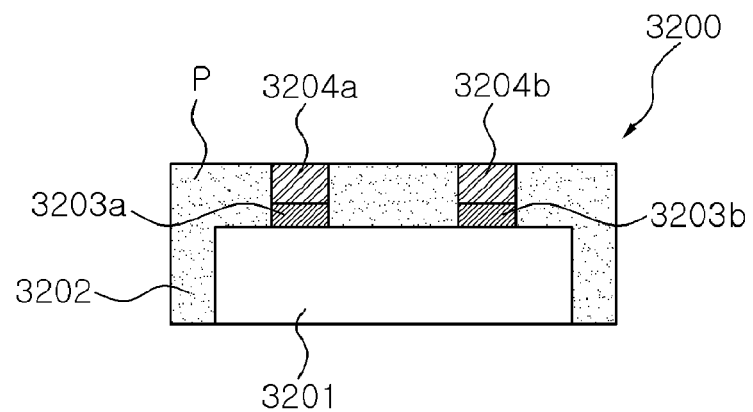
FIGS. 139 through 141 illustrate a light emitting device package according to another embodiment of the present invention.

FIG. 139 is a schematic cross-sectional view of a light emitting device package according to another embodiment of the present invention. Referring to FIG. 139, the light emitting device package 3200 according to this embodiment of the present invention includes a light emitting device 3201 and a wavelength conversion part 3202 which is formed to cover the surface of the light emitting device 3201 and converts the wavelength of light emitted from the light emitting device 3201. To this end, the wavelength conversion part 3202 may have a structure in which a phosphor P is dispersed within a transparent resin part. The light emitting device package 3200 can emit white light by mixing light converted by the wavelength conversion part 3202 with light emitted from the light emitting device 3201. The light emitting device 3201 may have a structure in which an n-type semiconductor layer, a light emitting layer, and a p-type semiconductor layer are stacked, and a first electrode 3203a and a second electrode 3203b are formed on one surface of the light emitting device 3201.

Referring to FIG. 139, when a surface of the light emitting device 3201 where the first electrode 3203a and the second electrode 3203b are formed is defined as a first surface; a surface facing the first surface is defined as a second surface; and a surface disposed between the first surface and the second surface is defined as a side surface, the wavelength conversion part 3202 may be formed to cover the first surface (electrode formation surface) and the side surface of the light emitting device 3201. This is intended so that light is emitted from the light emitting device 3201 in the upward direction and the lateral direction in FIG. 139. In this embodiment, the wavelength conversion part 3202 is thinly coated along the surface of the light emitting device 3201. This method can obtain uniform light as a whole, compared with the method of injecting a phosphor into the cup of the package main body. Furthermore, the size of the device can be reduced because the wavelength conversion part 3202 is applied directly onto the surface of the light emitting device 3201, and the package main body is not separately provided.

In order for electrical connection of the light emitting device 3201, a first electrical connection part 3204a and a second electrical connection part 3204b including a plating layer are used, instead of the lead frame. Specifically, the first and second electrical connection parts 3204a and 3204b are connected to the first and second electrodes 3203a and 3203b, and the first and second electrical connection parts 3204a and 3204b include plating layers. The first and second electrical connection parts 3204a and 3204b are exposed to the outside through the wavelength conversion part 3202 and provided as a region for wire bonding. Compared with the typical package, the light emitting device 3200 according to this embodiment of the present invention has a simplified structure and may be variously applied in chip-on-board (COB) or package type light emitting devices.

Figure 140:
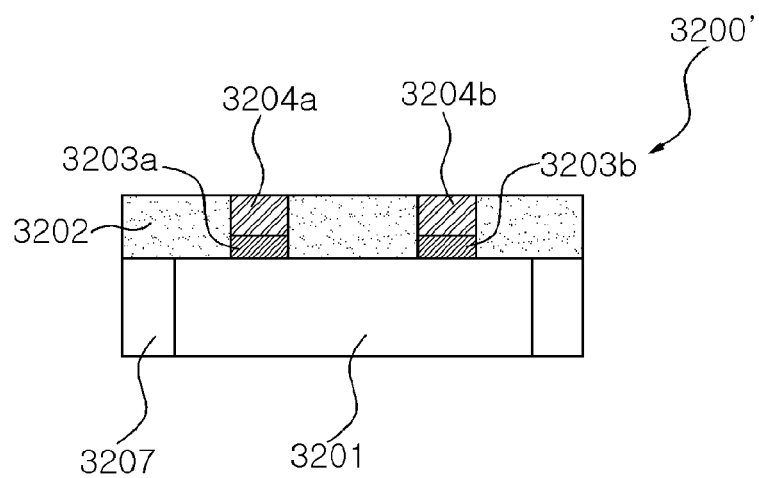
Figure 141:
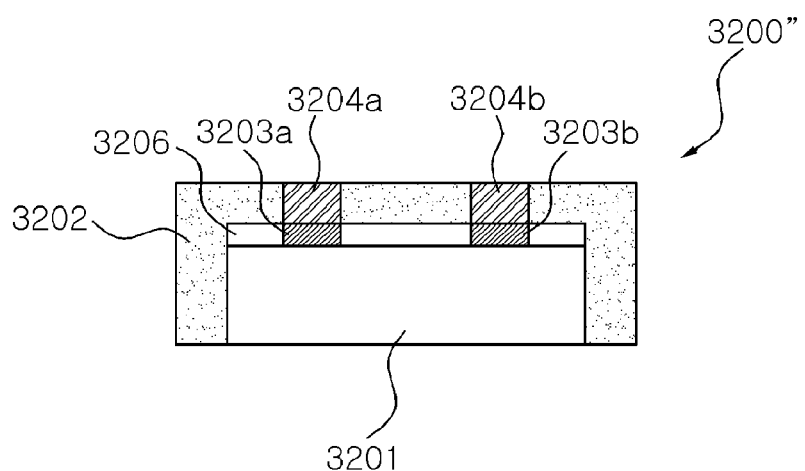

FIGS. 140 and 141 are schematic cross-sectional views of light emitting device packages according to another embodiment of the present invention. Referring to FIG. 140, the light emitting device package 3200' includes a light emitting device 3201 with first and second electrodes 3203a and 3203b, a wavelength conversion part 3202, and first and second electrical connection parts 3204a and 3204b. A difference from the structure of FIG. 139 is that the resin part 3207 formed on the side surface of the light emitting device 3201 is formed of a transparent resin, with the phosphor being excluded. This is done considering that the intensity of light emitted to the side surface of the light emitting device 3201 is lower than the intensity of light emitted to the first surface of the light emitting device 3201.

Referring to FIG. 141, the light emitting device 3200" includes a light emitting device 3201 with first and second electrodes 3203a and 3203b, a wavelength conversion part 3202, and first and second electrical connection parts 3204a and 3204b. A difference from the structure of FIG. 139 is that an underfill resin part 3206 disposed on the first surface of the light emitting device 3201 to surround the side surfaces of the first and second electrodes 3203a and 3203b is formed of a transparent resin, with the phosphor being excluded.

Various embodiments of the wavelength conversion part structure in which phosphors are stacked in a multi-layer structure on a UV light emitting device or blue light emitting device will be described below with reference to FIGS. 142 and 143.

Figure 142:
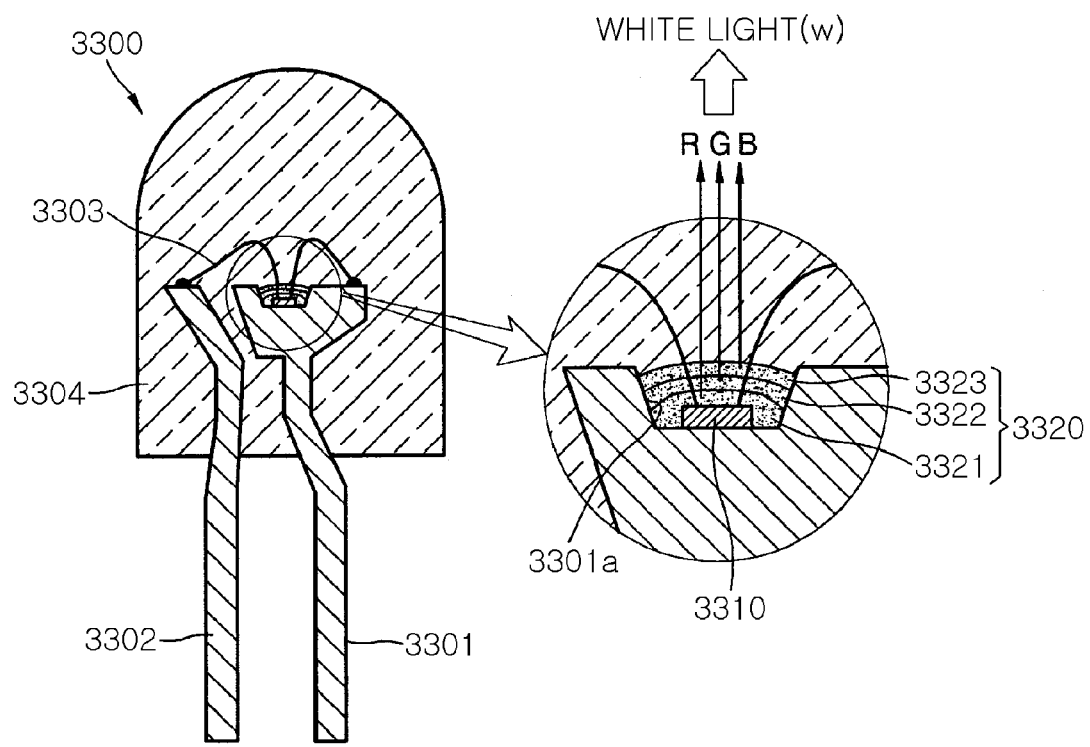
FIGS. 142 and 143 illustrate a structure of a lamp-type light emitting device package and a chip-type light emitting device package according to embodiments of the present invention, respectively.
Figure 143:
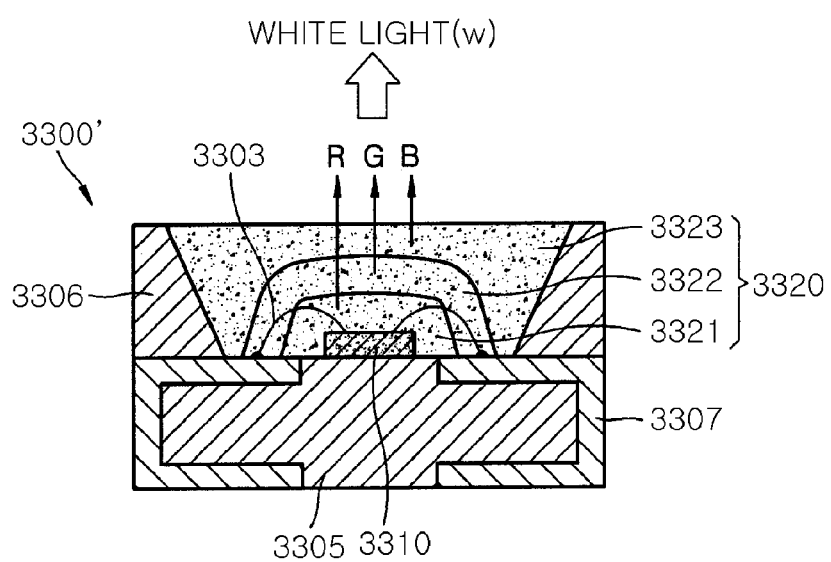

First, FIGS. 142 and 143 are cross-sectional views of a lamp-type light emitting device package and a chip-type light emitting device package according to another embodiment of the present invention, respectively.

In the lamp-type light emitting device illustrated in FIG. 142, a UV light emitting device 3310 having a wavelength of approximately 410 nm or less may be covered by a multi-layer phosphor layer 3320 which includes first, second and third phosphor layers 3321, 3322 and 3323 containing three kinds of phosphors excited by ultraviolet light to emit different color light.

In the chip-type light emitting device illustrated in FIG. 143, a UV light emitting device 3310 is installed inside a groove of a casing 3306 on a substrate 3305. First, second and third phosphor layers 3321, 3322 and 3323 containing three kinds of phosphors are formed inside the groove of the casing 3306. The first, second and third phosphor layers 3321, 3322 and 3323 constitute a multi-layer phosphor layer 3320 covering the UV light emitting device 3310. An n-electrode and a p-electrode of the UV light emitting device 3310 are electrically connected through a wire 3303 to a metal line 3307 formed on the substrate 3305.

Specifically, the first phosphor layer is disposed on the UV light emitting device, and may be formed by mixing a red phosphor with a resin. The red phosphor includes a phosphor material which is excited by ultraviolet light and emits light having a peak emission wavelength of approximately 600-700 nm. For example, the red phosphor may include the inorganic compound or at least one of the silicate-based phosphor, the sulfide-based phosphor, the nitride-based phosphor, and the QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$.

The second phosphor layer is disposed on the first phosphor layer, and may be formed by mixing a green phosphor with a resin. The green phosphor may be formed of a phosphor material which is excited by ultraviolet light and emits light having a wavelength of approximately 500-550 nm. The third phosphor layer is disposed on the second phosphor layer, may be formed by mixing a blue phosphor with a resin. The blue phosphor may be formed of a phosphor material which is excited by ultraviolet light and emits light having a wavelength of approximately 420-480 nm.

The ultraviolet light emitted from the UV light emitting device through those structures excites different kinds of the phosphors included in the first, second and third phosphor layers. Accordingly, red light (R), green light (G), and blue light (B) are emitted from the first, second and third phosphor layers. Those three light colors are mixed together to generate the white light (W).

In particular, the phosphor layers for converting the ultraviolet light are formed in multi-layers, i.e., three layers. The first phosphor layer emitting the red light (R) having the longest wavelength is disposed on the UV light emitting device, and the second and third phosphor layers emitting the green light (G) and the blue light (B) having the shorter wavelengths than the red light (R) are sequentially stacked on the first phosphor layer. Since the first phosphor layer containing the phosphor emitting the red light (R) having the lowest light conversion efficiency is disposed closest to the UV light emitting device, the light conversion efficiency at the first phosphor layer is relatively increased. Accordingly, the entire light conversion efficiency of the light emitting device is improved.

Figure 144:
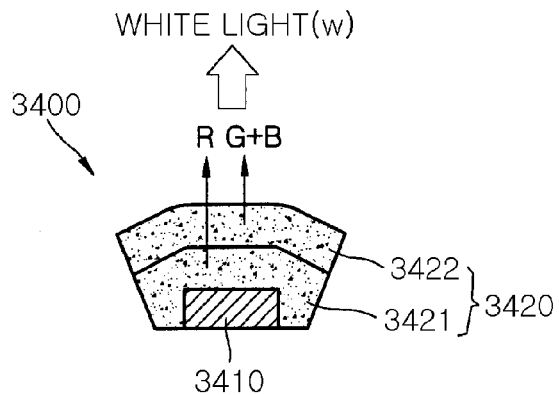
FIGS. 144 and 145 illustrate a partial structure of a light emitting device package according to another embodiment of the present invention.
Figure 145:
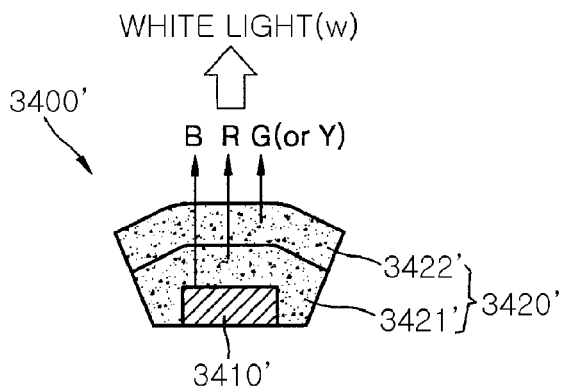

FIGS. 144 and 145 partially illustrate the configuration of the light emitting device according to this embodiment of the present invention. Only the light emitting device and the multi-layer phosphor layer are illustrated in FIGS. 144 and 145, and the configurations of the others are identical to those of FIGS. 142 and 143.

The light emitting device package illustrate in FIG. 144 includes a multi-layer phosphor layer 3420 formed to cover the UV light emitting device 3410 having a wavelength of 410 nm or less. In this case, the multi-layer phosphor layer 3420 is provided with a double-layer phosphor layer. Specifically, the first phosphor layer 3421 formed on the UV light emitting device 3410 is formed by mixing a red phosphor with a resin. The red phosphor includes a phosphor material which is excited by ultraviolet light and emits light having a peak emission wavelength of approximately 600-700 nm. For example, the red phosphor may include the inorganic compound or at least one of the silicate-based phosphor, the sulfide-based phosphor, the nitride-based phosphor, and the QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$. The second phosphor layer 3422 stacked on the first phosphor layer 3421 may be formed by selectively mixing the green phosphor and the blue phosphor with a resin.

The ultraviolet light emitted from the UV light emitting device through those structures excites the phosphor included in the first phosphor layer 3421 to emit the red light (R), and excites two kinds of the phosphors included in the second phosphor layer 3422 to emit the green light (G) and the blue light (B). Those three color lights are mixed to generate white light (W). As described above, the phosphor layers for converting the ultraviolet light are formed in two layers. The first phosphor layer 3421 emitting red light (R) having the longest wavelength is disposed on the UV light emitting device 3410, and the second phosphor layer 3422 emitting the green light (G) and the blue light (B) having the shorter wavelengths than the red light (R) are stacked on the first phosphor layer 3421. Like the previous embodiment, such a multi-layer phosphor structure improves the light conversion efficiency.

The light emitting device package illustrate in FIG. 145 includes a multi-layer phosphor layer 3420' formed to cover the light emitting device 3410' emitting blue light (B) having a wavelength of 420 nm to 480 nm. The multi-layer phosphor layer 3420' is formed in two layers. Specifically, the first phosphor layer 3421' formed on the light emitting device 3410' is formed by mixing a red phosphor with a resin. The red phosphor includes a phosphor material which is excited by blue light and emits light having a peak emission wavelength of approximately 600-700 nm. For example, the red phosphor may include the inorganic compound or at least one of the silicate-based phosphor, the sulfide-based phosphor, the nitride-based phosphor, and the QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$. The second phosphor layer 3422' stacked on the first phosphor layer 3421' may be formed by mixing the green phosphor and/or the yellow phosphor with a resin.

The blue light emitted from the light emitting device through those structures excites the phosphor included in the first phosphor layer 3421' to emit the red light (R), and excites the phosphors included in the second phosphor layer 3422' to emit the green light (G) and the yellow light (Y). As such, the red light (R) and the green light (G) (or the yellow light (Y)) emitted from the multi-layer phosphor layer and the blue light (B) emitted from the light emitting device are mixed to generate the white light (W).

The principle of emitting the white light in the light emitting device package illustrated in FIG. 145 will be described below in detail.

Figure 146:
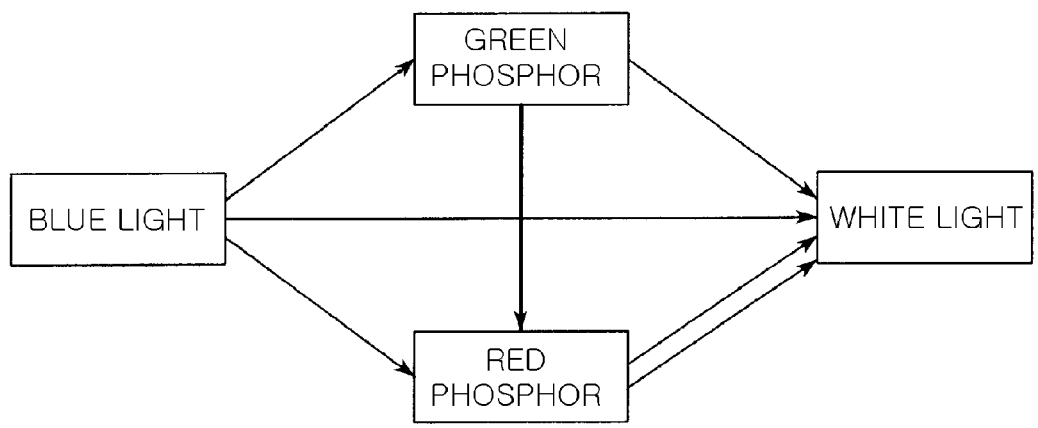
FIGS. 146 and 147 are schematic views illustrating an energy transition between a green phosphor (second phosphor) and a red phosphor (first phosphor) used in the light emitting device package.

FIG. 146 is a schematic conceptual diagram of the light emitting device package of FIG. 145. Referring to FIG. 146, blue light is emitted from a blue light source. The blue light source has a peak emission wavelength of 420 nm to 480 nm. In particular, a blue light emitting device having a peak emission wavelength of 420 nm to 480 nm may be used as the blue light source. The green phosphor and the red phosphor are excited by the blue light emitted from the blue light source to emit green and red visible light, respectively. The emitted green and red visible light is mixed with the blue light (light emitted from the blue light source) passing through the phosphors, thereby obtaining white light.

The green phosphor has a peak emission wavelength of approximately 490-550 nm, and the red phosphor includes a phosphor material which is excited by blue light and emits light having a peak emission wavelength of approximately 600-700 nm. For example, the red phosphor may include an inorganic compound or at least one of a silicate-based phosphor, a sulfide-based phosphor, a nitride-based phosphor, and a QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$. The respective phosphors may have high photon efficiency at the specific emission wavelength of the blue light source. Also, the respective phosphors have considerable transparency with respect to the visible light emitted by other phosphors. The red phosphor is excited by the blue light emitted by the blue light source and the green light emitted by the green phosphor, and emits red light. The red phosphor may have a peak excitation wavelength of approximately 420-500 nm so that the red phosphor is sufficiently excited by the blue light and the green light. Furthermore, since the red phosphor is also excited by the green phosphor as well as the blue light source (that is, the red phosphor is excited doubly), the quantum yield of the red phosphor is improved. Due to the improvement in the quantum yield of the red phosphor, the entire luminous efficiency, brightness and color rendering index are also improved. Moreover, if the green light which has been wasted with no purpose (e.g., the green light leaking out to the rear of the emission surface) is used to excite the red phosphor, total luminous efficiency will be further improved. The increase in the quantum efficiency may improve the entire brightness and color rendering index of the white light emitting device.

Figure 147:
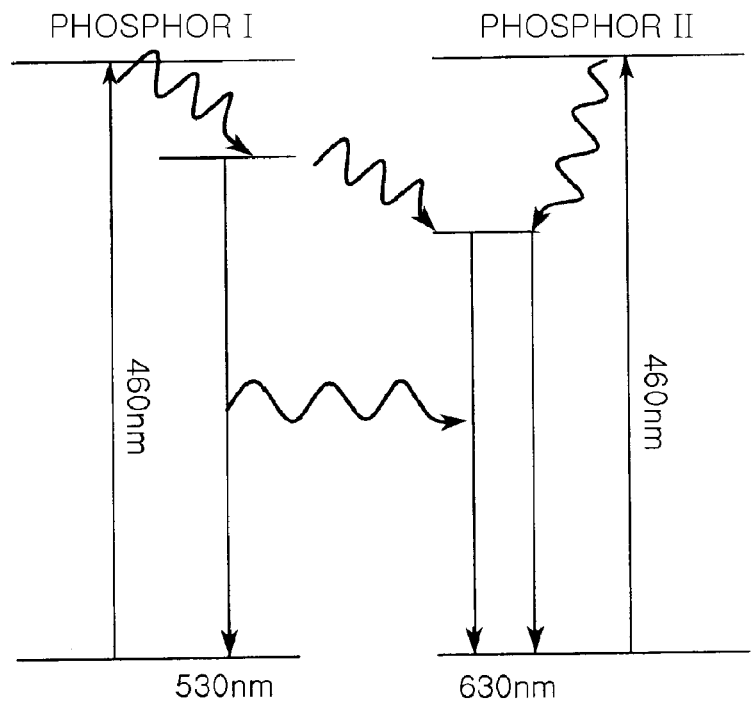

FIG. 147 is a schematic view illustrating the energy transition of the green phosphor (the second phosphor) and the red phosphor (the first phosphor) used in the light emitting device package according to this embodiment of the present invention. Referring to FIG. 147, the second phosphor is excited by blue light of approximately 460 nm, and emits green light of approximately 530 nm. Also, the first phosphor absorbs a part of the green light emitted by the second phosphor, as well as blue light of approximately 460 nm, and emits red light of approximately 620 nm. In this manner, the first phosphor is excited doubly to emit the red light. Specifically, the first phosphor is disposed on a blue light source such as a blue light emitting device, and the second phosphor is disposed on the first phosphor. In this way, the first phosphor easily absorbs the light emitted from the second phosphor rearwardly, and emits red light. Accordingly the additional light emitted by the first phosphor further improves the overall brightness of the light emitting device and also further improves the color rendering index of the light emitting device. Furthermore, the light which is otherwise emitted rearward and thus wasted can be efficiently used by the first phosphor. The phosphor arrangement having the above-described layer structure may be easily implemented because it forms a molding resin layer where the respective phosphors are dispersed.

Figure 148:
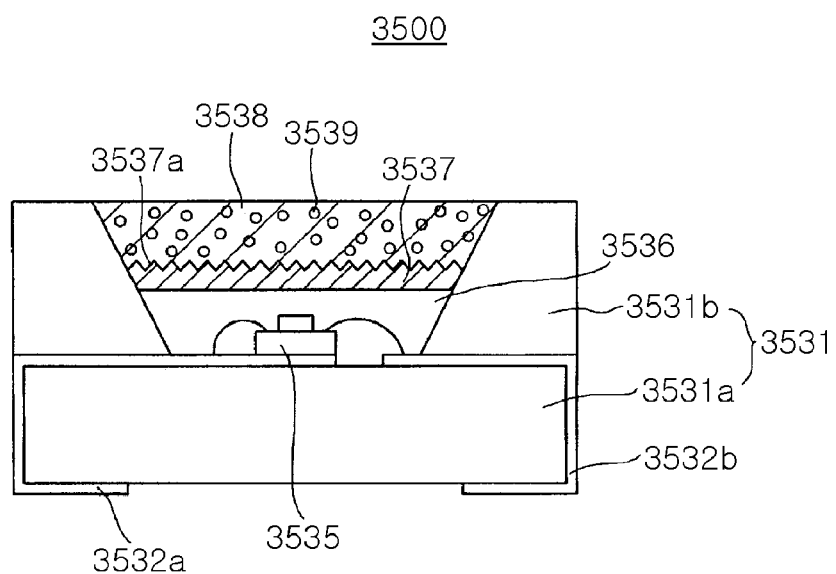
FIGS. 148 and 149 are a cross-sectional view of a light emitting device package and a schematic view a light extraction mechanism according to another embodiment of the present invention.

FIG. 148 is a cross-sectional view of a light emitting device package according to another embodiment of the present invention. Referring to FIG. 148, the light emitting device package 3500 includes a package substrate 3531 and a light emitting diode chip 3535 mounted on the package substrate 3531. The package substrate 3531 may include a bottom package substrate 3531a in which two lead frames 3532a and 3532b are formed, and a top package substrate 3531b in which the cavity is provided. The light emitting device 3535 is mounted inside the cavity region. Electrodes (not shown) of the light emitting device 3535 are connected to the top surfaces of the lead frames 3532a and 3532b through wires, respectively.

A low-refractive-index region 3536 is provided to surround the light emitting device 3535. The low-refractive-index region 3536 may be an empty space, or may be a region filled with a transparent resin having a relatively low refractive index. When the low-refractive-index region 3536 is the empty space, it has a refractive index (n=1) similar to the atmosphere. On the other hand, when the low-refractive-index region 3536 is formed of the transparent resin, epoxy, silicon or a mixed resin thereof may be used. In this case, the low-refractive-index region 3536 may have a refractive index of approximately 1.7.

A high-refractive-index layer 3537 is formed on the low-refractive-index region 3536. The high-refractive-index layer 3537 has a refractive index higher than at least the low-refractive-index region 3536, and an uneven pattern 3537a is formed on the top surface of the high-refractive-index layer 3537. Furthermore, a wavelength conversion layer 3538 is formed on the high-refractive-index layer 3537. The wavelength conversion layer 3538 includes a phosphor 3539 for converting the wavelength of light emitted from the LED 3535. The wavelength conversion layer 3538 is a phosphor-containing resin layer, and has a refractive index lower than that of at least the high-refractive-index layer 3537.

The wavelength conversion layer 3538 includes at least the red phosphor which absorbs the light emitted from the light emitting device, and emits light having a peak emission wavelength of approximately 600-700 nm. For example, the red phosphor includes the inorganic compound or at least one of the silicate-based phosphor, the sulfide-based phosphor, the nitride-based phosphor, and the QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$.

The high-refractive-index layer 3537 used herein may be formed of a resin having a high refractive index, or may be implemented with a transparent resin layer which include high-refractive-index particles. In this case, the high-refractive-index particles may be selected from the group consisting of GaP, Si, $TiO_2$, $SrTiO_3$, SiC, cubic or amorphous carbon, carbon nano tube, AlGaInP, AlGaAs, SiN, SiON, ITO, SiGe, AlN, and GaN.

The high-refractive-index layer 3537 has a high refractive index so that photons scattered from the phosphor particles 3539 can be totally reflected at the interface with the low-refractive-index region 3536. The high-refractive-index layer 3537 may have a refractive index of approximately 1.8 or more. When the low-refractive-index region 3536 is formed of a resin having a specific refractive index, the high-refractive-index layer 3537 may be formed of a material having a higher refractive index so that it can have a sufficient refractive index difference from the specific resin.

Although a relatively high light extraction critical angle is obtained at the interface with the wavelength conversion layer 3538, the uneven pattern 3537a formed on the high-refractive-index layer 3537 makes it easier to extract light at the wavelength conversion layer 3538. The formation period of the uneven pattern 3537a may be in the range of approximately 0.001-500 μm. Also, when the refractive index difference between the high-refractive-index layer 3537 and the wavelength conversion layer 3538 is excessively large, it is difficult to expect the sufficient light extraction even by means of the uneven pattern 3537a. Hence, it is preferable that the refractive index of the high-refractive-index layer 3537 is 10 or less.

Figure 149:
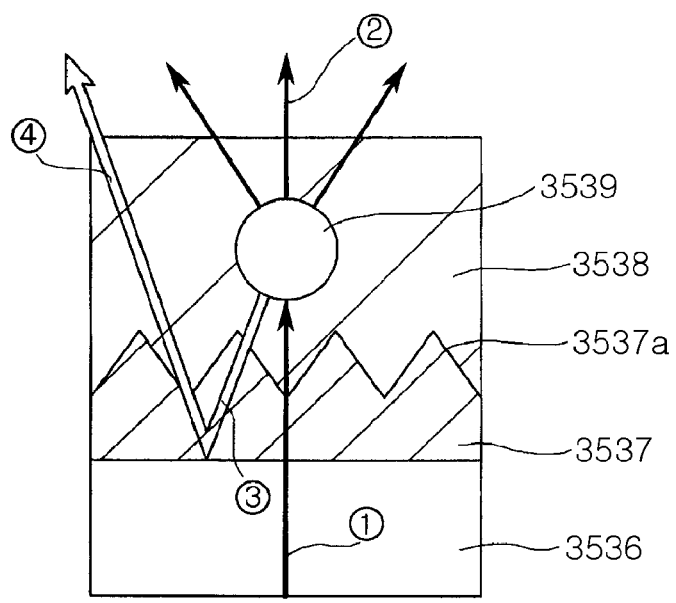

FIG. 149 is a schematic view explaining a light extraction mechanism in the light emitting device package illustrated in FIG. 148. Referring to FIGS. 148 and 149, light ① emitted from the light emitting device 3535 passes through the low-refractive-index region 3536 and the high-refractive-index layer 3537 and is directed toward the wavelength conversion layer 3538. Although the low-refractive-index region 3536 has a refractive index lower than that of the nitride constituting the light emitting device 3535, the light emitted from the light emitting device 3535 may be effectively extracted at the low-refractive-index region 3536 because the uneven pattern (not shown) is formed on the surface of the light emitting device 3535. Furthermore, the light directed from the low-refractive-index region 3536 toward the high-refractive-index layer 3537 may be effectively extracted because it is directed to the high-refractive-index material. Since the wavelength conversion layer 3538 has a lower refractive index than that of the high-refractive-index layer 3537, it has a limited light extraction critical angle, but it may be effectively extracted by the uneven pattern formed on the surface of the high-refractive-index layer 3537.

Then, the light ① emitted from the LED is excited at the phosphor particles 3539, and a portion of the excited light ② may be extracted in a desired direction, i.e., in a direction upward of the package. On the other hand, another portion of the excited light ③ may be directed from the wavelength conversion layer 3538 to the high-refractive-index layer 3537 toward the inside of the package. Since the wavelength conversion layer 3538 has a refractive index lower than that of the high-refractive-index layer 3537, the light ③ directed to the inside of the package may be entered into the high-refractive-index layer 3537, without being almost lost. Most of the light ③ entered into the high-refractive-index layer 3537 is totally reflected at the interface with the low-refractive-index region 3536 by the high refractive index difference. The totally reflected light ④ is directed to the upper portion of the high-refractive-index layer 3537, and may be extracted in a desired direction while passing through the interface between the high-refractive-index layer 3537 and the wavelength conversion layer 3538. As described above, although the high-refractive-index layer 3537 and the wavelength conversion layer 3538 have the limited light extraction critical angle due to the refractive index difference, the light may be easily extracted by the uneven pattern 3537a formed on the top surface of the high-refractive-index layer 3537.

As such, the light ③ scattered by the phosphor particles 3539 and directed to the inside of the package may be effectively totally reflected in a desired upward direction by the low-refractive-index region 3536 and the high-refractive-index layer where the uneven pattern 3537a is formed on the top surface thereof.

In accordance with the embodiment of the present invention, the wavelength conversion layer 3538 including the phosphor particles is provided at the upper portion of the light emitting device package, and the optical structure having the low-refractivity-index region and the high-refractivity-index layer with the uneven pattern is provided at the lower portion of the light emitting device package. Hence, the traveling direction of the light scattered at the phosphor particles in an omni-direction may be readjusted in the upper direction to thereby improve the light extraction efficiency.

Figure 150:
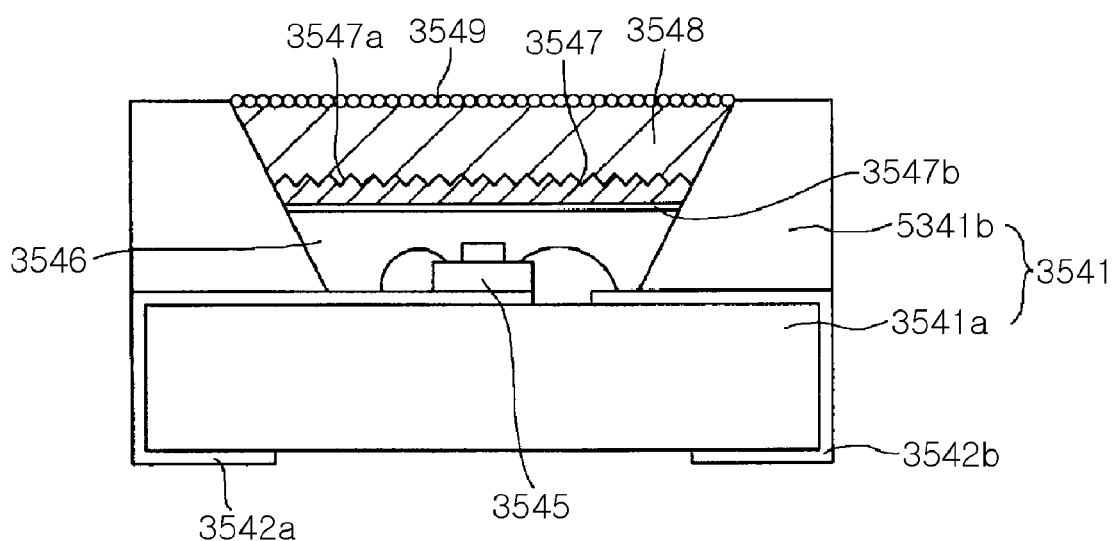
FIGS. 150 through 152 are cross-sectional views of a light emitting device package according to another embodiment of the present invention.
Figure 151:
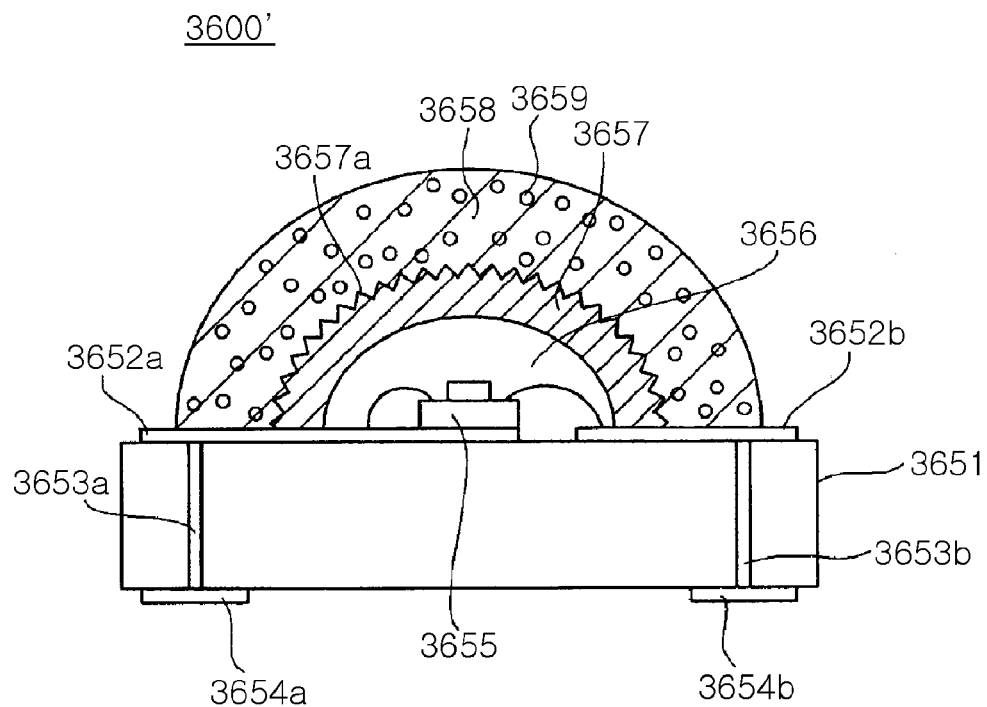
Figure 152:
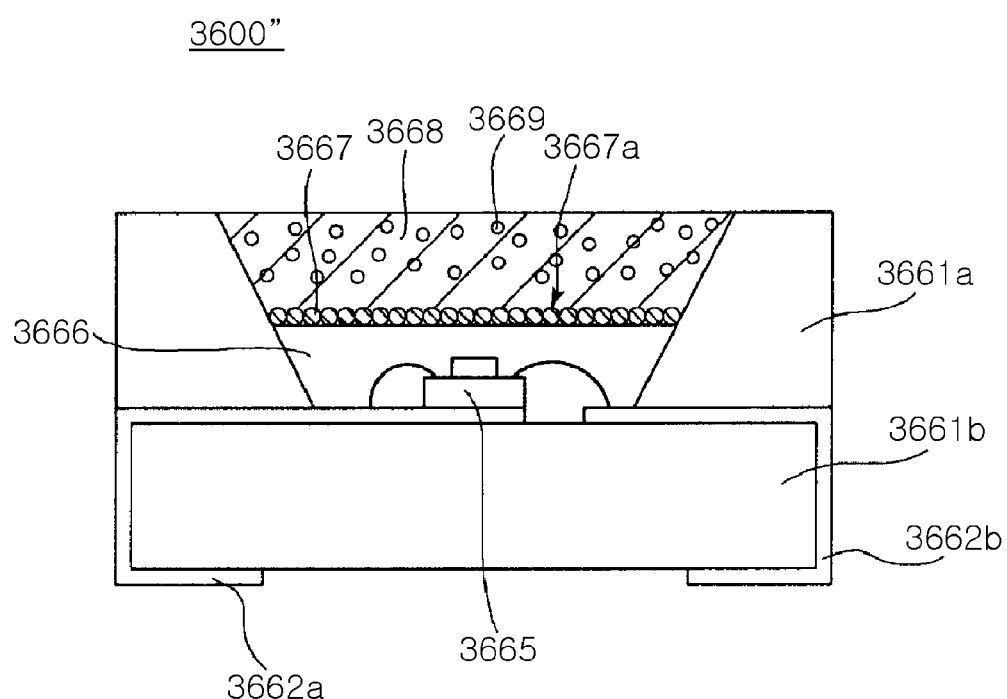

FIGS. 150 through 152 are cross-sectional views of a light emitting device package according to another embodiment of the present invention. FIG. 150 illustrates an improved structure of the wavelength conversion layer in the light emitting device package of FIG. 148, and FIG. 151 illustrates an improved structure of the package substrate. FIG. 152 illustrates an improved structure of the high-refractive-index layer. The high-refractive-index layer of FIG. 152 is formed using the shape of the high-refractive-index particles themselves, without employing a typical molding process or etching process.

Similar to the light emitting device package of FIG. 148, the light emitting device package 3600 of FIG. 150 includes a package substrate 3641 and a light emitting diode chip 3645 mounted on the package substrate 3641. The package substrate 3641 may include a bottom package substrate 3531a in which two lead frames 3642a and 3642b are formed, and a top package substrate 3641b in which a cavity is provided. Electrodes (not shown) of the light emitting device 3645 are connected to the top surfaces of the lead frames 3642a and 3642b through wires, respectively.

A low-refractive-index region 3646 is provided to surround the light emitting device 3645. The low-refractive-index region 3646 may be an empty space, or may be a region filled with a transparent resin having a relatively low refractive index, e.g., epoxy or silicon resin. When the low-refractive-index region 3646 is an empty space, the low-refractive-index region 3646 may be provided in such a manner that a lens (not shown) having a low refractive index is disposed in the empty space region to surround the light emitting device 3645.

A high-refractive-index layer 3647 is formed on the low-refractive-index region 3646. The high-refractive-index layer 3647 has a refractive index higher than at least the low-refractive-index region 3646, and an uneven pattern 3647a is formed on the top surface of the high-refractive-index layer 3647. The uneven pattern 3647a formed on the high-refractive-index layer 3647 may make it easier to extract light from the wavelength conversion layer 3648 having a relatively low refractive index. The formation period of the uneven pattern 3647a may be in the range of approximately 0.001-500 μm.

Also, a non-reflective layer 3647b may be further formed at the bottom surface of the high-refractive-index layer 3647, i.e., at the interface between the high-refractive-index layer 3647 and the low-refractive-index region 3646. The non-reflective layer 3647b is formed of a material which is non-reflective in the light wavelength band of the light emitting device 3645. Due to the non-reflective layer 3647b, the light generated by the light emitting device 3645 may be more effectively directed toward the high-reflective-index layer 3647.

A wavelength conversion layer 3648 is formed on the high-refractive-index layer 3647. The wavelength conversion layer 3648 includes a phosphor 3649 for converting the wavelength of light emitted from the light emitting device 3645. The wavelength conversion layer 3648 has a refractive index lower than that of at least the high-refractive-index layer 3647.

In this embodiment, the wavelength conversion layer 3648 may be formed by forming a typical transparent resin region and coating a phosphor 3649 on the top surface thereof. In such a structure, since the layer including the phosphor particles 3649 is disposed on an optical structure including the high-refractive-index layer 3647 and the low-refractive-index region 3646, light extraction efficiency is remarkably improved.

Furthermore, the high-refractive-index layer 3647 may be formed of a resin having a high refractive index, or may be formed of a transparent resin containing high-refractive-index particles. The high-refractive-index layer 3647 has a refractive index of 1.8 or more so that photons scattered at the phosphor particles 3649 are totally reflected at the interface with the low-refractive-index region 3646. The high-refractive-index layer 3647 may have a refractive index of 10 or less in order to facilitate light extraction at the wavelength conversion layer 3648.

Although the package manufacturing method according to the present invention is not limited to the following example, when the low-refractive-index region 3646 is formed of a transparent resin such as epoxy or silicon resin, the low-refractive-index region 3646 may be formed by sequentially coating and curing the high-refractive-index layer 3647 and the wavelength conversion layer 3648. The uneven pattern 3647a formed on the high-refractive-index layer 3647 may be formed by applying a mechanical or chemical etching process after a curing process, or by using a molding frame before a curing process.

Next, the light emitting device package 3600' illustrated in FIG. 151 includes a package substrate 3651 and a light emitting device 3655 mounted on the package substrate 3651. The package substrate 3651 includes, but is not limited to, two lead frames 3652a and 3652b formed on the top surface thereof, two connection pads 3654a and 3654b formed on the bottom surface thereof, and conductive via holes 3653a and 3653b connecting them.

Similar to other embodiments, the light emitting device package 3600 includes a hemispherical low-refractive-index region 3656 surrounding a light emitting device 3655, a high-refractive-index layer 3657 formed on the low-refractive-index region 3656, and a wavelength conversion layer 3658 formed on the high-refractive-index layer 3657. The high-refractive-index layer 3657 has a refractive index higher than that of at least the low-refractive-index region 3656, and an uneven pattern 3657a is formed on the top surface of the high-refractive-index layer 3657. The wavelength conversion layer 3658 has a refractive index lower than that of at least the high-refractive-index layer 3657.

In this embodiment, when the hemispherical low-refractive-index region 3656 is formed of a transparent resin, it may be easily formed using a conventional molding process, e.g., a transfer molding process. In this case, other layers 3657 and 3658 may be formed through a molding process. On the other hand, when the low-refractive-index region 3656 is provided with an empty space, it may be implemented by forming the high-refractive-index layer 3657 and/or the wavelength conversion layer 3658 into a desired shape through a separate molding process and attaching the high-refractive-index layer 3657 and/or the wavelength conversion layer 3658 on the package substrate 3651. Although the hemispherical high-refractive-index layer 3657 and the hemispherical wavelength conversion layer 3658 are exemplified, they may also be formed in various cross-sectional shapes, e.g., rectangular or triangular.

These various shapes may also be applied to the structure of FIG. 150 in a similar manner. For example, although the high-refractive-index layer 3547 having a flat shape is illustrated in FIG. 150, it may be modified into a hemispherical shape or other shapes, as illustrated in FIG. 151.

Similar to the light emitting device package of FIG. 148, the light emitting device package of FIG. 152 includes a package substrate 3661 and an LED chip 3665 mounted on the package substrate 3661. The package substrate 3661 may include a bottom package substrate 3661a in which two lead frames 3662a and 3662b are formed, and a top package substrate 3661b in which the cavity is provided.

The light emitting device 3665 is mounted inside the cavity region. Electrodes (not shown) of the light emitting device 3665 are connected to the top surfaces of the lead frames 3662a and 3662b through wires, respectively.

A low-refractive-index region 3666 may be an empty space, or may be a region filled with a transparent resin having a relatively low refractive index. When the low-refractive-index region 3666 is the empty space, it has a refractive index (n=1) similar to that of the atmosphere. On the other hand, when the low-refractive-index region 3666 is formed of the transparent resin, epoxy, silicon or a mixed resin thereof may be used. In this case, the low-refractive-index region 3666 may have a refractive index of approximately 1.7.

A high-refractive-index layer 3667 is formed on the low-refractive-index region 3666. The high-refractive-index layer 3667 has a refractive index higher than that of at least the low-refractive-index region 3666, and an uneven pattern 3667a is formed by the shape of the particles. Accordingly, in this embodiment, the shape or period of the uneven pattern 3667a is determined by the grain size or shape of the high-refractive-index particles. The high-refractive-index particles may be selected from the group consisting of GaP, Si, $TiO_2$, $SrTiO_3$, SiC, cubic or amorphous carbon, carbon nano tubes, AlGaInP, AlGaAs, SiN, SiON, ITO, SiGe, AlN, and GaN.

The high-refractive-index layer 3667 used herein may be formed by arranging the high-refractive-index particles on at least the top surface thereof in the cavity region through a separate process. Alternatively, when the low-refractive-index region 3666 is formed of a specific resin, it may be formed by densely coating the high-refractive-index particles on the top surface of the resin.

A wavelength conversion layer 3668 is formed on the high-refractive-index layer 3667. The wavelength conversion layer 3668 includes a phosphor 3669 for converting the wavelength of light emitted from the light emitting device 3665. The wavelength conversion layer 3668 has a refractive index lower than that of at least the high-refractive-index layer 3667.

The uneven pattern 3667a formed on the high-refractive-index layer 3667 makes it easier to extract light from the wavelength conversion layer having a relatively low refractive index. Also, when the refractive index difference between the high-refractive-index layer 3667 and the wavelength conversion layer 3668 is excessively large, it is difficult to expect sufficient light extraction even by means of the uneven pattern 3667a. Hence, it is preferable that the refractive index of the high-refractive-index layer 3667 is 10 or less.

Figure 153:
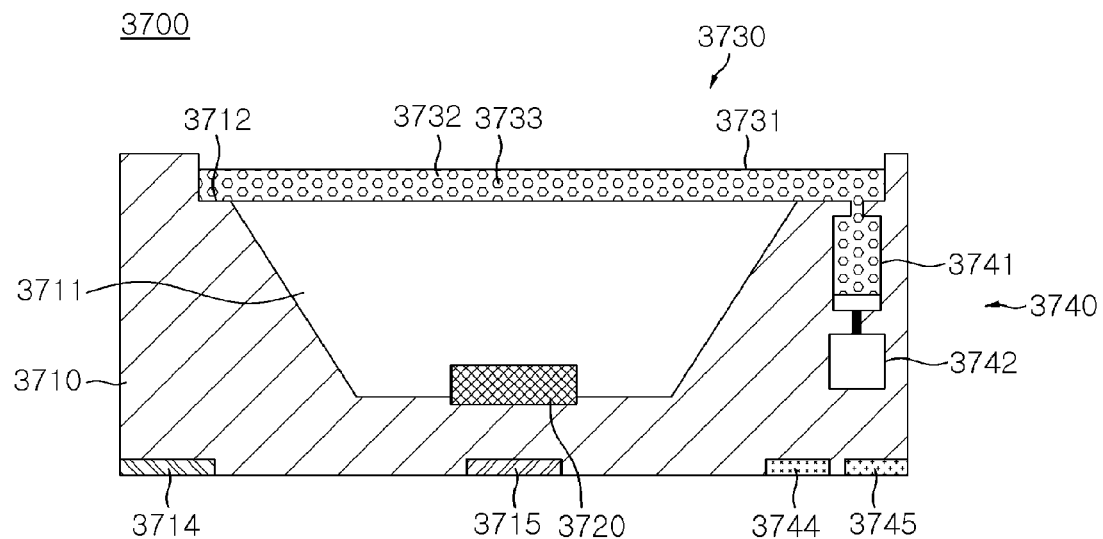
FIG. 153 is a schematic cross-sectional view of a light emitting device package according to another embodiment of the present invention.
Figure 154:
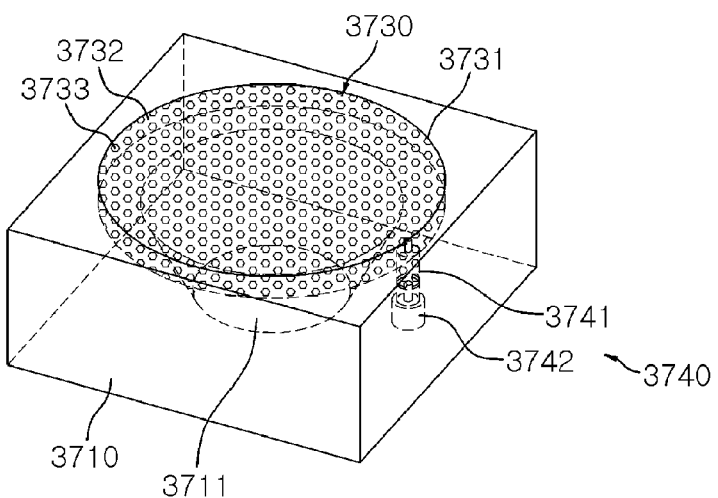
FIG. 154 is a schematic perspective view of a wavelength conversion part and a control part in the light emitting device package of FIG. 153.

FIG. 153 is a schematic cross-sectional view of a light emitting device package according to another embodiment of the present invention. FIG. 154 is a schematic perspective view of a wavelength conversion part and a control part in the light emitting device package illustrated in FIG. 153.

Referring to FIGS. 153 and 154, the light emitting device package 3700 according to this embodiment of the present invention includes a main body 3710, a light emitting device 3720, a wavelength conversion part 3730, and a control part 3740. The main body 3710 may be formed of a plastic, a resin, or a ceramic. The main body 3710 includes a cavity 3711 having an opened front side, and the light emitting device 3720 is accommodated in the cavity 3711. The cavity 3711 has an inner periphery inclined in a forward direction in order to spread light generated from the light emitting device 3720. The inner periphery of the cavity 3711 is extending in a direction from the inside to the outside.

As illustrated, when the cavity 3711 is formed in a cylindrical structure and thus has a circular or elliptical horizontal-section, the cavity 3711 has a cone shape in which its outside inner diameter is wider than its inside inner diameter. However, the present invention is not limited to the above embodiment, and the cavity 3711 may have a rectangular horizontal cross-section. In this case, the cavity 3711 may have a pyramid shape in which its outside cross-section is wider than its inside cross-section.

The main body 3710 includes a stepped mount part 3712 in which the wavelength conversion part 3730 is mounted on the opened front side (top surface) of the cavity 3711. The mount part 3712 is formed to be stepped downward from the front side (top surface) of the main body 3710, so that the wavelength conversion part 3730 may be mounted thereon. The mount part 3712 may be formed along the outer periphery of the cavity 3711.

The main body 3710 includes a pair of main electrodes 3714 and 3715 having one terminal exposed to the bottom surface of the cavity 3711 to be electrically connected to the light emitting device 3720 mounted on the main body 3710, and the other terminal exposed to the outside of the main body 3710. The light emitting device 3720 is a type of a semiconductor device which radiates light having a predetermined wavelength when an external voltage is applied thereto. The light emitting device package according to this embodiment of the present invention changes color temperature by using a single light emitting device, as opposed to the related art in which a plurality of light emitting devices are used. The light emitting device 3720 is mounted on the main body 3710 so that it is electrically connected to the pair of the main terminals 3714 and 3715 which are accommodated in the cavity 3711 and provided inside the main body 3710.

Meanwhile, the wavelength conversion part 3730 is mounted in the mount part 3712 of the main body 3710 to cover the cavity 3711, and changes the wavelength of light emitted from the light emitting device 3720. The wavelength conversion part 3730 includes a fluid containing part 3731 disposed on the path of light emitted from the light emitting device 3720, a transparent fluid 3732 introduced into the fluid containing part 3731, and a phosphor material 3733 dispersed within the transparent fluid 3732. The wavelength conversion part 3730 controls the color temperature by controlling the volume of the fluid containing part 3731 while changing the capacity of the transparent fluid 3732 which contains the phosphor material 3733 and is introduced into the fluid containing part 3731. The wavelength conversion part 3730 includes at least the red phosphor which absorbs the light emitted from the light emitting device, and emits light having a peak emission wavelength of approximately 600-700 nm. For example, the red phosphor includes the inorganic compound or at least one of the silicate-based phosphor, the sulfide-based phosphor, the nitride-based phosphor, and the QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$.

The fluid containing part 3731 may be formed of a silicon or rubber material, which has superior deformation characteristics, such as contraction and expansion, and superior restoring characteristic. The fluid containing part 3731 may have light transparency in order not to affect the color temperature. Also, the fluid containing part 3731 may be formed in a hollow tube structure which has a predetermined volume sufficient to contain the transparent fluid 3732 introduced into the inside of the fluid containing part 3731. Although the fluid containing part 3731 having a disk-shaped structure is illustrated, the present invention is not limited thereto. The fluid containing part 3731 may have a polygonal structure, e.g., a rectangular structure, depending on the outer cross-section shape of the cavity 3711. The transparent fluid 3732 introduced into the fluid containing part 3731 may include water, oil, or resin in order to have a flowable characteristic. The transparent fluid 3732 is contained in the uniformly dispersed phosphor material 3733.

Meanwhile, the control part 3740 is connected to the wavelength conversion part 3730, and controls the color temperature by adjusting the volume of the fluid containing part 3731 while changing the capacity of the transparent fluid 3732. The control part 3740 includes a reservoir 3741, which communicates with the fluid containing part 3731 and contains the transparent fluid 3732, and an actuator 3742, which is connected to the reservoir 3741 and adjusts the capacity of the transparent fluid 3732 contained in the fluid containing part 3731. The reservoir 3741 is connected to the fluid containing part 3731 and contains a part of the transparent fluid 3732 contained in the fluid containing part 3731. Therefore, the transparent fluid 3732 having a flowable characteristic is not fixed in such a state that it is contained in the fluid containing part 3731 but is movable between the fluid containing part 3731 and the reservoir 3741. In this way, the capacity of the transparent fluid 3732 in the fluid containing part 3731 may be changed. The reservoir 3741 may be formed of the same material as the fluid containing part 3731, and may be integrally formed with the fluid containing part 3731.

The actuator 3742 is connected to the reservoir 3741 and controls the capacity of the transparent fluid 3732 contained in the fluid containing part 3731. That is, the capacity of the transparent fluid 3732 inside the fluid containing part 3731 is controlled by moving the transparent fluid 3732, which is contained in the reservoir 3741 connected to the actuator 3742, toward the fluid containing part 3731, or moving the transparent fluid 3732 from the fluid containing part 3731 to the reservoir 3741 through the expansion or contraction of the actuator 3742. Examples of the actuator 3741 may include a piezo actuator (PZT), a MEMS device, and so on. The actuator 3742 is driven by an external voltage. To this end, the actuator 3742 includes a pair of auxiliary terminals 3744 and 3745 whose one end is electrically connected to the actuator 3742 and whose another end is exposed to the outside of the main body 3710.

The light emitting device package may further include an electronic device (not shown) controlling the operation of the actuator 3742. A description of the detailed connection structure of the actuator 3742 and the auxiliary terminals 3744 and 3745 will be omitted. Although the auxiliary terminals 3744 and 3745 exposed to the bottom of the main body 3710 are illustrated, they may also be exposed to the side of the main body 3710. The reservoir 3741 and the actuator 3742 may be adjacent to the cavity 3711 and buried inside the main body 3710. In this case, the main body 3710 may have a recessed receiving groove (not shown) at which the reservoir 3741 and the actuator 3742 are received. Accordingly, the reservoir 3741 and the actuator 3742 may be inserted into and mounted in the receiving groove.

In the light emitting device package according to this embodiment of the present invention, the reservoir 3471 and the actuator 3742 are arranged in parallel with an optical axis along a minor axis direction of the main body 3710. However, the reservoir 3741 and the actuator 3742 may also be arranged to be perpendicular to the optical axis along a major axis direction of the main body 3710. In this case, the thickness of the main body 3710 may be reduced, and the reservoir 3741 and the actuator 3742 may be more effectively mounted.

The fluid containing part 3731 is mounted on the stepped surface of the mount part 3712 to cover the cavity 3711. In this case, the cavity 3711 of the main body 3710 is filled with a transparent resin in order to seal the light emitting device 3720 disposed within the cavity 3711. In addition, the cavity 3711 may be filled with air to surround the light emitting device 3720 disposed within the cavity 3711. In this case, the light emitting device is sealed by the fluid containing part 3731 which is mounted to cover the cavity 3711.

Figure 155:
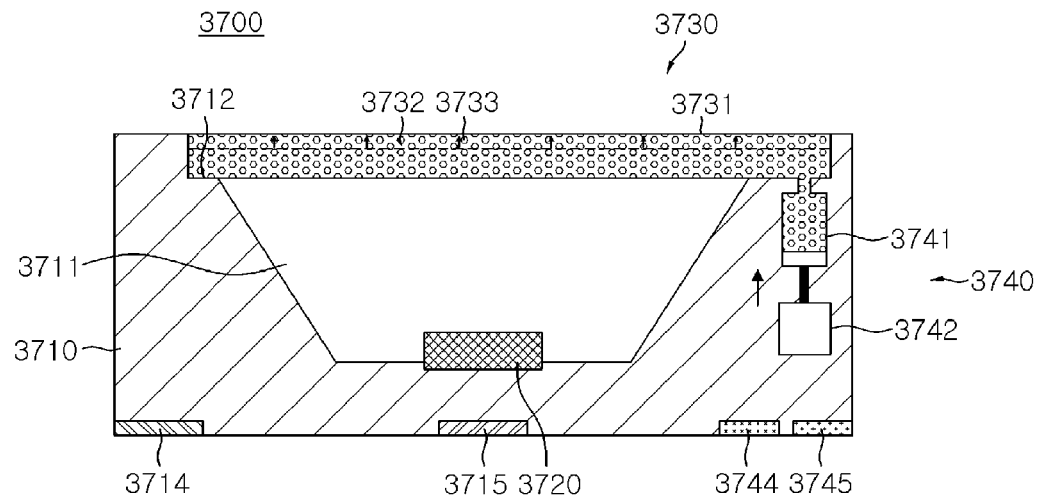
FIGS. 155 and 156 are cross-sectional views illustrating a method of changing a color temperature through the operation of the wavelength conversion part and the control part in FIG. 153.

A method of changing color temperature through the operations of the wavelength conversion part 3730 and the control part 37 will be described below with reference to FIGS. 155 and 156. Referring to FIG. 155, when external voltage is applied through the pair of the auxiliary terminals 3744 and 3745 and the actuator 3742 performs an expansion operation, the reservoir 3741 connected to the actuator 3742 is contracted by the actuator 3742, and thus the volume of the reservoir 3741 is reduced. At this time, the transparent fluid 3732 contained in the reservoir 3741 is moved to the fluid containing part 3731 to thereby increase the flow rate of the transparent fluid 3732 filling the fluid containing part 3731. Therefore, the fluid containing part 3731 is expanded by the introduced transparent fluid 3732, and thus its volume is increased. Hence, the thickness of the phosphor fluid layer disposed on the optical axis is increased as much. Since the light generated from the light emitting device 3720 passes through the thick phosphor fluid layer, the color temperature of the emitted light is lowered.

Figure 156:
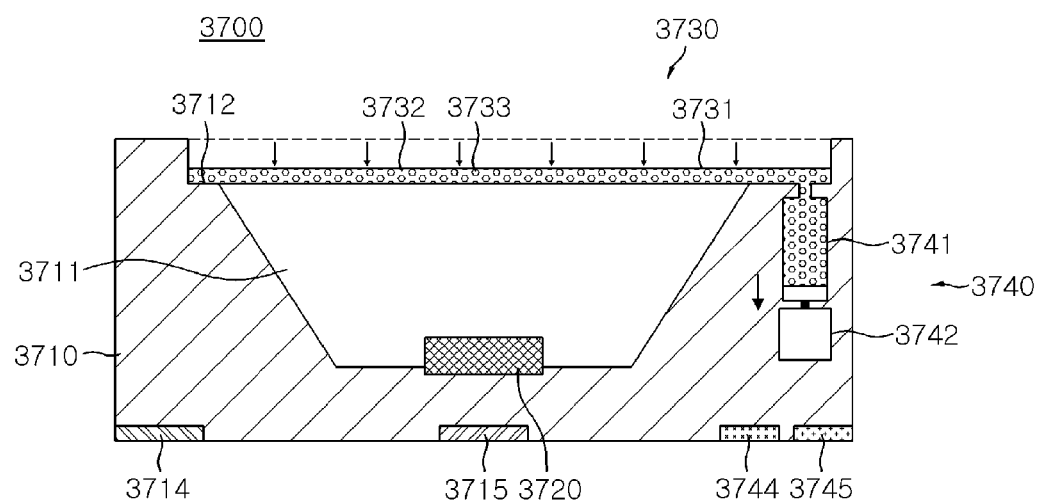

Referring to FIG. 156, when the actuator 3742 performs a contraction operation, the reservoir 3741 connected to the actuator 3742 is expanded by the actuator 3742 and thus the volume of the reservoir 3741 is increased. At this time, the transparent fluid 3732 contained in the reservoir 3741 is moved to the reservoir 3741 to thereby decrease the flow rate of the transparent fluid 3732 filling the fluid containing part 3731. Therefore, the fluid containing part 3731 is contracted by the introduced transparent fluid 3732, and thus its volume is decreased. Hence, the thickness of the phosphor fluid layer disposed on the optical axis is decreased as well. Since the light generated from the light emitting device 3720 passes through the thin phosphor fluid layer, the color temperature of the emitted light is increased.

Although the front surface (top surface) of the fluid containing part 3731 which is expanded and contracted in a flat state is illustrated in the drawings, its center portion may protrude in a dome shape. The change of the color temperature may be more precisely adjusted by the electronic device (not shown) which controls the actuator 3742. Therefore, color temperature may be easily adjusted with the single light emitting device, and the light source may be miniaturized because it is unnecessary to ensure the distance for color mixture.

Figure 157:
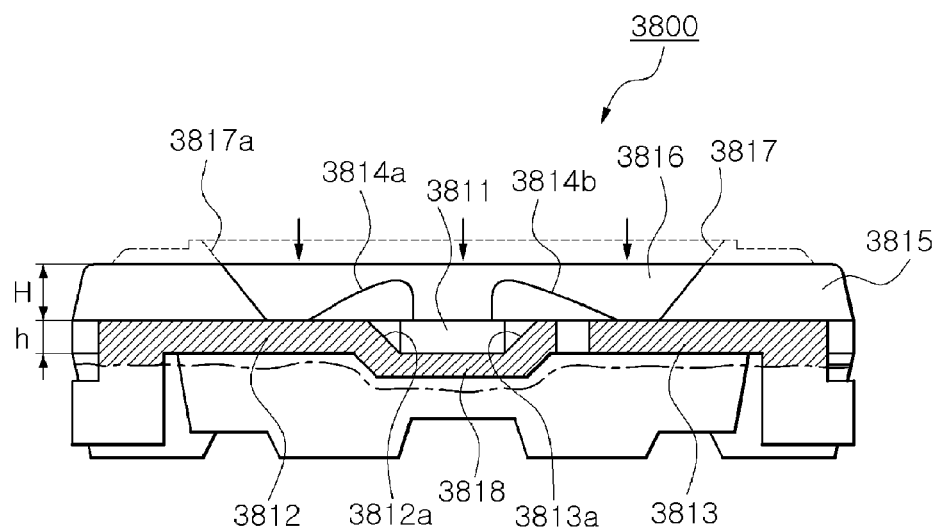
FIGS. 157 and 158 are schematic views of light emitting device packages according to various embodiments of the present invention.

FIG. 157 is a cross-sectional view of a light emitting device package 3800 according to another embodiment of the present invention.

Referring to FIG. 157, the light emitting device package 3800 according to this embodiment of the present invention includes a light emitting device 3811, electrode structures 3812 and 3813, a package main body 3815, a translucent transparent resin 3816, and a recessed part 3818 where the light emitting device 3811 is mounted.

The light emitting device 3811 is bonded to the respective first ends of a pair of (metal) wires 3814a and 3814b, and the electrode structures 3812 and 3813 are bonded to the second ends of the pair of wires 3814a and 3814b.

The light emitting device 3811 may be one of the light emitting devices according to the various embodiments of the present invention.

The package main body 3815 is a structure which is injection-molded of a resin to form a cavity 3817 having a closed bottom surface and an opened top surface.

The cavity 3817 may have a top inclined surface inclined at a certain angle, and a reflection member 3817a may be provided on the top inclined surface of the cavity 3817. The reflection member 3817a is formed of a metal having a high reflectivity, e.g., Al, Ag, Ni, etc., in order to reflect light generated from the light emitting device 3811.

The pair of the electrode structures 3812 and 3813 are integrally formed and fixed to the package main body 3815, and a part of the first end top surfaces of the electrode structures 3812 and 3813 is exposed to the outside through the bottom surface of the cavity 3817.

The second ends of the electrode structures 3812 and 3813 are exposed to the outer surface of the package main body 3815 so that they may be connected to the external power supply.

The recessed part 3818 is formed by recessing the top surfaces of the electrode structures 3812 and 3813 exposed to the bottom surface of the cavity 3817. The recessed part 3818 may be formed in the electrode structure 3812 where the light emitting device 3811 is mounted among the pair of the electrode structures 3812 and 3813.

The recessed part 3818 is provided with a bent part which is bent downward in the first end of the electrode structure 3812 where at least one light emitting device 3811 is mounted. The bend part has a flat mount surface where the light emitting device 3811 is mounted, and a pair of lower inclined surfaces 3812a and 3813c extending upward at a certain angle at the left and right sides of the mount surface and facing the outer surface of the light emitting device 3811.

A reflection member may be provided on the lower inclined surfaces 3812a and 3813a in order to reflect light generated from the light emitting device 3811.

The depth H of the recessed part 3818 may be approximately 50-400 μm, considering the height h of the light emitting device 3811. In this way, the cavity height H of the package main body 3815 may be reduced at 150-500 μm. Since the amount of the translucent transparent resin which is contained within the capacity 3817 is reduced, the manufacturing costs are accordingly reduced and brightness is improved. Furthermore, the products may be miniaturized.

Figure 158:
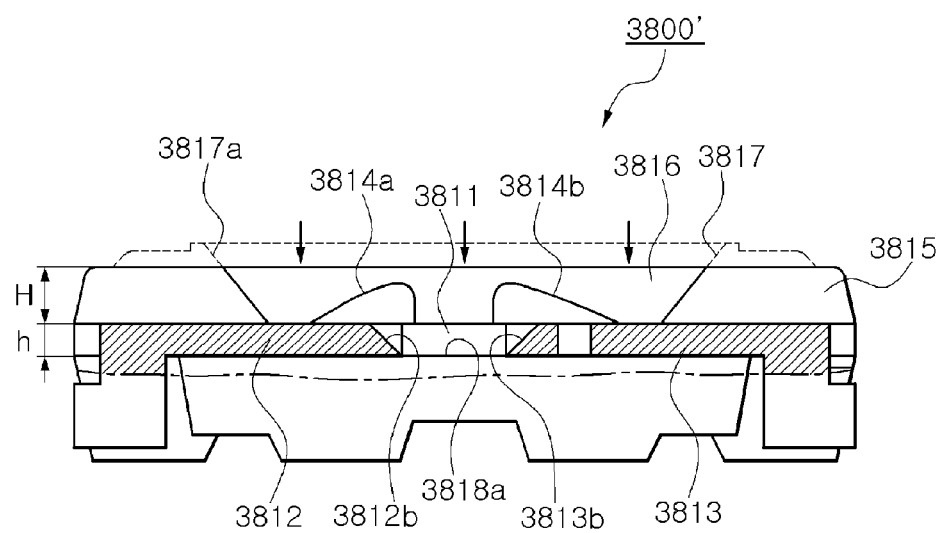

FIG. 158 is a cross-sectional view illustrating a modified embodiment of the light emitting device package of FIG. 157.

Unlike the recess part 3818 of the previous embodiment, the light emitting device package according to this modified embodiment of the present invention includes a groove 3818a which is recessed from the bottom surface of the cavity 3817 at a certain depth when forming the package main body 3815 between the pair of electrode structures 3812 and 3813 facing each other.

Since the other elements are the same as the light emitting device package of FIG. 157, a detailed description thereof will be omitted.

The translucent transparent resin 3816 is formed of a transparent resin material such as epoxy, silicon, or resin filling the cavity 3817 in order to cover the light emitting device 3811 and the wires 3814a and 3814b and protect them from the external environment.

The translucent transparent resin 3816 may include a phosphor material which is a wavelength conversion means selected from a garnet-based phosphor such as YAG and TAG, a silicate-based phosphor, a sulfide-based phosphor, a nitride-based phosphor, and a QD phosphor, which are capable of converting light emitted from the light emitting device 3811 into white light.

A garnet-based phosphor material including YAG and TAG may be selected from (Y, Tb, Lu, Sc, La, Gd, Sm)3(Al, Ga, In, Si, Fe)5(O, S)12:Ce, and a silicate-based phosphor material may be selected from (Sr, Ba, Ca, Mg)2SiO4:(Eu, F, Cl). Also, the sulfide-based phosphor material may be selected from (Ca, Sr)S:Eu, (Sr, Ca, Ba)(Al, Ga)2S4:Eu. The nitride-based phosphor may be an oxynitride phosphor formed by activating rare earth elements. The sulfide-based phosphor may be a phosphor in which a part or all of a metal Me (where Me is Ca, or one or two kinds of Y) solid-solved in α-SiAlON expressed as (Sr, Ca, Si, Al, O)N:Eu (e.g., CaAlSiN4:Eu, or β-SiAlON:Eu) or Ca-α SiAlON:Eu-based formula: MeXSi12−(m+2)Al(m+n)OnN16−n:Re (where x, y, m and n are coefficients) is replaced with a lanthanide metal Re which is the center of light emission.

The α-SiAlON-based phosphor may be selected from phosphor components of (Cax, My)(Si, Al)12(O, N)16 (where, M is at least one of Eu, Tb, Yb, and Er, $0.05<(x+y)<0.3$, $0.02<x<0.27$, and $0.03<y<0.3$).

The QD phosphor is a nano crystal particle composed of a core and a shell, and a core size is in the range of approximately 2-100 nm. The QD phosphor may be used as phosphor materials to emit various colors, e.g., blue (B), yellow (Y), green (G) and red (R) by adjusting the core size. The core and shell structure of the QD phosphor may be formed by the heterojunction of at least two kinds of semiconductors among group II-VI compound semiconductors (ZnS, ZnSe, ZnTe, CdS, CdSe, CdTe, HgS, HgSe, HgTe, MgTe, etc.), group III-V compound semiconductors (GaN, GaP, GaAs, GaSb, InN, InP, InAs, InSb, AlAs, AlP, AlSb, AlS, etc.), and group IV semiconductors (Ge, Si, Pb, etc.). An organic ligand using a material such as oleic acid may be formed at the outer shell of the QD phosphor in order to terminate the molecular bonding of the shell surface, suppress the aggregation between the QD particles, improve the dispersion inside the resin such as a silicon resin or an epoxy resin, or improve the phosphor function.

The white light may include the yellow (Y) phosphor, the green (G) phosphor, and the red (R) phosphors in the blue light emitting device. The yellow, green and red phosphors are excited by the blue light emitting device to emit the yellow light, the green light, and the red light, respectively. The yellow light, the green light, and the red light are mixed with a part of the blue light emitted from the blue light emitting device to thereby output the white light.

Since the respective phosphors for outputting the white light have been described above in detail, a further description thereof will be omitted in this modified embodiment of the present invention.

The ends of the electrode structures 3812 and 3813 facing the outer surface of the light emitting device 3811 mounted into the groove 3818a may have lower inclined surfaces 3812b and 3813b where a reflection member is provided in order to reflect light generated from the light emitting device 3811.

In the light emitting device packages 3800 and 3800' having the above-described structure, the light emitting device 3811 disposed at the center of the cavity 3817 is mounted on the mount source of the recessed part, which is bent downward in the electrode structure 3812, or mounted in the groove 3818a, which is recessed between the ends of the electrode structures 3812 and 3813 facing each other. Thus, the top surface of the light emitting device 3811 wire-bonded to the electrode structures 3812 and 3813 through wires 3814a and 3814b may be approximately identical to the top surface height of the electrode structures 3812 and 3813.

In this case, the maximum height of the wires 3814a and 3814b wire-bonded to the light emitting device 3811 may be reduced by the reduced mount height of the light emitting device 3811.

Accordingly, it is possible to reduce the filling amount of the translucent transparent resin 3816 contained in the cavity in order to protect the light emitting device 3811 and the wires 3814a and 3814b. Also, the filling height H of the translucent transparent resin may be reduced by the reduced mount height of the light emitting device 3811. Hence, the brightness of light generated during the light emission of the light emitting device 3811 may be markedly improved.

Since the filling height H of the translucent transparent resin 3816 contained in the cavity 3817 is reduced, the top end height of the package main body 3815 is reduced by the reduced filling height, thereby further reducing the entire package size.

Figure 159:
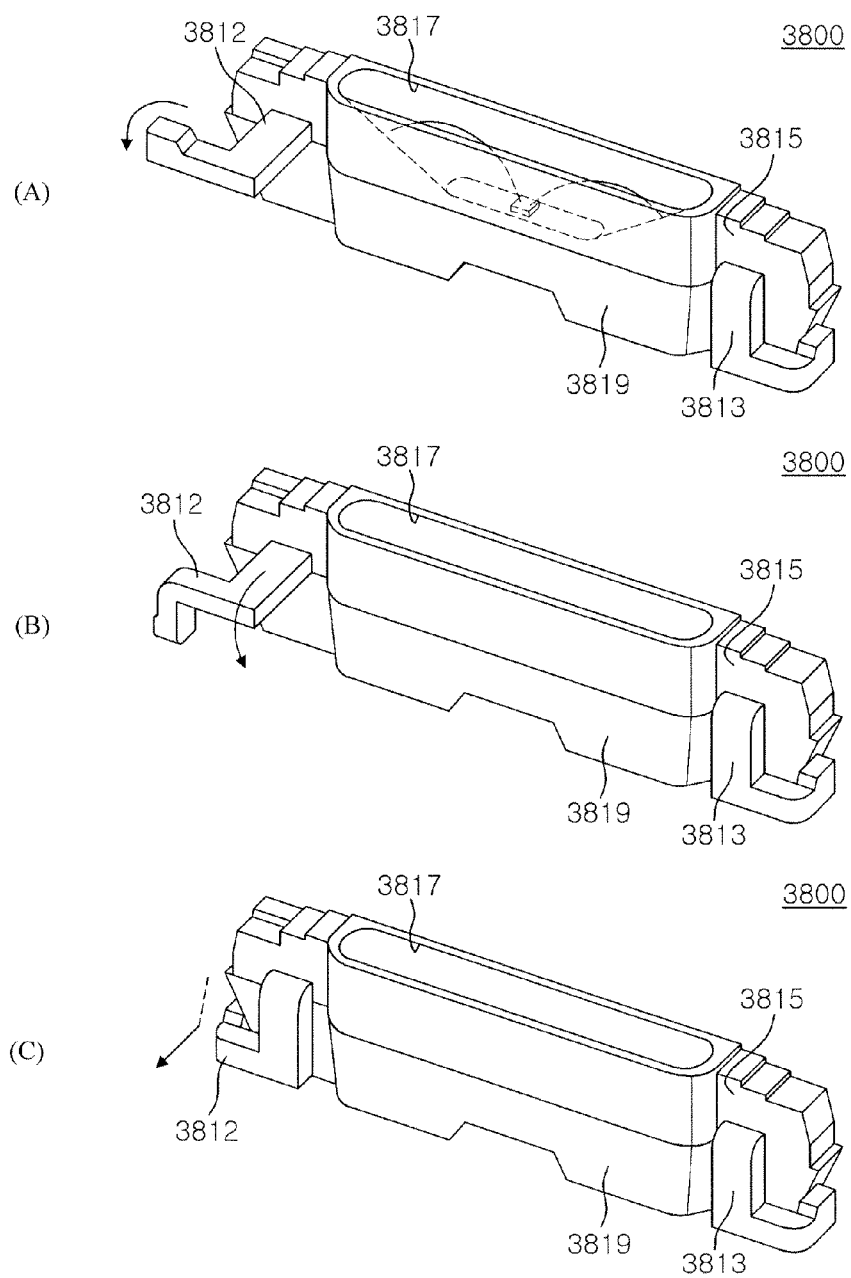
FIGS. 159(A) through 159(C) are schematic views illustrating a process of forming an external lead frame in the light emitting device package of FIG. 157.

FIGS. 159A to 159C are schematic views illustrating a method of manufacturing an external lead frame in the light emitting device package according to the embodiment of the present invention.

Referring to FIG. 159A, the negative and positive electrode structures 3812 and 3813 are integrally fixed to the package main body 3815 which is mostly injection-molded out of a resin. However, the ends of the electrode structures 3812 and 3813 are exposed to the outer surface of the package main body 3815 so that they may be connected to the external power supply.

The electrode structures 3812 and 3813 exposed downward to the outside of the package main body 3815 are bent in a direction opposite to the emission surface which is bent through the side and/or bottom surface of the package to form the cavity 3817.

The electrode structures 3812 and 3813 are bent at the side and/or rear surface (bottom) of the mount surface (bottom surface, 3819) of the package.

As illustrated in FIG. 159B, the end portion of the electrode structure 3812 exposed to the package bottom surface 3819 is primarily bent to form the side shape of the package 3800. Then, as illustrated in FIG. 159C, the end portion of the electrode structure 3812 is bent toward the rear of the package bottom surface 3819. In this way, the entire electrode structure 3812 is completely formed.

The light emitting device package may provide a white light source module which is suitable for use as an LCD backlight unit. That is, the white light source module according to the embodiment of the present invention is an LCD backlight unit and may be combined with various optical members (a diffusion plate, a light guide plate, a reflection plate, a prism sheet, etc.) to constitute the backlight assembly. Exemplary white light sources are illustrated in FIGS. 160 and 161.

Figure 160:
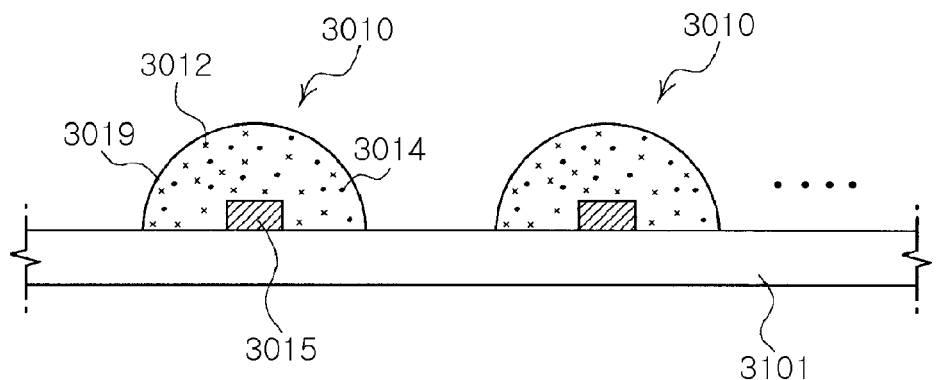
FIGS. 160 and 161 are schematic side sectional views illustrating white light source modules according to various embodiments of the present invention.

Referring to FIG. 160, the light source module 310 for the LCD backlight includes a circuit board 3101, and a plurality of white light emitting device packages 3010 mounted on the circuit board 3101. A conductive pattern (not shown) connected to the light emitting device 3010 may be formed on the top surface of the circuit board 3101.

The white light emitting device packages 3010 may be understood as the white light emitting device package which has been described above with reference to FIG. 120. That is, the blue light emitting device 3015 is directly mounted on the circuit board 3101 in a chip on board (COB) method. Since the structure of the respective white light emitting device package 3010 is provided with the hemispherical resin encapsulation part 3019 having no separate reflection wall and having a lens function, the white light emitting device packages 3100 may exhibit a wide orientation angle. The wide orientation angle of each respective light source may contribute to reducing the size (thickness or width) of the LCD display.

Figure 161:
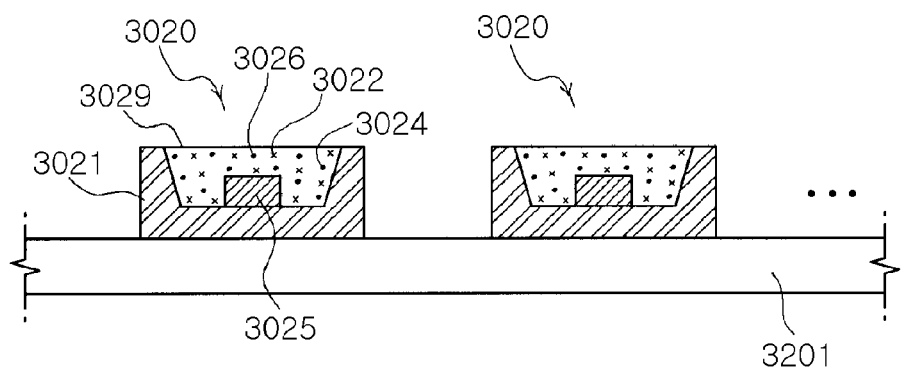

Referring to FIG. 161, the light source module 3200 for the LCD backlight includes a circuit board 3201, and a plurality of white light emitting device packages 3020 mounted on the circuit board 3201. The white light emitting device package 3020 includes a blue light emitting device 3025, which is mounted inside a reflection cup of a package main body 3021, and a resin encapsulation part 3029, which encapsulates the blue light emitting device 3025, as described above with reference to FIG. 121. Green and red phosphors 3022 and 3024 and yellow or orange yellow phosphors 3026 are dispersed within the resin encapsulation part 3029.

<Backlight Unit>

A backlight unit according to an embodiment of the present invention includes the above-described light emitting device package. The light emitting device package including the semiconductor light emitting device may be applied as various light sources, e.g., illumination devices, car headlights, etc., as well as a surface light source such as a backlight unit.

Backlight units including the light emitting device packages according to the various embodiments of the present invention will be described below.

Figure 162:
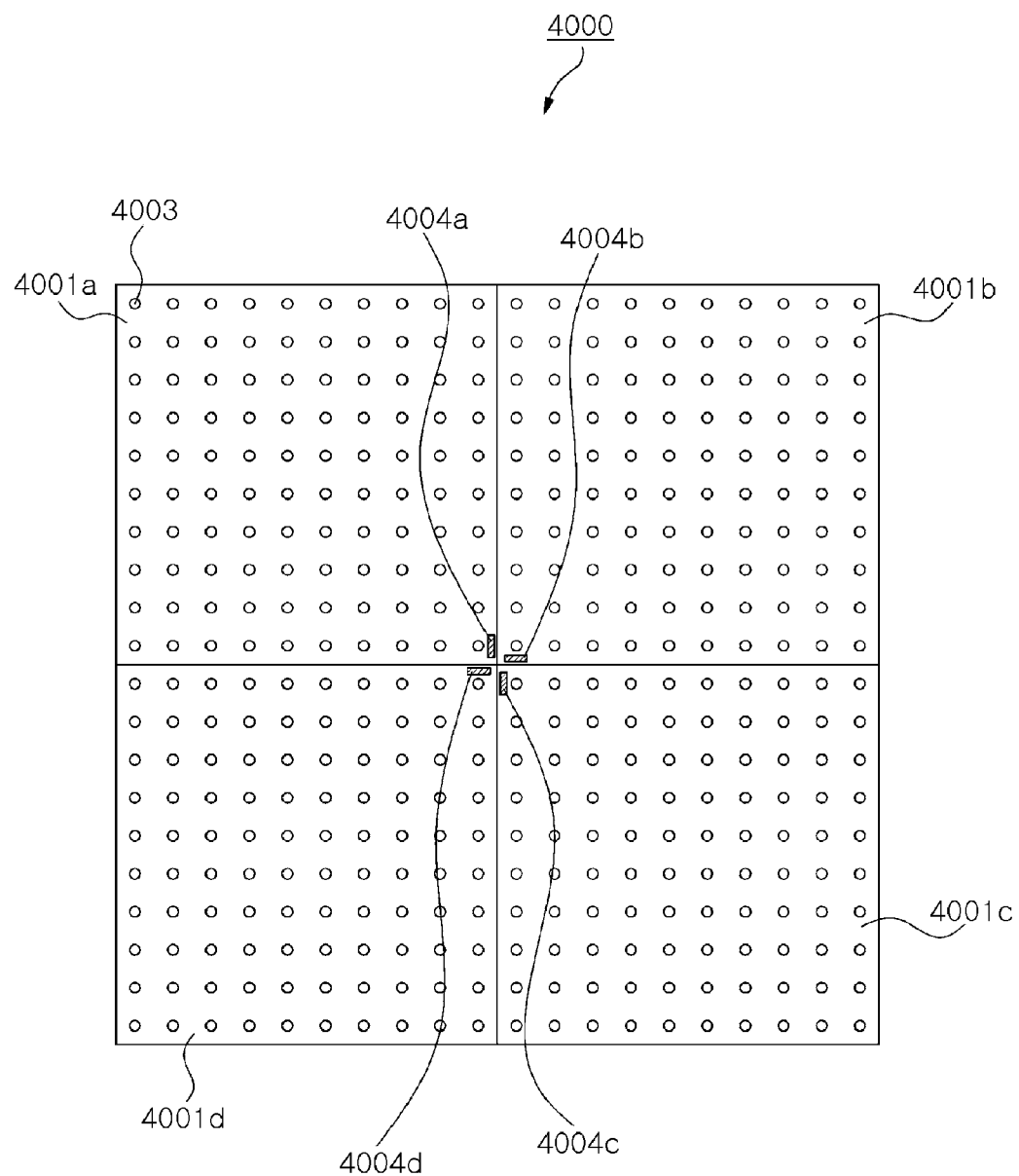
FIG. 162 is a schematic plan view illustrating the arrangement structure of a light emitting modules in a surface light source according to an embodiment of the present invention.
Figure 163:
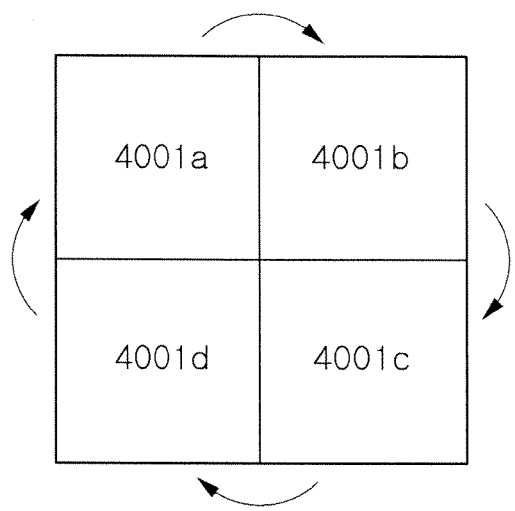
FIGS. 163(A) and 163(B) illustrate a rotation arrangement method of the light emitting modules of FIG. 162.
Figure 163:
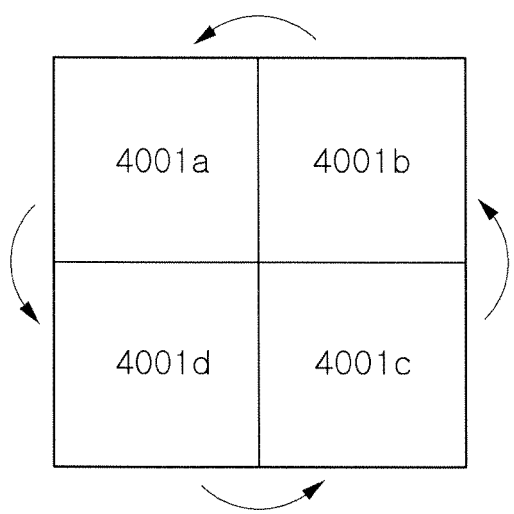

FIG. 162 is a schematic plan view illustrating the arrangement structure of light emitting modules in a surface light source according to an embodiment of the present invention. FIG. 163 illustrates rotation arrangement method of the light emitting modules of FIG. 162.

Referring to FIG. 162, the surface light source 4000 includes first to fourth light emitting modules 4001a to 4001d. The first to fourth light emitting modules 4001a to 4001d include a plurality of light emitting devices 4003 and a plurality of connectors 4004a to 4004d, respectively. The plurality of light emitting devices 4003 are arranged two-dimensionally in rows and columns to form an emission region. Specifically, when the white light emitting device is used, the surface light source 1900 may be used in a backlight unit, an illumination device, etc. The first to fourth light emitting modules 4001a to 4001d may have a square-shaped structure and have the same shape, and include the plurality of light emitting devices 4003 and the connectors 4004a to 4004d arranged on an insulation substrate.

The connector 4004a included in the first light emitting module 4001 is disposed adjacent to one vertex of the first light emitting module 4001a. In this case, the vertex of the first light emitting module 4001a corresponds to the center point of the triangle formed by the first to fourth light emitting modules of FIG. 162, i.e., the center point of the entire surface light source 4000. The term "adjacent" may be understood to mean that the connector 4004a is disposed closest to a specific vertex among four vertexes of the first light emitting module 4001a. As will be described later, the specific vertex is the rotation center point of the light emitting module.

The second to fourth light emitting modules 4001b to 4001d are provided in such a structure that the first light emitting module 4001a is sequentially rotated around the rotation center point at 90 degrees. That is, the plurality of light emitting devices 4003 and the connector 4004b included in the second light emitting module 4001b are provided in such a structure that the plurality of light emitting devices 4003 and the connector 4004a included in the first light emitting module 4001a are rotated at 90 degrees in a clockwise direction. Likewise, the plurality of light emitting devices 4003 and the connector 4004c included in the third light emitting module 4001c are provided in such a structure that the plurality of light emitting devices 4003 and the connector 4004b included in the second light emitting module 4001b are rotated at 90 degrees in a clockwise direction. The fourth light emitting module 4001d may be arranged in the same manner. Such a rotation arrangement is illustrated in FIG. 163A. In this case, the rotation direction may be not the clockwise direction but the counterclockwise direction.

Referring to FIG. 162, the connectors 4004a to 4004d included in the first to fourth light emitting modules 4001a to 4001d are arranged adjacent to the center point, and their separation distance is very close. Accordingly, the line structure for electrical connection may be simplified. In addition, since the first to fourth light emitting modules 4001a to 4001d have the 90-degree rotation arrangement structure, the surface light source 4000 according to this embodiment of the present invention may be configured with only one kind of the light emitting module. When the rotation arrangement structure is not used, the first to fourth light emitting modules 4001a to 4001d must have different structures in order that the connectors 4004a to 4004d may be arranged adjacent to the center point. Unlike the first embodiment of the present invention, four kinds of light emitting modules are required. As such, in the case of the surface light source according to the first embodiment of the present invention, the distance between the connectors 4004a to 4004d becomes short and the electrical line structure is simplified. Thus, only one light emitting module is required. Consequently, the cost reduction effect may be obtained through the standardization and production improvement.

Figure 164:
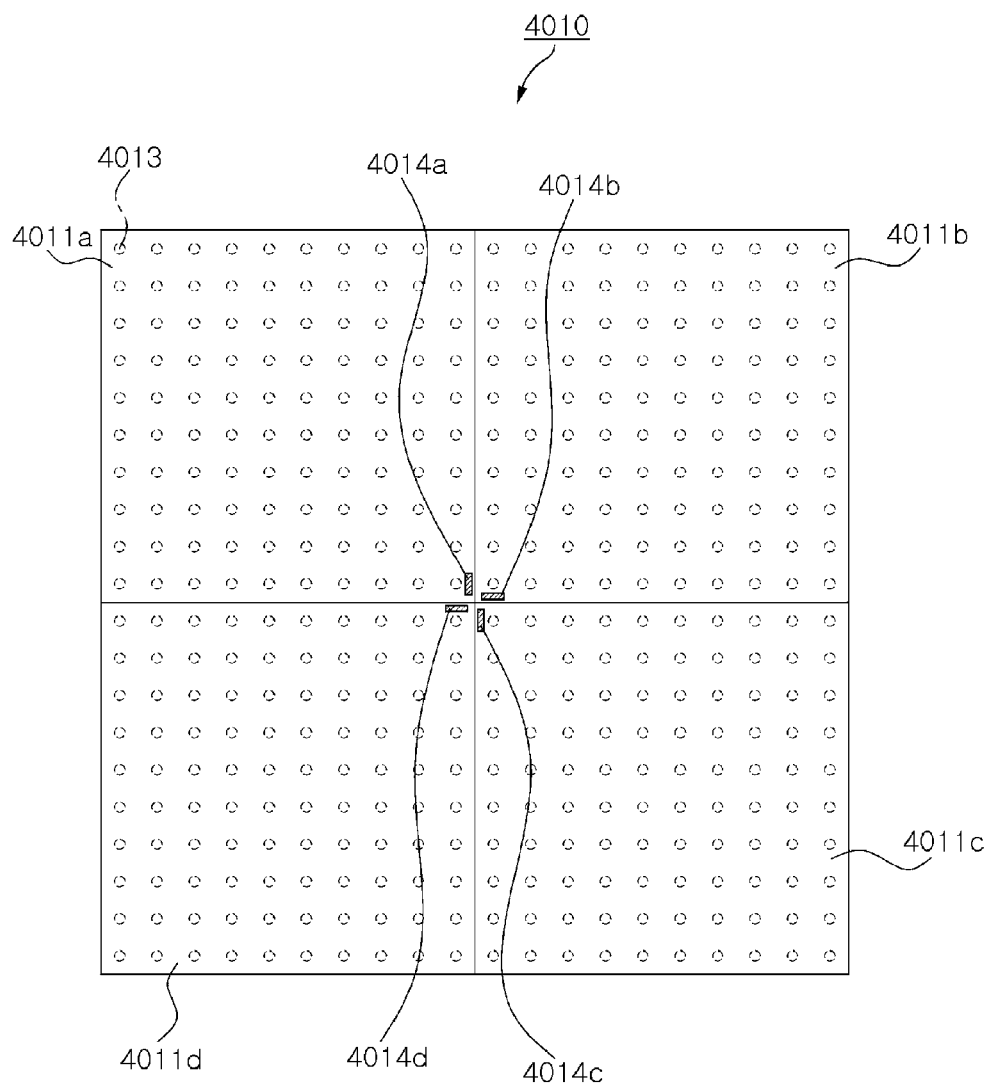
FIGS. 164 through 167 are schematic plan views illustrating the arrangement structures of light emitting modules in a surface light source according to various embodiments of the present invention.

FIG. 164 is a schematic plan view illustrating the arrangement structure of light emitting modules in a surface light source according to another embodiment of the present invention.

Referring to FIG. 164, the surface light source according to this embodiment of the present invention includes first to fourth light emitting modules 4011a to 4011d. The first to fourth light emitting modules 4011a to 4011d include a plurality of light emitting devices 4003 and a plurality of connectors 4004a to 4004d, respectively. Unlike the embodiment of FIG. 162, in the case of the surface light source according to the second embodiment of the present invention, the connectors 4014a to 4014d are formed in regions separate from the light emitting devices 4013. That is, FIG. 164 is a view of the surface light source 4010 when seen in a direction in which the connectors 4014a to 4014d are arranged. In the first to fourth light emitting modules 4011a to 4011d, the connectors 4014a to 4014d may be formed in regions opposite to the light emitting devices 4013. Accordingly, the light emitting devices 4013 may be arranged without limitation on the connectors 4014a to 4014d.

Figure 165:
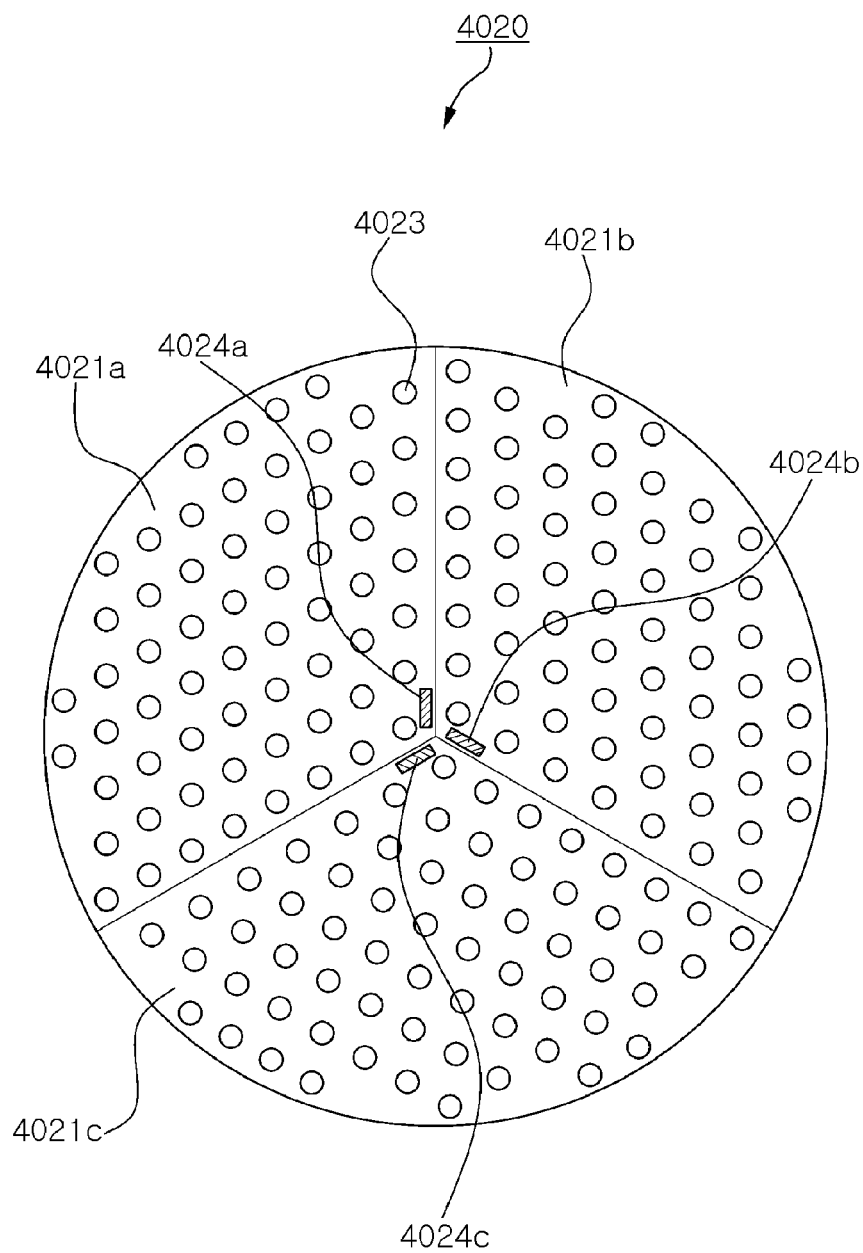

FIG. 165 is a schematic plan view illustrating the arrangement structure of light emitting modules in a surface light source according to another embodiment of the present invention.

Referring to FIG. 165, the surface light source 4020 according to this embodiment of the present invention includes first to third light emitting modules 4021a to 4021c. The shape of the outer boundary lines of the first to third light emitting modules 4021a to 4021c is circular. A light emitting region is circular. Like the embodiment of FIG. 162, the first to third light emitting modules 4021a to 4021c have the same shape. Specifically, the first to third light emitting modules 4021a to 4021c have a fan shape in which their sharing vertex, i.e., the angle formed with the rotation center point, is 120 degrees (=360 degrees/3). A plurality of light emitting devices 4023 included in the first light emitting module 4021a are arranged two-dimensionally in first and second directions. The angle between the first direction and the second direction is 120 degrees. In this case, the first direction refers to a direction of the boundary line between the first light emitting module 4021a and the second light emitting module 4021b, and the second direction refers to a direction of the boundary line between the first light emitting module 4021a and the third light emitting module 4021c.

The plurality of light emitting devices 4023 and the connector 4024b included in the second light emitting module 4021b are provided in such a structure that the plurality of light emitting devices 4023 and the connector 4024a included in the first light emitting module 4021a are rotated by 120 degrees in a clockwise direction. Likewise, the plurality of light emitting devices 4023 and the connector 4024c included in the third light emitting module 4021c are provided in such a structure that the plurality of light emitting devices 4023 and the connector 4024b included in the second light emitting module 4021b are rotated at 120 degrees in a clockwise direction. Although the circular surface light source 4020 divided into three parts has been described in this embodiment of the present invention, the shape of the surface light source may be a regular n polygon (where n is a natural number equal to or greater than 3), e.g., a regular triangle, a regular pentagon, etc. In this case, n light emitting modules may be arranged at a rotation angle of 360 degrees/n.

Figure 166:
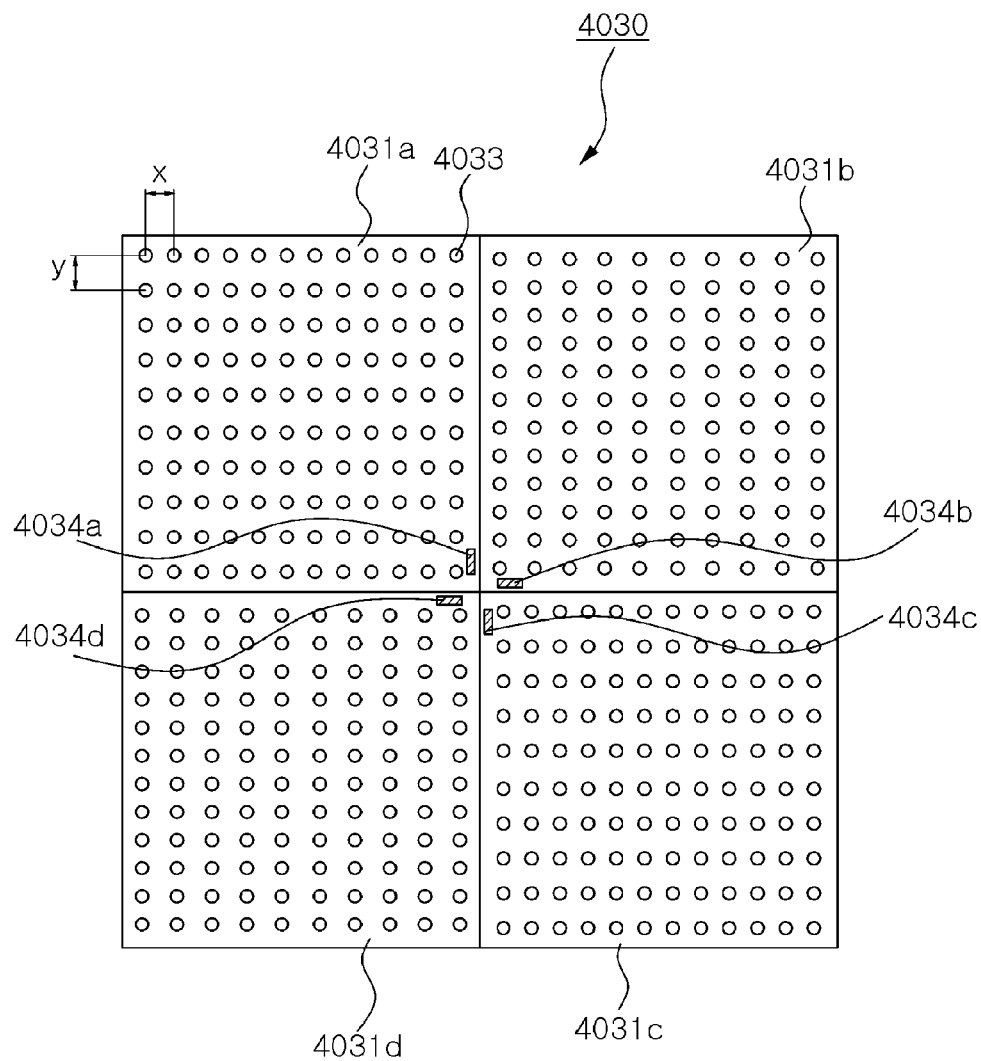

FIG. 166 is a schematic plan view illustrating the arrangement structure of light emitting modules in a surface light source according to another embodiment of the present invention.

Referring to FIG. 166, the surface light source 4030 according to this embodiment of the present invention has a structure similar to the surface light source 4000 of FIG. 162. The surface light source 4030 includes first to fourth light emitting modules 4031a to 4031d. The first to fourth light emitting modules 4031a to 4031 include a plurality of light emitting devices 4033 and a plurality of connectors 4034a to 4034d, respectively. The second to fourth light emitting modules 4031b to 4031d may be arranged in such a structure that the first light emitting module 4031a is sequentially rotated at 90 degrees.

In this embodiment, the plurality of light emitting devices 4033 included in the first light emitting module 4031a are arranged in rows and columns, i.e., in x-axis and y-axis directions. An x-axis direction pitch x is different from a y-axis direction pitch y. In this embodiment, the y-axis direction pitch y is greater than the x-axis direction pitch x corresponding to a value which may be generally adopted. Accordingly, the total number of the light emitting devices 4033 used herein may be reduced. Specifically, the x-axis direction pitch x is approximately 26-27 mm, and the y-axis direction pitch y is approximately 29-37 mm. Although the y-axis direction pitch y is greater than the x-axis direction pitch x in this embodiment, the x-axis direction pitch x may be greater than the y-axis direction pitch y according to embodiments of the present invention. That is, the x-axis direction pitch x and the y-axis direction pitch y may have any values only if they are different from each other. Meanwhile, the pitch used herein corresponds to the distance between the center points of the adjacent light emitting devices 4033 spaced apart in a certain direction.

The arrangement structure of the light emitting devices having the different x-axis and y-axis direction pitches may minimize the non-uniform brightness as the y-axis direction pitch y increases. Although the y-axis direction pitch y is greater than the x-axis direction pitch x in the first light emitting module 4031a, the second light emitting module 4031b is opposite to the first light emitting module 4031a. Also, the third light emitting module 4031c is opposite to the second light emitting module 4031b. Furthermore, the fourth light emitting module 4031d formed by rotating the third light emitting module 4031c at 90 degrees in a clockwise direction has the same pitch structure as that of the second light emitting module 4031b. Since the light emitting module has the arrangement structure opposite to the adjacent light emitting module, it is possible to minimize the non-uniform brightness caused by the different x-axis and y-axis direction pitches. Consequently, the surface light source 4030 may reduce the number of the light emitting devices 4033 while maintaining the uniformity of the brightness distribution.

In this case, the reduction of brightness caused by the reduction in the number of the light emitting devices 4033 may be solved by increasing an applied current. In this way, if the arrangement of the first light emitting module 4031a and the area occupied by the first light emitting module 4031a in the entire light emitting area are determined, the arrangement of the other light emitting modules may be determined by rotating the first light emitting module 4031a in a clockwise or counterclockwise direction. The brightness uniformity and the reduction in the number of the light emitting devices may be achieved, without regard to the rotation direction.

Figure 167:
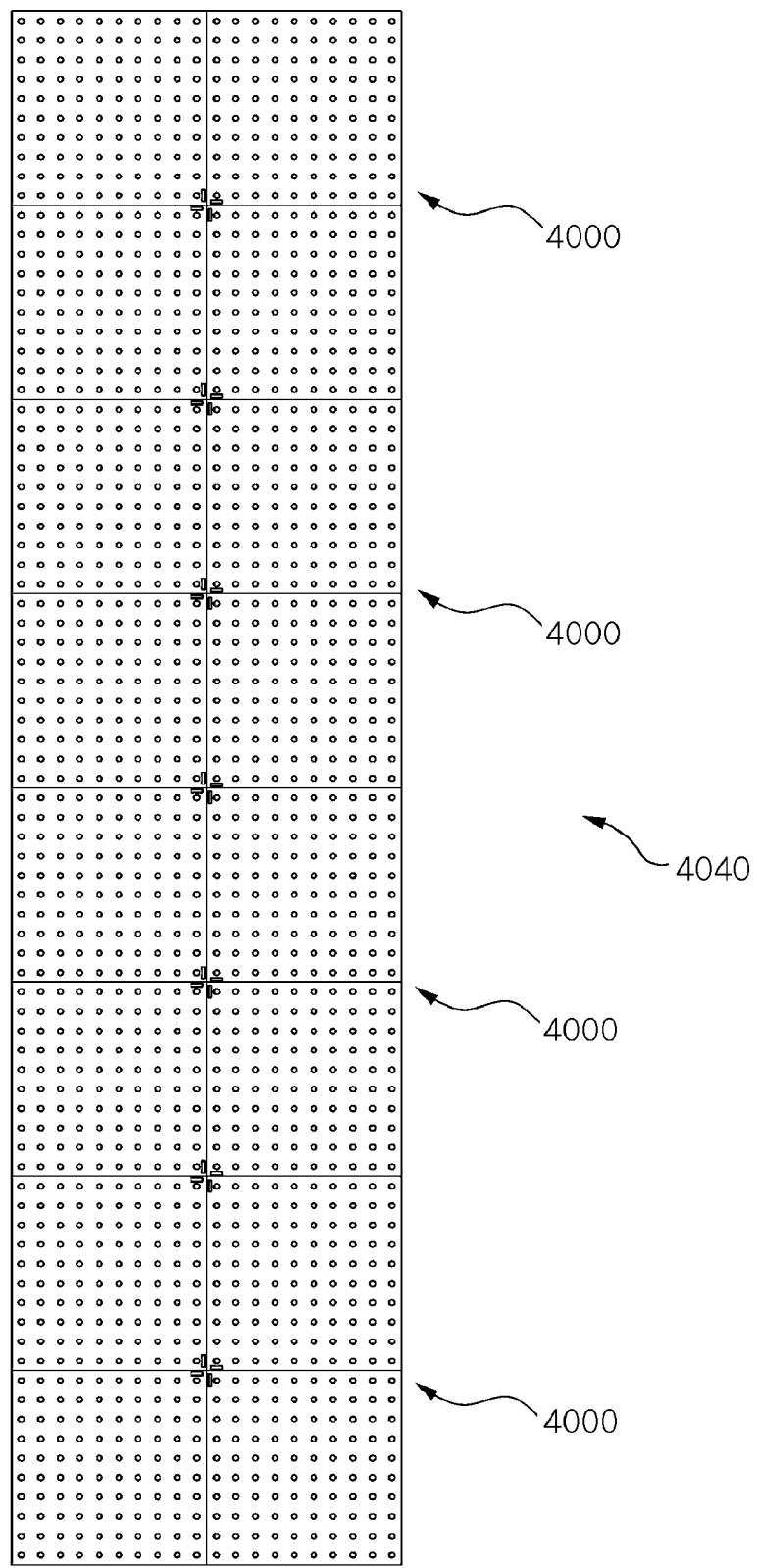

Although the case in which the whole shape of the surface light sources is square and circular has been described in the foregoing embodiments, the present invention may also be applied to rectangular surface light sources, as illustrated in FIG. 167.

FIG. 167 is a plan view of a surface light source according to another embodiment of the present invention. In this embodiment, the surface light source 4040 has a rectangular shape. The surface light source 4040 may be provided by attaching four surface light sources 4000 of FIG. 162 in series. The surface light source according to this embodiment of the present invention may be applied to surface light sources having a size of 300×1,200, 600×1,200, etc., as well as 300×300 and 600×600. Furthermore, the surface light source having the above-described structure may also be used in a backlight unit which irradiates light onto a rear surface of an LCD panel.

The surface light sources according to the above-described embodiments adopt the light emitting device packages according to the various embodiments of the present invention. The respective light emitting device packages include a wavelength conversion part which includes at least a red phosphor which absorbs the light emitted from the light emitting device, and emits light having a peak emission wavelength of approximately 600-700 nm. For example, the red phosphor includes an inorganic compound or at least one of a silicate-based phosphor, a garnet-based phosphor, a sulfide-based phosphor, a nitride-based phosphor, and a QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$.

Figure 168:
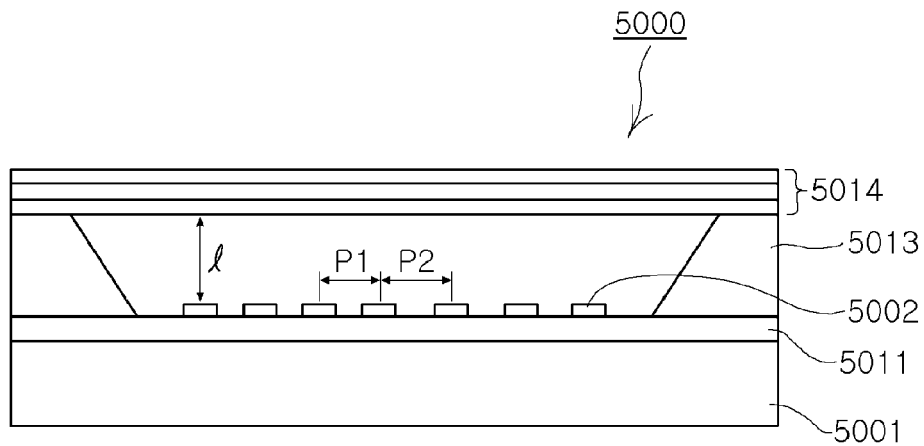
FIG. 168 is a cross-sectional view of a backlight unit used in surface light sources according to various embodiments of the present invention.

FIG. 168 is a cross-sectional view of a backlight unit adopting one of the above-described surface light sources according to the various embodiments of the present invention.

Referring to FIG. 168, the backlight unit 5000 according to this embodiment of the present invention may include the above-described surface light sources according to the various embodiments of the present invention. One of the embodiments will be taken as an example. The surface light source 5000 includes a plurality of light emitting devices 5002 arranged on a substrate 5001. The light emitting devices 5002 are arranged at different pitches P1 and P2. Although not shown in detail, the light emitting region of the surface light source 5000 is divided by n, and first to n-th light emitting modules are formed in the divided regions. The second to n-th light emitting modules are formed by sequentially rotating the first light emitting module at 360 degrees/n in a clockwise or counterclockwise direction. Although not shown, a connector supplying a voltage to the plurality of light emitting devices 5002 is arranged adjacent to the rotation center of the first to n-th light emitting modules.

An optical sheet 5014 is disposed on the top surface of the surface light source. The optical sheet 5014 includes a diffusion sheet or a diffusion plate for uniformly diffusing incident light, and a light condensing sheet disposed on the diffusion sheet or the diffusion plate to condense incident light in a vertical direction. The optical sheet 5014 may further include a protection sheet disposed on the light condensing sheet to protect a lower optical structure. A sidewall 5013 is formed at an edge of the top surface of the substrate 5001 to surround the light emitting devices 5002. The sidewall 5002 has an inclined surface in a direction in which the light emitting devices 5002 are arranged. In addition, a reflective layer 5011 may be provided on the top surface of the substrate 5001 to reflect light emitted from the light emitting devices 5002 in an upward direction. Meanwhile, the arrangement intervals of the light emitting devices 5002, i.e., the pitches P1 and P2, may be less than an optical distance l. If this condition is not met, the brightness uniformity of the surface light source may be degraded, and hot spots may appear. The optical distance l may be understood as a distance from the emission surface of the light emitting device 5002 to the optical sheet 5014, i.e., a distance through which light travels in a vertical direction.

Figure 169:
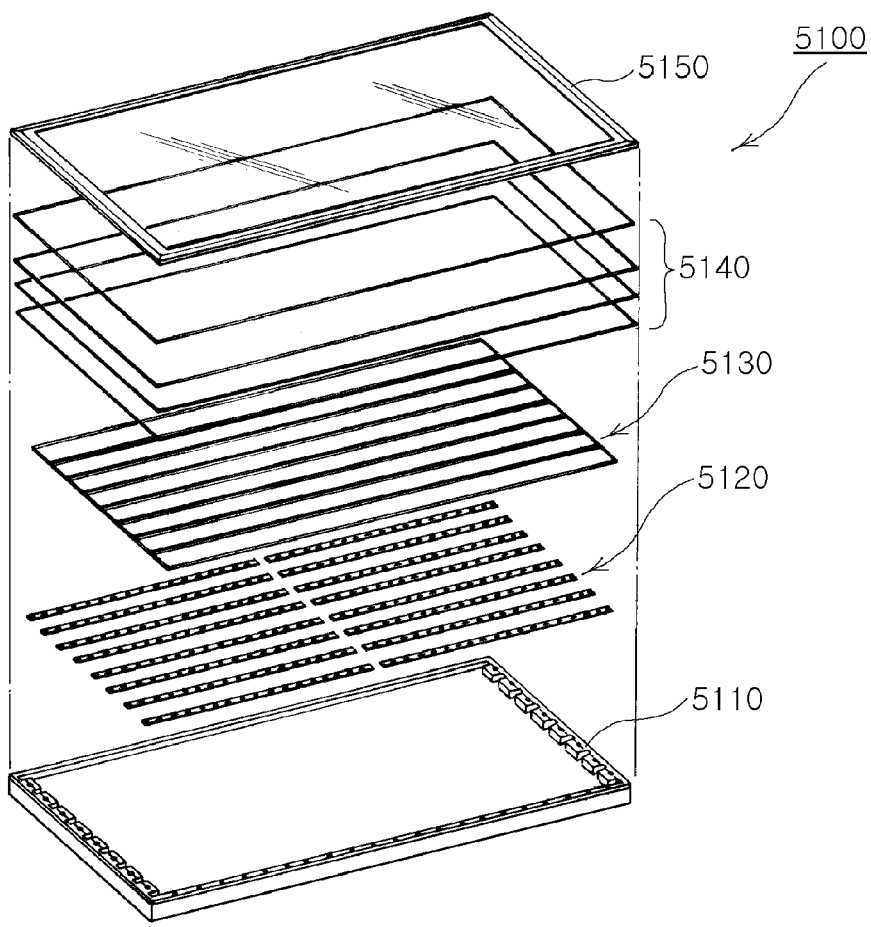
FIG. 169 is a perspective view of a surface light source according to another embodiment of the present invention.

FIG. 169 is a perspective view of a surface light source according to another embodiment of the present invention. Referring to FIG. 169, the surface light source 5100 includes a lower frame 5110, a light emitting device package 5120, a light guide plate 5130, and an optical sheet 5140. The surface light source 5100 may be used in an LCD device, together with an LCD panel which displays an image by controlling the transmittance of light. The optical sheet 5140 may be mounted on the light guide plate 5130 to protect a diffusion plate, a diffusion sheet, a prism sheet, and a protection sheet.

The light guide plate 5130 is divided into a plurality of light guide plates. The plurality of light guide plates are disposed in parallel in a receiving space of the lower frame 5110, and the light emitting device package 5120 is disposed on a side surface of the light guide plate 5130. The plurality of light guide plates 5130 may be arranged separately, and may be arranged to be integrally connected together.

The light emitting device package 5130 includes a wavelength conversion part where a red phosphor, a blue phosphor, a green phosphor, and a yellow phosphor are appropriately mixed with a resin material. The red phosphor includes an inorganic compound or at least one of a silicate-based phosphor, a garnet-based phosphor, a sulfide-based phosphor, a nitride-based phosphor, and a QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$. Although not shown, a reflection plate may be further provided under the light guide plate 5130. The surface light source may be mounted on and fixed to the inner space of the lower frame 5110.

Figure 170:
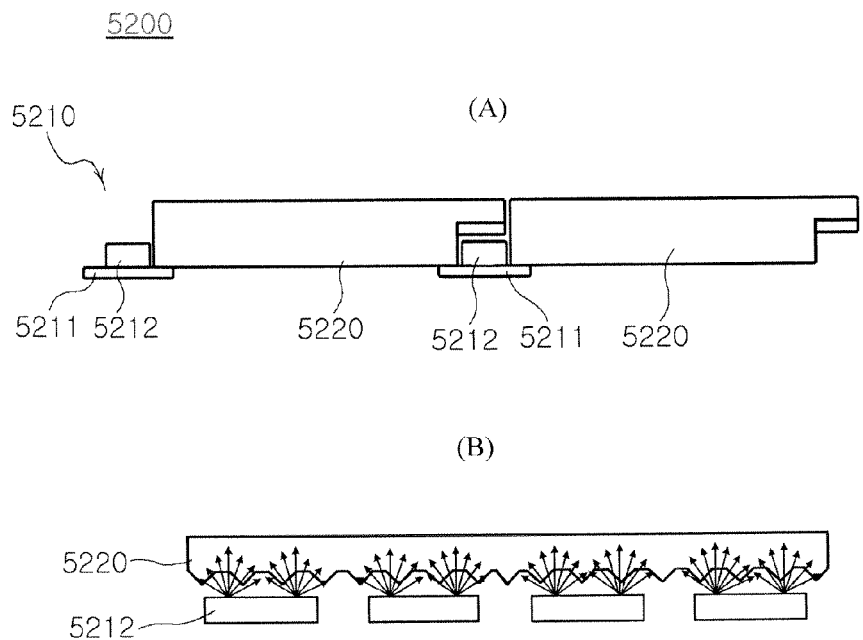
FIGS. 170(A), 170(B) and 171 are schematic views of a surface light source and a plate-type light guide plate according to another embodiment of the present invention.

FIG. 170 is a schematic view a backlight unit, i.e., a surface light source having a plate-type light guide plate according to another embodiment of the present invention.

Referring to FIG. 170, the backlight unit 5200 having the plate-type light guide plate according to this embodiment of the present invention is a tandem-type surface light source, and includes n LED light source modules 5210, and n plate-type light guide plates 5220.

Each of the n LED light source modules 5210 includes a plurality of light emitting device packages 5212 arranged on a substrate 5211 in a row. The n LED light source modules are arranged in parallel. The plate-type light guide plates 5220 are arranged on the sides of the n LED light source modules 5210.

In addition, the backlight unit having the plate-type light guide plates 5220 may include a reflection member (not shown) which is disposed under the LED light source modules 5210 and the plate-type light guide plates 5220 to reflect light emitted from the LED light source modules 5210.

Furthermore, the backlight unit may include a diffusion sheet or an optical sheet (not shown) on the top surface of the plate-type light guide plates 5220. The diffusion sheet diffuses light, which is reflected at the reflection member, refracted at the plate-type light guide plates, and emitted toward the LCD panel, in several directions. The optical sheet (not shown) such as a prism sheet functions to collect light, which has passed through the diffusion sheet, within a front viewing angle.

Specifically, the LED light source module 5210 may be provided with a plurality of light emitting device packages 5212 mounted in a top view method. The plate-type light guide plates 5220 are arranged in a direction in which light is emitted from the LED light source, and may be formed of a transparent material through which light may be transmitted.

Compared with an edge-type light guide plate, the plate-type light guide plate has a simple shape and its mass-production is easy. Also, it is easy to align the position of the light guide plate on the LED light source.

The plate-type light guide plate 5220 includes a light incidence part 5221, a light emission part 5224, and a front end part 5222. Light emitted from the LED light source 5210 is incident on the light incidence part 5221. The light emission part 5224 is formed in a flat panel having a uniform thickness and has a light emission surface through which light incident from the LED light source is emitted to the LCD panel as illumination light. The front end part 5222 protrudes at an opposite side of the light emission part 5224 with respect to the light incidence part 5221 and is thinner than the light incidence part 5221. The front end part 5222 of the plate-type light guide plate 5220 is disposed to cover the LED light source 5210. That is, (n+1)-th LED light source 5210 is disposed under the front end part 5222 of the n-th plate-type light guide plate 5220. The front end part 5222 of the plate-type light guide plate 5220 has a prism-shaped bottom surface 5223.

As illustrated in FIG. 170B, the light emitted from the LED package 5212 is not directly emitted to the light guide plate 5220, but is scattered and dispersed by the prism-shaped bottom surface 5223 of the front end part 5222 of the plate-type light guide plate 5220. Due to such a structure, it is possible to remove hot spots occurring in the light guide plate on the LED light source 5210.

Figure 171:
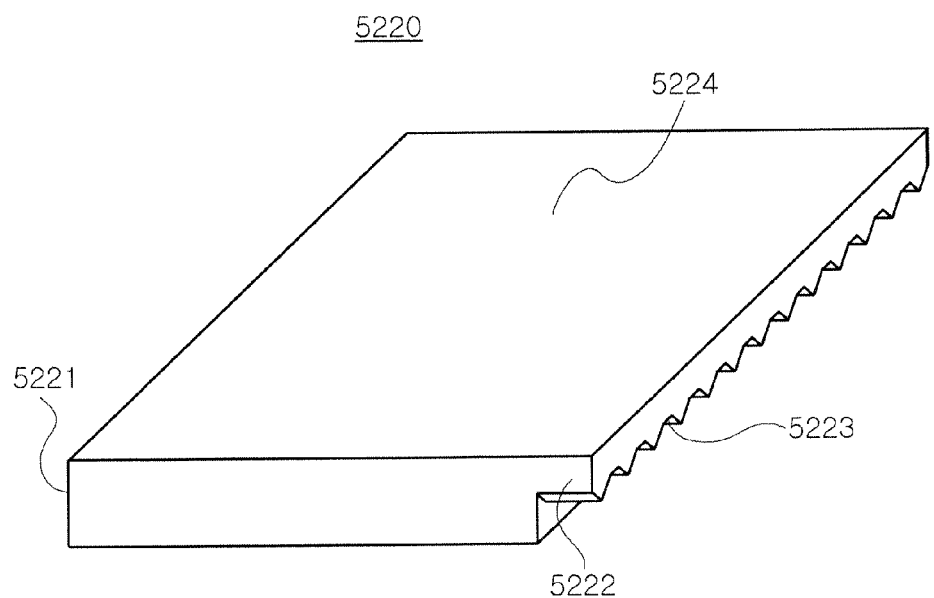

FIG. 171 is a schematic perspective view explaining the plate-type light guide plate 5220 of FIG. 170. Referring to FIG. 171, the plate-type light guide plate 5220 includes a light incidence part 5221, a light emission part 5224, and a front end part 5222. Light emitted from the LED light source 5210 including a plurality of LED packages 5212 is incident on the light incidence part 5221. The light emission part 5224 is formed as a flat panel having a uniform thickness and has a light emission surface through which light incident from the LED light source is emitted to the LCD panel (not shown) as illumination light. The front end part 5222 is formed at an opposite side of the light emission part 5224 with respect to the light incidence part 5221. The cross-section of the front end part 5222 has a smaller thickness than the light incidence cross-section of the light incidence part 5221.

The front end part 5222 has a prism shape 5223 for dispersing a part of light emitted from the LED packages 5212 which are arranged thereunder. The prism shape 5223 of the front end part 5222 may be at least one of a triangular prism, a conical prism, and a hemispherical prism which is capable of dispersing and scattering incident light.

Furthermore, the prism shape of the front end part 5222 may be formed over the front end part 5222, or may be partially formed only on the top surface of the LED package 5212. Such a prism shape makes it possible to remove hot spots occurring in the light guide plate 5220 on the LED package 5212.

Therefore, in the plate-type light guide plate 5220, by processing the prism shape 5223 on the bottom surface of the front end part 5222, it is unnecessary to separately process the diffusion sheet and the prism sheet between the LED package and the light guide plate in order to disperse hot spots occurring in the light guide plate 5220 on the LED package 5212 by a part of light emitted from the LED package 5212.

A backlight unit having a plate-type light guide plate according to another embodiment of the present invention will be described below with reference to FIGS. 172 through 178.

Figure 172:
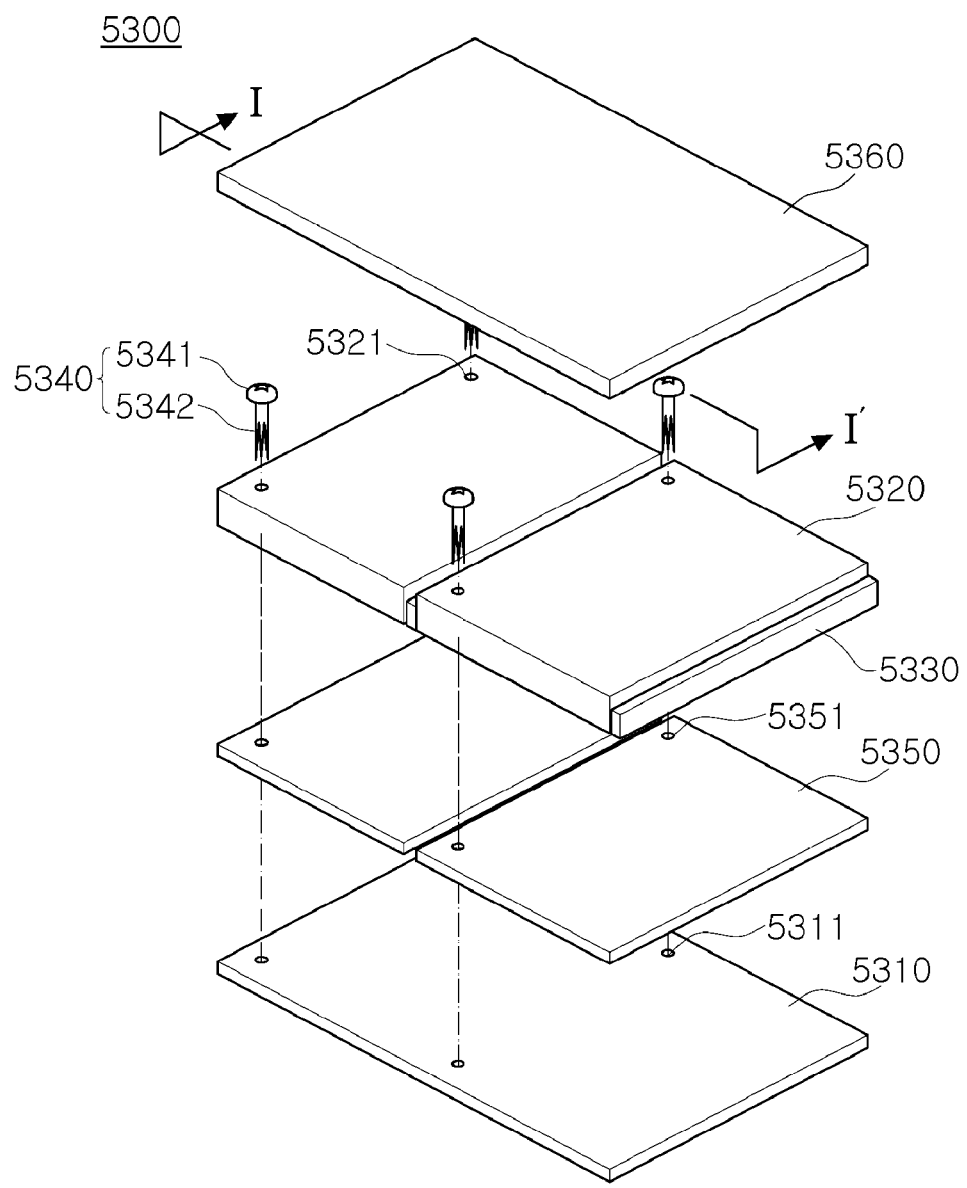
FIGS. 172 through 177 illustrate a backlight unit having a plate-type light guide plate according to another embodiment of the present invention.
Figure 173:
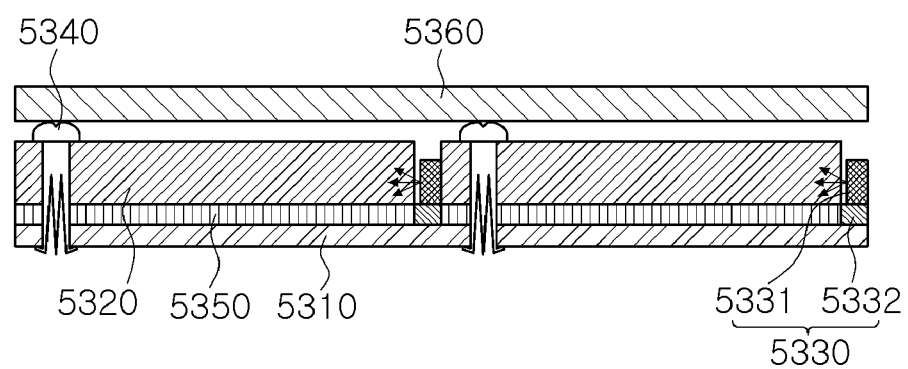

FIG. 172 is an exploded perspective view of the backlight unit according to another embodiment of the present invention, and FIG. 173 is a cross-sectional view taken along line I-I' after the mounting of the backlight unit of FIG. 172. Although the backlight unit may include a plurality of light guide plates, only two light guide plates are illustrated for convenience.

Referring to FIGS. 172 and 173, the backlight unit 5300 includes a bottom cover 5310, a light guide plate 5320, a light source 5330, and a fixing part 5340.

The bottom cover 5310 has a receiving space. For example, the receiving space may be defined by a plate, which forms the bottom surface of the bottom cover 5310, and a sidewall bent at an edge of the plate.

The bottom cover 5310 may include a coupling opening or coupling part 5311 to which the fixing part 5340 is connected, as will be described later. The coupling opening or coupling part 5311 may be a through-hole through which the fixing part 5340 passes, or a groove into which the fixing part 5340 is inserted, as will be described later.

The light guide plate 5320 is divided into a plurality of parts. The plurality of light guide plates 5320 are arranged in parallel in a receiving space of the bottom cover 5310.

Each of the light guide plates 5320 has a through-hole 5321 passing through a body part. The through-holes 5321 are disposed at edges of the light guide plates 5320. However, the present invention is not limited to the depicted position and number of the through-holes 5321. The through-holes 5321 are disposed to correspond to the coupling part 5311.

Although the light guide plates 5320 having a rectangular shape are illustrated, the present invention is not limited thereto. For example, the light guide plates 5320 may have a triangular or hexagonal shape.

A plurality of light sources 5330 are disposed at one side of each light guide plate 5320 to provide light to each light guide plate 5320. Each light source 5330 may include a light source 5331, i.e., a light emitting device package, and a substrate 5332 having a plurality of circuit patterns for applying a driving voltage of the light emitting device package 5331.

For example, the light emitting device package 5331 may include sub light emitting devices which implement a blue color, a green color, and a red color. At this time, a blue light, a green light, and a red light emitted from the sub light emitting devices which implement the blue color, the green color, and the red color may be mixed to generate a white light. Alternatively, the light emitting device may include a blue light emitting device and a phosphor which converts a part of the blue light emitted from the blue light emitting device into a yellow light. At this time, the blue light and the yellow light are mixed to implement white light.

Since the light emitting device package and the phosphor has been described above, a further description thereof will be omitted.

The light generated by the light source 5330 is incident on the side surface of the light guide plate 5320 and emitted upward by the total internal reflection of the light guide plate 5320.

The fixing part 5340 fixes the light guide plate 5320 to the bottom cover 5310 in order to prevent the movement of the light guide plate 5320. The fixing part 5340 is inserted into the through-hole 5321 of the light guide plate 5320 and fixes the light guide plate 5320 to the bottom cover 5310. In addition, the fixing part 5340 may pass through the through-hole 5321 of the light guide plate 5320 and penetrate the coupling part 5311 of the light guide plate 5320, e.g., the through-hole part, or be inserted into the insertion groove.

The fixing part 5340 includes a body portion 5342, and a head portion 5341 which extends from the body portion 5342.

The body portion 5342 passes through the through-hole 5321 of the light guide plate 5320 and is coupled to the coupling part 5311. Specifically, the body portion 5342 couples the light guide plate 5320 to the bottom cover 5310, so that the light guide plate 5320 is fixed on the bottom cover 5310.

The head portion 5341 has a larger width than the body portion 5342 and thus prevents the fixing part 5340 from being completely released from the through-hole 5321 of the light guide plate 5320.

The head portion 5341 may have a variety of cross-sectional shapes, e.g., a semicircular shape, a semi-elliptical shape, a rectangular shape, a triangular shape, etc. When the head portion 5341 has a triangular cross-sectional shape, it is possible to minimize the contact between the fixing part 5340 and an optical member 5360, as will be described later. Thus, it is possible to minimize the occurrence of hot spots due to the fixing part 5340.

Since the light emitting plate 5320 and the optical member 5360 are spaced apart from each other by a constant interval, the light emitted from the light guide plate 5320 may be uniformly provided to the optical member 5360. Since the head portion 5341 supports the optical member 5360, it functions to maintain the interval between the light guide plate 5320 and the optical member 5360, as will be described later. The interval between the light guide plate 5320 and the optical member 5360 may be controlled by adjusting the height of the head portion 5341.

In order to minimize the influence on image quality, the fixing part 5340 may be formed of a translucent material, e.g., a transparent plastic.

In addition, a reflective member 5350 may be disposed under the light guide plates 5320. The reflective member 5350 reflects light emitted downward to the light guide plate 5320 and thus makes the light incident on the light guide plate 5320. Consequently, the luminous efficiency of the backlight unit is improved.

The reflective member 5350 may include a through-hole 5321 and a penetration part 5351 corresponding to the coupling part 5311. The fixing part 5340 may be coupled to the coupling part 5311 through the through-hole 5321 and the penetration part 5351. In this manner, when the reflective member 5350 is divided into a plurality of members, like the light guide plate 5320, the plurality of reflection members 5350 may be fixed on the bottom cover 5310 by the fixing part 5340.

In addition, the backlight unit may include the optical member 5360 disposed on the light guide plate 5320. Examples of the optical member 5360 may include a diffusion plate, a diffusion sheet, a prism sheet, and a protection sheet, which are disposed on the light guide plate 5340.

Accordingly, when the backlight unit is provided with the plurality of light guide plates, a local dimming effect caused by partial driving may be further improved.

Furthermore, defects caused by the movement of the light guide plates may be prevented by fixing the light guide plates to the bottom cover by using the fixing part.

Moreover, uniform light may be provided to the LCD panel because the interval between the light guide plate and the optical member is constantly maintained by the fixing part.

Figure 174:
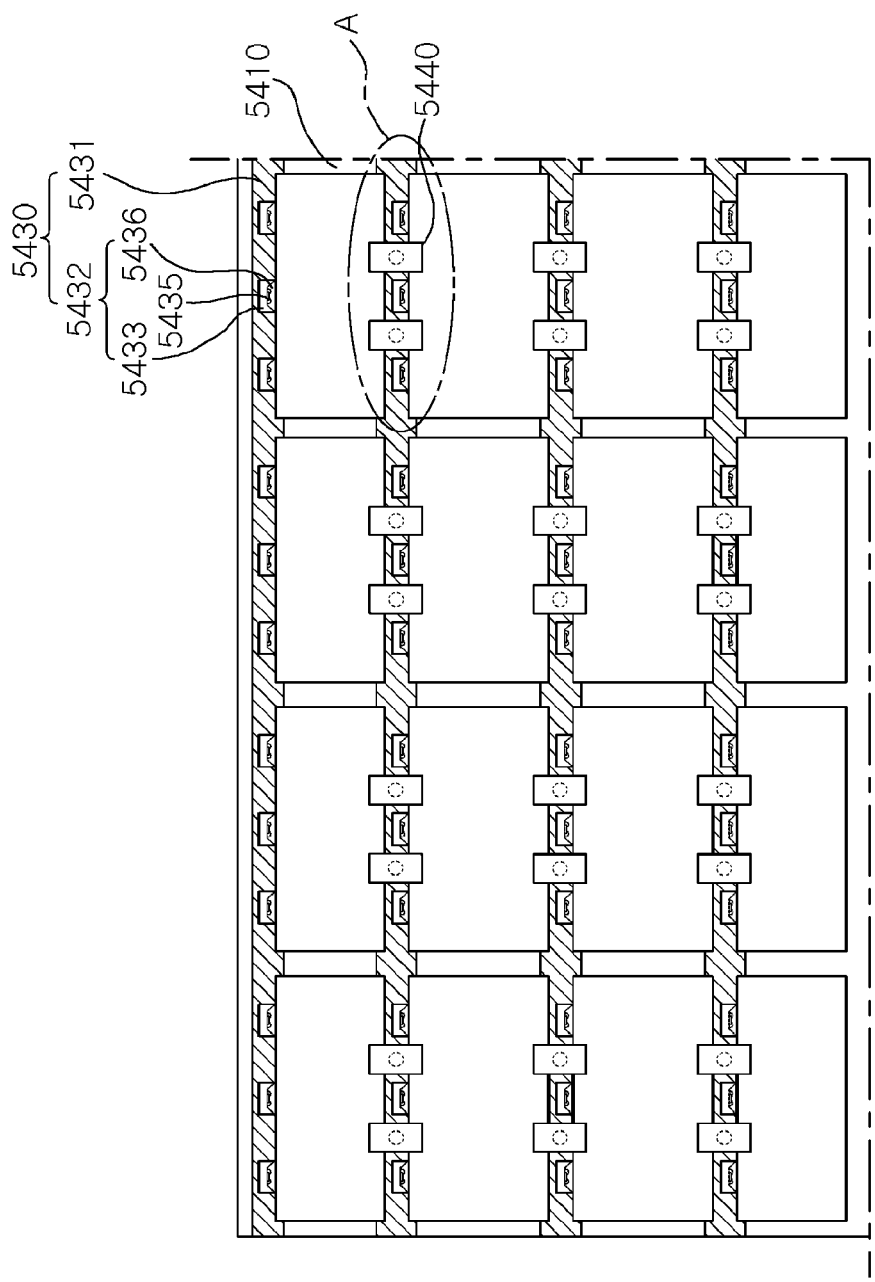
Figure 175:
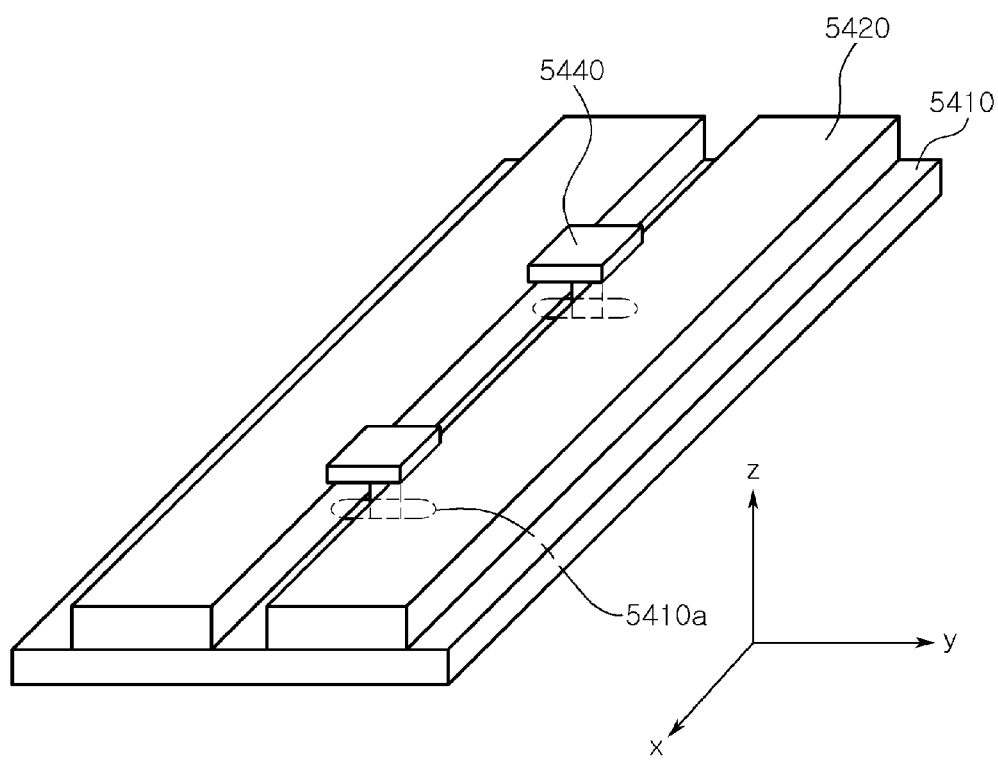
Figure 176:
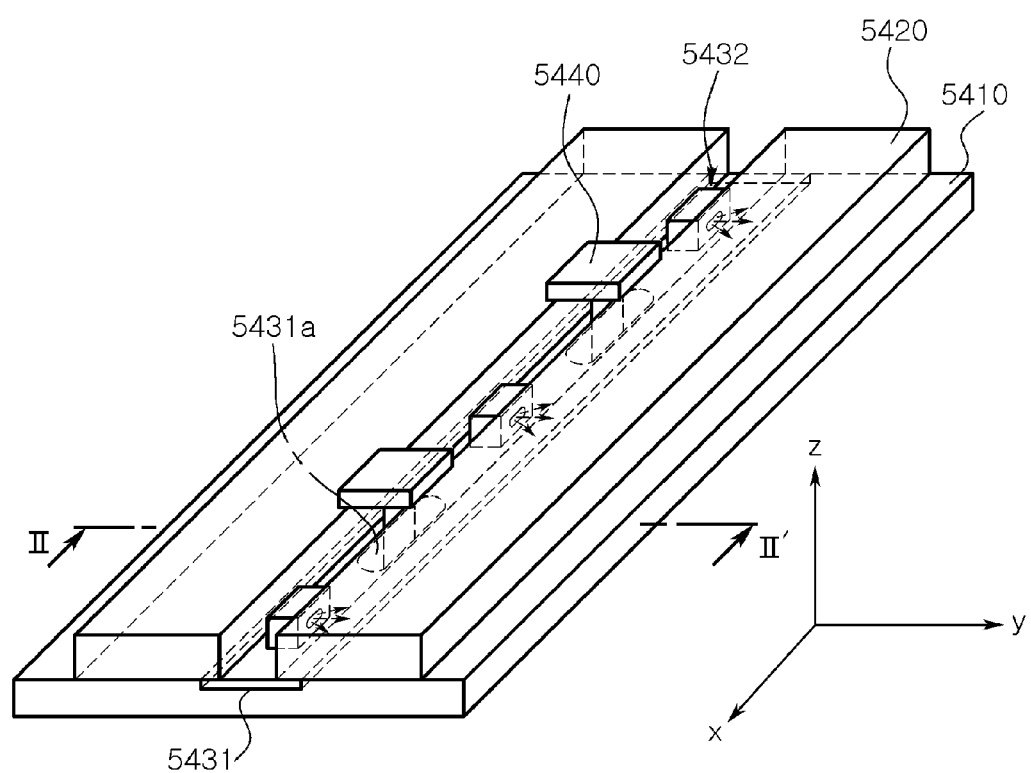
Figure 177:
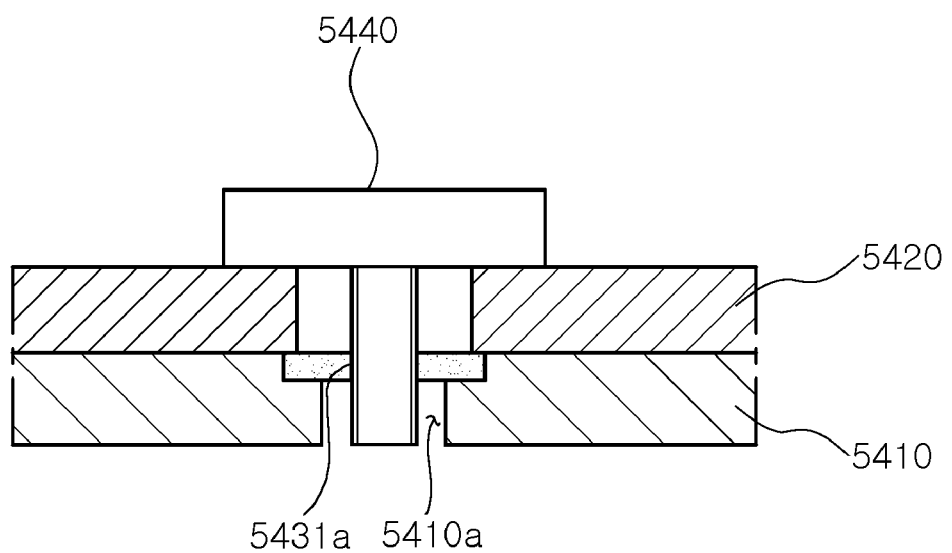

FIG. 174 is a plan view of an LED backlight unit according to another embodiment of the present invention. FIG. 175 is a perspective view illustrating a portion A of FIG. 174 before the coupling of a substrate, and FIG. 176 is a perspective view illustrating the portion A of FIG. 174 after the coupling of the substrate. FIG. 177 is a cross-sectional view taken along line II-II of FIG. 176.

Referring to FIGS. 174 through 177, the LED backlight unit according to this embodiment of the present invention includes a bottom cover 5410, a plurality of light guide plates 5420, a substrate 5431, a plurality of LED packages 5432, and a fixing part 5440. The bottom cover 5410 has a coupling opening or coupling part, e.g., a first through-hole 5410*a* or a groove. The plurality of light guide plates 5420 are arranged on the bottom cover 5410. The substrate 5431 is disposed horizontally on the bottom surface of the bottom cover 5410 at one side of the light guide plates 5420, and includes a line for applying an external voltage, and a second through-hole 5431*a* corresponding (or facing) the first through-hole 5410*a* of the bottom cover 5410. The plurality of LED packages 5432 for providing light are mounted on the substrate 5431 disposed at one side of each light guide plate 5420. The fixing part 5440 is coupled to the second through-hole 5431*a* of the substrate 5431 and/or the first through-hole 5410*a* of the bottom cover 5410, and presses edge portions of the adjacent light guide plates 5420.

The bottom cover 5410 has the first through-hole 5410*a* (or a concave coupling groove formed in the plate) passing through the plate forming a receiving space to constitute the bottom surface and having a circular, rectangular or elliptical shape. The bottom cover 5410 forms a lower frame using iron (Fe) or electrolytic galvanized iron (EGI). Furthermore, the bottom cover 5410 may have a side frame, i.e., a sidewall formed by extending the bottom surface vertically in an upward direction the edge portion of the plate constituting the bottom surface. At this time, the bottom surface of the lower frame may be divided into a plurality of regions formed in a row in order for the construction of the split-type backlight unit. The plurality of regions may be divided by the concave grooves formed in one side region. The concave grooves separating the plurality of regions corresponds to receiving grooves of the substrate 5431, as will be described later.

The first through-hole 5410*a* on the bottom cover 5410 may have various shapes, in addition to the circular shape, for example, an elliptical shape or a rectangular shape. However, in this embodiment, the first through-hole 5410*a* may be a through-hole having a major direction with, more specifically, a through-hole having two parallel major sides and two minor sides formed to be connected together at both ends of the two major sides with a predetermined curvature. The first through-hole 5410*a* may be formed on the bottom cover 5410 such that the major-axis direction (Y-axis) of the first through-hole 5410 is the same as the light traveling direction. The coupling groove also has the same structural characteristic as above.

In the case of forming a concave receiving groove at which the entire bottom surface of the bottom cover 5410, or the substrate 5431, is received, a reflective plate (not shown) is attached on the plurality of bottom surfaces, except for the concave groove. The reflective plate is formed of a white polyester film or a film coated with a metal (Ag or Al). The reflectivity of the visible light on the reflective plate is approximately 90-97%, and reflectivity increases when the coated film is thicker.

In this case, a plurality of reflective plates on the bottom surface of the bottom cover 5410 may extend such that they are located between the LED package 5432 and the light guide plate 6120 disposed adjacent to each other on the rear surface of the LED package 5432. In this case, light provided and guided from one side of the light guide plate 5420 is again reflected by the reflective plate, without interference of the LED package 5432 disposed on the other side of the light guide plate 5420, and then provided in a direction of an optical member (not shown) disposed at an upper portion. Hence, the light reflection efficiency is improved.

An LED light source 5430 is provided at the concave receiving groove of the bottom cover 5410 or one side of the light guide plate 5420. The LED light source 5430 includes a substrate 5431 (i.e., PCB) and an LED package 5432. The substrate 5431 is disposed horizontally on the bottom surface of the bottom cover 5410 at the concave receiving groove, and includes a line for applying an external voltage, and a second through-hole 5431a corresponding the first through-hole 5410a of the bottom cover 5410. The LED package 5432 is mounted on the substrate 5431.

The substrate 5431 has a second through-hole 5431a between the LED packages 5432. The substrate 5431 having the second through-hole 5431a is provided on the bottom surface of the lower cover 5410 to correspond to (face) the first through-hole 5410a of the lower cover 5410. The second through-hole 5431a formed on the substrate 5431 may be circular or elliptical, like the first through-hole 5410a of the bottom cover 5410. However, in this embodiment, the second through-hole 5431a may be a through-hole having a major direction with, more specifically, a through-hole having two parallel major sides and two minor sides formed to be connected together at both ends of the two major sides with a predetermined curvature. Since the major axis direction (X axis) of the second through-hole 5431a is perpendicular to the light traveling direction, the second through-hole 5431a of the substrate 5431 is intersected with the major axis direction (Y axis) of the first through-hole 5410a of the bottom cover 5410.

The size of the second through-hole 5431a formed on the substrate 5431, more specifically, the interval (or distance) between the two major sides, is related to the diameter of the body of the fixing part 5440 with threads. This is because the size of the second through-hole 5431a may affect the interval between the LED package 5432 and the light guide plate 5420 which guides the light provided from the LED package 5432. A detailed description regarding this will be made later.

The LED package 5432 includes a package main body 5433, a light emitting device 5435, and a pair of first and second electrode structures (not shown). The package main body 5433 is fixed to the substrate 5431 to form an external frame, and has a receiving groove. The light emitting device 5435 is mounted on the receiving groove of the package main body 5433 to provide light. A pair of first and second electrode structures (not shown) are exposed to the receiving groove, so that the light emitting device 5435 is mounted thereon, and is electrically connected to the line on the substrate 5431.

When the light emitting device is a blue light emitting device, the LED package 5432 may further include a resin encapsulation part 5436 formed in the receiving groove in order to provide a white light. In this case, the resin encapsulation part 5436 may include a yellow phosphor. For example, the resin encapsulation part 5436 may be formed by injecting a gel-type epoxy resin containing a YAG-based yellow phosphor, or a gel-type silicon resin containing a YAG-based yellow phosphor into the receiving groove of the package main body 5433, and performing ultraviolet curing or thermal curing thereupon.

It is apparent that the present invention is not limited to the LED package 5432 including the blue light emitting device and the yellow light emitting device. For example, the LED package 5432 may include a near ultraviolet chip, and a resin encapsulation part in which a red phosphor, a green phosphor, and a blue phosphor provided on the near ultraviolet chip are mixed, or a resin encapsulation part in which a red phosphor, a green phosphor, and a blue phosphor are sequentially stacked. Also, the LED package 5342 may be a white LED package which includes an inorganic compound or at least one of a silicate-based phosphor, a garnet-based phosphor, a sulfide-based phosphor, a nitride-based phosphor, and a QD phosphor, wherein the inorganic compound is expressed as the composition of $(Sr, M)_2SiO_{4-x}N_y$:Eu synthesized in the above-described embodiments 1 through 11.

A plurality of light guide plates 5420 are provided on the bottom surface of the bottom cover 5410 divided into a plurality of regions. The side of the light guide plate 5420 may be closely attached to the package main body 5433 in order to provide the light emitted from the light emitting device 5435, which is mounted within the receiving groove of the package main body 5433, to the light guide plate 5420 without loss.

The light guide plate 5420 is formed of PMMA. Since PMMA among polymer materials has the least light absorption characteristics in a visible light area, it has excellent transparency and gloss. PMMA is not easily broken or deformed because of its high mechanical hardness, and it is also light and superior in a chemical resistance. PMMA has a high transmittance with respect to a visible light in the range of 90-91% and has a very small internal loss. Also, the PMMA is superior in its chemical characteristic, namely, tolerance and mechanical characteristic, e.g., tensile strength, flexural strength, elongation strength, etc.

A fixing part 5440 is coupled to the substrate 5431 between the light guide plates 5420. The fixing part 5440 has a type of a screw formed of a transparent material. The fixing part 5440 is coupled to the second through-hole 5431a of the substrate 5431 and the first through-hole 5410a of the bottom cover 5410, which corresponds to the second through-hole 5431a, in order to simultaneously fix the adjacent light guide plates 5420 while maintaining a constant interval between the light guide plates 5420 provided on both sides of the LED package 5432, i.e., the front surface through which light is emitted, and the rear surface opposite to the front surface.

In this embodiment, the fixing part 5440 is formed of a transparent material in order that light guided within the light guide plate 5420 is provided to the upper optical member disposed without interference. The fixing part 5440 may be formed of the same material as the light guide plate 5420.

The fixing part 5440 has a head portion and a body portion. The head portion has various shapes, e.g., a circular shape or a rectangular shape. The body portion extends from the head portion and has a cylindrical shape. The fixing part 5440 may be fixed to the second through-hole 5431a of the substrate 5431 and/or the first through-hole 5410a of the bottom cover 5410 through the threads formed on the outer surface of the body portion of the fixing part 5440. The body portion of the fixing part 5440 may have a rectangular pillar shape.

Since the fixing part 5440 is designed so that the head portion covers the interval between the light guide plates 5420 and partially covers an edge portion of the light guide plate 5420, the interval between the light guide plates 5420 may be slightly changed. Also, the diameter of the body portion may be formed to be equal to the interval or distance between the two parallel major sides at the second through-hole 5431a of the substrate 5431 and/or the first through-hole 5410a of the bottom cover 5410.

Furthermore, in the fixing part 5440, the size of the head portion or the diameter of the body portion may be slightly changed according to the size of the second through-hole 5431a of the substrate 5431. That the size of the second through-hole 5431a of the substrate 5431 is small means that the diameter of the body portion of the fixing part 5440 is small. This means that the interval between the LED package 5432 and the light guide plate 5420 may be reduced.

When the fixing part 5440 is coupled to the substrate 5431 and/or the bottom cover 5410 in a screw manner, the head portion presses the upper edge portion of the light guide plate 5420 disposed adjacent to the substrate 5431 to which the LED package 5432 is fixed. Thus, the movement of the light guide plate 5420 may be prevented even though an external impact is applied.

Moreover, when the fixing part 5440 passes through the first through-hole 5410a of the bottom cover 5410, the externally exposed portion of the fixing part 5440 is additionally coupled by a nut, thereby reinforcing the coupling strength.

Consequently, since the fixing part 5440 coupled to the substrate 5431 can act as a spacer between the LED package 5432 and the light guide plate 5420, it maintains the interval between the LED package 5432 and the light guide plate 5420 is constantly maintained, thereby coping with the contraction and/or expansion of the light guide plate 5420.

The fixing part 5440 need not necessarily be formed in a thread shape. For example, as illustrated in FIG. 173, the fixing part 5440 may pass through the second through-hole 5431a of the substrate 5431 and the first through-hole 5410a of the bottom cover 5410 and be coupled to them through a hook portion formed at an end portion corresponding to the head portion of the screw, and fixed by the bottom cover 5410.

An optical member (not shown) is provided on the plurality of light guide plates 5420 in order to enhance the optical characteristic of light provided through the light guide plate 5420. For example, the optical member may include a diffusion plate and a prism sheet. The diffusion plate has a diffusion pattern for reducing the non-uniformity of light transmitted through the light guide plate 5420, and the prism sheet has a light condensing pattern for increasing the front brightness of light.

Through the above structure, the fixing part 5440 provided between the light guide plates 5420 fixes the light guide plates 5420 while maintaining the constant interval therebetween. Therefore, it is possible to prevent the movement of the light guide plate 5420 due to an external impact, and to cope with the contraction of the light guide plate 5420 in a direction (X axis) perpendicular to the light traveling direction.

In addition, the second through-hole 5431a of the substrate 5431 formed to have the major axis direction and the minor axis direction makes it possible to cope with the contraction of the substrate 5431 in a major axis direction (X axis) of the second through-hole 5431a.

Furthermore, due to the first through-hole 5410a of the bottom cover 5410 having the major axis direction (Y axis) along the light traveling direction and the fixing part 5440 coupled to the first through-hole 5410a, the light guide plate 5420 and the fixing part 5440 and/or the substrate 5431 may move together along the major axis direction (Y axis) of the first through-hole 5410a of the bottom cover 5410 when an expansion and/or contraction of the light guide plate 5420 occurs. Consequently, the interval between the light guide plate 5420 and the LED package 5432 is constantly maintained, thereby improving the luminescent spot and luminescent line phenomenon.

Meanwhile, an LCD display unit according to an embodiment of the present invention may include the LED backlight unit described in the above embodiments, and may further include an LCD panel (not shown) provided on the optical member.

The LCD display unit may further include a mold structure, called a main support, for preventing the LCD from being distorted from an external impact or the like. The backlight unit is provided under the main support, and the LCD panel is provided on the main support.

The LCD panel includes a thin film transistor (TFT) array substrate, a color filter substrate, and a liquid crystal layer. The TFT array substrate and the color filter substrate are attached to each other, with the liquid crystal layer interposed therebetween.

On the TFT array substrate, signal lines such as gate lines and data lines are intersected, and TFTs are formed at the intersection regions of the data lines and the gate lines. The TFTs are configured to switch video signals to be transmitted from the data lines to liquid crystal cells of the liquid crystal layer, i.e., red color (R), green color (G), and blue color (B) data signals, in response to scan signals provided through the gate lines. In addition, pixel electrodes are formed in pixel regions between the data lines and the gate lines.

A black matrix, a color filter, and a common electrode are formed on the color filter substrate. The black matrix is formed corresponding to the gate lines and the data lines of the TFT array substrate. The color filter is formed in a region partitioned by the black matrix to provide red color, green color, and blue color. The common electrode is provided on the black matrix and the color filter.

Data pads and gate pads are formed at an edge portion of the TFT array substrate attached to the color filter substrate. The data pads extend from the data lines, and the gate pads extend from the gate lines. A gate driver and a data driver are respectively connected to the data pads and the gate pads to transfer signals.

Furthermore, a top cover is provided on the LCD panel. The top cover covers four edge portions of the LCD panel and is fixed to the sidewall of the bottom cover 5410 or the main support. The top cover is formed of the same material as the bottom cover 5410.

Figure 178:
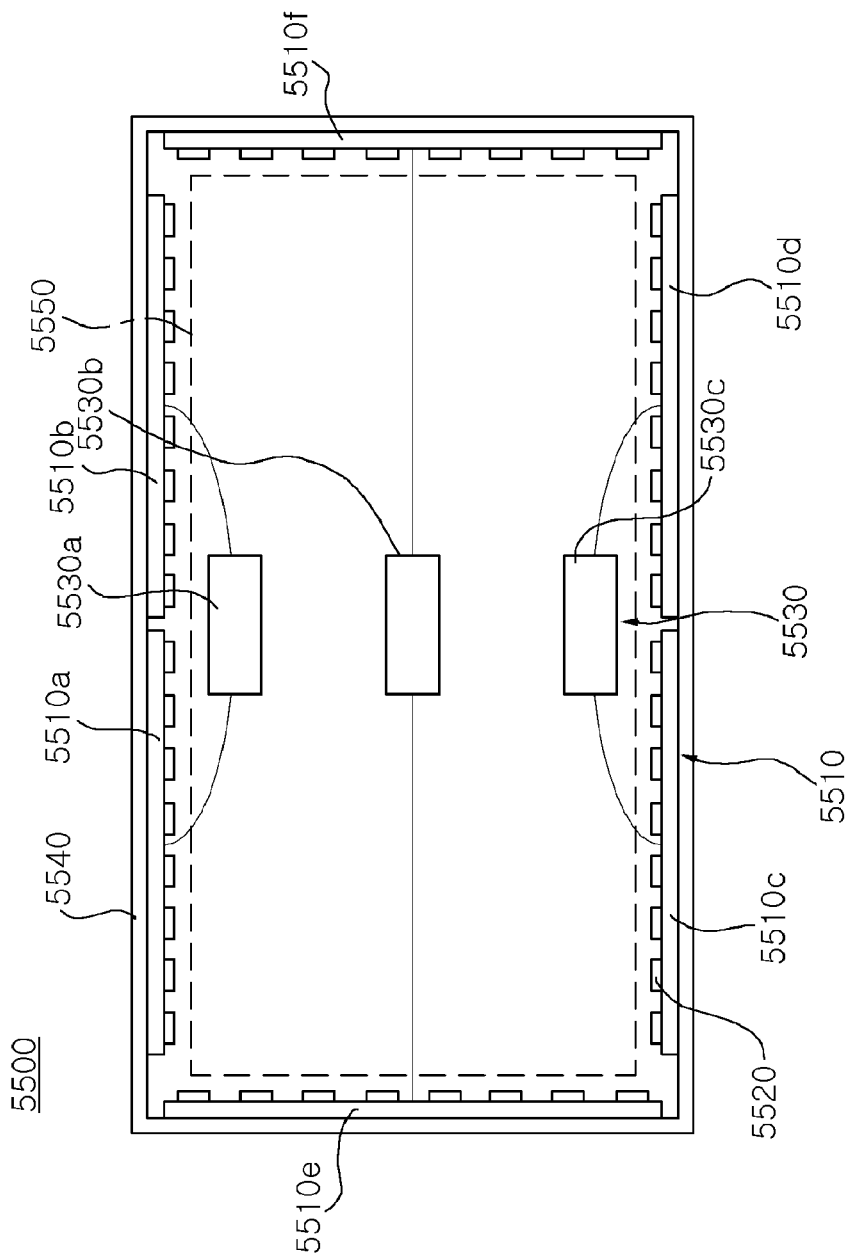
FIGS. 178 through 182 are schematic views of a backlight unit according to another embodiment of the present invention.
Figure 179:
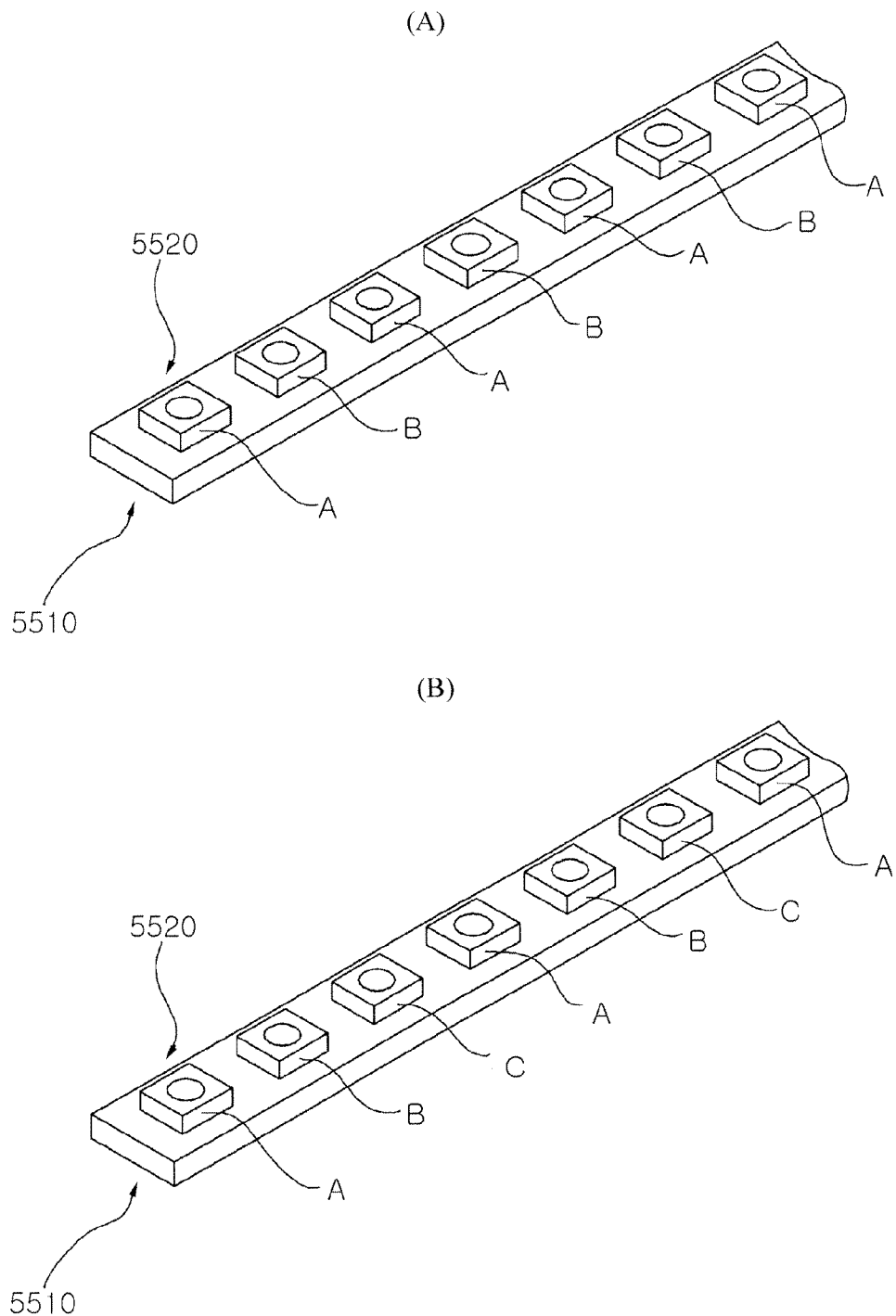
Figure 180:
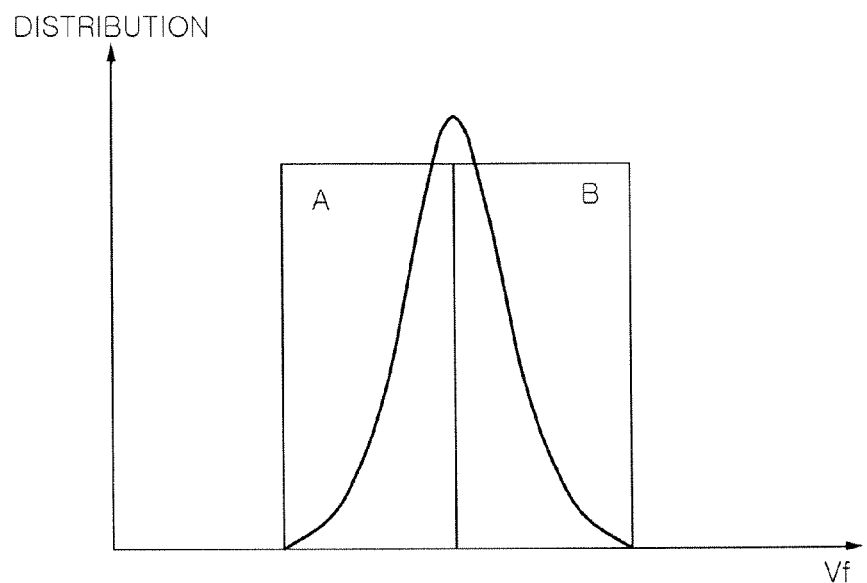
Figure 180:
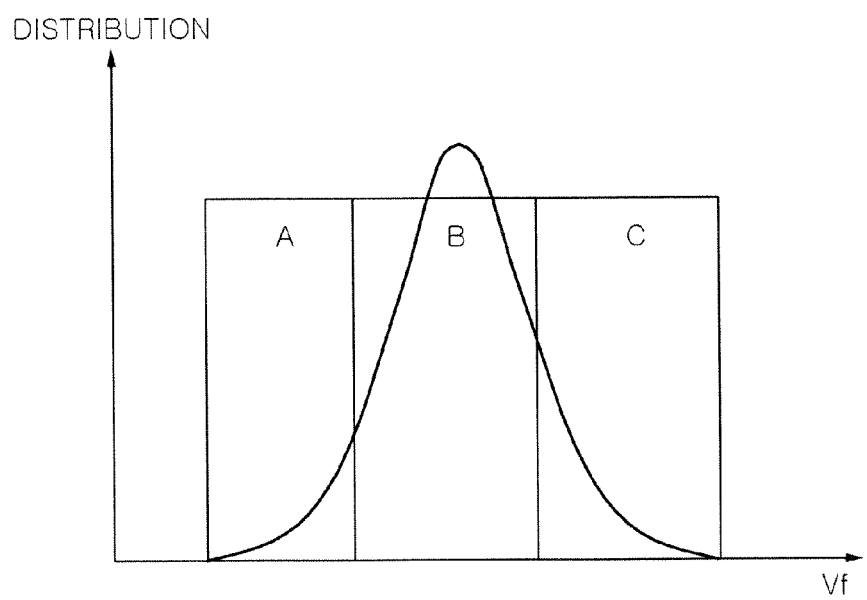

FIG. 178 is a schematic plan view of a backlight unit according to another embodiment of the present invention. FIG. 179 is a perspective view illustrating embodiments of the combination of the LEDs mounted on the LED module of FIG. 178. FIG. 180 is a graph showing the LED distribution, depending on a forward voltage.

Referring to FIGS. 178 through 180, the backlight unit 5500 according to this embodiment of the present invention includes a plurality of LED modules 5510 and at least one driver 5530. Each of the LED modules 5510 includes a plurality of LEDs 5520, and the driver 5530 adjusts the brightness of the LEDs 5520 provided in the LED modules 5510. In this embodiment, the following description will be made with regard to an edge method of arranging the LED modules 5510 used as a line light source facing one or more sides of the light guide plate 5550 along the inner surface of the frame 5540, however, the present invention is not limited thereto. Although a direct method may also be used, it is different only in the arrangement position of the LED modules. Therefore, a detailed description of the direct method will be omitted.

Since the LED module 5510 includes a plurality of LEDs 5520 to emit a white light, it becomes a unit which can be employed as a surface light source or a line light source having a predetermined area. The LED module 5510 includes a sub mount, such as a substrate, and a plurality of LEDs 5520 mounted on the sub mount. The plurality of LEDs 5520 may be, but is not limited to, a white LED.

Referring to FIG. 179, the plurality of LEDs 5520 included in each LED module 5510 are mounted on the substrate and electrically connected together. The plurality of LEDs 5520 included in each LED module 5510 form a serially connected LED array. In this embodiment, the LED array provided in each LED module 5510 is formed by a method of subdividing the LED characteristic into predetermined sections and combining the subdivided sections. LED unit products manufactured by packaging LED chips have characteristics such as color coordinates corresponding to a specific range section, brightness, forward voltage ($V_f$), and wavelength. The values of the characteristics are not identical. The values of LED chips are slightly different in all LED unit products and thus exhibit a scattering characteristic. That is, the range section of the color coordinates and the range section of the forward voltage in LED unit products are not identical, but different in the upper limit value or the lower limit value. When the LED array is formed by mounting a plurality of LEDs 5520, if only LEDs having characteristics corresponding to a specific range section are mounted, a voltage difference (ΔV) occurs between LED modules where only LEDs having a low forward voltage ($V_f$) are mounted, as opposed to LED modules where only LEDs having a high forward voltage (Vf) are mounted. Thus, brightness uniformity is degraded and hot spots are generated on the screen.

In this embodiment, the forward voltage ($V_f$) of the LEDs among all LED characteristics is subdivided into a plurality of sections according to the LED distribution, and the LEDs having the forward voltage corresponding to each section are alternately mounted in each section to thereby form an LED array. The forward voltage ($V_f$) refers to a voltage applied across the LED connected in a forward direction.

A detailed description regarding this will be made below with reference to FIG. 180. FIGS. 180A and 180B are graphs showing LED distribution according to the forward voltage. As illustrated in FIG. 180A, when the forward voltage ($V_f$) range of the LED 5520 is narrow, it may be subdivided into two sections (section A and section B) with respect to the center of the distribution diagram. In this case, the LEDs 5520 to be mounted are classified into first type LEDs having the forward voltage corresponding to the section A, and second type LEDs having the forward voltage corresponding to the section B. The first type LEDs and the second type LEDs are alternately mounted to form the LED array. Although an array combined in the order of ABAB . . . is illustrated in FIG. 179A, the present invention is not limited thereto. The array may be formed by mounting the LEDs in various combination methods, for example, in the order of AABB, ABBA, and so on.

As illustrated in FIG. 180B, when the forward voltage ($V_f$) range of the LED 5520 is wide, it may be subdivided into three sections (section A, section B, and section C). In this case, the LEDs 5520 to be mounted are classified into first type LEDs having the forward voltage corresponding to the section A, second type LEDs having the forward voltage corresponding to the section B, third type LEDs having the forward voltage corresponding to the section C. The first type LEDs, the second type LEDs, and the third type LEDs are alternately mounted to form the LED array. Although an array combined in the order of ABCABC . . . is illustrated in FIG. 179B, the present invention is not limited thereto. The array may be formed by mounting the LEDs in various combination methods, for example, in the order of ABAC, ABBC, and so on. Although the forward voltage ($V_f$) is subdivided into two or three range sections in FIGS. 180A and 180B, the present invention is not limited thereto. The forward voltage ($V_f$) may be subdivided in to various range sections.

By alternately mounting the LEDs 5520 having the forward voltage ($V_f$) corresponding to each section, it is possible to predict the average value of the forward voltages of the LED module 5510 including the LEDs 5520, and it is also possible to reduce the scattering diagram to have a specific range value. By reducing a deviation of the forward voltage ($V_f$) between the LEDs 5520 serially connected within the module, the voltage difference (ΔV) between the LED modules 5510 is reduced and thus the brightness of the unit is made uniform as a whole.

At least one driver 5530 is provided to control the brightness of the LEDs 5520 included in the LED modules 5510, and is electrically connected to the LED modules 5510. Although not shown, a sensor is provided to sense light emitted from the LED. A sensed brightness and color quality are compared with a predefined brightness and color quality and compensated to control the brightness of the LEDs. Also, the backlight unit may further include a control unit connected to the driver 5530 to control the driver 5530. The LED modules 5510 connected to the driver 5530 are connected to one driver 5530, and each driver 5530 is connected to at least two LED modules 5510. At this time, the LED modules connected to the same driver 5530 have a forward voltage having a small voltage difference or a substantially same This may be controlled through the combination of the LEDs 5520 depending on the subdivision of the forward voltage for the plurality of LEDs 5520 mounted on the LED modules 5510. Therefore, the LED modules 5510 are connected in parallel between LED modules 5510 connected to the same driver 5530.

Referring to FIG. 178, the first LED module 5510a and the second LED module 5510b having a small voltage difference are connected to the first driver 5530a to form a connection structure. The third LED module 5510c and the fourth LED module 5510d are connected to the third driver 5530c to form a connection structure. The fifth LED module 5510e and the fifth LED module 5510f are connected to the second driver 5530b to form a connection structure. That is, at least two LED modules 5510 having a small voltage difference are integrally driven by the single common driver 5530. Compared with the conventional backlight unit in which separate drivers are provided in each LED module, the number of the drivers may be reduced, thereby contributing to the miniaturization and slimness of the backlight unit. Also, the number of electric/electronic parts used in the backlight unit may be reduced. Furthermore, as the number of the drivers is reduced, the entirety of drivers for compensating the optical characteristics of the backlight unit may be controlled more easily, thereby improving the image quality.

Figure 181:
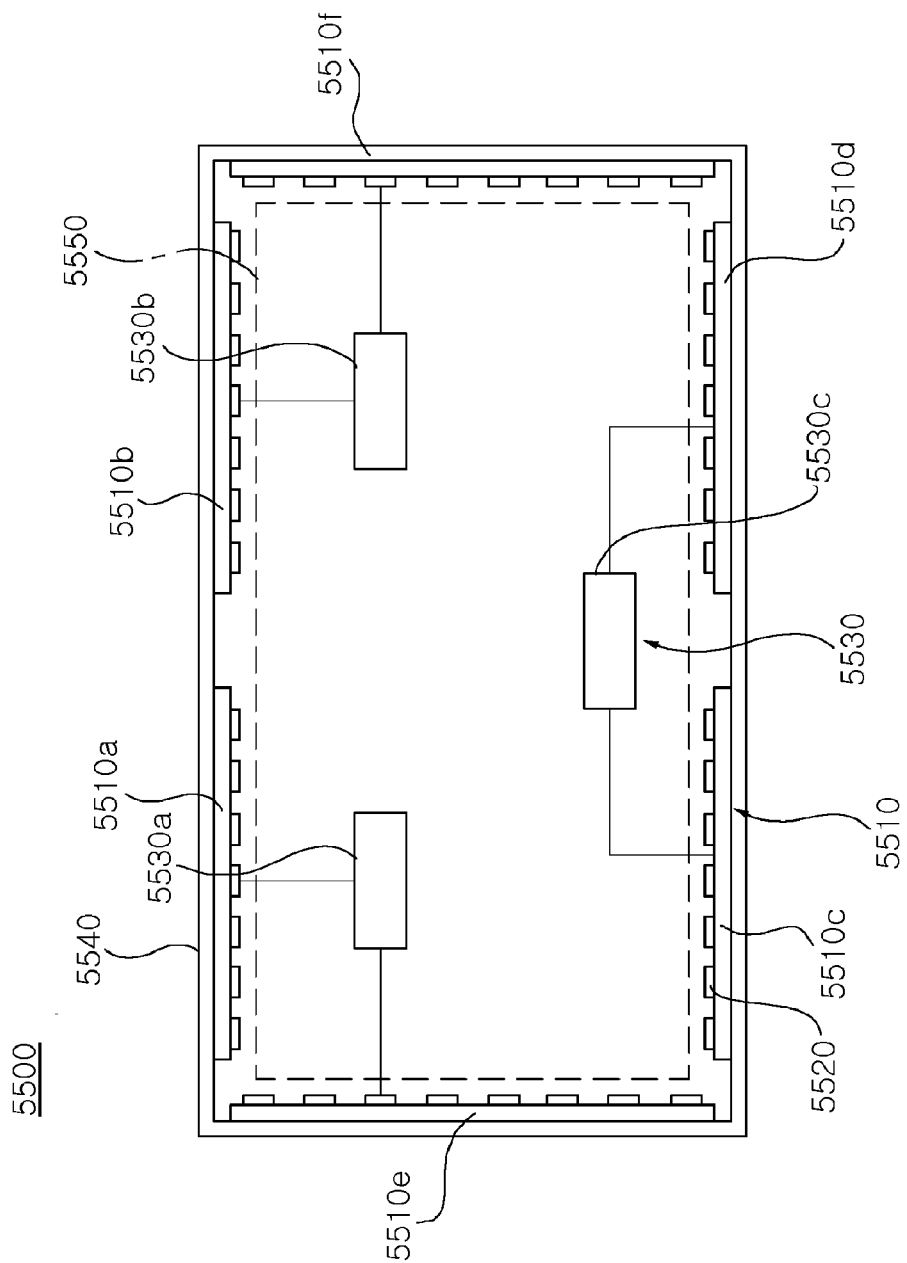
Figure 182:
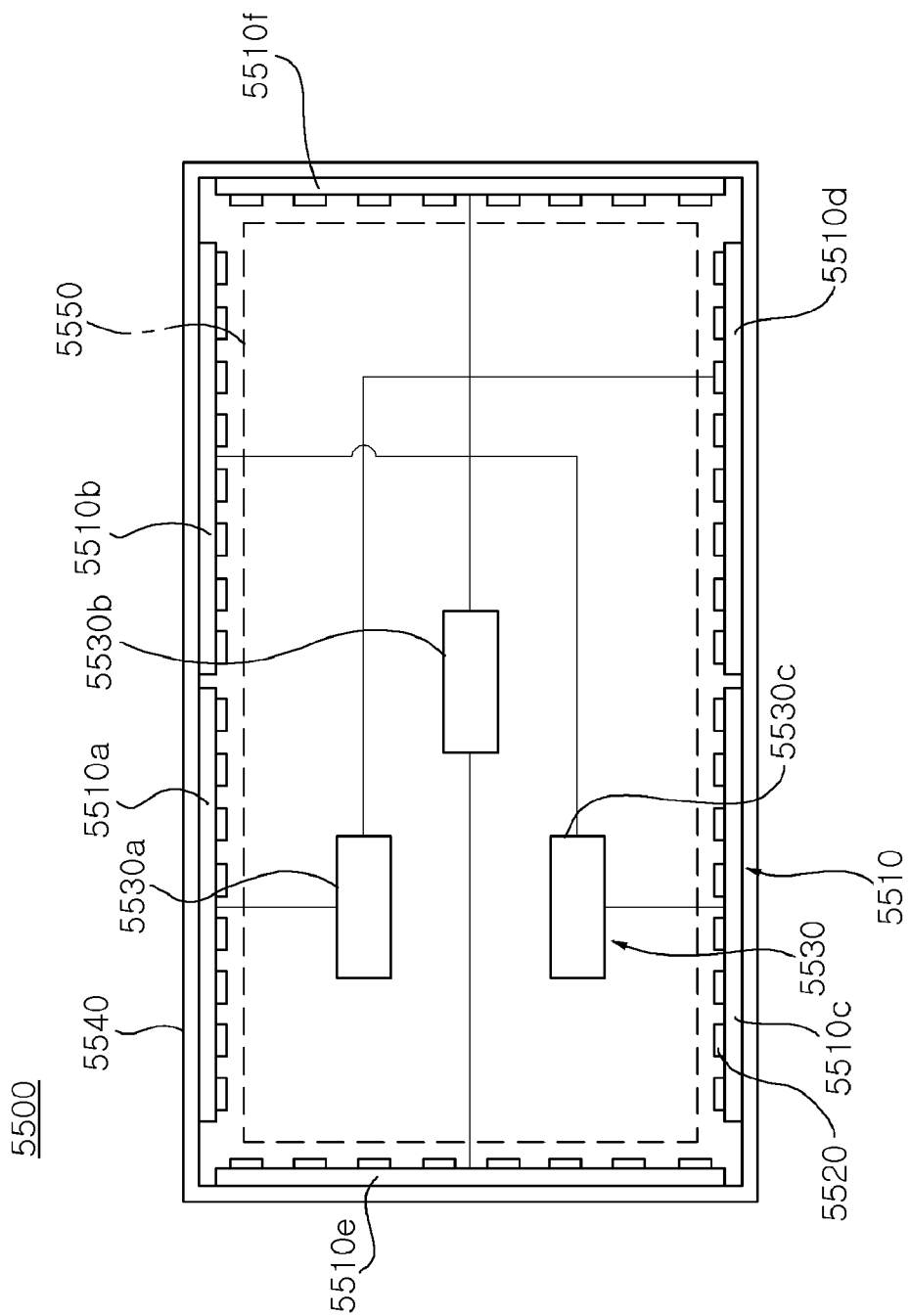

FIGS. 181 and 182 illustrate various embodiments of the connection structure of the LED module 5510 and the driver 5530. Referring to FIG. 181, the first driver 5530a is connected to the first LED module 5510a and the fifth LED 5510e to form a connection structure. The second driver 5530b is connected to the second LED module 5510b and the sixth LED module 5510f to form a connection structure. The third driver 5530c is connected to the third LED module 5510c and the fourth LED module 5510b to form a connection structure.

In the embodiment of FIG. 182, the first LED module 5510a and the fourth LED module 5510d are connected to the first driver 5530a to form a connection structure. The fifth LED module 5510e and the sixth LED module 5510f are connected to the second driver 5530b to form a connection structure. The second LED module 5510b and the third LED module 5510c are connected to the third driver 5530c to form a connection structure. The LED modules 5510 electrically connected to the drivers 5530 may have various connection structures, and the present invention is not limited thereto. The plurality of LED modules 5510 are electrically connected only between the LED modules 5510 commonly using the drivers 5530, and are not electrically connected to LED modules 5510 connected to other drivers 5530.

The surface light source and the backlight unit according to the embodiments of the present invention may include LED driver circuits which can be directly used with AC voltages, without any converter which converts AC voltages into DC voltages, and may include LED array devices implemented according to the LED driver circuits. The LED driver circuit and the LED array device will be described in detail with reference to FIGS. 183 through 187.

Figure 183:
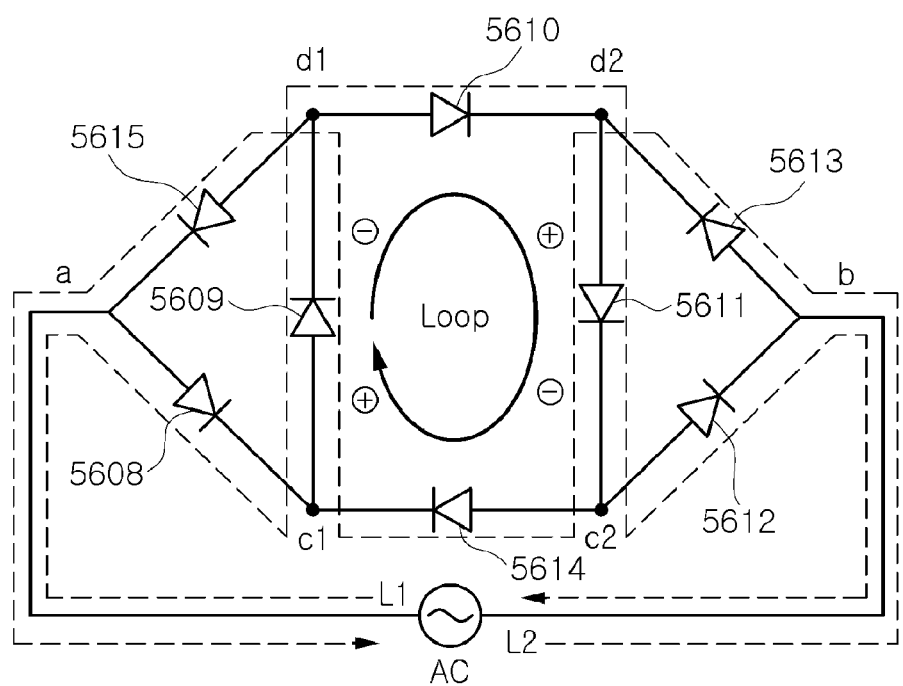
Figure 184:
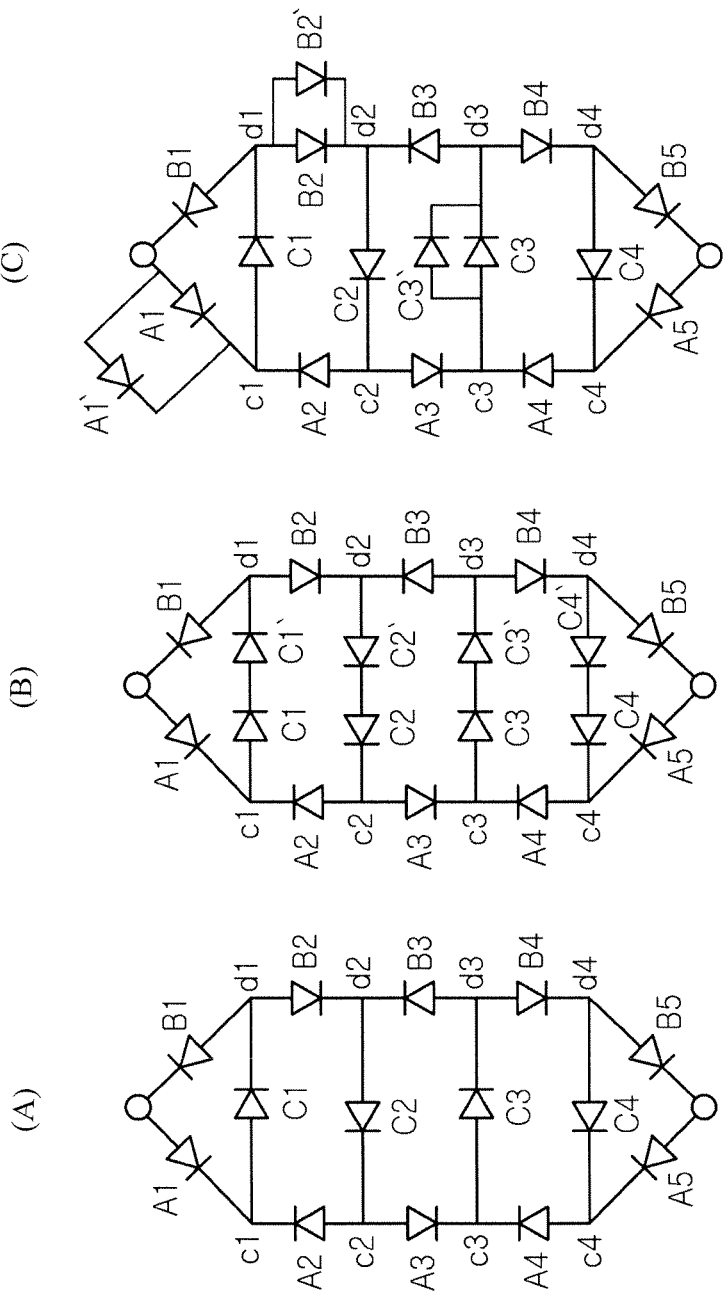

FIG. 183 illustrates an LED driver circuit according to an embodiment of the present invention. The LED driver circuit of FIG. 184 includes a ladder network LED circuit. The ladder network circuit includes three first branches and three second branches. The three first branches are connected at first middle contact points c1 and c2 between first and second contact points a and b, and the three second branches are connected at second middle contact points d1 and d2 between the first and second contact points a and b. The LED driver circuit has two middle branches connected between the first and second middle contact points c1 and d1, c2 and d2. LED devices 5608, 5609, 5610, 5611, 5612, 5613, 5614 and 5615 are disposed at the first and second branches and the middle branches.

The LED driver circuit has two current loops L1 and L2 which are driven at different half cycles of the AC voltage. The first current loop L1 includes LED devices 5608, 5609, 5610, 5611 and 5612 which are serially connected to be driven at a first half cycle of the AC voltage. The second current loop L2 includes LED devices 5613, 5611, 5614, 5609 and 5615 which are serially connected to be driven at a second half cycle of the AC voltage. As such, when the AC voltage is applied, the LED devices 5609 and 5611 may be driven bi-directionally.

When the order of the first contact point a, the first and second branches, and the middle branches is defined as m, the LED arrangement of the ladder network circuit may be described as follows. The LED devices 5608, 5609, 5610, 5611, 5612, 5613, 5614 and 5615 may be divided into a first LED group and a second LED group according to the period of a drivable AC voltage. The first LED group includes LEDs 5608, 5609, 5610, 5611 and 5612 which belong to odd-numbered (2m−1) first branches, all the middle branches, and even-numbered (2m) second branches and are serially connected. The second LED group includes LEDs 5613, 5611, 5614, 5609 and 5615 which belong to even-numbered (2m) first branches, all the middle branches, and odd-numbered (2m−1) second branches and are serially connected in a polarity direction opposite to the first LED group.

Therefore, the first LED group may form the first current loop which is driven at the first half cycle of the AC voltage, and the second LED group may form the second current loop which is driven at the second half cycle of the AC voltage. According to this driving method, the LED devices 5609 and 5611 disposed at the middle branch and commonly belonging to the first and second LED groups may be continuously operated at the entire cycles of the AC voltage.

In the LED driver circuit including the eight LED devices 5608, 5609, 5610, 5611, 5612, 5613, 5614 and 5615, since the two LED devices 5610 and 5614 can be driven at the entire cycles of the AC voltage, five LED devices continuously emit light in the practical ladder network circuit (the ratio of the number of LEDs used to the number of LEDs driven is 62.5%). This value is an enhanced value compared with the typical AC-type LED arrangement, i.e., a reverse polarity arrangement (50%) or a bridge arrangement (generally 60%).

The LED driver circuit according to the embodiment of the present invention is different from the bridge structure in that the LED device 5609 and the LED device 5611 are connected not in parallel but in series. That is, in the LED driver circuit according to the embodiment of the present invention, since the LED devices 5610 and 5614 are arranged between the LED device 5609 and the LED device 5611, the LED device 5609 and the LED device 5611 are serially connected. From this viewpoint, the LED driver circuit according to the embodiment of the present invention has the ladder network structure which is fundamentally different from the bridge structure.

In the LED driver circuit according to the embodiment of the present invention, the connection of the LEDs driven bi-directionally is established not in parallel but in series by inserting the LED devices 5610 and 5614 and connecting four middle contact points c1, c2, d1 and d2. Such an LED arrangement connection structure forms a single loop. As described above, in the practical driving operation, since the potential differences of the LEDs are different within the loop formed by the middle contact points, they are operated in a single series type without forming the current loop.

According to another embodiment of the present invention, when a loop connecting the first and second contact points in the ladder network structure of FIG. 183 is defined as a stack, various LED driver circuits may be provided by continuously connecting a plurality of stacks. The first and second middle contact points may be implemented with the same number of three or more, and the first and second branches may be implemented with the same number of four or more.

FIG. 184A illustrates an LED driver circuit according to another embodiment of the present invention, which has four first middle contact points c1, c2, c3 and c4 and four second middle contact points d1, d2, d3 and d4. The LED driver circuit includes four middle branches which sequentially connect the first and second middle contact points. Such a driver circuit may be understood as a ladder network circuit having three stages. In FIG. 184A, one LED device is disposed in each branch. In such an arrangement, the LEDs are arranged to have the first and second current loops which are driven at different half cycles of the AC voltage. That is, the LED devices are serially arranged to have the first current loop along A1-C1-B2-C2-A3-C3-B4-C4-A5 at the first half cycle of the AC voltage, and the LED devices are serially arranged to have the second current loop along B1-C1-A2-C2-B3-C3-A4-C4-B5 at the second half cycle of the AC voltage.

In the LED driver circuit according to this embodiment of the present invention, four LED devices C1, C2, C3 and C4 disposed at the middle branch and commonly involved in the first and second current loops may be continuously operated at the entire cycles of the AC voltage. As such, in the LED driver circuit including fourteen LED devices, the four LED devices C1, C2, C3 and C4 may be driven at the entire cycles of the AC voltage. Thus, nine LED devices continuously emit light in the practical ladder network circuit (LED use efficiency is approximately 64%). In this embodiment, the further reduction in the number of LEDs used can be expected compared with the previous embodiment.

In the driver circuit of FIGS. 183 and 184*a*, although the case in which each of the first and second branches and the middle branch includes one LED device has been exemplified, the first and second branches and the middle branches may include a plurality of LED devices. Even in this case, the plurality of LED devices belonging to the same branches are serially connected. Specifically, when the number of LEDs of the middle branch increases, the number of LEDs driven bi-directionally relatively increases. Thus, the luminous efficiency with respect to the number of LEDs used is markedly improved. Consequently, it is possible to reduce the number of LEDs necessary to obtain the desired light emitting level at the AC voltage.

The LED driver circuit of FIG. 184B has a structure in which two LED devices are serially connected to the middle branches, in addition to the LED driver circuit of FIG. 184A. The LED devices are serially arranged to have a first current loop along A1-C1-C1'-B2-C2-C2'-A3-C3-C3'-B4-C4-C4'-A5 at a first half cycle of an AC voltage, and the LED devices are serially arranged to have a second current loop along B1-C1-C1'-A2-C2-C2'-B3-C3-C3'-A4-C4-C4'-B5 at a second half cycle of an AC voltage. In the LED driver circuit according to this embodiment of the present invention, eight LED devices C1, C1', C2, C2', C3, C3', C4 and C4' belong to the middle branches. That is, the number of the LED devices C1, C1', C2, C2', C3, C3', C4 and C4' commonly involved in the first and second current loops to continuously operate at the entire cycles of the AC voltage are two times larger than that of the LED driver circuit of FIG. 184A. Consequently, in the LED driver circuit provided with eighteen LED devices, eight LED devices C1, C1', C2, C2', C3, C3', C4 and C4' can be driven at the entire cycles of the AC voltage. Hence, thirteen LED devices continuously emit light in the practical ladder network circuit (LED use efficiency: approximately 72%). Compared with the foregoing embodiments, the number of LEDs used may be further reduced.

The LED driver circuit of FIG. 184C has a structure in which LED devices A1', B2' and C3' connected in parallel are arranged at a first-stage first branch, a second-stage second branch, and a third-stage third branch in the LED driver circuit of FIG. 184A. The LED devices are serially arranged to have a first current loop along (A1, A1')-C1-(B2,B2')-C2-A3-(C3,C3')-B4-C4-A5 at a first half cycle of an AC voltage, and the LED devices are serially arranged to have a second current loop along B1-C1-A2-C2-B3-(C3,C3')-A4-C4-C4'-B5 (devices indicated by parentheses are connected in parallel). Since the increase in the number of the LED devices disposed at the middle branches causes the increase in the number of devices driven bi-directionally, it is advantageous to improving LED use efficiency. However, when only the number of the LED devices disposed at the middle branches is increased, the reverse voltage applied to the LED devices belonging to the first and second branches is increased. Therefore, when the LED devices have the same specification, it is preferable that two or three LED devices are disposed at the middle branches.

Figure 186:
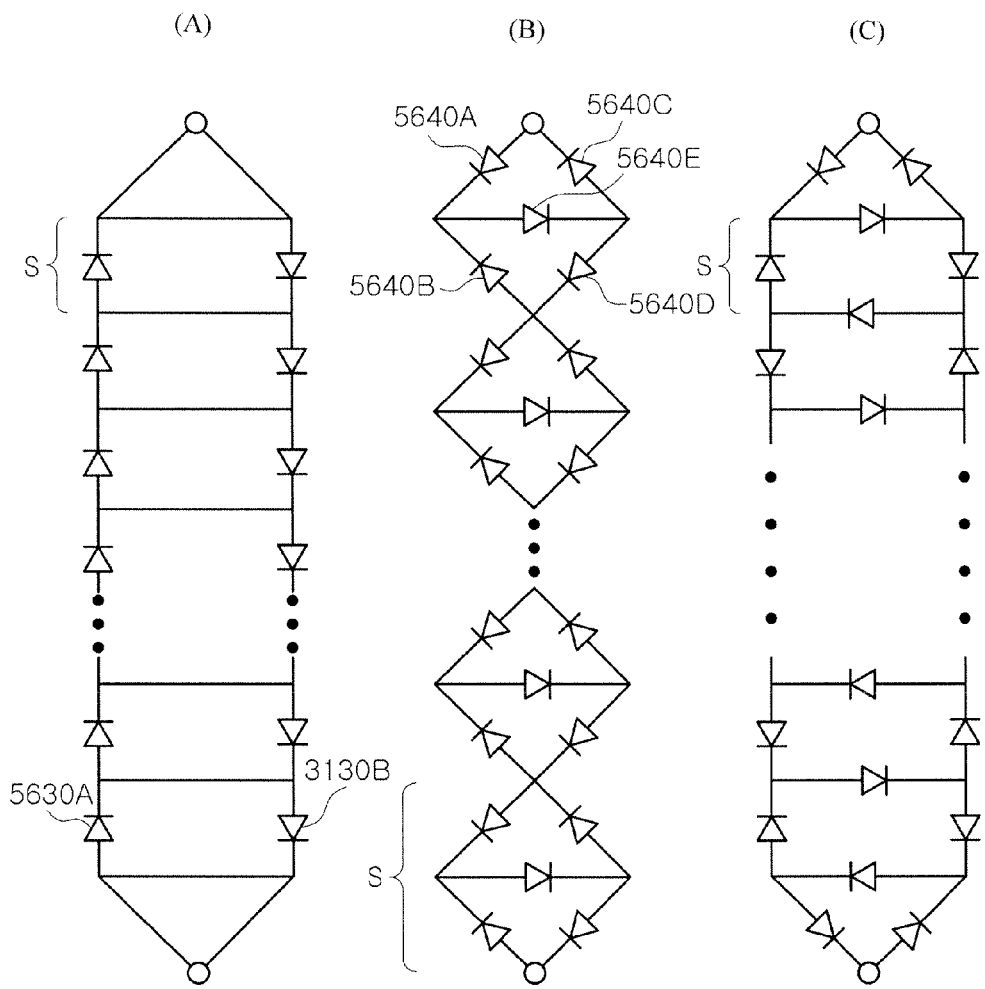
Figure 187:
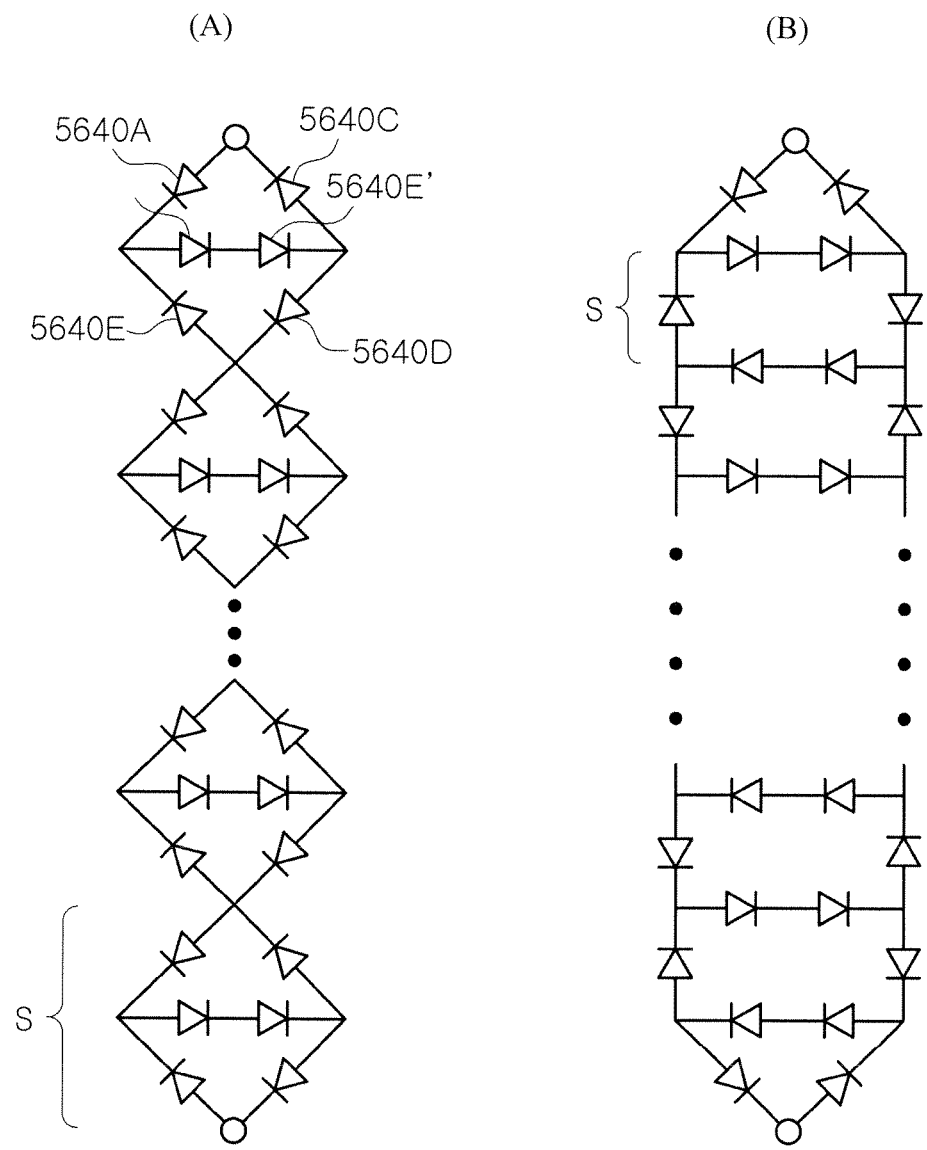

In a specific embodiment of the present invention, a plurality of ladder network circuits are provided. A second contact point of a certain ladder network circuit may be serially connected to a first contact point of another ladder network circuit. Such an embodiment is illustrated in FIG. 186.

Figure 185:
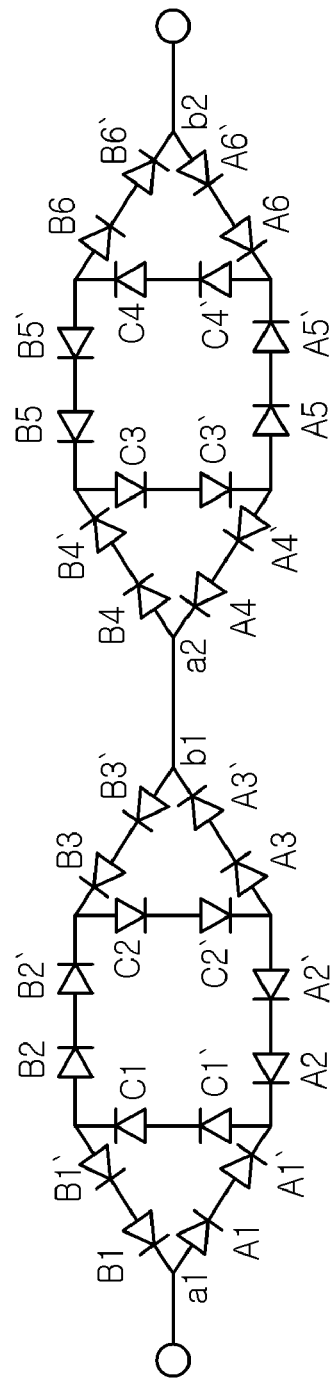

Referring to FIG. 185, the LED driver circuit has a structure in which two ladder network circuits are serially connected. That is, a second contact point b1 of the first ladder network circuit is connected to a first contact point a2 of the second ladder network circuit, and a first contact point a1 of the first ladder network circuit is connected to a second contact point (i.e., an AC voltage terminal) of the second ladder network circuit. Also, in this embodiment, two LED devices serially connected to the first branch the second branch and the middle branch are arranged.

In the LED driver circuit of FIG. 185, the LED devices are serially arranged to have a first current loop along A1-A1'-C1-CV-B2-B2'-C2-C2'-A3-A3'(the first ladder network circuit)-B4-B4'-C3-C3'-A5-A5'-C4-C4'-B6-B6'(the second ladder network circuit) at a first half cycle of an AC voltage, and the LED devices are serially arranged to have a second current loop along B1-BV-C1-C1'-A2-A2'-C2-C2'-B3-B3' (the first ladder network circuit)-A4-A4'-C3-C3'-B5-B5'-C4-C4'-A6-A6'(the second ladder network circuit) at a second half cycle of the AC voltage.

In the LED driver circuit according to this embodiment of the present invention, eight LED devices C1, C1', C2, C2', C3, C3', C4, C4' belong to the middle branches. That is, the number of the LED devices C1, C1', C2, C2', C3, C3', C4 and C4' commonly involved in the first and second current loops to continuously operate at the entire cycles of the AC voltage are two times larger than that of the LED driver circuit of FIG. 184A. As such, the LED arrangement for AC driving of the ladder network structure according to the embodiment of the present invention may be applied in various manners.

In another aspect of the present invention, there is provided an LED array apparatus including the LED devices in which the LED driver circuit having the various ladder network structures is implemented as described above. Specifically, in the LED array apparatus according to the embodiment of the present invention, K first LED devices (where K≥3) are arranged in parallel to have n first middle contact points (where n≥2) to which electrodes having the same polarity are connected between a first contact point and a second contact point. L second LED devise (where L≥3) are arranged in parallel to have n second middle contact points to which electrodes having the same polarity are connected between the first contact point and the second contact point. Electrodes having opposite polarity to that of the first LED devices connected to the first and second contact points are connected to the first and second contact points.

Also, in M third LED devices corresponding to the middle branches of the above-described circuit (where M≥n), electrodes having opposite polarity to that of the first and second LED devices are connected to the same m-th first and second middle contact points (where m is a positive integer defining the order from the first contact point to the n first and second middle contact points).

The first and second LED devices may be arranged between the contact points one by one. In a similar manner, the third LED device may be connected between the first and second contact points.

If necessary, a plurality of third LED devices may be connected between one or more first and second middle contact points. The third LED devices may be connected in series or in parallel between at least one or more first and second middle contact points (see FIG. 184B or 184C).

In order to explain the effect that reduces the number of LEDs used in the ladder network LED driver circuit according to the embodiment of the present invention, a difference in the number of LED devices required for meeting a specific output condition is determined is compared with the conventional AC type LED circuit (a bipolar circuit, a bridge circuit, etc.).

FIG. 186A illustrates a conventional LED driver circuit, and FIGS. 186B and 186C illustrates an LED driver circuit according to an embodiment of the present invention.

The LED driver circuit of FIG. 186A is a reverse parallel circuit for AC driving, in which LED devices 5630A and 5630B arranged in reverse parallel are serially connected in a plurality of stages S. As shown in Table 4, even though the number of the stages S increases, the ratio of the number of the continuously driven LEDs to the number of LEDs used (LED use efficiency) is 50%.

The LED driver circuit of FIG. 186B is a bridge circuit in which one LED device is arranged at each branch. One stage includes a total of five LED devices 5640A, 5640B, 5640C, 5640D and 5640E. The LED devices may be connected to one another in a plurality of stages in order to ensure a desired output. As shown in Table 4, the bridge network LED circuit has a use efficiency of 60%, without regard to the number of the stages S. This is because, unlike the reverse parallel arrangement of FIG. 186A, the LED devices 5640E arranged at the middle branch can be driven continuously bi-directionally.

In the same manner as FIG. 184A, the ladder network LED driver circuit illustrated in FIG. 184A includes a total of eight LEDs to define two stages. Five LEDs are continuously driven to ensure a high use efficiency of 62.5%. Also, as shown in Table 4, the ladder network LED driver circuit is configured such that as the number of stages S increases, a larger number of LEDs are driven bi-directionally, leading to a gradual increase in the LED use efficiency.

This improvement is further achieved in the circuit with a higher output. That is, in a case in which an output of sixty three LED devices is required, the reverse parallel circuit and the bridge circuit require one hundred twenty six and one hundred five LED devices, respectively, to enable AC driver circuit. However, the ladder network LED circuit requires only ninety five LED devices, thereby reducing the number of the LED devices by 31 and 10, respectively, compared with the conventional circuit.

This is because in the bridge LED circuit, at least two LED devices are located in a current loop between the LEDs commonly driven bi-directionally. Meanwhile, in the ladder network, at least one LED device is required between the LED devices commonly used. That is, the ladder network circuit requires a smaller number of LEDs between the LEDs commonly used bi-directionally than the bridge network circuit. This allows the ladder network to commonly use a larger number of LEDs bi-directionally than the bridge structure.

TABLE 4

| No. of stages | Reverse parallel network | | | | Bridge network | | | | Ladder network | | | |
|---|---|---|---|---|---|---|---|---|---|---|---|---|
| | $V_f$ | No. of LED | No. of bi-direction turns | Efficiency (%) | $V_f$ | No. of LED | No. of bi-direction turns | Efficiency (%) | $V_f$ | No. of LED | No. of bi-direction turns | Efficiency (%) |
| 1 | $\Delta V_f$ | 2 | 0 | 50 | $3 \cdot \Delta V_f$ | 5 | 1 | 60 | $5 \cdot \Delta V_f$ | 8 | 2 | 62.5 |
| 2 | $2 \cdot \Delta V_f$ | 4 | 0 | 50 | $6 \cdot \Delta V_f$ | 10 | 2 | 60 | $7 \cdot \Delta V_f$ | 11 | 3 | 63.6 |
| 3 | $3 \cdot \Delta V_f$ | 6 | 0 | 50 | $9 \cdot \Delta V_f$ | 15 | 3 | 60 | $9 \cdot \Delta V_f$ | 14 | 4 | 64.3 |
| 4 | $5 \cdot \Delta V_f$ | 8 | 0 | 50 | $12 \cdot \Delta V_f$ | 20 | 4 | 60 | $11 \cdot \Delta V_f$ | 17 | 5 | 64.7 |
| 5 | $5 \cdot \Delta V_f$ | 10 | 0 | 50 | $15 \cdot \Delta V_f$ | 25 | 5 | 60 | $13 \cdot \Delta V_f$ | 20 | 6 | 65 |
| 6 | $6 \cdot \Delta V_f$ | 12 | 0 | 50 | $18 \cdot \Delta V_f$ | 30 | 6 | 60 | $15 \cdot \Delta V_f$ | 23 | 7 | 65.2 |
| 7 | $7 \cdot \Delta V_f$ | 14 | 0 | 50 | $21 \cdot \Delta V_f$ | 35 | 7 | 60 | $17 \cdot \Delta V_f$ | 26 | 8 | 65.4 |
| 8 | $8 \cdot \Delta V_f$ | 16 | 0 | 50 | $24 \cdot \Delta V_f$ | 40 | 8 | 60 | $19 \cdot \Delta V_f$ | 29 | 9 | 65.5 |
| 9 | $9 \cdot \Delta V_f$ | 18 | 0 | 50 | $27 \cdot \Delta V_f$ | 45 | 9 | 60 | $21 \cdot \Delta V_f$ | 32 | 10 | 65.6 |
| 10 | $10 \cdot \Delta V_f$ | 20 | 0 | 50 | $30 \cdot \Delta V_f$ | 50 | 10 | 60 | $23 \cdot \Delta V_f$ | 35 | 11 | 65.7 |
| 21 | $21 \cdot \Delta V_f$ | 42 | 0 | 50 | $63 \cdot \Delta V_f$ | 105 | 21 | 60 | $45 \cdot \Delta V_f$ | 68 | 22 | 66.2 |
| 30 | $30 \cdot \Delta V_f$ | 60 | 0 | 50 | $90 \cdot \Delta V_f$ | 150 | 30 | 60 | $63 \cdot \Delta V_f$ | 95 | 31 | 66.3 |
| 63 | $63 \cdot \Delta V_f$ | 126 | 0 | 50 | — | — | — | — | — | — | — | — |

Therefore, in a case in which an output of nine LED devices are required, the reverse parallel LED circuit illustrated in FIG. 186A requires a total of eighteen LED devices, and the bridge network LED circuit requires a total of fifteen LED devices to define three stages. Meanwhile, in the ladder network LED circuit according to the embodiment of the present invention, a total of fourteen LEDs are connected to define three stages, thereby providing desired light amount (nine LED devices). This leads to a considerable decrease in the number of employed LED devices compared with the bridge LED circuit.

FIG. 187A illustrates an LED driver circuit according to another conventional example, and FIG. 187B illustrates an LED driver circuit according to another embodiment of the present invention.

The LED driver circuits of FIGS. 187A and 187B are similar to those of FIGS. 186A and 186B but configured such that two LED devices are arranged in each middle branch. That is, the number of continuously driven LED devices is increased to an equal level in each stage. The ladder network LED driver circuit shown in FIG. 187B will be understood with reference to the embodiment shown in FIG. 184B.

TABLE 5

| No. of stages | Reverse parallel network | | | | Bridge network | | | | Ladder network | | | |
|---|---|---|---|---|---|---|---|---|---|---|---|---|
| | $V_f$ | No. of LED | No. of bi-direction turns | Efficiency (%) | $V_f$ | No. of LED | No. of bi-direction turns | Efficiency (%) | $V_f$ | No. of LED | No. of bi-direction turns | Efficiency (%) |
| 1 | $\Delta V_f$ | 2 | 0 | 50 | $4 \cdot \Delta V_f$ | 6 | 2 | 66.7 | $7 \cdot \Delta V_f$ | 10 | 4 | 70 |
| 2 | $2 \cdot \Delta V_f$ | 4 | 0 | 50 | $8 \cdot \Delta V_f$ | 12 | 4 | 66.7 | $10 \cdot \Delta V_f$ | 14 | 6 | 71.4 |
| 3 | $3 \cdot \Delta V_f$ | 6 | 0 | 50 | $12 \cdot \Delta V_f$ | 18 | 6 | 66.7 | $13 \cdot \Delta V_f$ | 18 | 8 | 72 |
| 4 | $5 \cdot \Delta V_f$ | 8 | 0 | 50 | $16 \cdot \Delta V_f$ | 24 | 8 | 66.7 | $16 \cdot \Delta V_f$ | 22 | 10 | 72.7 |
| 5 | $5 \cdot \Delta V_f$ | 10 | 0 | 50 | $20 \cdot \Delta V_f$ | 30 | 10 | 66.7 | $19 \cdot \Delta V_f$ | 26 | 12 | 73.1 |
| 6 | $6 \cdot \Delta V_f$ | 12 | 0 | 50 | $24 \cdot \Delta V_f$ | 36 | 12 | 66.7 | $22 \cdot \Delta V_f$ | 30 | 14 | 73.3 |
| 7 | $7 \cdot \Delta V_f$ | 14 | 0 | 50 | $28 \cdot \Delta V_f$ | 42 | 14 | 66.7 | $25 \cdot \Delta V_f$ | 34 | 16 | 73.5 |
| 8 | $8 \cdot \Delta V_f$ | 16 | 0 | 50 | $32 \cdot \Delta V_f$ | 48 | 16 | 66.7 | $28 \cdot \Delta V_f$ | 38 | 18 | 73.7 |
| 9 | $9 \cdot \Delta V_f$ | 18 | 0 | 50 | $36 \cdot \Delta V_f$ | 54 | 18 | 66.7 | $31 \cdot \Delta V_f$ | 42 | 20 | 73.8 |
| 10 | $10 \cdot \Delta V_f$ | 20 | 0 | 50 | $40 \cdot \Delta V_f$ | 60 | 20 | 66.7 | $34 \cdot \Delta V_f$ | 46 | 22 | 73.9 |

TABLE 5-continued

| | Reverse parallel network | | | | Bridge network | | | | Ladder network | | |
|---|---|---|---|---|---|---|---|---|---|---|---|
| No. of stages | $V_f$ | No. of LED | No. of bi-direction turns | Efficiency (%) | $V_f$ | No. of LED | No. of bi-direction turns | Efficiency (%) | $V_f$ | No. of LED | No. of bi-direction turns | Efficiency (%) |
| 13 | $13 \cdot \Delta V_f$ | 26 | 0 | 50 | $52 \cdot \Delta V_f$ | 78 | 26 | 66.7 | $43 \cdot \Delta V_f$ | 58 | 28 | 74 |
| 16 | $16 \cdot \Delta V_f$ | 32 | 0 | 50 | $64 \cdot \Delta V_f$ | 96 | 32 | 66.7 | $52 \cdot \Delta V_f$ | 70 | 34 | 74.3 |
| 52 | $52 \cdot \Delta V_f$ | 104 | 0 | 50 | — | — | — | — | — | — | — | — |

Therefore, in a case in which an output of sixteen LED devices is required, the reverse-parallel LED circuit illustrated in FIG. 186A requires a total thirty two LED devices, and the bridge network LED circuit illustrated in FIG. 187A requires a total twenty four LED devices to define four stages. Meanwhile, in the ladder network LED circuit according to the embodiment of the present invention, a total twenty two LED devices are required to provide desired light amount (sixteen LED devices), leading to a considerable reduction in the number of the employed LED devices compared with the bridge LED circuit.

This improvement is further achieved in the circuit with a higher output. That is, in a case in which an output of fifty two LED devices is required, the reverse parallel circuit and the bridge circuit require one hundred four and seventy eight LED devices, respectively, to enable AC driver circuit. However, the ladder network LED circuit requires only seventy LED devices, thereby reducing the number of the LED devices by 34 and 8, respectively, compared with the conventional circuit.

As described above, the ladder network LED driver circuit requires a smaller number of LED devices for AC driving to achieve identical output than the conventional reverse parallel structure and the bridge structure as well.

The following description will be made regarding an automatic LED dimming apparatus which is capable of reducing power consumption by automatically adjusting the brightness of an LED in a surface light source and a backlight employing a light emitting package according to various embodiments of the present invention, depending on a surrounding brightness.

Figure 188:
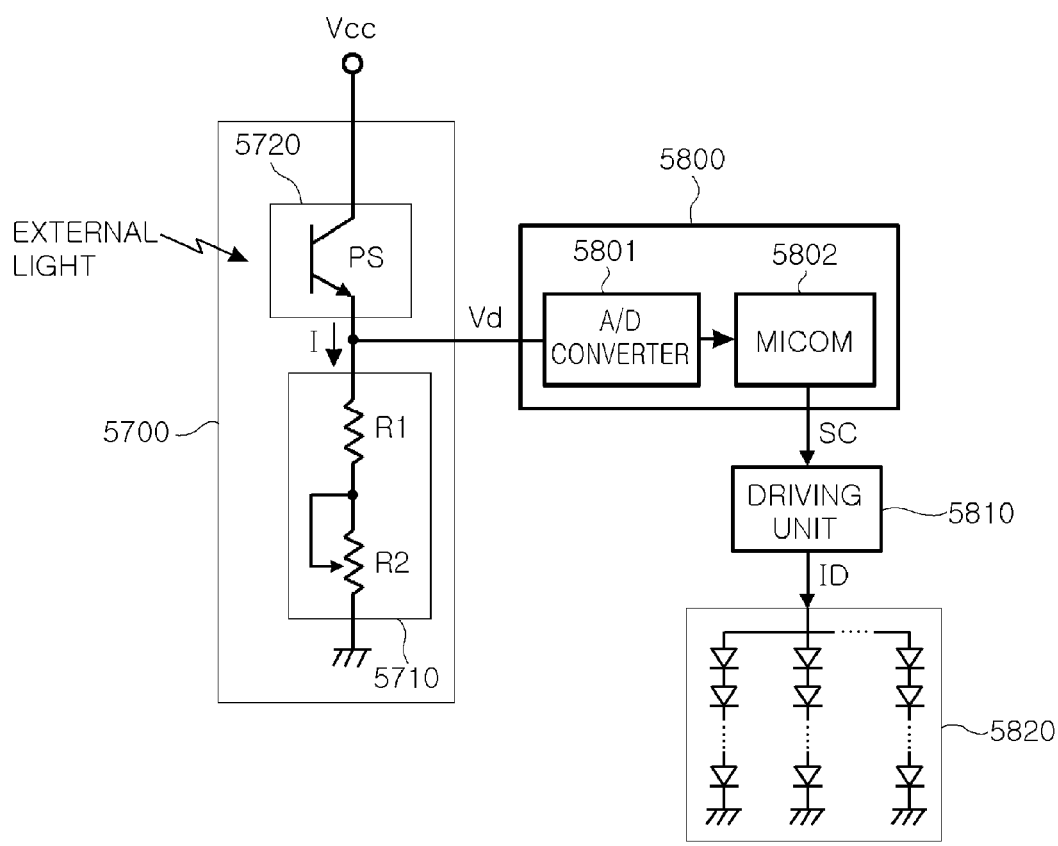
FIG. 188 is a configuration diagram of an automatic LED dimming apparatus according to an embodiment of the present invention.

FIG. 188 is a configuration diagram of an automatic LED dimming apparatus according to an embodiment of the present invention. Referring to FIG. 188, the automatic LED dimming apparatus includes a surrounding brightness detection unit 5700 detecting a surrounding brightness, a dimming control unit 5800 controlling a driving according to a magnitude of a detection voltage Vd generated by the detection of the surrounding brightness detection unit 5700, and a dimming driving unit 5810 generating an LED driving current according to the driving control of the dimming control unit 5800. Furthermore, the automatic LED dimming apparatus may include an LED unit 5820 including a plurality of LEDs and driven according to a driving current of the dimming driving unit 5810.

The surrounding brightness detection unit 5700 may include a sensitivity setting unit 5710 setting a detection sensitivity for detection of a surrounding brightness, and a photo sensor unit 5720 receiving an external light and detecting a surrounding brightness at the detection sensitivity set by the sensitivity setting unit 5710. The photo sensor unit 5720 may include a photo transistor PT having a collector connected to a power supply terminal through which an operating voltage Vcc is supplied, a base receiving an external light, and an emitter connected to the sensitivity setting unit 5710. The sensitivity setting unit 5710 may include a variable resistor connected to the emitter of the photo transistor PT and adjustable by a user, and a resistor serially connected to the variable resistor.

Upon operation of the automatic LED dimming apparatus, the surrounding brightness detection unit 5700 detects a surrounding brightness and outputs a detection voltage Vd to the dimming control unit 5800. For example, when the surrounding brightness detection unit 5700 includes the sensitivity setting unit 5710 and the photo sensor unit 5720, the sensitivity setting unit 5710 may set a detection sensitivity for detection of the surrounding brightness with respect to the photo sensor unit 5720. The photo sensor unit 5720 may receive an external light and detect the surrounding brightness at the detection sensitivity set by the sensitivity setting unit 5710. In this case, the photo sensor unit 5720 may be implemented with a photo resistor PT having a collector connected to a power supply terminal through which an operating voltage Vcc is supplied, a base receiving the external light, and an emitter connected to the sensitivity setting unit 5710. When the photo transistor PT receives the external light, it is turned on so that a current I flows from the operating voltage (Vcc) terminal to the photo transistor PT and the sensitivity setting unit 5710. That is, the current I is detected as the detection voltage Vd by the sensitivity setting unit 5710. When the sensitivity setting unit 5710 is connected to the emitter of the photo transistor PT and implemented with the available resistor and the resistor, the current I is changed according to the resistance of the variable resistor, and the slope of the detection voltage Vd is changed according to the current I.

The dimming control unit 5800 includes an analog/digital (A/D) converter 5801 converting the analog detection voltage Vd generated by the detection of the surrounding brightness detection unit 5700 into a digital detection voltage, and a micom 5802 controlling a driving according to the magnitude of the digital detection voltage Vd outputted from the A/D converter 5801. When the digital detection voltage Vd from the A/D converter 5801 is lower than a preset first reference voltage, the micom 5802 may generate a driving current preset according to the magnitude of the difference voltage between the first reference voltage and the first reference voltage. When the digital detection voltage Vd is not lower than the first reference voltage, the micom 5802 may stop an illumination driving.

The operation of the dimming control unit 5800 will be described below in more detail. The dimming control unit 5800 controls the driving of the dimming driving unit 5810 according to the magnitude of the detection voltage Vd generated by the detection of the surrounding brightness detection unit 5700. for example, when the dimming control unit 5800 includes the A/D converter 5801 and the micom 5802, the A/D converter 5801 converts the analog detection voltage Vd generated by the detection of the surrounding brightness detection unit 5700 into a digital detection voltage, and outputs the digital detection voltage to the micom 5802. The micom 5802 may control the driving according to the magnitude of the digital detection voltage Vd outputted from the A/D converter 5801.

The dimming driving unit 5810 generates an LED driving current according to the driving control of the dimming control unit 5800, and provides the generated LED driving current to the LED unit 5820. Consequently, the dimming driving unit 5810 generates a small driving current when there is much external light amount, and generates a large driving current when there is little external light amount. Accordingly, the LED unit 5820 may include a plurality of LEDs, which are driven according to the driving current from the dimming driving unit 5810. As described above, the brightness of the LEDs may be automatically adjusted according to the external light amount, and the power consumption may be reduced to the minimum level.

Figure 189:
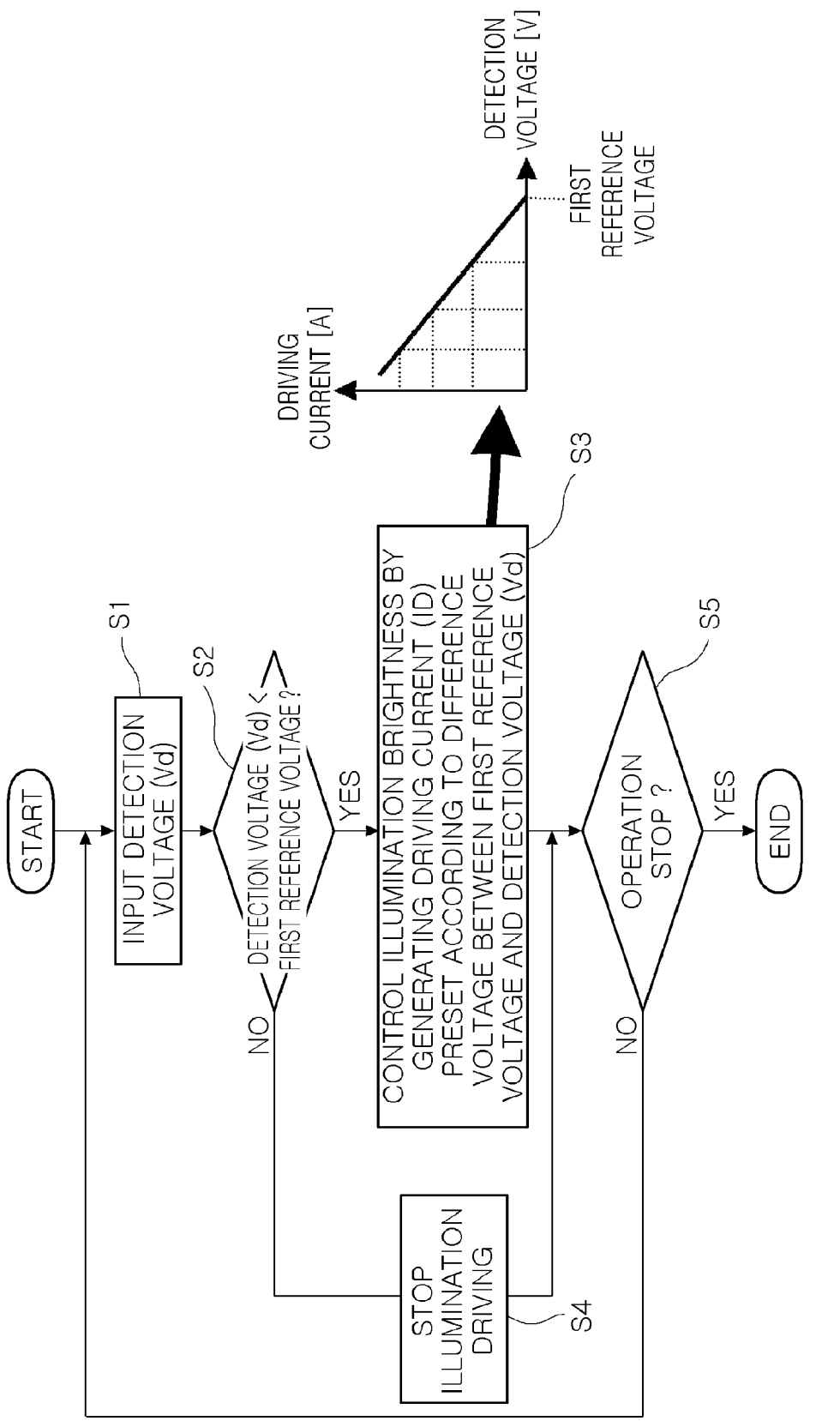
FIG. 189 is a flowchart illustrating the operation of the automatic LED dimming apparatus of FIG. 188.

FIG. 189 is an operation flowchart of the automatic LED dimming apparatus according an embodiment of the present invention. Referring to FIG. 1890, S1 is a step of receiving a detection voltage Vd. S2 is a step of comparing a digital detection voltage Vd with a preset first reference voltage. S3 is a step of controlling illumination brightness by generating a driving current which is preset according to the magnitude of a difference voltage between the first reference voltage and the digital detection voltage Vd when a digital detection voltage Vd is lower than a preset first reference voltage. S4 is a step of stopping the illumination driving when the digital detection voltage Vd is not lower than the first reference voltage. S5 is a step of determining whether to stop the operation. When it is determined not to stop the operation at step S5, the procedures of steps S1 to S3 are repeated. It is determined to stop the operation at step S5, the entire procedures are ended.

Referring to FIGS. 188 and 189, the micom 5802 receives the digital detection voltage Vd from the A/D converter 5801 (S1), and compares the digital detection voltage Vd with the preset first reference voltage (S2). The micom 5802 controls the illumination brightness by generating the driving current which is preset according to the magnitude of the difference voltage between the first reference voltage and the digital detection voltage Vd when the digital detection voltage Vd from the A/D converter 5801 is lower than the first reference voltage (S3). The micom 5802 may stop the illumination driving when the digital detection voltage Vd is not lower than the first reference voltage (S4). Meanwhile, the micom 5802 determines whether to stop the operation (S5). When the micom 5802 determines not to stop the operation, it repeats the procedures of steps S1 to S3. When the micom 5802 determines to stop the operation, it ends the entire procedures.

Figure 190:
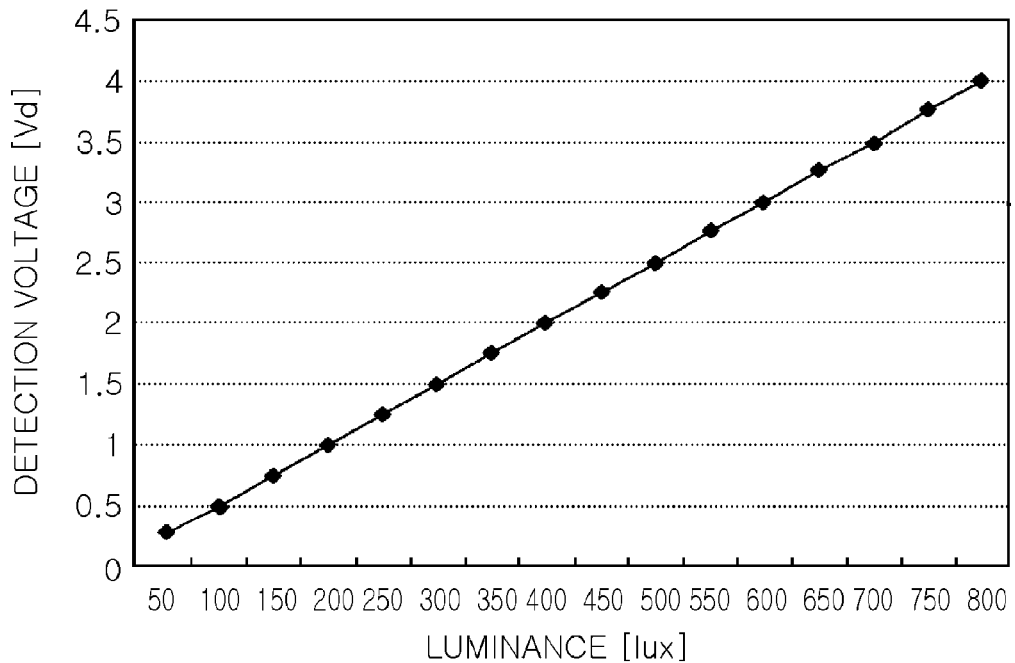
FIG. 190 is an external luminance-detection voltage relationship graph of the automatic LED dimming apparatus of FIG. 188.

FIG. 190 is an external luminance-detection voltage relationship graph according to an embodiment of the present invention. Specifically, FIG. 190 is an external luminance-detection voltage relationship graph explaining the operation of the surrounding brightness detection unit 5700 according to the embodiment of the present invention. The external luminance-detection voltage graph exhibits that the detection voltage increases with the increase of the external luminance. Referring to the external luminance-detection voltage relationship graph of FIG. 190, the detection voltage of the surrounding brightness detection unit 5700 becomes higher as the external luminance increases.

Figure 191:
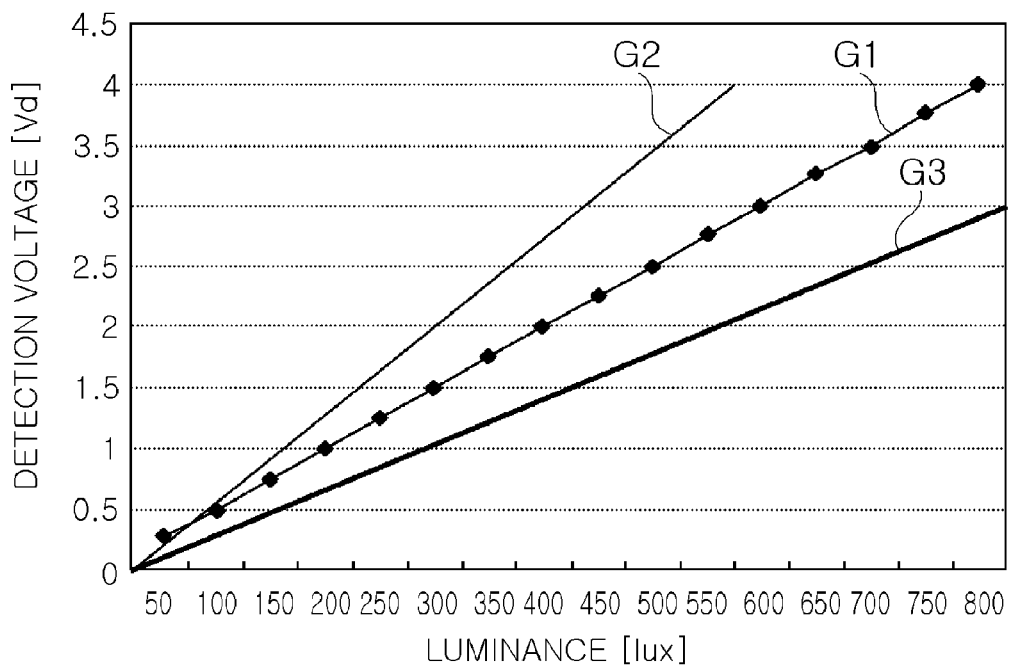
FIG. 191 is an external luminance-detection voltage relationship graph according to the sensitivity setting of the automatic LED dimming apparatus of FIG. 188.

FIG. 191 is various external luminance-detection voltage relationship graphs according to the sensitivity setting according to the embodiment of the present invention. FIG. 191 shows an example in which a slope of the external luminance-detection voltage relationship graph is changed according to the sensitivity setting of the sensitivity setting unit 5710 included in the surrounding brightness detection unit 5700. Among three graphs illustrated in FIG. 191, the graph G1 is an external luminance-detection voltage relationship graph having a middle slope, the graph G2 is an external luminance-detection voltage relationship graph having the greatest slope, and the graph G3 is an external luminance-detection voltage relationship graph having the smallest slope.

Referring to FIG. 191, when the sensitivity is set differently by adjusting the variable resistor included in the sensitivity setting unit 5710 of the surrounding brightness detection unit 5700, the slope of the external luminance-detection voltage relationship graph is changed, like the graphs G1, G2 and G3 of FIG. 191. For example, in a normal case, the sensitivity is set to a level corresponding to the graph G1. In a case in which there is a large amount of external light and there is a great change therein, the sensitivity is set to a level corresponding to the graph 2. In a case in which there is a small amount of external light and there is a slight change therein, the sensitivity is set to a level corresponding to the graph G3.

A vehicle headlight including the light emitting device including a light emitting device and a light emitting device package as a light source will be described below with reference to FIGS. 192 through 197.

Figure 192:
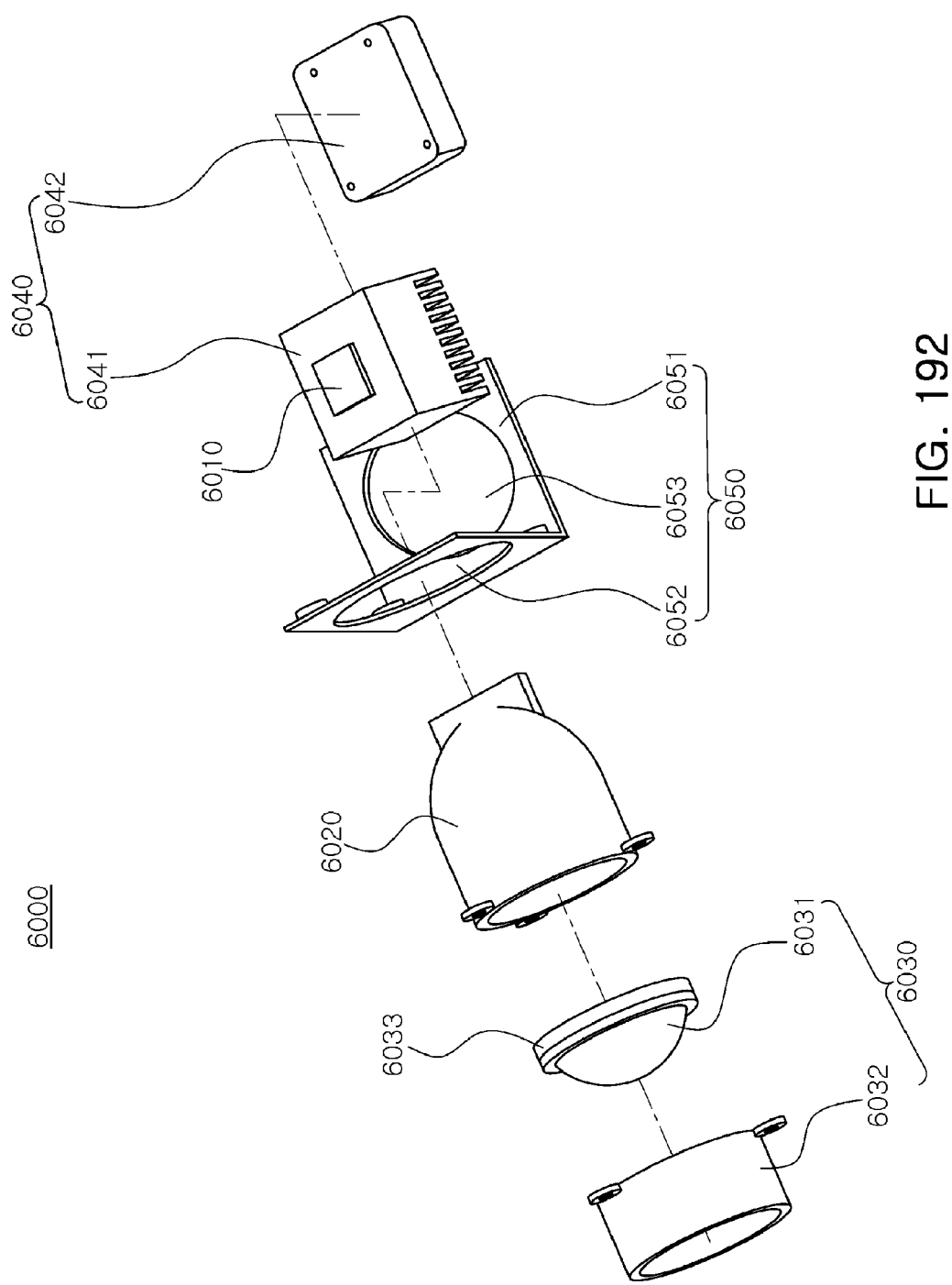
FIG. 192 is an exploded perspective view of a vehicle headlight according to an embodiment of the present invention.
Figure 193:
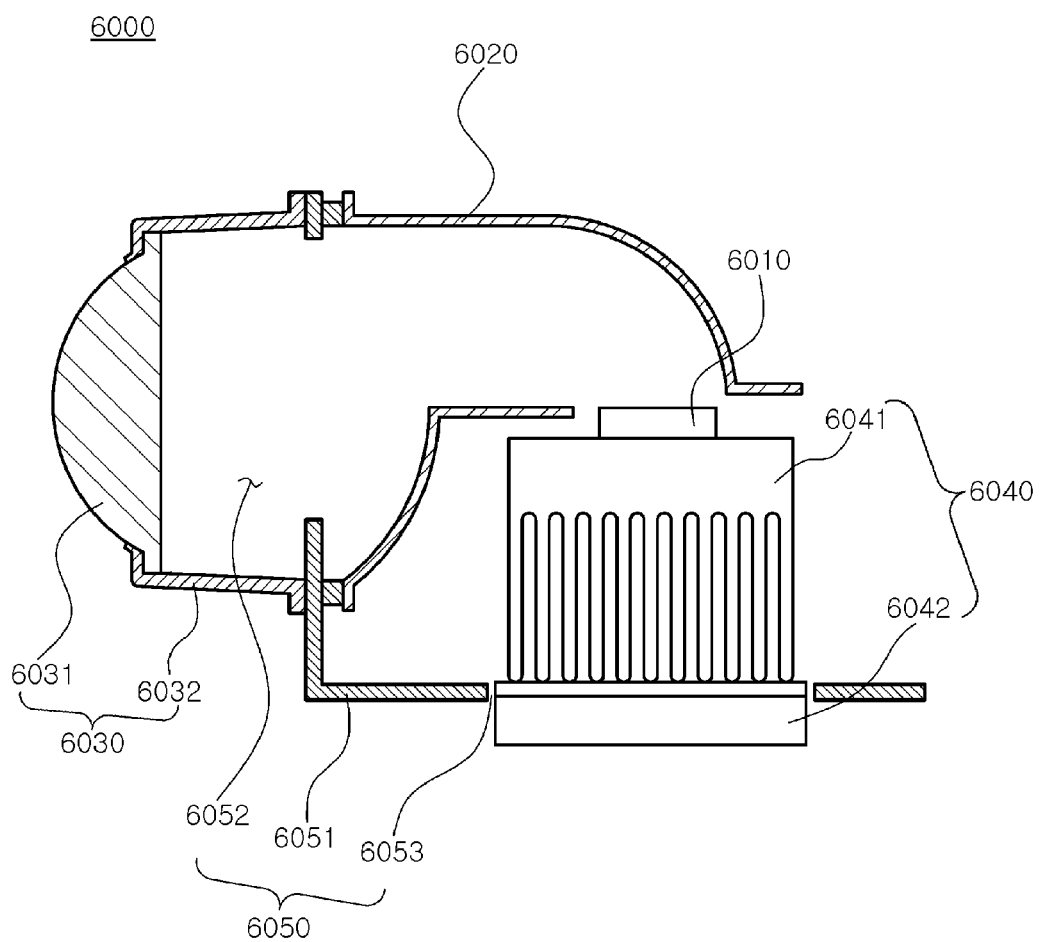
FIG. 193 is a cross-sectional view illustrating an assembly of the vehicle headlight of FIG. 192.

FIG. 192 is an exploded perspective view of a vehicle headlight according to an embodiment of the present invention, and FIG. 193 is a cross-sectional view illustrating an assembly of the vehicle headlight of FIG. 192.

Referring to FIG. 192, the vehicle headlight 6000 includes light emitting device packages 6010, 6010-1, 6010-2 and 6010-3, a reflection unit 6020, a lens unit 6030, and a heat dissipation unit 6040. The light emitting device packages 6010, 6010-1, 6010-2 and 6010-3 are mounted on the heat dissipation unit 6040 and electrically connected to an external power supply (not shown). The light emitting device packages 6010, 6010-*a*, 6010-2 and 6010-3 function as a light source to emitting light when a voltage is supplied.

Various structures of the light emitting device packages 6010, 6010-1, 6010-2 and 6010-3 will be described below in more detail with reference to FIGS. 194 through 197. First, a light emitting device package in which a resin layer includes a phosphor will be described with reference to FIGS. 194 and 196.

Figure 194:
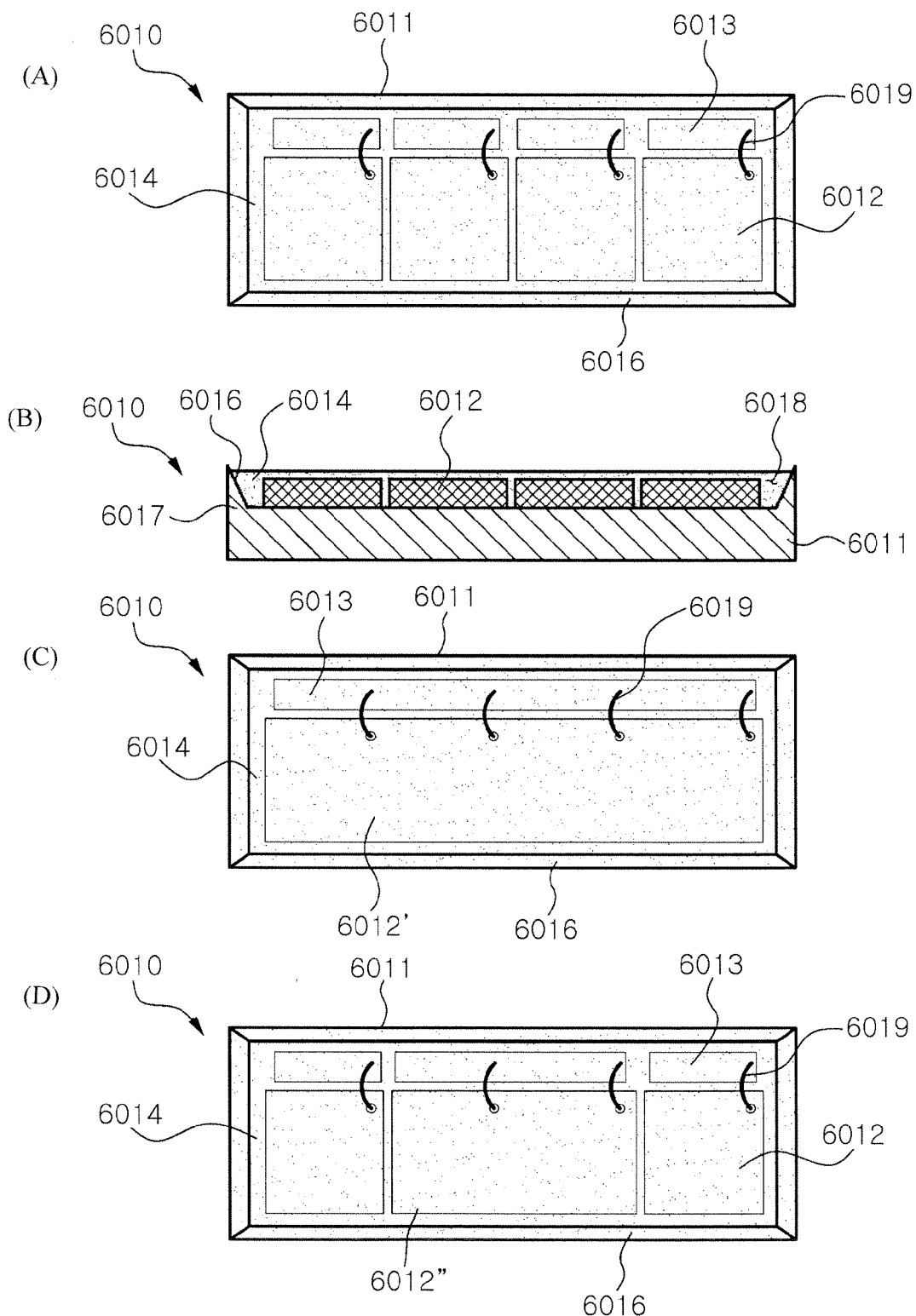

FIG. 194A is a plan view of a light emitting device package according to an embodiment of the present invention, FIG. 194B is a cross-sectional view of the light emitting device package of FIG. 194A, and FIG. 194C is a plan view illustrating modified examples of the light emitting device package of FIG. 194 in which a light emitting device chip is mounted.

FIG. 195A is a plan view of a light emitting device package according to another embodiment of the present invention, FIG. 195B is a cross-sectional view of the light emitting device package of FIG. 195A, and FIGS. 195C and 195D are plan views illustrating modified examples of the light emitting device package of FIG. 195A in which a light emitting device chip is mounted.

Figure 195:
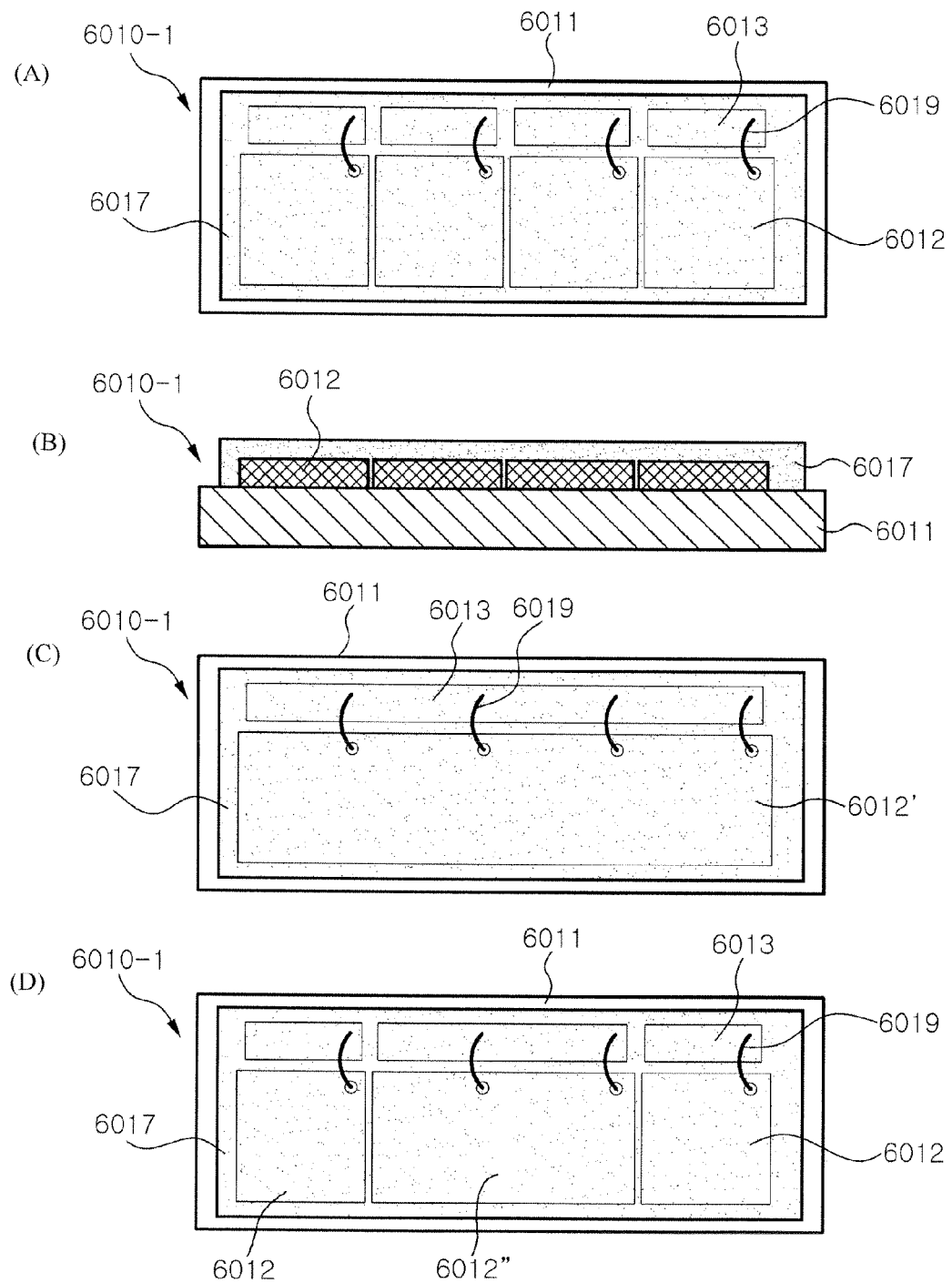

Referring to FIGS. 194 and 195, the light emitting device packages 6010 and 6010-1 include at least one light emitting device chip 6012, a substrate 6011, and a resin layer 6014. The light emitting device chip 6012 is mounted on the substrate 6011, and the substrate 6011 includes at least one connection terminal 6013 electrically connected to the light emitting device chip 6012. The resin layer 6014 includes a phosphor and seals the light emitting device chip 6012 and the connection terminal 6013. The light emitting device chip 6012 is mounted on the top surface of the substrate 6011, and is a type of a semiconductor device which emits light of a predetermined wavelength by an external voltage. Referring to FIGS. 194A, 194B, 195A and 195B, the plurality of light emitting device chip 6012 may be provided at the center portion of the substrate 6011. In this case, when the light emitting device chip 6012 is a blue light emitting device, the light emitting device packages 6010 and 6010-1 may further include a phosphor for providing a white light, and the phosphor may include a yellow phosphor. For example, the white light may be obtained by injecting a gel-type epoxy resin containing a YAG-based yellow phosphor, or a gel-type silicon resin containing a YAG-based yellow phosphor into the receiving groove of the package and performing an ultraviolet curing or a thermal curing thereon, or coating or stacking a phosphor layer on the top surface of the chip.

The present invention is not limited to the light emitting device package including the blue light emitting device and the yellow light emitting device. For example, the light emitting device package may include a near ultraviolet chip, and a resin encapsulation part in which a red phosphor, a green phosphor, and a blue phosphor provided on the near ultraviolet chip are mixed, or a resin encapsulation part in which a red phosphor, a green phosphor, and a blue phosphor are sequentially stacked. Also, the light emitting device chip emitting ultraviolet light or blue light may be a white light emitting device package which includes an inorganic compound or at least one of a silicate-based phosphor, a garnet-based phosphor, a sulfide-based phosphor, a nitride-based phosphor, and a QD phosphor, wherein the inorganic compound is expressed as the composition of $(Sr, M)_2SiO_{4-x}N_y:Eu$ synthesized in the above-described embodiments 1 through 11.

Alternatively, the light emitting device chips 6012 may be arrayed with the combination of a blue light emitting device, a red light emitting device, and a green light emitting device and configured to generate a white light. However, the present invention is not limited to the above embodiment. As illustrated in FIGS. 194C and 195C, a single white light emitting device 6012' may be provided at the center portion of the substrate 6010. In this case, the light emitting device chip 6012' may be a blue light emitting device or an ultraviolet (UV) light emitting device. A white light is emitted through the phosphor of the resin layer 6014, which will be described layer.

Also, as illustrated in FIGS. 194D and 195D, short light emitting device chips 6012 may be symmetrically provided on both sides of a long light emitting device chip 6012" provided at the center portion of the substrate 6011. In this case, the light emitting device chip 6012" provided at the center portion of the substrate 6011 may be 1.5 to 2 times longer than the light emitting device 6012 provided on both sides of the light emitting device chip 6012". The light emitting device chip 6012" may be, but is not limited to, a green light emitting device. The lighting device chip 6012 is electrically connected through a metal wire 6019 to the connection terminal 6013 patterned on the top surface of the substrate 6011 in a wire bonding method.

Referring to FIGS. 194A and 194B illustrating the light emitting device package 6000 according to the embodiment of the present invention, the substrate 6010 includes a cavity 6018. The light emitting device chip 6012 is mounted on the top surface of the cavity 6018, and the connection terminal 6013 is mounted inside the cavity 6018. The cavity 6918 forms a reflection surface 6016 along an inner periphery surface inclined downward to the light emitting device chip 6012 and the connection terminal 6013. The cavity 6018 may be provided by recessing the top surface of the substrate 6011 at a predetermined size through a laser or an etching process, or may be provided by molding the resin layer 6017 along the perimeter of the top surface of the substrate 6011 at a predetermined height so that the reflection surface 6016 protrudes. In order for further efficient implementation of the reflection surface 6016, a reflective layer having a high reflectivity may be further provided on the reflection surface 6016.

The cavity 6018 is filled with a resin layer 6014 including a phosphor, and integrally covers and seals the light emitting device chip 6012, the metal wire 6019, the connection terminal 6013, and the top surface of the substrate 6011, thereby protecting the light emitting device chip 6012 and so on disposed within the cavity 6018. In this case, the light emitting device package 6000 is configured so that the top and side surfaces of the light emitting device chip 6012, including the interval between the light emitting device chips 6012, is sealed by the resin layer 6014.

Therefore, it is possible to solve the problem of the conventional light emitting device package that irradiated light appears to be not continuous but discontinuously separated because the phosphor is coated on only the top surface of the light emitting device chip.

Meanwhile, referring to FIGS. 195A and 195B illustrating a light emitting device package 6010-1 according to another embodiment of the present invention, the resin layer 6014 is molded on the flat top surface of the substrate 6000-1 at a predetermined size and height to integrally cover and seal the light emitting device chip 6012 and the connection terminal 6013. In this case, the light emitting device chip 6000-1 is configured so that the top and side surfaces of the light emitting device chip 6012, including the interval between the light emitting device chips 6012, is sealed by the resin layer 6014.

Figure 196:
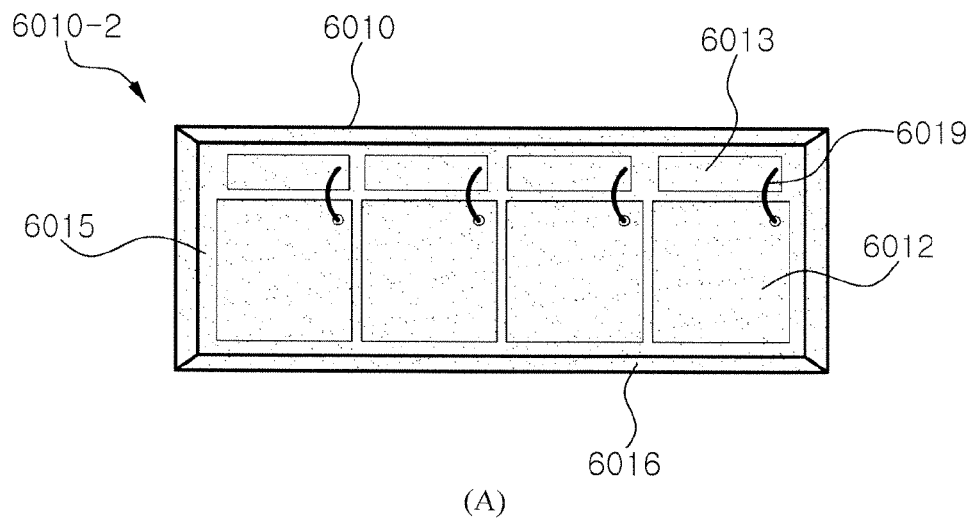
Figure 196:
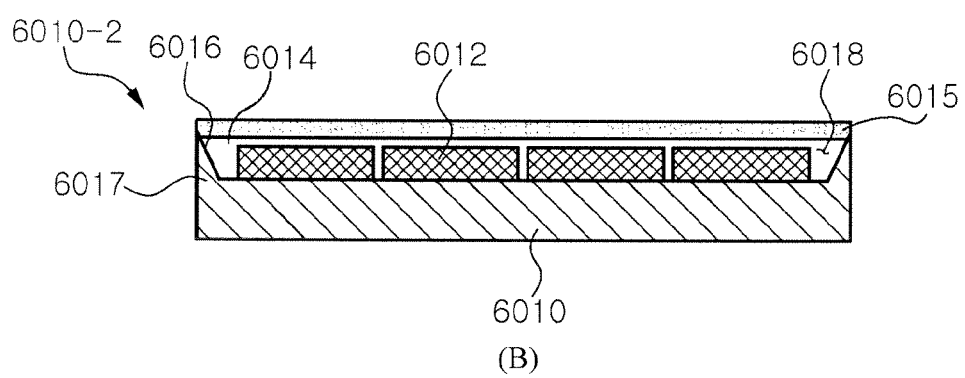
Figure 196:
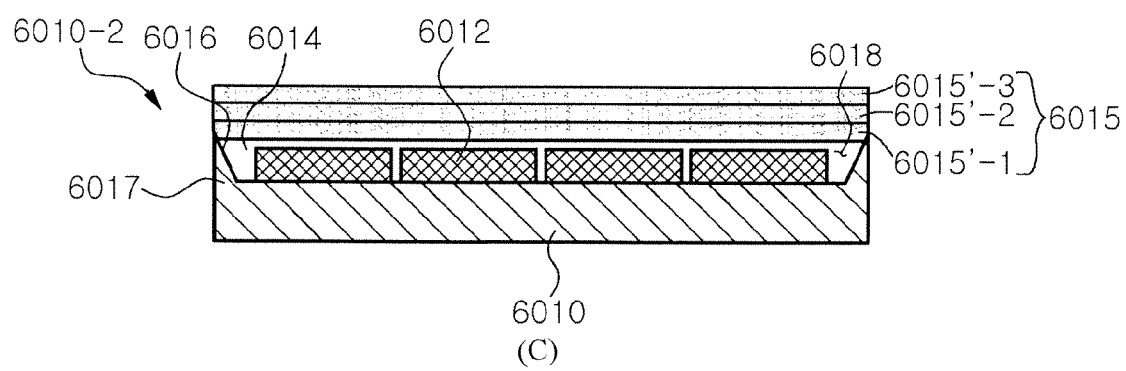

Next, a light emitting device package including a phosphor layer which is formed on the top surface of a resin layer and includes a phosphor layer containing a phosphor to convert wavelength of light emitted from a light emitting device chip, will be described with reference to FIGS. 196 and 197. FIG. 196A is a plan view illustrating another embodiment of the light emitting device package of FIG. 194A, FIG. 196B is a cross-sectional view of the light emitting device package of FIG. 196A, and FIG. 196C is a cross-sectional view illustrating a modified embodiment of the light emitting device package of FIG. 196B.

The structure of the light emitting device package 6010-2 illustrated in FIG. 196 is substantially identical to that of the embodiment illustrated in FIG. 194, except that the phosphor layer including the phosphor is provided on the top surface of the resin layer. Thus, a detailed description about the same elements as the embodiment of FIG. 194 will be omitted, and only different elements will be described below.

Referring to FIG. 196, the resin layer 6014 filling the cavity 6018 and integrally covering and sealing the light emitting device chip 6012, the metal wire 6019, the connection terminal 6013, and the top surface of the substrate 6011 does not include a phosphor. However, like the embodiment of FIG. 194, the resin layer 6014 integrally seals the top and side surfaces of the light emitting device chip 6012, including the interval between the light emitting device chips 6012, and the connection terminal 6013. The resin layer 6014 includes a phosphor layer 6015 including a phosphor on the top surface thereof to convert wavelength of light emitted from the light emitting device chip 6012. Although the phosphor layer 6015 provided on the top surface of the resin layer 6014 is illustrated, it may be coated on the outer side of the resin layer 6015, or may be attached to the outer surface of the resin layer 6014 in a layer form. In this case, the phosphor layer 6015 may be provided by at least one stacked layer.

Referring to FIG. 196B, the phosphor is included within the phosphor layer 6015 in order to convert the wavelength of light. The phosphor may be provided by mixing at least one phosphor of a blue phosphor, a green phosphor, a red phosphor, and a yellow phosphor. In addition, although the multi-layer structure (three layers are stacked in the drawing) is illustrated in FIG. 196C, the present invention is not limited thereto. In this case, the stacked phosphor layer 6015 may include the same phosphor or different phosphors in layers. In the stacked phosphor layer 6015, the phosphor layer having a short wavelength is disposed on the upper portion, and the phosphor layer having a long wavelength is disposed on the lower portion. In this manner, the phosphor layers are sequentially stacked according to the wavelength.

For example, when the light emitting device chip 6012 is a UV light emitting device chip, a first phosphor layer 6015'-1 formed on the light emitting device chip 6012 may be provided with a mixture of a red phosphor and a resin. The red phosphor emitting a red light (R) may be formed of a phosphor material which is excited by ultraviolet light and has a peak emission wavelength of approximately 600-700 nm. A second phosphor layer 6015'-2 is stacked on the first phosphor layer 6015'-2 and may be provided with a mixture of a green phosphor and a resin. The green phosphor emitting a green light (G) may be formed of a phosphor material which is excited by ultraviolet light and has a peak emission wavelength of approximately 500-550 nm. A third phosphor layer 6015'-3 is stacked on the second phosphor layer 6015'-3 and may be provided with a mixture of a blue phosphor and a resin. The blue phosphor emitting a blue light (B) may be formed of a phosphor material which is excited by ultraviolet light and has a peak emission wavelength of approximately 420-480 nm.

The ultraviolet light emitted from the UV light emitting device chip through the above-described structure excite different kinds of the phosphors included in the first phosphor layer 6015'-1, the second phosphor layer 6015'2, and the third phosphor layer 6015'-3. Accordingly, the red light (R), the green light (G), and the blue light (B) are emitted from the respective phosphor layers, and the three color lights are mixed to generate a white light (W). In particular, when the phosphor layer for converting ultraviolet light is formed of a multi-layer structure, e.g., a three-layer structure, the first phosphor layer 6015'-1 emitting the red light (R) having the longest wavelength is stacked on the UV light LED chip 6012, and the second phosphor layer 6015'-2 and the third phosphor layer 6015'3 emitting the green light (G) and the blue light (B) having a shorter wavelength than the red light (R) are sequentially stacked on the first phosphor layer 6015'-1.

Since the first phosphor layer 6015'-1 including the phosphor emitting the red light (R) having the lowest light conversion efficiency is disposed closest to the UV LED chip 6012, the light conversion efficiency at the first phosphor layer is relatively increased, thereby improving the entire light conversion efficiency of the LED chip 6012.

When the light emitting device chip 6012 is a light emitting device chip emitting the red light (B) having the wavelength range of 420-480 nm as an excitation light, the first phosphor layer 6015'-1 formed on the light emitting device chip 6012 is provided by a mixture of a red phosphor and a resin, and the second phosphor layer 6015'-2 and the third phosphor layer 6015'-3 stacked on the first phosphor layer 6015'-1 is provided by a mixture of a green or yellow phosphor and a resin.

The blue light (B) emitted from the light emitting device chip 6012 through the above-described structure excites the phosphor included in the first phosphor layer 6015'-1 to emit the red light (R), and excites the phosphors included in the second and third phosphor layers 6015'-2 and 6015'-3 to emit the green light (G) or the yellow light (Y). The red light (R) and the green light (G) (or the yellow light (Y)) emitted from the multi-layer phosphor layer and the blue light (B) emitted from the light emitting device chip are mixed to generate a white light (W).

Meanwhile, FIG. 197*a* is a plan view illustrating another embodiment of the light emitting device package of FIG. 195A, FIG. 197B is a cross-sectional view of the light emitting device package illustrated in FIG. 197A, and FIG. 197C is a cross-sectional view illustrating a modified embodiment of FIG. 197B.

Figure 197:
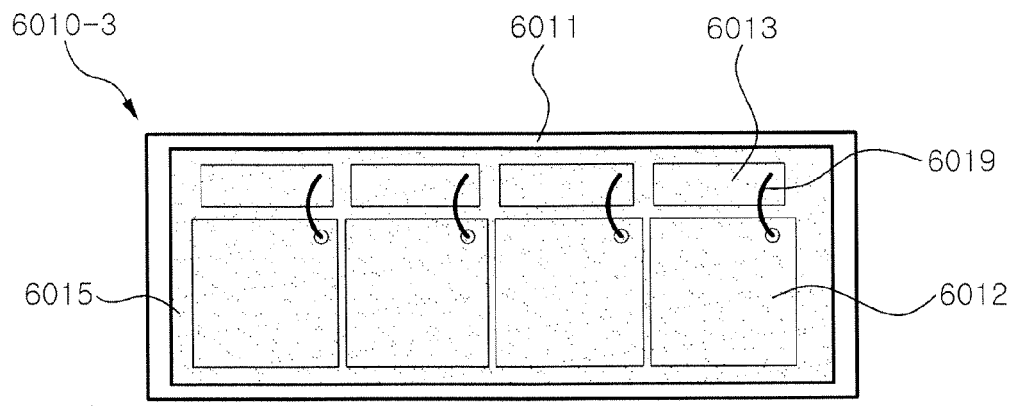
Figure 197:
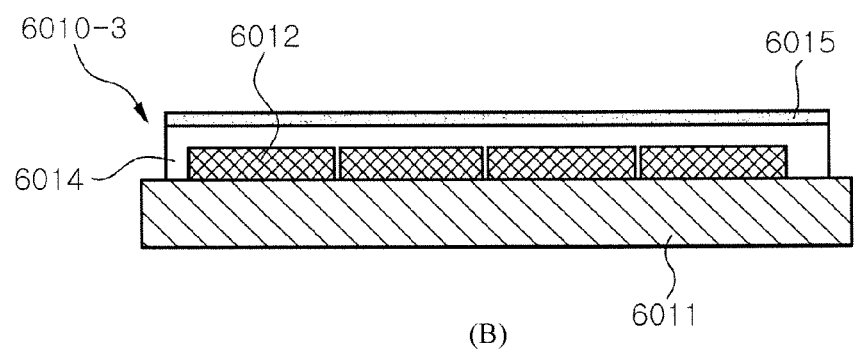
Figure 197:
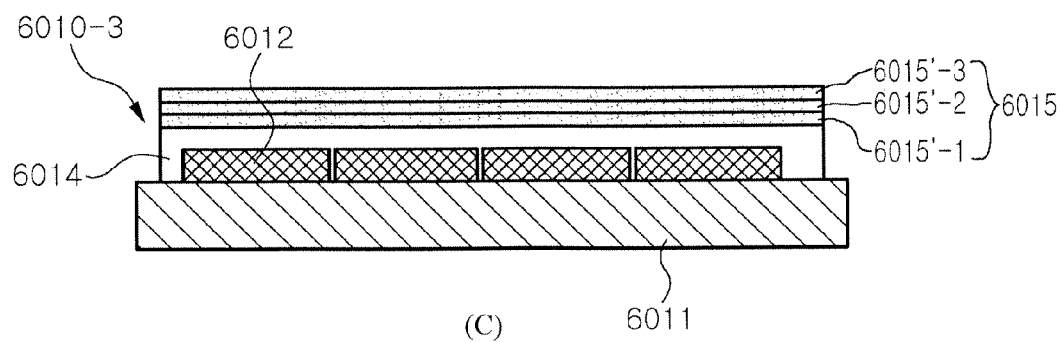

The structure of the light emitting device package 6010-3 illustrated in FIG. 197 is substantially identical to that of the embodiment illustrated in FIG. 195, except that the phosphor layer including the phosphor is provided on the side surface of the rein layer. Thus, a detailed description about the same elements as the embodiment of FIG. 195 will be omitted, and only different elements will be described below.

Referring to FIG. 197, the resin layer 6014 provided on the flat top surface of the substrate 6010 and integrally covering and sealing the light emitting device chip 6012, the metal wire 6019, the connection terminal 6013, and the top surface of the substrate 6011 does not include a phosphor. Also, the embodiment of FIG. 197 is substantially identical to the embodiment of FIG. 196 in that the resin layer 6014 does not include a phosphor and the phosphor is included within the phosphor layer 6015 provided on the top surface of the resin layer 6014.

Referring to FIG. 197B, the phosphor included within the phosphor layer 6015 may be provided by mixing at least one phosphor of a blue phosphor, a green phosphor, a red phosphor, and a yellow phosphor. In addition, although the multi-layer structure (three layers are stacked in the drawing) is illustrated in FIG. 197C, the present invention is not limited thereto. In this case, the stacked phosphor layer 6015 may include the same phosphor or different phosphors in layers.

In the stacked phosphor layer 6015, the phosphor layer having a short wavelength is disposed on the upper portion, and the phosphor layer having a long wavelength is disposed on the lower portion. Since the detailed structure of the phosphor 6015 is substantially identical to the phosphor layers 6015 of FIGS. 196B and 196C, a detailed description thereof will be omitted.

The heat dissipation unit 6040 includes a heat sink 6040 and a cooling fan 6042. Since the light emitting device packages 6010, 6010-1, 6010-2 and 6010-3 are provided on the heat dissipation unit 6040, heat generated from the light emitting device packages 6010, 6010-1, 6010-2 and 6010-3 are emitted to the outside.

Specifically, the heat sink 6041 is mounted on the top surfaces of the light emitting device packages 6010, 6010-1, 6010-2 and 6010-3, and high-temperature heat generated from the light emitting device packages 6010, 6010-1, 6010-2 and 6010-3 is emitted to the outside. In this case, a plurality of grooves may be formed on the bottom surface in order to obtain a wide surface area. The cooling fan 6042 is mounted under the heat sink 6041 to increase the heat dissipation efficiency of the heat sink 6041.

The reflection unit 6020 is provided on the light emitting device packages 6010, 6010-1, 6010-2 and 6010-3 and the heat dissipation unit 6040 to guide and reflect light emitted from the light emitting device packages 6010, 6010-1, 6010-2 and 6010-3. As illustrated in FIGS. 192 and 193, the reflection unit 6020 is formed to have a dome-shaped cross-section and guides light emitted from the light emitting device chip 6012 in the front of the vehicle. Also, the reflection unit 6020 has an opened front side and emits the reflected light to the outside.

The vehicle headlight 6000 according to this embodiment of the present invention further includes a housing 6050 fixing and supporting the heat dissipation unit 6040 and the reflection unit 6020. Specifically, a center hole 6050 is formed on a first side of the housing 6050 so that the heat dissipation unit 6040 is connected and mounted on the first side of the housing 6050. A front hole 6052 is formed on the second side integrally connected to the first side and bent at the right angle, so that the reflection unit 6020 is disposed on the top surface of the light emitting device packages 6010, 6010-1, 6010-2 and 6010-3.

Therefore, the reflection unit 6020 is fixed to the housing 6050 so that the opened front side of the reflection unit 6020 corresponds to the front hole 6052. Thus, the light reflected by the reflection unit 6020 is emitted to the outside through the front hole 6052.

The lens unit 6030 emits the light reflected by the reflection unit 6020 to the outside. The lens unit 6030 includes a hollow guide 6032 and a lens 6061. Specifically, the guide 6032 is mounted along the front hole 6052 of the housing 6050 and guides the light reflected by the reflection unit 6020 and passing through the front hole 6052 in a front direction. The guide 6032 has a hollow cylindrical structure in which the lens 6031 is received. The guide 6032 is an injected plastic product formed by injection molding.

The lens 6031 may be mounted on the front side of the guide 6032 to refract and disperse the light in a front direction of the vehicle, and may be formed of a transparent material.

The illumination apparatus such as the backlight unit and the vehicle headlight according to the various embodiments of the present invention may employ the above-described various light emitting device packages. The light emitting device package may include an inorganic compound or at least one of a silicate-based phosphor, a garnet-based phosphor, a sulfide-based phosphor, a nitride-based phosphor, and a QD phosphor, wherein the inorganic compound is expressed as the composition of $(Sr, M)_2SiO_{4-x}N_y$:Eu synthesized in the above-described embodiments 1 through 11, where M is at least one of monad or dyad elements, $0<x<4$, and $y=2x/3$. The light emitting device package includes a wavelength conversion unit or a resin encapsulation unit for absorbing light emitted from the LED chips and converting the wavelength of the emitted light.

As set forth above, exemplary embodiments of the invention provide the vertical type semiconductor light emitting device which is capable of improving external light extraction efficiency, specifically, lateral light extraction efficiency.

While the present invention has been shown and described in connection with the exemplary embodiments, it will be apparent to those skilled in the art that modifications and variations can be made without departing from the spirit and scope of the invention as defined by the appended claims.

The invention claimed is:

1. A light emitting apparatus including a semiconductor light emitting device, wherein the semiconductor light emitting device comprises:
    a light emitting structure including a first-conductivity type semiconductor layer, an active layer, and a second-conductivity semiconductor layer;
    a first electrode and second electrode connected to the first-conductivity type semiconductor layer and second-conductivity type semiconductor layer, respectively;
    an insulator electrically separating the second electrode from the first-conductivity type semiconductor layer, and the active layer;
    a resin encapsulation part packaging the light emitting structure and having at least one of a yellow phosphor, a green phosphor, a red phosphor or a quantum dot,
    wherein the first electrode includes:
    a contact layer electrically connected to the first-conductivity type semiconductor layer between the conductive substrate and the first-conductivity type semiconductor layer and extending to be exposed to the outside of the light emitting device, and
    the second electrode includes:
    a plurality of conductive vias passing through the first-conductivity type semiconductor layer and the active layer and connected to the inside of the second-conductivity type semiconductor layer; and
    an electrical connection part extending from the plurality of conductive vias;
    wherein the plurality of conductive vias have a radius of about 1 to about 50 um and are uniformly disposed in the light emitting structure, the spacing between the two adjacent conductive vias is in the range of about 5 to about 500 um,
    wherein the light emitting device further comprises an etch stop layer disposed on at a region in which the light emitting structure is not disposed over the top surface of the contact layer, and
    a side surface of the etch stop layer, a side surface of the contact layer and a side surface of the insulator are substantially coplanar in a thickness direction of the light emitting device.

2. The light emitting apparatus of claim 1, wherein the contact area between the second electrode and the second-conductivity type semiconductor layer is in the range of about 0.615% to about 15.68% of the area of the light emitting structure.

3. The light emitting apparatus of claim 1, wherein the number of conductive vias is about 5 to about 150.

4. The light emitting apparatus of claim 1, further comprising a passivation layer which is provided on at least one side of the light emitting structure, wherein the passivation layer includes at least one selected from the group consisting of silicon oxide, silicon nitride, and insulating material, and the passivation layer is about 0.1 to about 2 μm in thickness.

5. The light emitting apparatus of claim 1, wherein the second electrode includes at least one selected from the group consisting of Ti, Al, Cr, and Au.

6. The light emitting apparatus of claim 1, wherein the quantum dot has a nano crystal particle composed of a core and a shell, and the core size is in the range of about 2 nm to about 100 nm.

7. The light emitting apparatus of claim 1,
    wherein the quantum dot has formed by the group II-VI compound semiconductors include at least one selective from group consisting of ZnS, ZnSe, ZnTe, CdS, CdSe, CdTe, HgS, HgSe, HgTe and MgTe,
    the group III-V compound semiconductors include at least one selective from group consisting of GaN, GaP, GaAs, GaSb, InN, InP, InAs, InSb, AlAs, AlP, AlSb, and AlS, and
    the group IV semiconductors include at least one selective from group consisting of Ge, Si and Pb.

8. The light emitting apparatus of claim 1, wherein the light emitting structure emits light in the range of approximately 360~460 nm.

* * * * *